US009448482B2

(12) United States Patent
Iwato et al.

(10) Patent No.: US 9,448,482 B2
(45) Date of Patent: Sep. 20, 2016

(54) PATTERN FORMING METHOD, RESIST PATTERN FORMED BY THE METHOD, METHOD FOR MANUFACTURING ELECTRONIC DEVICE USING THE SAME, AND ELECTRONIC DEVICE

(71) Applicant: FUJIFILM Corporation, Minato-ku, Tokyo (JP)

(72) Inventors: Kaoru Iwato, Shizuoka (JP); Takanobu Takeda, Shizuoka (JP); Hiroo Takizawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/719,830

(22) Filed: May 22, 2015

(65) Prior Publication Data

US 2015/0253673 A1 Sep. 10, 2015

Related U.S. Application Data

(63) Continuation of application No. PCT/JP2013/080837, filed on Nov. 14, 2013.

(30) Foreign Application Priority Data

Nov. 26, 2012 (JP) ................................ 2012-257845

(51) Int. Cl.
*G03F 7/075* (2006.01)
*G03F 7/30* (2006.01)
(Continued)

(52) U.S. Cl.
CPC ............... *G03F 7/30* (2013.01); *G03F 7/0392* (2013.01); *G03F 7/0397* (2013.01);
(Continued)

(58) Field of Classification Search
CPC .. G03F 7/0392; G03F 7/0397; G03F 7/0752; G03F 7/30; G03F 7/325; G03F 7/40; G03F 7/11; H01L 21/0274; H01L 21/0275; H01L 21/0337; H01L 21/3121; H01L 21/30604
USPC ......... 430/270.1, 272.1, 322, 325, 329, 330, 430/331
See application file for complete search history.

(56) References Cited

U.S. PATENT DOCUMENTS

2009/0286188 A1 11/2009 Hatakeyama et al.
2010/0203457 A1* 8/2010 Hatakeyama ........... G03F 1/144 430/326

(Continued)

FOREIGN PATENT DOCUMENTS

JP 2009-301007 A 12/2009
JP 2010-217884 A 9/2010

(Continued)

OTHER PUBLICATIONS

Search Report dated Dec. 17, 2013 issued by the International Searching Authority in counterpart International Patent Application No. PCT/JP2013/080837 (PCT/ISA/210).

(Continued)

*Primary Examiner* — Amanda C Walke
(74) *Attorney, Agent, or Firm* — Sughrue Mion, PLLC

(57) ABSTRACT

There is provided a pattern forming method including (1) forming a film by an actinic ray-sensitive or radiation-sensitive resin composition containing a resin (A) capable of increasing the polarity by the action of an acid so that a solubility thereof in a developer containing an organic solvent is decreased, (2) exposing the film, (3) developing the film by a developer including an organic solvent to form a negative pattern having a space part obtained by removing a part of the film and a residual film part which is not removed by the developing, (4) forming a resist film for reversing a pattern, on the negative pattern, so as to be embedded in the space part in the negative pattern, and (5) reversing the negative pattern into a positive pattern by removing the residual film part in the negative pattern by using an alkaline wet etching liquid.

9 Claims, 1 Drawing Sheet

(51) Int. Cl.

| | |
|---|---|
| ***G03F 7/11*** | (2006.01) |
| ***H01L 21/027*** | (2006.01) |
| ***H01L 21/033*** | (2006.01) |
| ***H01L 21/306*** | (2006.01) |
| ***G03F 7/40*** | (2006.01) |
| ***G03F 7/039*** | (2006.01) |
| ***G03F 7/32*** | (2006.01) |

(52) U.S. Cl.

CPC .............. *G03F 7/0752* (2013.01); *G03F 7/11* (2013.01); *G03F 7/325* (2013.01); *G03F 7/40* (2013.01); *H01L 21/0274* (2013.01); *H01L 21/0275* (2013.01); *H01L 21/0337* (2013.01); *H01L 21/30604* (2013.01)

(56) References Cited

U.S. PATENT DOCUMENTS

2011/0177462 A1* 7/2011 Hatakeyama ......... G03F 7/0397 430/325
2012/0045899 A1* 2/2012 Maruyama ................ G03F 7/40 438/694
2012/0122031 A1* 5/2012 Chen ..................... G03F 7/0397 430/280.1
2012/0183903 A1* 7/2012 Hatakeyama ........... G03F 7/004 430/284.1
2014/0017896 A1* 1/2014 Sakaida ................. C08G 77/20 438/694
2014/0225252 A1* 8/2014 Lin ................... H01L 23/49811 257/737
2014/0234781 A1* 8/2014 Hatakeyama ........... G03F 7/325 430/324
2014/0234785 A1* 8/2014 Hatakeyama ............. G03F 7/40 430/326

FOREIGN PATENT DOCUMENTS

JP 2011-197628 A 10/2011
JP 4826846 B2 11/2011
JP 2012-137698 A 7/2012
WO 2010/095763 A1 8/2010

OTHER PUBLICATIONS

Written Opinion dated Dec. 17, 2013 issued by the International Searching Authority in counterpart International Patent Application No. PCT/JP2013/080837 (PCT/ISA/237).

Translation of Written Opinion dated Dec. 17, 2013 issued by the International Searching Authority in counterpart International Patent Application No. PCT/JP2013/080837 (PCT/ISA/237).

Office Action from the Japanese Patent Office dated Mar. 22, 2016 in counterpart Japanese Application No. 2012-257845.

* cited by examiner

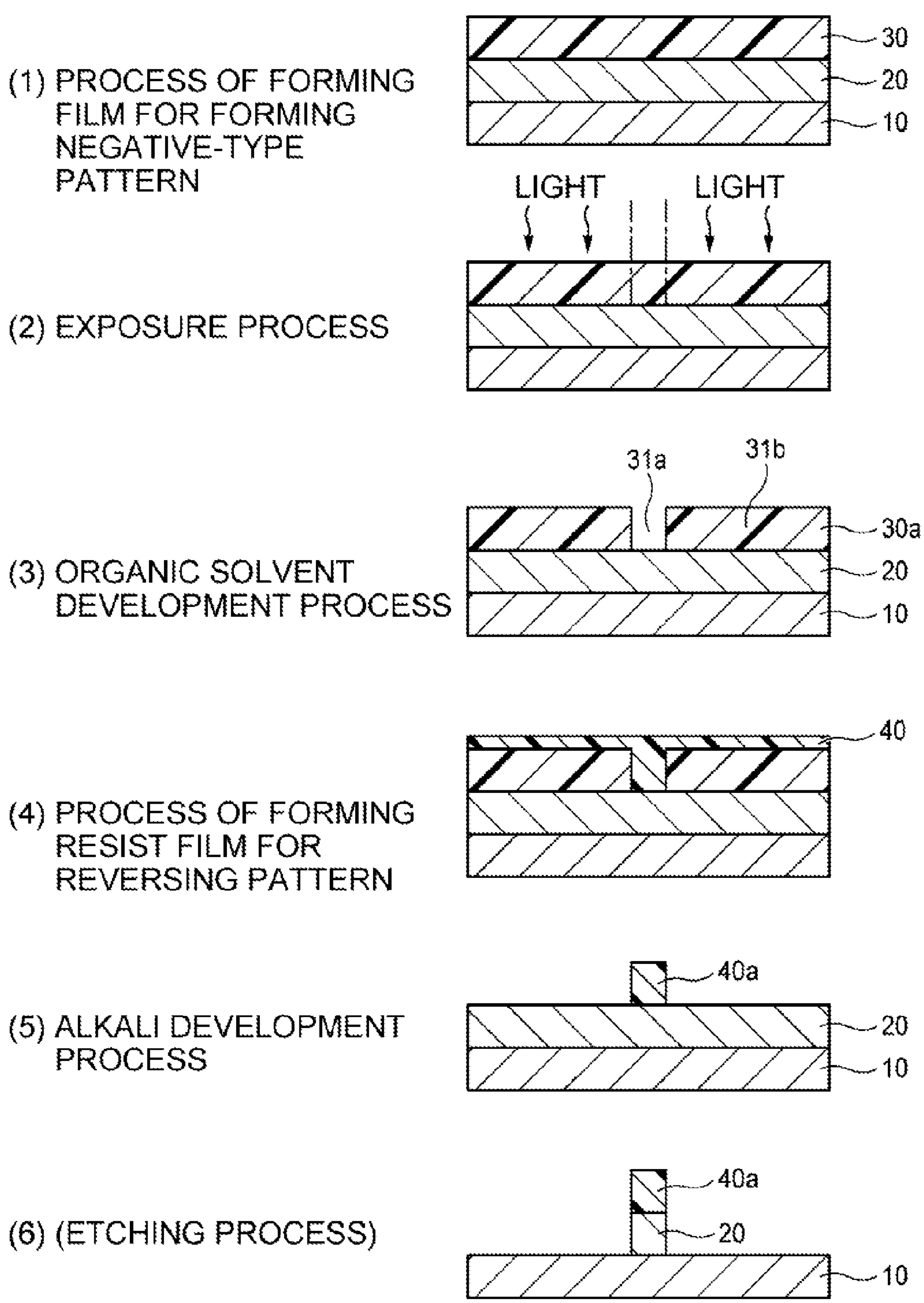
(1) PROCESS OF FORMING FILM FOR FORMING NEGATIVE-TYPE PATTERN
30
20
10
LIGHT
LIGHT
(2) EXPOSURE PROCESS
31a
31b
30a
(3) ORGANIC SOLVENT DEVELOPMENT PROCESS
20
10
40
(4) PROCESS OF FORMING RESIST FILM FOR REVERSING PATTERN
40a
(5) ALKALI DEVELOPMENT PROCESS
20
10
40a
(6) (ETCHING PROCESS)
20
10

PATTERN FORMING METHOD, RESIST PATTERN FORMED BY THE METHOD, METHOD FOR MANUFACTURING ELECTRONIC DEVICE USING THE SAME, AND ELECTRONIC DEVICE

CROSS REFERENCE TO RELATED APPLICATION

This is a continuation of International Application No. PCT/JP2013/080837 filed on Nov. 14, 2013, and claims priority from Japanese Patent Application No. 2012-257845 filed on Nov. 26, 2012, the entire disclosures of which are incorporated herein by reference.

BACKGROUND

1. Technical Field

The present invention relates to a pattern forming method, a resist pattern formed by the method, a method for manufacturing an electronic device using the same, and an electronic device. More specifically, the present invention relates to an ultra-micro lithography process which may be applied to a process of manufacturing ultra LSI and high capacity microchips, a process of preparing a mold for nanoimprinting, a process of producing a high-density information recording medium, and the like, a pattern forming method which is suitably used in other photo fabrication processes, a resist pattern formed by the method, a method for manufacturing an electronic device using the same, and an electronic device.

2. Background Art

Since the advent of a resist for KrF excimer laser (248 nm), an image forming method called chemical amplification has been used as an image forming method of the resist in order to compensate for sensitivity reduction caused by light absorption. For example, the image forming method by a positive-type chemical amplification is an image forming method of decomposing an acid generator in the exposed portion by exposure to generate an acid, converting an alkali insoluble group into an alkali soluble group by using the generated acid as a reaction catalyst in the baking after exposure (PEB: Post Exposure Bake), and removing the exposed portion by alkali development. A positive-type image forming method using such a chemical amplification mechanism has currently become a mainstream process.

However, in the positive-type image forming method as described above, in a case of forming the isolated space or fine hole patterns, the shape of the patterns easily deteriorates.

From the viewpoint of solving these problems, a method is known, in which after a positive-type pattern is first formed by exposure and development, the positive-type pattern is made to be alkali-soluble, and then a negative-type resist pattern is formed by applying a reversal film thereon, and dissolving the positive-type pattern by alkali etching to reverse the film pattern into a negative-type pattern (see Japanese Patent No. 4826846 and Japanese Patent Application Laid-Open No. 2009-301007), but there is a problem in that the process is complicated, such as requirement to convert the positive-type pattern into being alkali soluble before the reversal film is applied.

Meanwhile, in recent years, with high integration of integrated circuits, ultrafine pattern formation of a submicron or quarter-micron region has been required. Accordingly, the exposure wavelength also shows a tendency to be a shorter wavelength, and thus development of lithography using electron beams, or X-rays, or EUV light has also proceeded.

The lithography using electron beams, or X-rays, or EUV light is ranked as a next-generation or next-next-generation pattern formation technique, thereby leading to development of an ultrafine pattern formation method, and line thinning has been further pursued.

From the viewpoint of such line thinning, a pattern forming method using a developer (organic-based developer) including an organic solvent has also been developed (see, for example, Japanese Patent Application Laid-Open No. 2010-217884). According to the method, it is considered that a high-precision fine pattern may be stably formed.

However, the more line thinning is pursued as described above, pattern collapse easily occurs, so that thinning of the resist film is required from the viewpoint of preventing such pattern collapse.

However, the thinner the resist film becomes as a result of pursuing the line thinning, etching resistance of the resist film may disappear, so that a dilemma in which the film fails to function as a resist film may occur.

As described above, the line thinning and the etching resistance as a function of the resist film are in a trade-off relationship, and thus it is important how to simultaneously satisfy both the line thinning and the etching resistance.

Further, in the positive-type image forming method, it is said that an isolated line or a dot pattern may be satisfactorily formed, but it is currently difficult to form a fine isolated line pattern having a line width of approximately 25 to 30 nm, or form a dot pattern having a fine dot diameter (for example, approximately 25 to 30 nm).

An object of the present invention is to provide a pattern forming method, which may form a fine pattern, such as a fine isolated line pattern or a fine dot pattern, which is difficult to form in a positive-type pattern forming method in the related art, may solve a dilemma of line thinning and the development of etching resistance by using a resist film for reversing a specific pattern, and thus may form a pattern which has a good roughness performance such as line width roughness (LWR) and may sufficiently withstand etching even though the pattern is fine, a resist pattern formed by the method, a method for manufacturing an electronic device using the same, and an electronic device.

SUMMARY

That is, the present invention is as follows.

[1]A pattern forming method comprising the following processes (1) to (5):

(1) a process of forming a film by an actinic ray-sensitive or radiation-sensitive resin composition containing a resin (A) capable of increasing the polarity by the action of an acid so that a solubility thereof in a developer comprising an organic solvent is decreased;

(2) a process of exposing the film;

(3) a process of developing the exposed film by a developer including an organic solvent to form a negative-type pattern having a space part obtained by removing a part of the film and a residual film part which has not been removed by the development;

(4) a process of forming a resist film for reversing a pattern, on the negative-type pattern, so as to be embedded in the space part in the negative-type pattern; and (5) a process of reversing the negative-type pattern into a positive-type pattern by removing the residual film part in the negative-type pattern by using an alkaline wet etching liquid.

[2] The pattern forming method described in [1], wherein the resin (A) has a repeating unit having a group capable of decomposing by the action of an acid to generate a polar group.

[3] The pattern forming method described in [1] or [2], wherein in the process (4), a resist film for reversing a pattern is formed of a composition containing an organic silicon compound having a siloxane bond.

[4] The pattern forming method described in any one of [1] to [3], wherein the exposure is performed by using X-ray, electron beam, or EUV.

[5]A resist pattern formed by the pattern forming method described in any one of [1] to [4].

[6]A method for manufacturing an electronic device, comprising the pattern forming method described in any one of [1] to [5].

[7] An electronic device manufactured by the method for manufacturing an electronic device described in [6].

According to the present invention, it is possible to provide a pattern forming method, which may form a fine pattern, such as a fine isolated line pattern or a fine dot pattern, which is difficult to form in a positive-type pattern forming method in the related art, may solve a dilemma of line thinning and the development of etching resistance by using a resist film for reversing a specific pattern, and thus may form a pattern which has a good roughness performance such as line width roughness (LWR) and may sufficiently withstand etching even though the pattern is fine, a resist pattern formed by the method, a method for manufacturing an electronic device using the same, and an electronic device.

BRIEF DESCRIPTION OF DRAWINGS

FIG. 1 is a schematic cross-sectional view describing a pattern forming method of the present invention.

DETAILED DESCRIPTION OF EXEMPLARY EMBODIMENTS

Hereinafter, exemplary embodiments of the present invention will be described in detail.

Meanwhile, it is stipulated that in the notations of groups (atomic groups) in the present specification, the notation which does not explicitly describe substituted or unsubstituted includes not only groups having no substituent but also groups having a substituent. For example, it is stipulated that the "alkyl group" which does not explicitly describe substituted or unsubstituted includes not only an alkyl group having no substituent (unsubstituted alkyl group) but also an alkyl group having a substituent (substituted alkyl group).

The "actinic ray" or "radiation" in the present specification means, for example, a bright line spectrum of a mercury lamp, far ultraviolet ray represented by excimer laser, extreme ultraviolet (EUV) rays, X-rays or electron beam (EB). Further, the "light" in the present invention means actinic ray or radiation.

In addition, the "exposure" in the present invention, unless otherwise specified, includes not only exposure by a mercury lamp, far ultraviolet ray represented by excimer laser, X-rays and EUV light or the like, but also drawing with a particle beam such as electron beam and ion beam.

The pattern forming method of the present invention has the following processes (1) to (5).

(1) A process of forming a film by an actinic ray-sensitive or radiation-sensitive resin composition containing a resin (A) capable of increasing the polarity by the action of the following acids so that the solubility thereof in a developer including an organic solvent is decreased, (2) a process of exposing the film (3) a process of developing the exposed film by a developer including an organic solvent to form a negative-type pattern having a space part, which is formed by removing a part of the film, and a residual film part, which has not been removed by the development, (4) a process of forming a resist film for reversing a pattern, on the negative-type pattern, so as to be embedded in the space part in the negative-type pattern, and (5) a process of reversing the negative-type pattern into a positive-type pattern by removing the residual film part in the negative-type pattern by using an alkaline wet etching liquid.

The pattern forming method of the present invention forms a film 30 for forming a negative-type pattern on a layer 20 to be processed of a substrate 10, as illustrated in FIG. 1(1). Subsequently, exposure is performed as illustrated in FIG. 1(2). As illustrated in FIG. 1(3), a negative-type pattern 30*a* having a space part 31*a*, which is by removing a part of the film 30 by developing an organic solvent, and a residual film part 31*b*, which has not been removed by the development, is formed. As illustrated in FIG. 1(4), a resist film 40 for reversing a pattern is formed, on the negative-type pattern 30*a*, so as to be embedded in the space part 31 in the negative-type pattern 30*a*. As illustrated in FIG. 1(5), the negative-type pattern 30*a* is reversed into a positive-type resist pattern 40*a* by removing the residual film part 31*b* in the negative-type pattern 30*a* by using an alkaline wet etching liquid.

Thereafter, as illustrated in FIG. 1(6), the layer 20 to be processed may be etched according to the positive-type resist pattern 40*a*.

In a positive-type pattern forming method in the related art, it is difficult to form a fine pattern, such as a fine isolated line pattern or a fine dot pattern by a dilemma of line thinning and the development of etching resistance, but according to the pattern forming method of the present invention, by using a resist film for reversing a specific pattern, it is possible to solve the dilemma of line thinning and the development of etching resistance, and to form a pattern which has a good roughness performance such as line width roughness (LWR) and may sufficiently withstand etching even though the pattern is fine.

Furthermore, in the negative-type pattern forming method by the development of the organic solvent in the related art, it is possible to form a fine isolated space pattern, a fine hole pattern, and the like well, but it is difficult to form a fine isolated line pattern, a fine dot pattern, and the like, but according to the pattern forming method of the present invention, it is possible to form a fine isolated line pattern, a fine dot pattern, and the like by reversing a pattern using a resist film for reversing a specific pattern.

(1) Film-Forming Process for Forming Negative-Type Pattern

According to the pattern forming method of the present invention, in the process (1), a film for forming a negative-type pattern is formed by an actinic ray-sensitive or radiation-sensitive resin composition to be described below in detail.

More specifically, a film for forming a negative-type pattern may be formed by dissolving each component of an actinic ray-sensitive or radiation-sensitive resin composition, which will be described below, in a solvent, filtering the resulting solution with a filter, if necessary, and then applying the filtered solution on a support (substrate).

The composition is applied on a substrate (for example: coated with silicon or silicon dioxide) to be used in the manufacture of an integrated circuit device by a suitable application method such as spin coater. Thereafter, a photosensitive film is formed by drying the composition. In the drying step, it is preferred that heating (prebaking) is performed.

The film thickness is not particularly limited, but is adjusted to preferably in a range of 10 to 500 nm, more preferably in a range of 10 to 200 nm, and still more preferably in a range of 10 to 80 nm. When the actinic ray-sensitive or radiation-sensitive resin composition is applied by a spinner, the rotation speed thereof is usually 500 to 3,000 rpm, preferably 800 to 2,000 rpm, and more preferably 1,000 to 1,500 rpm.

The heating (prebaking) temperature is performed preferably at 60 to 200° C., more preferably at 80 to 150° C., and still more preferably at 90 to 140° C.

The heating (prebaking) time is not particularly limited, but is preferably 30 to 300 seconds, more preferably 30 to 180 seconds, and still more preferably 30 to 90 seconds. The heating may be performed by a means equipped with an exposure•developing machine, or may also be performed by using a hot plate or the like.

If necessary, a commercially available inorganic or organic antireflection film may be used. Further, an antireflection film may be used while being applied on a lower layer of the actinic ray-sensitive or radiation-sensitive resin composition. As the antireflection film, it is possible to use either an inorganic film type such as titanium, titanium dioxide, titanium nitride, chromium oxide, carbon and amorphous silicon, or an organic film type composed of a light absorber and a polymer material. In addition, as the organic antireflection film, it is also possible to use a commercially available organic antireflection film such as DUV30 Series and DUV-40 Series manufactured by Brewer Science. Inc., or AR-2, AR-3 and AR-5 manufactured by Shipley Co., Ltd.

[1] Actinic Ray-Sensitive or Radiation-Sensitive Resin Composition for Forming Negative-Type Pattern in Process (1)

The actinic ray-sensitive or radiation-sensitive resin composition for forming a negative-type pattern in the process (1) is used in the negative-type development (development in which when exposed, the solubility thereof in a developer is decreased, and thus an exposed portion remains as a pattern and an unexposed portion is removed). That is, the actinic ray-sensitive or radiation-sensitive resin composition according to the present invention may be used as an actinic ray-sensitive or radiation-sensitive resin composition for developing an organic solvent, which is used in the development using a developer including an organic solvent. Herein, "for developing an organic solvent" at least means the use for a process of performing development using a developer including an organic solvent.

It is preferred that the actinic ray-sensitive or radiation-sensitive resin composition for forming a negative-type pattern in the process (1) is typically a resist composition because a particularly high effect may be obtained. Furthermore, the composition according to the present invention is typically a chemical amplification-type resist composition.

The composition used in the present invention contains a resin (A) capable of decreasing the solubility in a developer including an organic solvent by the action of an acid. Hereinafter, the resin (A) will be described.

[1](A) Resin (a) Repeating Unit Having an Acid-Decomposable Group

The resin (A) is a resin capable of decreasing the solubility in a developer including an organic solvent by the action of an acid, and preferably has a repeating unit having an acid-decomposable group. The repeating unit having an acid-decomposable group is, for example, a repeating unit having a group capable of decomposing by the action of an acid (hereinafter, also referred to as "an acid-decomposable group") on the main chain or side chain of a resin, or both main chain and side chain thereof. A group produced by the decomposition of an acid-decomposable group is preferably a polar group because the group decreases affinity with a developer including an organic solvent, and proceeds with insolubilization or poor solubilization (negative patterning) in the developer including an organic solvent. Further, the polar group is more preferably an acidic group. The definition of the polar group has the same meaning as the definition described in the item of a repeating unit (b) to be described below, but examples of the polar group produced by the decomposition of an acid-decomposable group include an alcoholic hydroxyl group, an amino group, an acidic group, and the like.

The polar group produced by the decomposition of an acid-decomposable group is preferably an acidic group.

The acidic group is not particularly limited as long as the acidic group is a group insolubilized in a developer including an organic solvent, but preferred examples thereof may include a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, more preferably a carboxylic acid group, a fluorinated alcohol group (preferably hexafluoroisopropanol), a phenolic hydroxyl group, or an acidic group (a group capable of dissociating in 2.38% by mass of an aqueous tetramethylammonium hydroxide solution which is used as the developer for resist in the related art) such as sulfonic acid group.

The group preferred as the acid-decomposable group is a group in which a hydrogen atom of the group is substituted with a group capable of leaving by the action of an acid. Examples of the group capable of leaving by the action of an acid include —C($R_{36}$)($R_{37}$)($R_{38}$), —C($R_{36}$)($R_{37}$)($OR_{39}$), —C($R_{01}$)($R_{02}$)($OR_{39}$), and the like.

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

The acid-decomposable group is preferably a cumyl ester group, an enol ester group, an acetal ester group, a tertiary alkyl ester group, and the like. The acid-decomposable group is more preferably a tertiary alkyl ester group.

The repeating unit (a) is preferably a repeating unit represented by the following Formula (V).

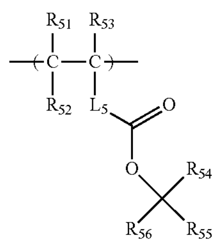

(V)

In Formula (V),

Each of $R_{51}$, $R_{52}$ and $R_{53}$ independently represents a hydrogen atom, an alkyl group, a cycloalkyl group, a halogen atom, a cyano group or an alkoxycarbonyl group. $R_{52}$ may be bonded with $L_5$ to form a ring, and in that case, $R_{52}$ represents an alkylene group.

$L_5$ represents a single bond or a divalent linking group, and in a case of forming a ring with $R_{52}$, $L_5$ represents a trivalent linking group.

$R_{54}$ represents an alkyl group, and each of $R_{55}$ and $R_{56}$ independently represents a hydrogen atom, an alkyl group, a cycloalkyl group, a monovalent aromatic ring group, or an aralkyl group. $R_{55}$ and $R_{56}$ may be bonded to each other to form a ring. However, $R_{55}$ and $R_{56}$ are not a hydrogen atom at the same time.

Formula (V) will be described in more detail.

Examples of an alkyl group of $R_{51}$ to $R_{53}$ in Formula (V) include preferably an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which groups may have a substituent, more preferably an alkyl group having 8 or less carbon atoms, and particularly preferably an alkyl group having 3 or less carbon atoms.

As an alkyl group included in an alkoxycarbonyl group, the groups such as an alkyl group in $R_{51}$ to $R_{53}$ are preferred.

The cycloalkyl group may be monocyclic or polycyclic. Preferred examples thereof may include a monocyclic cycloalkyl group having 3 to 8 carbon atoms, such as a cyclopropyl group, a cyclopentyl group, and a cyclohexyl group, each of which groups may have a substituent.

Examples of the halogen atom may include a fluorine atom, a chlorine atom, a bromine atom and an iodine atom, and a fluorine atom is particularly preferred.

Examples of preferred substituents in each of the above groups may include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group, and the number of carbon atoms of each group is preferably 8 or less.

Further, when $R_{52}$ is an alkylene group and forms a ring with $L_5$, preferred examples of the alkylene group may include an alkylene group having 1 to 8 carbon atoms, such as a methylene group, an ethylene group, a propylene group, a butylene group, a hexylene group, and an octylene group. An alkylene group having 1 to 4 carbon atoms is more preferred, and an alkylene group having 1 or 2 carbon atoms is particularly preferred. As the ring formed by combining $R_{52}$ with $L_5$, a 5- or 6-membered ring is particularly preferred.

As $R_{52}$ and $R_{53}$ in Formula (V), a hydrogen atom, an alkyl group, or a halogen atom is more preferred, and a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F) is particularly preferred. As $R_{52}$, a hydrogen atom, an alkyl group, a halogen atom or an alkylene group (forming a ring with $L_5$) is more preferred, and a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forming a ring with $L_5$), or an ethylene group (forming a ring with $L_5$) is particularly preferred.

Examples of a divalent linking group represented by $L_5$ may include an alkylene group, a divalent aromatic ring group. —COO-$L_1$-, —O-$L_1$-, a group formed by combining two or more of these groups, and the like. Here, $L_1$ represents an alkylene group, a cycloalkylene group, a divalent aromatic ring group, or a group formed by combining an alkylene group and a divalent aromatic ring group.

$L_5$ is preferably a single bond, a group represented by —COO-$L_1$- or a divalent aromatic ring group. $L_1$ is preferably an alkylene group having 1 to 5 carbon atoms, and more preferably a methylene group or a propylene group. As the divalent aromatic ring group, a 1,4-phenylene group, a 1,3-phenylene group, a 1,2-phenylene group, or a 1,4-naphthylene group is preferred, and a 1,4-phenylene group is more preferred.

Suitable examples of the trivalent linking group represented by L in a case where $L_5$ is bonded with $R_{52}$ to form a ring may include a group obtained by removing one arbitrary hydrogen atom from the aforementioned specific examples of divalent linking groups represented by $L_5$.

As the alkyl group of $R_{54}$ to $R_{56}$, an alkyl group having 1 to 20 carbon atoms is preferred, an alkyl group having 1 to 10 carbon atoms is more preferred, and alkyl group having 1 to 4 carbon atoms, such as a methyl group, an ethyl group, an n-propyl group, an isopropyl group, an n-butyl group, an isobutyl group, or a t-butyl group is particularly preferred.

As the cycloalkyl group represented by each of $R_{55}$ and $R_{56}$, a cycloalkyl group having 3 to 20 carbon atoms is preferred, and the cycloalkyl group may be a monocyclic group, such as a cyclopentyl group or a cyclohexyl group, or may be a polycyclic group, such as a norbonyl group, an adamantyl group, a tetracyclodecanyl group, or a tetracyclododecanyl group.

In addition, as the ring formed by $R_{55}$ and $R_{56}$ bonded to each other, a ring having 3 to 20 carbon atoms is preferred, and the ring may be a monocyclic group such as a cyclopentyl group or a cyclohexyl group, or may be a polycyclic group such as a norbonyl group, an adamantyl group, a tetracyclodecanyl group, or a tetracyclododecanyl group. When $R_{55}$ and $R_{56}$ are bonded to each other to form a ring, $R_{54}$ is preferably an alkyl group having 1 to 3 carbon atoms, and a methyl group or an ethyl group is more preferred.

As the monovalent aromatic ring group represented by $R_{55}$ and $R_{56}$, an aromatic ring group having 6 to 20 carbon atoms is preferred, and the group may be monocyclic or polycyclic, and may have a substituent. Examples thereof may include a phenyl group, a 1-naphthyl group, a 2-naphthyl group, a 4-methylphenyl group, a 4-methoxyphenyl group, and the like. When any one of $R_{55}$ and $R_{56}$ is a hydrogen atom, the other is preferably a monovalent aromatic ring group.

The aralkyl group represented by $R_{55}$ and $R_{56}$ may be monocyclic or polycyclic, and may have a substituent. Preferably, the group has 7 to 21 carbon atoms, and examples thereof may include a benzyl group, a 1-naphthylmethyl group, and the like.

As a synthesis method of a monomer corresponding to the repeating unit represented by Formula (V), a general synthesizing method of polymerizable group-containing esters may be applied, and the method is not particularly limited.

Hereinafter, specific examples of the repeating unit (a) represented by Formula (V) will be described, but the present invention is not limited thereto.

In the specific examples, Rx and $Xa_1$ represent a hydrogen atom, $CH_3$, $CF_3$, or $CH_2OH$. Each of Rxa and Rxb independently represents an alkyl group having 1 to 4 carbon atoms, an aryl group having 6 to 18 carbon atoms, or an aralkyl group having 7 to 19 carbon atoms. Z represents a substituent. p represents 0 or a positive integer, and is preferably 0 to 2, and more preferably 0 or 1. When a plurality of Z's is present, Z's may be same or different. As Z, from the viewpoint of increasing dissolution contrast in a developer containing an organic solvent before and after acid-decomposition, groups consisting of only a hydrogen atom or a carbon atom alone are suitably exemplified, and for example, a straight or branched alkyl group and cycloalkyl group are preferred.

1

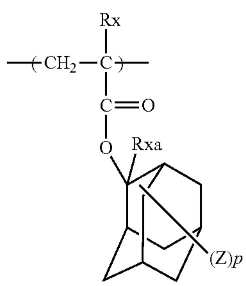

2

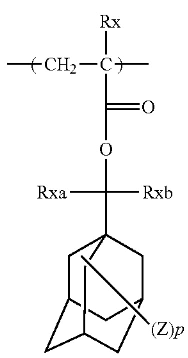

3

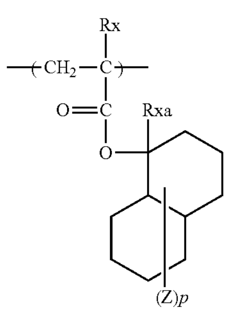

-continued

4

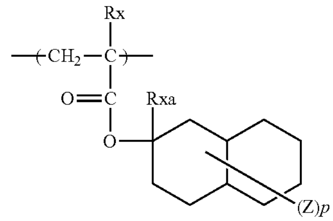

5

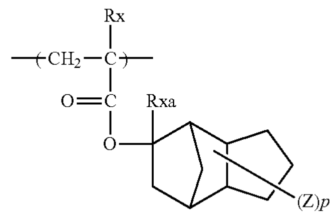

6

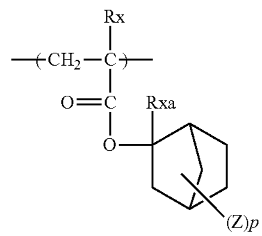

7

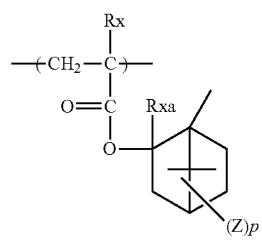

8

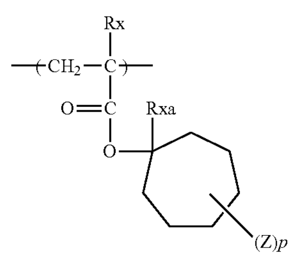

9

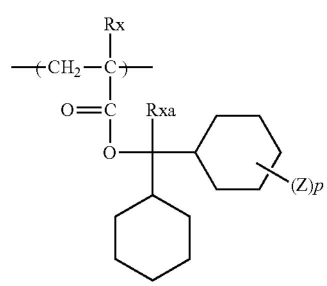

-continued
10
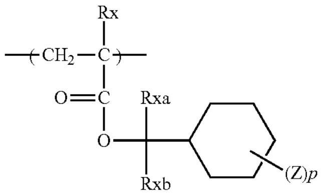
11
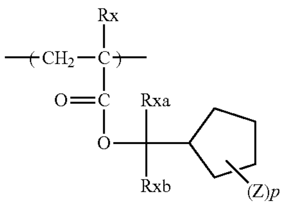
12
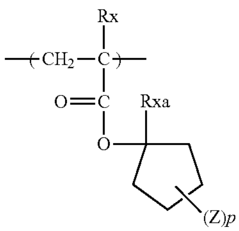
13
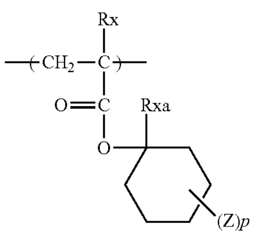
14
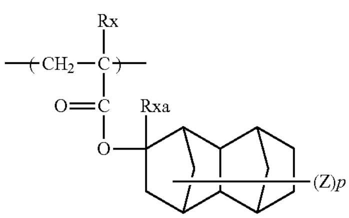
15
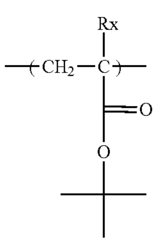
16
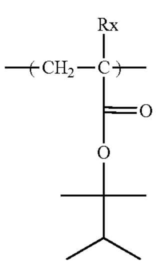
-continued
17
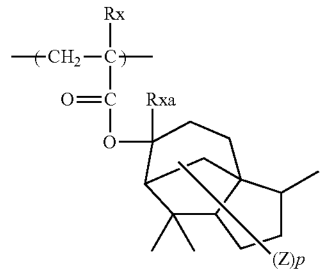
18
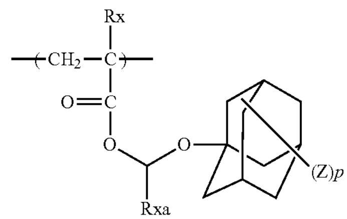
19
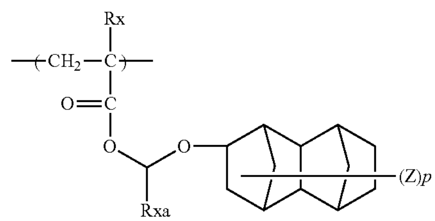
20
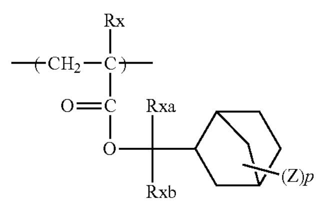
21
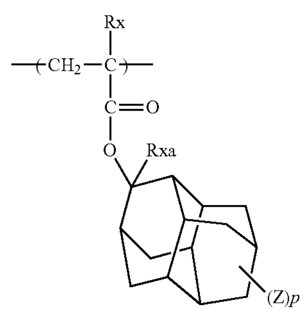
22
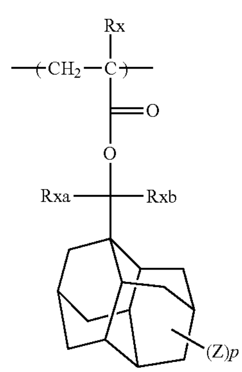

-continued
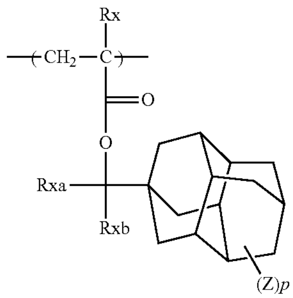
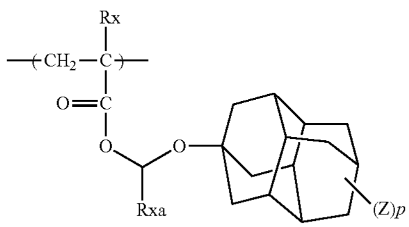
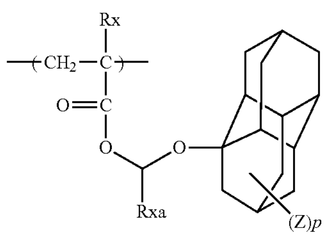
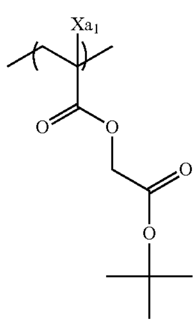
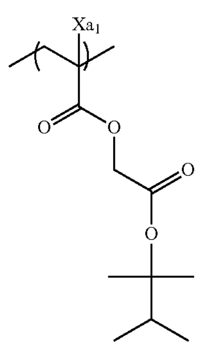
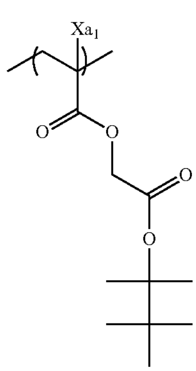
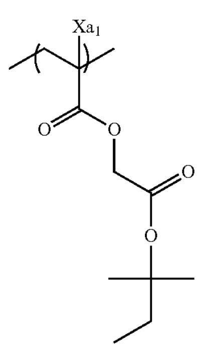
-continued
23
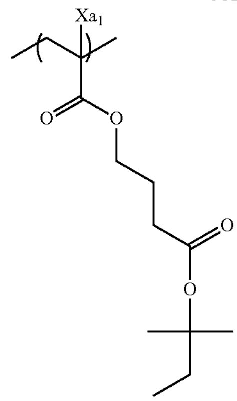
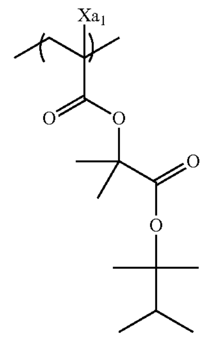
24
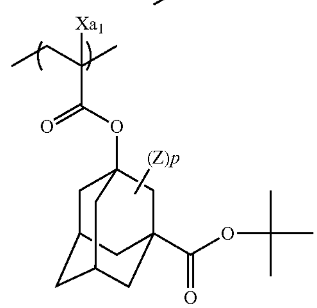
25
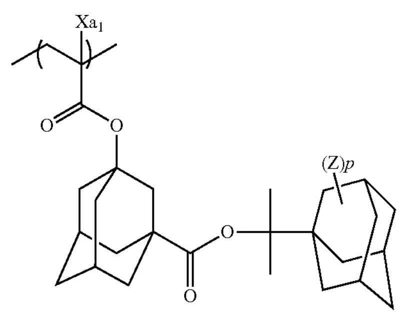
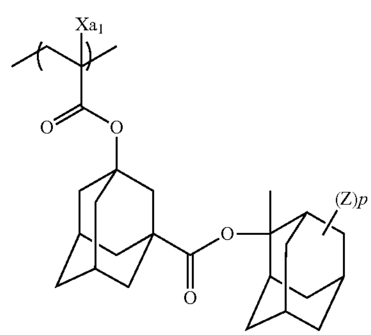
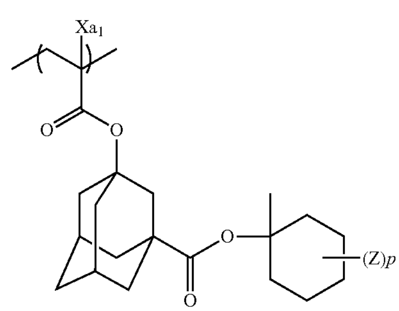

-continued
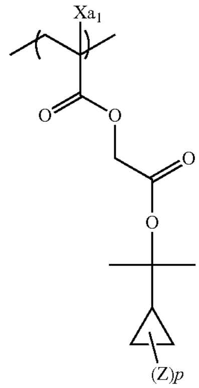
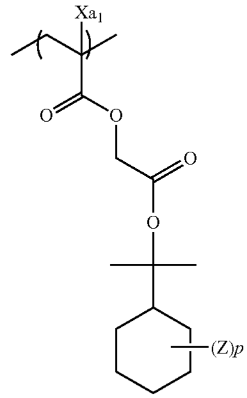
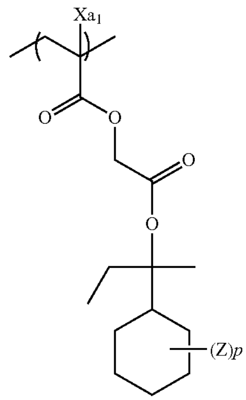
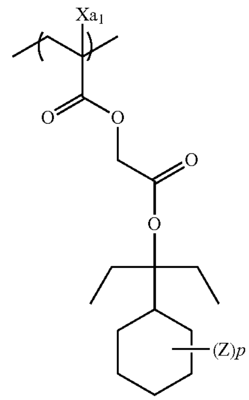
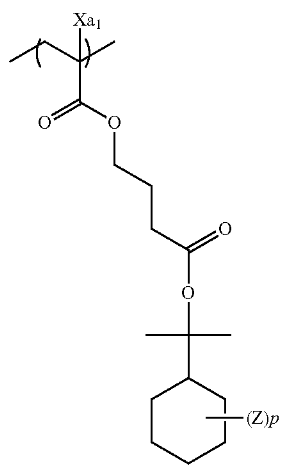
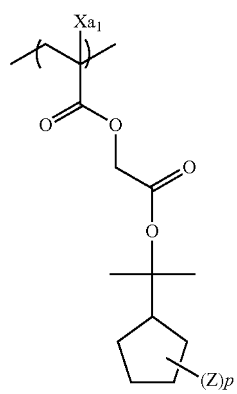
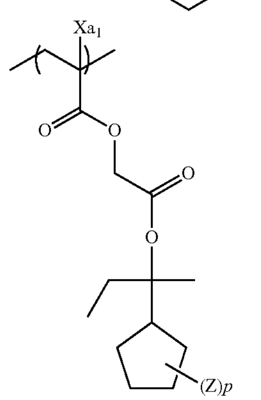
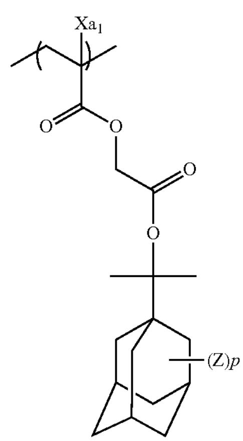
-continued
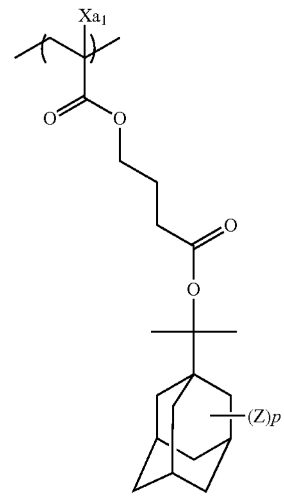
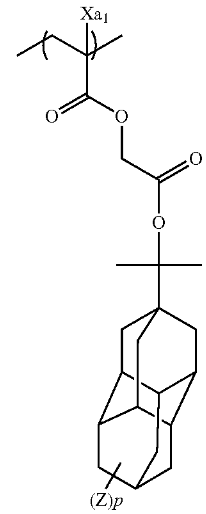
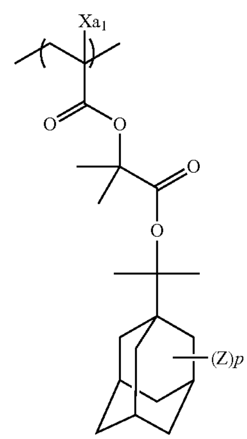
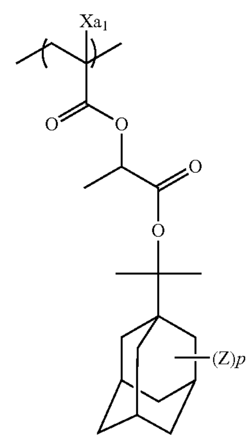
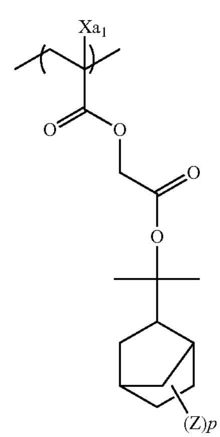
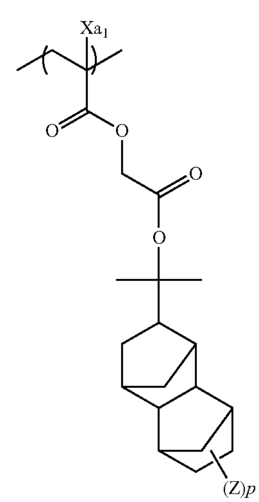

-continued
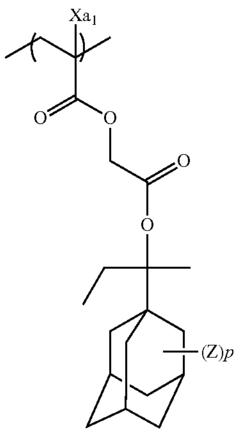
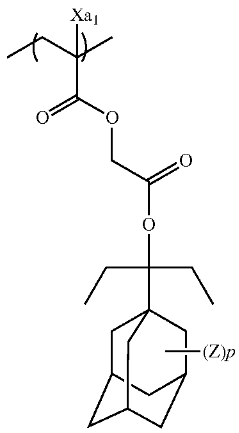
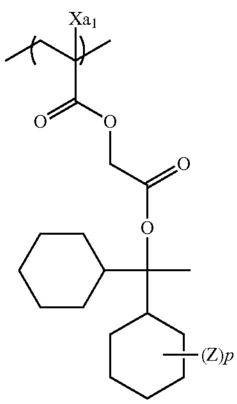
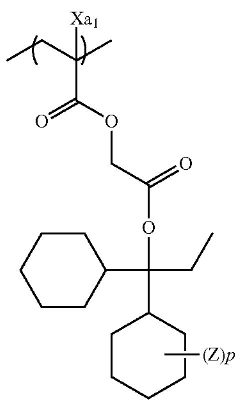
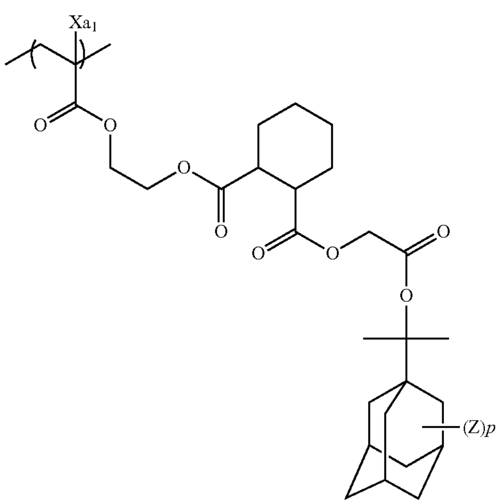
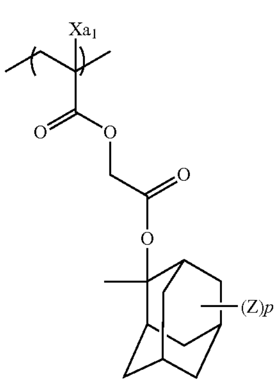
-continued
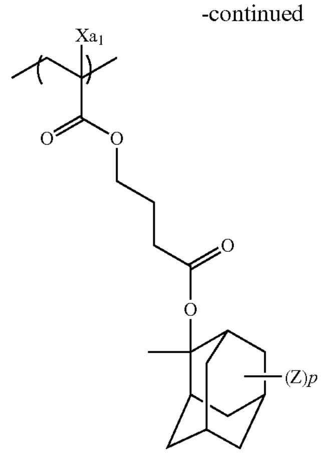
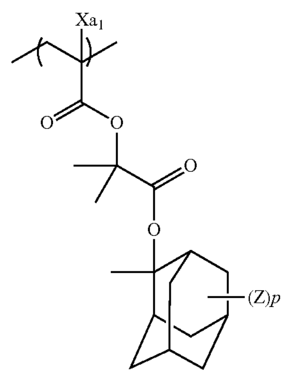
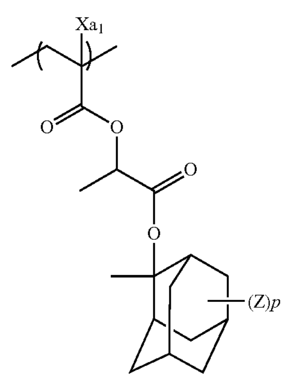
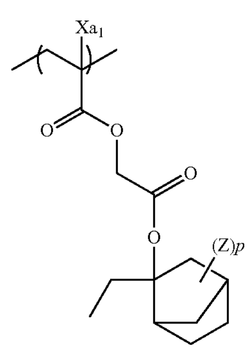

-continued
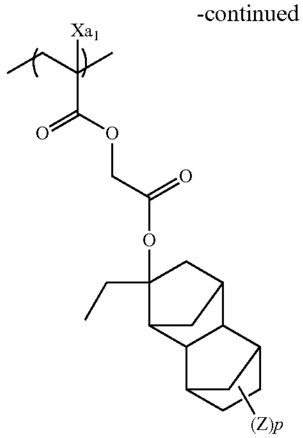
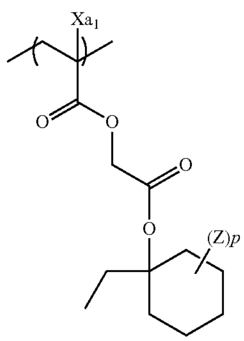
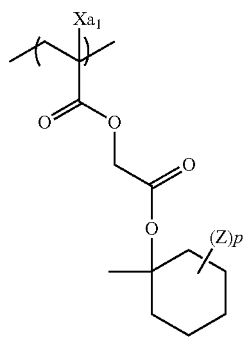
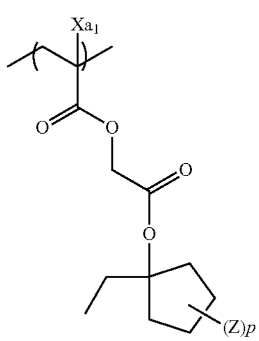
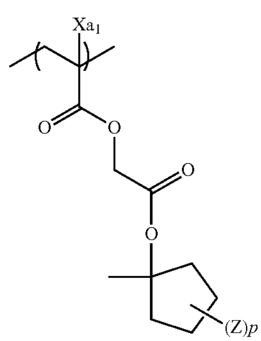
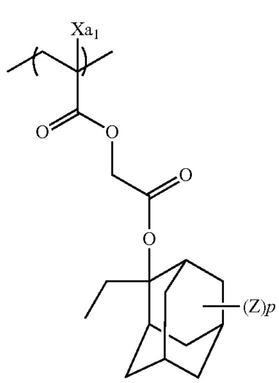
-continued
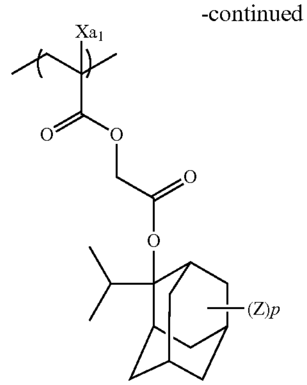
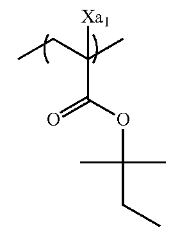
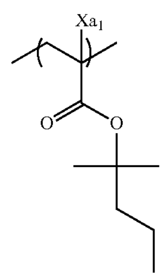
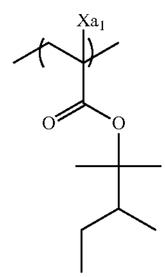
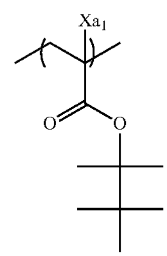
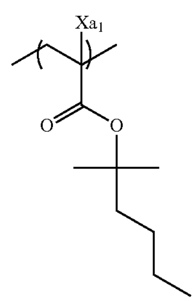
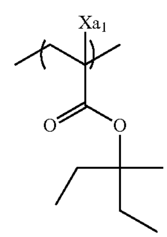
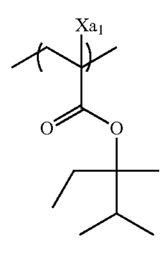
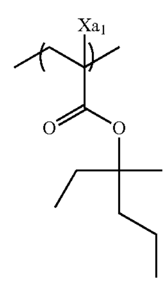
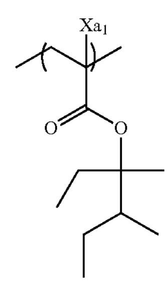
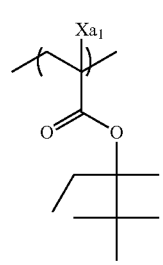
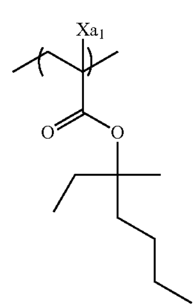

-continued
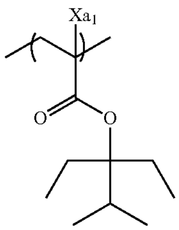
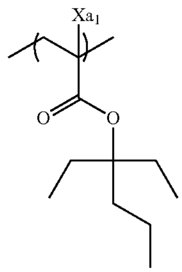
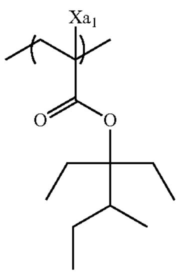
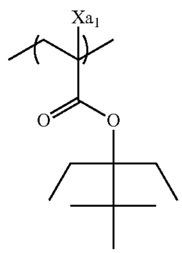
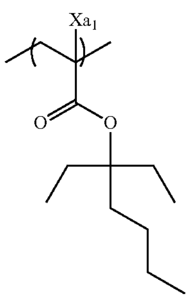
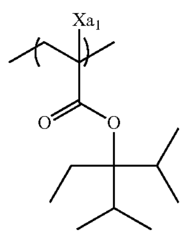
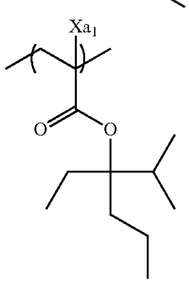
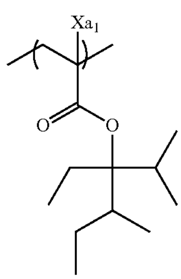
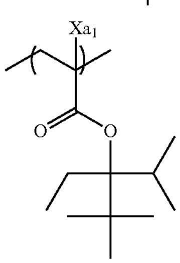
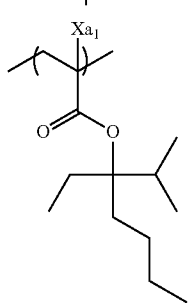
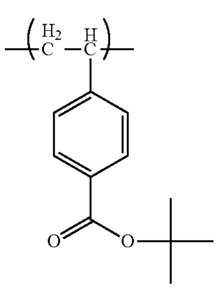
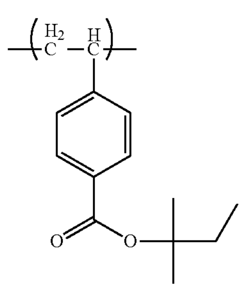
-continued
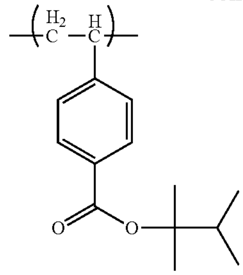
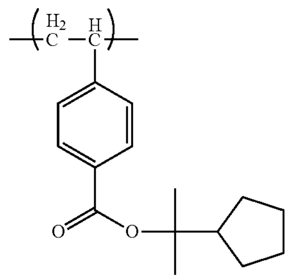
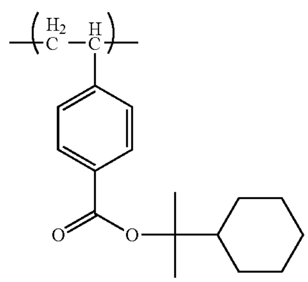
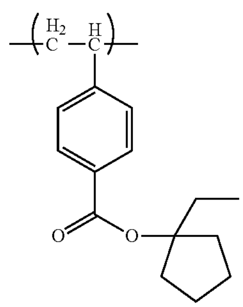
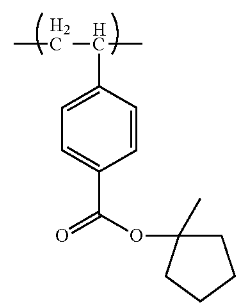
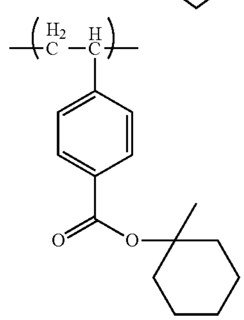
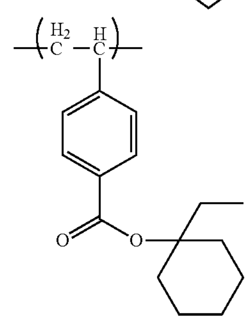
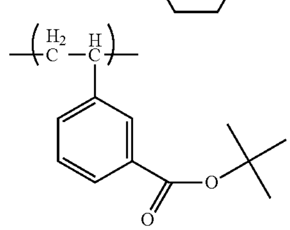

-continued
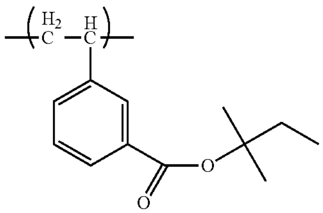
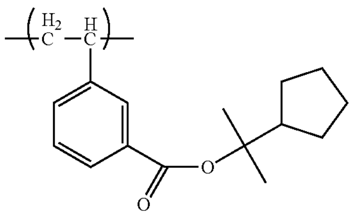
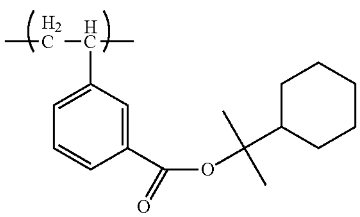
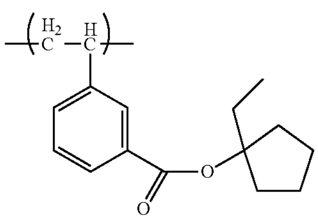
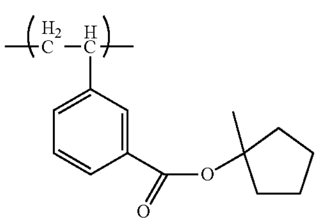
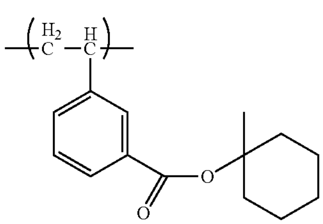
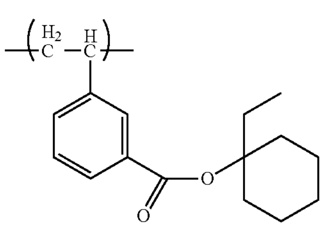
-continued
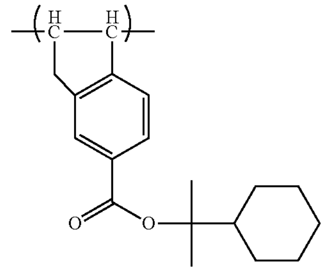
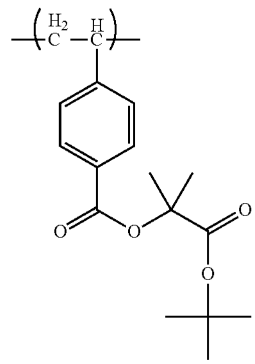
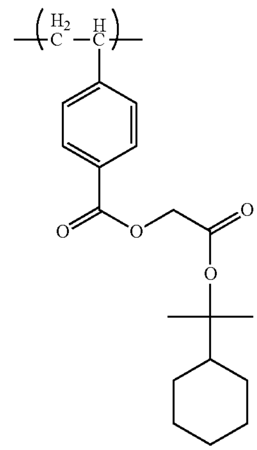
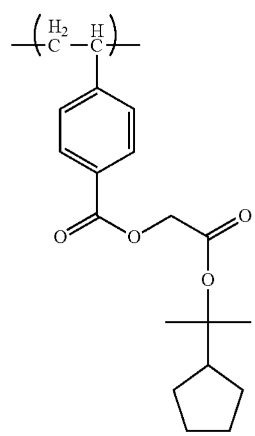
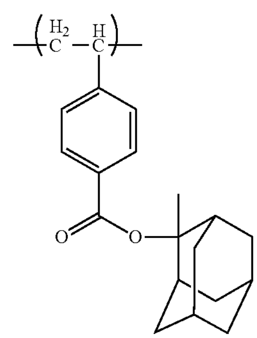
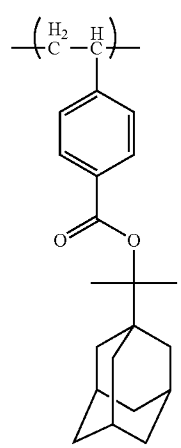
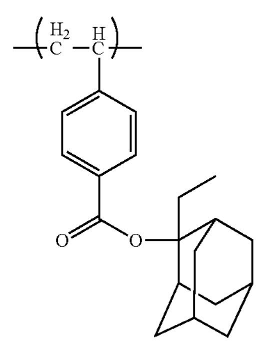

-continued
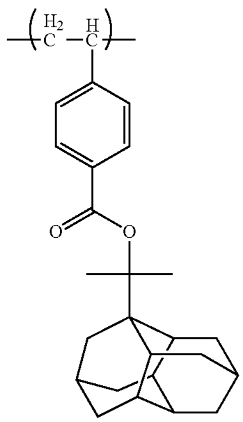
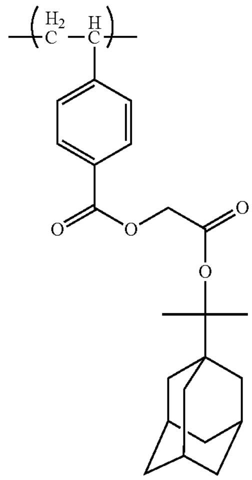
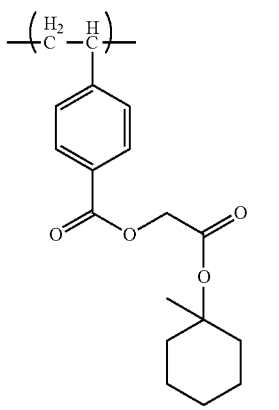
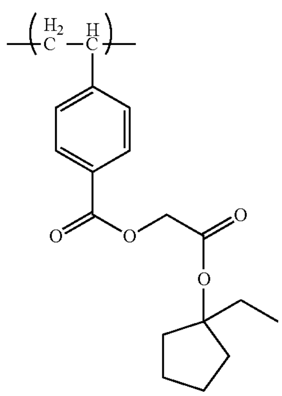
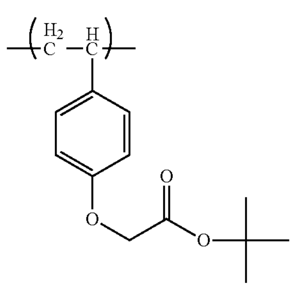
-continued
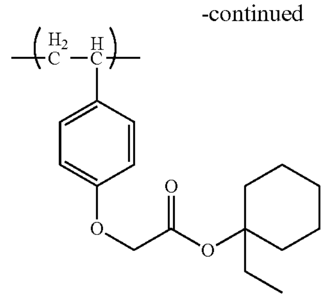
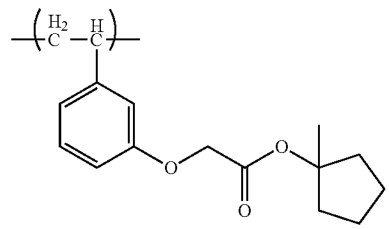
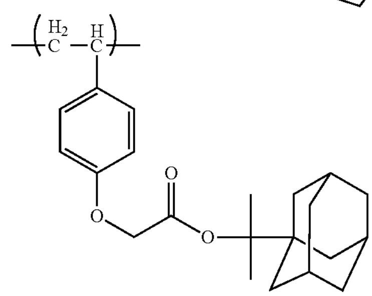
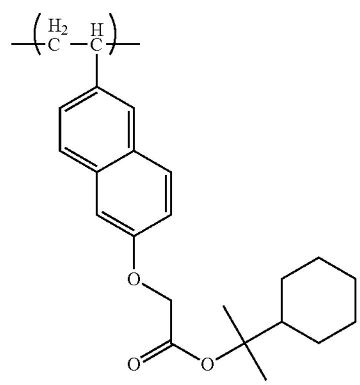
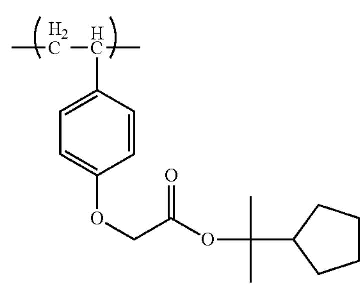
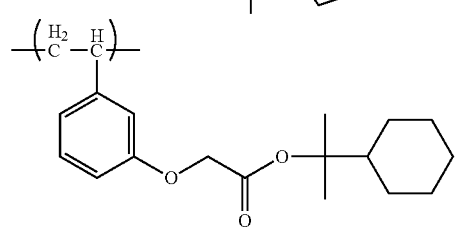

-continued

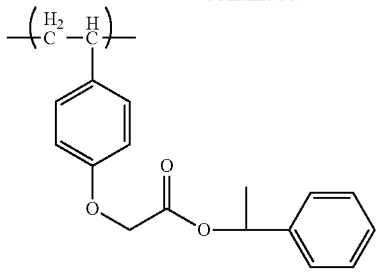

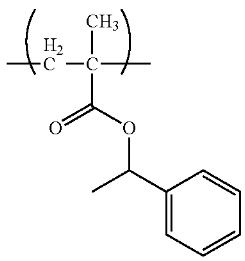

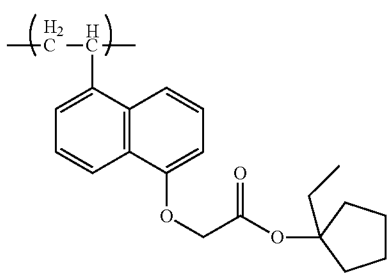

Furthermore, the resin (A) may include a repeating unit represented by the following Formula (VI) as the repeating unit (a).

(VI)

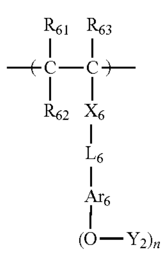

In Formula (VI),

Each of $R_{61}$, $R_{62}$ and $R_{63}$ independently represents a hydrogen atom, an alkyl group, a cycloalkyl group, a halogen atom, a cyano group or an alkoxycarbonyl group. However, $R_{62}$ may be bonded with $Ar_6$ to form a ring, and in that case, $R_{62}$ represents a single bond or an alkylene group, alkylene group.

$X_6$ represents a single bond, —COO— or —$CONR_{64}$—. $R_{64}$ represents a hydrogen atom or an alkyl group.

$L_6$ represents a single bond or an alkylene group.

$Ar_6$ represents a (n+1)-valent aromatic ring group, and in a case of being bonded with $R_{62}$ to form a ring, represents a (n+2)-valent aromatic ring group.

Each $Y_2$ independently represents a hydrogen atom or a group capable of leaving by the action of an acid, in a case of n>2. However, at least one of $Y_2$'s represents a group capable of leaving by the action of an acid.

n represents an integer of 1 to 4.

Formula (VI) will be described in more detail.

Examples of an alkyl group of $R_{61}$ to $R_{63}$ in Formula (VI) may include preferably an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which groups may have a substituent, and more preferably an alkyl group having 8 or less carbon atoms.

As an alkyl group which is included in an alkoxycarbonyl group, the groups such as an alkyl group in $R_{61}$ to $R_{63}$ are preferred.

The cycloalkyl group may be monocyclic or polycyclic, and preferred examples thereof may include a monocyclic cycloalkyl group having 3 to 8 carbon atoms, such as a cyclopropyl group, a cyclopentyl group, and a cyclohexyl group, each of which groups may have a substituent.

Examples of a halogen atom may include a fluorine atom, a chlorine atom, a bromine atom and an iodine atom, and a fluorine atom is more preferred.

When $R_{62}$ represents an alkylene group, preferred examples of the alkylene group include an alkylene group having 1 to 8 carbon atom, such as a methylene group, an ethylene group, a propylene group, a butylene group, and a hexylene group, each of which groups may have a substituent.

Examples of an alkyl group of $R_{64}$ in —$CONR_{64}$— ($R_{64}$ represents a hydrogen atom and an alkyl group) represented by $X_6$ include the groups such as an alkyl group of $R_{61}$ to $R_{63}$.

As $X_6$, a single bond, —COO—, and —CONH— are preferred, and a single bond and —COO— are more preferred.

Preferred examples of the alkylene group in $L_6$ may include an alkylene group having 1 to 8 carbon atom, such as a methylene group, an ethylene group, a propylene group, a butylene group, a hexylene group, and an octylene group, each of which groups may have a substituent. As the ring formed by combining $R_{62}$ with $L_6$, a 5- or 6-membered ring is particularly preferred.

$Ar_6$ represents a (n+1)-valent aromatic ring group. The divalent aromatic ring group in a case where n is 1 may have a substituent, and preferred examples thereof may include an arylene group having 6 to 18 carbon atoms, such as, for example, a phenylene group, a tolylene group, and a naphthylene group, or a divalent aromatic ring group including a heterocyclic ring, such as, for example, thiophene, furan, pyrrole, benzothiophenc, benzofuran, benzopyrrole, triazine, imidazole, benzimidazole, triazole, thiadiazole, and thiazole.

Specific examples of the (n+1)-valent aromatic ring group in a case where n is an integer of 2 or more may suitably include a group obtained by removing (n−1) arbitrary hydrogen atoms from the aforementioned specific examples of divalent aromatic ring groups.

The (n+1)-valent aromatic ring group may further have a substituent.

Examples of the substituent, which may be possessed by the alkyl group, the cycloalkyl group, the alkoxycarbonxyl group, the alkylene group, and the (n+1)-valent aromatic ring group described above, may include specific examples such as the above-described substituent which may be possessed by each of the groups represented by $R_{51}$ to $R_{53}$ in Formula (V).

n is preferably 1 or 2, and more preferably 1.

Each of n $Y_2$'s independently represents a hydrogen atom or a group capable of leaving by the action of an acid. However, at least one of n $Y_2$'s represents a group capable of leaving by the action of an acid.

Examples of the group $Y_2$ capable of leaving by the action of an acid may include —C($R_{36}$)($R_{37}$)($R_{38}$), —C(═O)—O—C($R_{36}$)($R_{37}$)($R_{38}$), —C($R_{01}$)($R_{02}$)($OR_{39}$), —C($R_{01}$)($R_{02}$)—C(═O)—O—C($R_{36}$)($R_{37}$)($R_{38}$), —CH($R_{36}$)(Ar), and the like.

In the formulae, each of $R_3$, to $R_{39}$ independently represents an alkyl group, a cycloalkyl group, a monovalent aromatic ring group, a group formed by combining an alkylene group and a monovalent aromatic ring group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

Ar represents a monovalent aromatic ring group.

An alkyl group of $R_{36}$ to $R_{39}$, $R_{01}$, and $R_{02}$ is preferably an alkyl group having 1 to 8 carbon atoms, and examples thereof may include a methyl group, an ethyl group, a propyl group, an n-butyl group, a sec-butyl group, a hexyl group, an octyl group, and the like.

The cycloalkyl group of $R_{36}$ to $R_{39}$, $R_{01}$, and $R_{02}$ may be monocyclic or polycyclic. As the monocyclic cycloalkyl group, a cycloalkyl group having 3 to 8 carbon atoms is preferred, and examples thereof may include a cyclopropyl group, a cyclobutyl group, a cyclopentyl group, a cyclohexyl group, a cyclooctyl group, and the like. As the polycyclic cycloalkyl group, a cycloalkyl group having 6 to 20 carbon atoms is preferred, and examples thereof may include an adamantly group, a norbornyl group, an isoboronyl group, a camphanyl group, a dicyclopentyl group, an α-pinel group, a tricyclodecanyl group, a tetracyclododecyl group, an androstanyl group, and the like. Meanwhile, a part of the carbon atoms in the cycloalkyl group may be substituted with a heteroatom such as an oxygen atom.

As the monovalent aromatic ring group of $R_{36}$ to $R_{39}$, $R_{01}$, $R_{02}$, and Ar, a monovalent aromatic ring group having 6 to 10 carbon atoms is preferred, and examples thereof may include an aryl group such as a phenyl group, a naphthyl group, and an anthryl group, and a divalent aromatic ring group including a heterocycle, such as thiophene, furan, pyrrole, benzothiophene, benzofuran, benzopyrrole, triazine, imidazole, benzimidazole, triazole, thiadiazole, and thiazole.

As the group formed by combining an alkylene group and a monovalent aromatic ring group of $R_{36}$ to $R_{39}$, $R_{01}$ and $R_{02}$, an aralkyl group having 7 to 12 carbon atoms is preferred, and examples thereof may include a benzyl group, a phenethyl group, a naphthyl methyl group, and the like.

As the alkenyl group of $R_{36}$ to $R_{39}$, $R_{01}$ and $R_{02}$, an alkenyl group having 2 to 8 carbon atoms is preferred, and examples thereof may include a vinyl group, an allyl group, a butenyl group, a cyclohexyl group, and the like.

The ring formed by $R_{36}$, and $R_{37}$ bonded to each other may be monocyclic or polycyclic. As the monocyclic ring, a cycloalkyl structure having 3 to 8 carbon atoms is preferred, and examples thereof may include a cyclopropane structure, a cyclobutane structure, a cyclopentane structure, a cyclohexane structure, a cycloheptane structure, a cyclooctane structure, and the like. As the polycyclic ring, a cycloalkyl structure having 6 to 20 carbon atoms is preferred, and examples thereof may include an adamantane structure, a norbornane structure, a dicyclopentane structure, a tricyclodecane structure, a tetracyclododecane structure, and the like. Meanwhile, a part of the carbon atoms in the cycloalkyl structure may be substituted with a heteroatom such as an oxygen atom.

Each of the groups as $R_{36}$ to $R_{39}$, $R_{01}$, $R_{02}$ and Ar may have a substituent, and examples of the substituent may include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group, and the like, and the number of carbon atoms of the substituent is preferably 8 or less.

As the group $Y_2$ capable of leaving by the action of an acid, a structure represented by the following Formula (VI-A) is more preferred.

(VI-A)

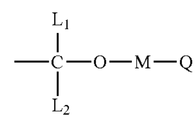

Here, each of $L_1$ and $L_2$ independently represents a hydrogen atom, an alkyl group, a cycloalkyl group, a monovalent aromatic ring group, or a group formed by combining an alkylene group and a monovalent aromatic ring group.

M represents a single bond or a divalent linking group.

Q represents an alkyl group, a cycloalkyl group which may include a heteroatom, a monovalent aromatic ring group which may include a heteroatom, an amino group, an ammonium group, a mercapto group, a cyano group or an aldehyde group.

At least two of Q, M and $L_1$ may be bonded to form a ring (preferably a 5- or 6-membered ring).

The alkyl group as $L_1$ and $L_2$ is, for example, an alkyl group having 1 to 8 carbon atoms, and specifically, preferred examples thereof may include a methyl group, an ethyl group, a propyl group, an n-butyl group, a sec-butyl group, a hexyl group and an octyl group.

The cycloalkyl group as $L_1$ and $L_2$ is, for example, a cycloalkyl group having 3 to 15 carbon atoms, and specifically, preferred examples thereof may include a cyclopentyl group, a cyclohexyl group, a norbornyl group, an adamantyl group, and the like.

The monovalent aromatic ring group as $L_1$ and $L_2$ is, for example, an aryl group having 6 to 15 carbon atoms, and specifically, preferred examples thereof may include a phenyl group, a tolyl group, a naphthyl group, an anthryl group, and the like.

The group formed by combining an alkylene group and a monovalent aromatic ring group as $L_1$ and $L_2$ is, for example, a group having 6 to 20 carbon atoms, and examples thereof may include an aralkyl group, such as a benzyl group and a phenethyl group.

Examples of the divalent linking group as M may include an alkylene group (for example, a methylene group, an ethylene group, a propylene group, a butylene group, a hexylene group, an octylene group, and the like), a cycloalkylene group (for example, a cyclopentylene group, a cyclohexylene, an adamantylene group, and the like), an alkenylene group (for example, an ethenylene group, a propenylene group, a butenylene group, and the like), a divalent aromatic ring group (for example, a phenylene group, a tolylene group, a naphthylene group, and the like), —S—, —O—, —CO—, —$SO_2$—, —N($R_0$)—, and a divalent linking group formed by combining a plurality of these groups. $R_0$ is a hydrogen atom or an alkyl group (for example, an alkyl group having 1 to 8 carbon atoms, and specifically, a methyl group, an ethyl group, a propyl group, an n-butyl group, a sec-butyl group, a hexyl group, an octyl group, and the like).

The alkyl group as Q is the same as each of the groups as $L_1$ and $L_2$ as described above.

Examples of the aromatic hydrocarbon ring group which does not include a heteroatom, and the monovalent aromatic ring group which does not include a heteroatom, in the cycloalkyl group which may contain a heteroatom, and the monovalent aromatic ring group which may include a heteroatom, as Q, may include a cycloalkyl group, a monovalent aromatic ring group, and the like as $L_1$ and $L_2$ as described above, and the carbon number thereof is preferably 3 to 15.

Examples of the cycloalkyl group including a heteroatom and the monovalent aromatic ring group including a heteroatom may include a group having a heterocyclic structure, such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the heterocyclic structure is not limited thereto as long as the heterocyclic structure is a structure generally called a heterocycle (a ring formed of carbon and a heteroatom, or a ring formed of a heteroatom).

The ring which may be formed by combining at least two of Q, M and $L_1$ includes a case where at least two of Q, M and $L_1$ combine to form, for example, a propylene group or a butylene group, thereby forming a 5- or 6-membered ring containing an oxygen atom.

Each of the groups represented by $L_1$, $L_2$, M and Q in Formula (VI-A) may have a substituent, examples of the substituent include those descried above as the substituent which may be possessed by $R_{36}$ to $R_{39}$, $R_{01}$, $R_{02}$, and Ar, and the number of carbon atoms of the substituent is preferably 8 or less.

The group represented by -M-Q is preferably a group composed of 1 to 30 carbon atoms, and more preferably a group composed of 5 to 20 carbon atoms.

Hereinafter, specific examples of the repeating unit represented by Formula (VI) as a preferred specific example of the repeating unit (a) will be described, but the present invention is not limited thereto.

(VI-1)

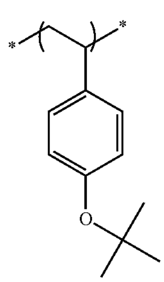

-continued (VI-2)

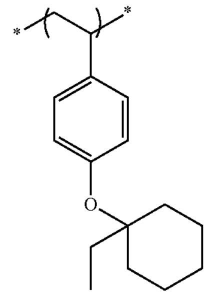

(VI-3)

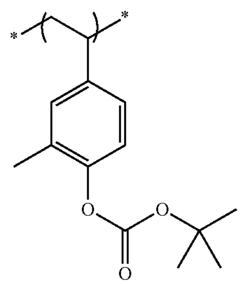

(VI-4)

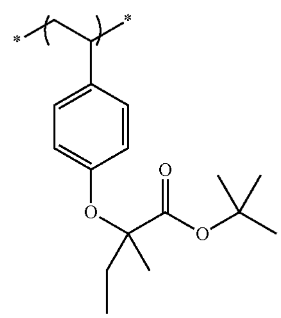

(VI-5)

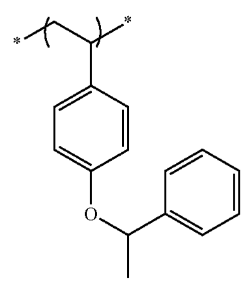

(VI-6)

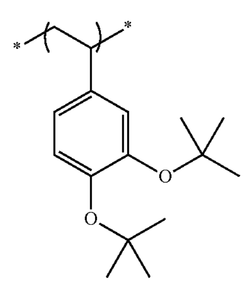

-continued
(VI-7)
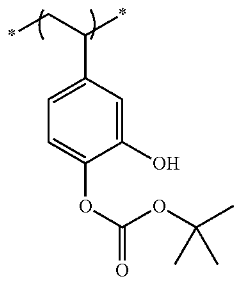
(VI-8)
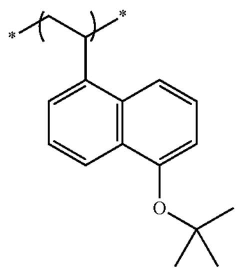
(VI-9)
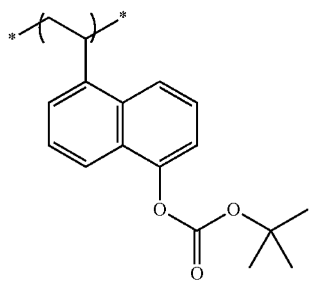
(VI-10)
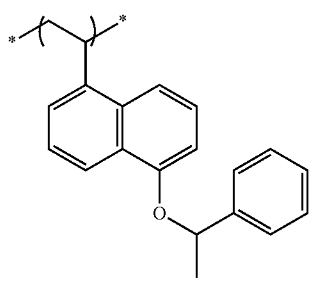
(VI-11)
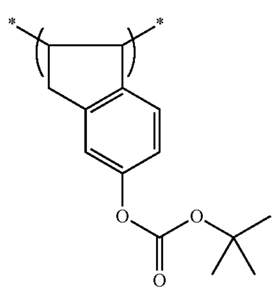
-continued
(VI-12)
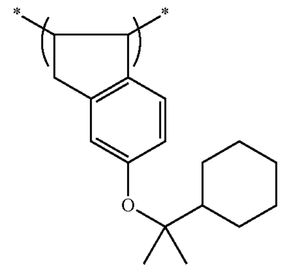
(VI-13)
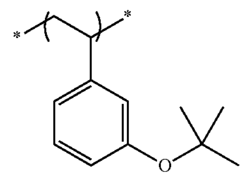
(VI-14)
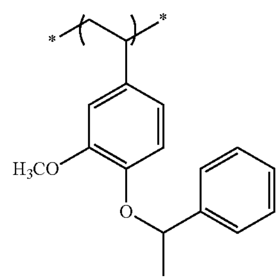
(VI-15)
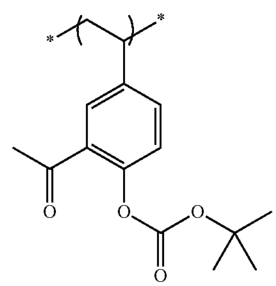
(VI-16)
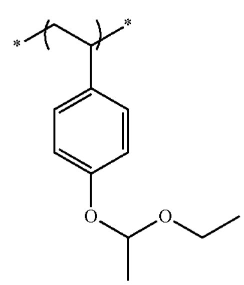
(VI-17)
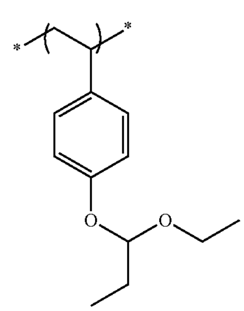

-continued
(VI-18)
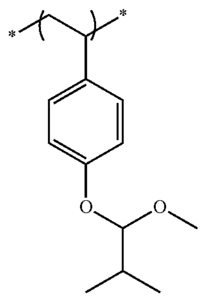
(VI-19)
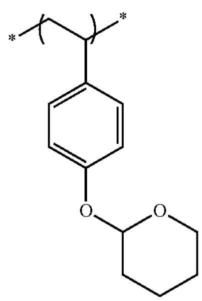
(VI-20)
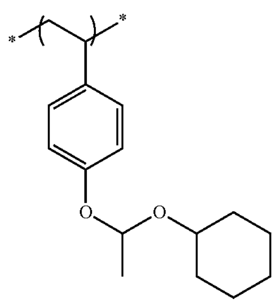
(VI-21)
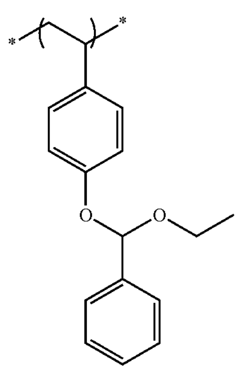
(VI-22)
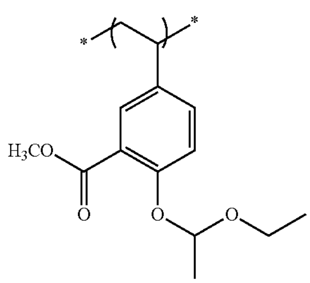
-continued
(VI-23)
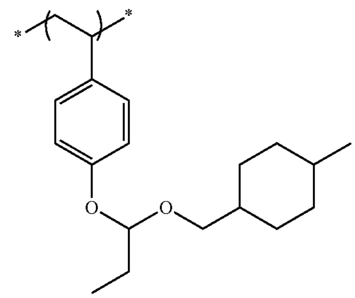
(VI-24)
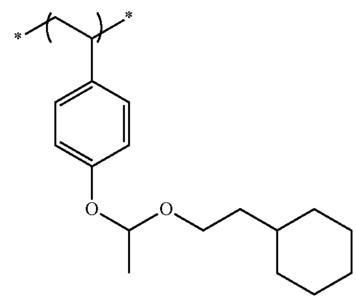
(VI-25)
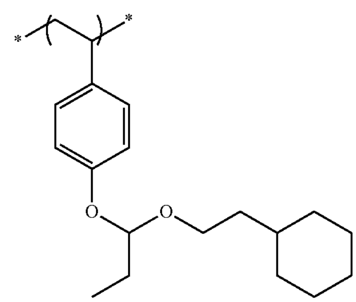
(VI-26)
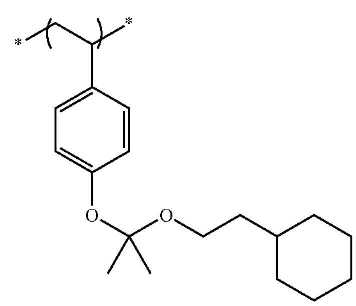
(VI-27)
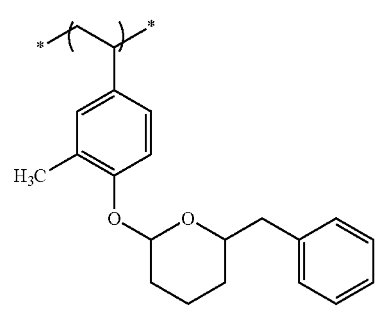

-continued
(VI-28)
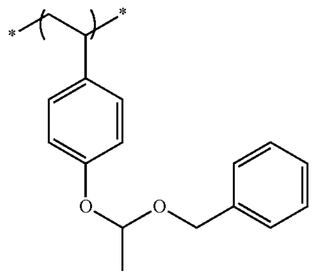
(VI-29)
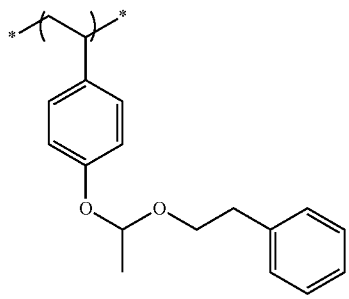
(VI-30)
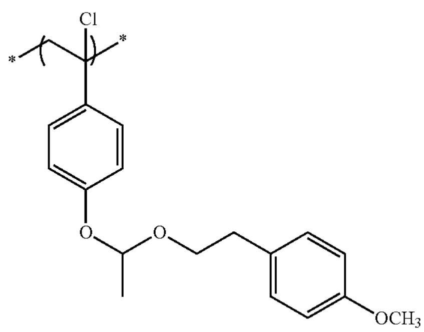
(VI-31)
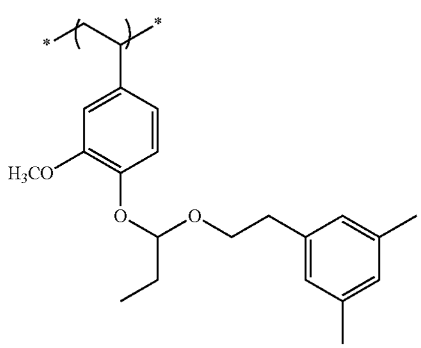
(VI-32)
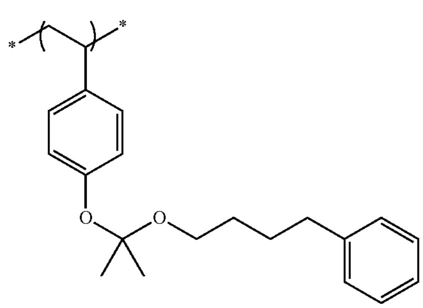
-continued
(VI-33)
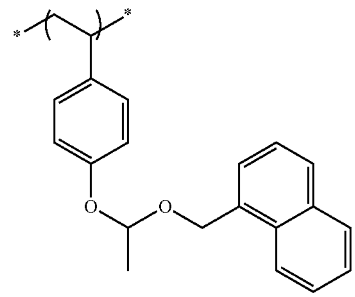
(VI-34)
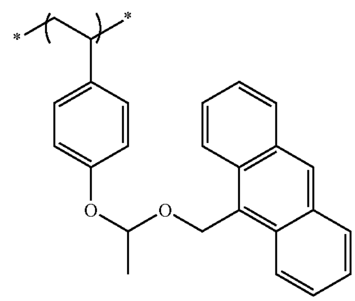
(VI-35)
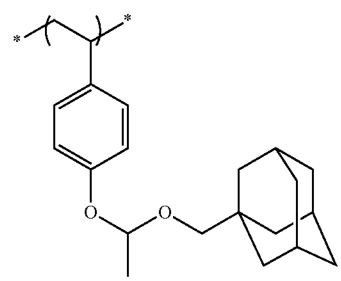
(VI-36)
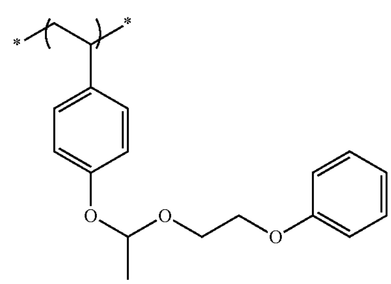
(VI-37)
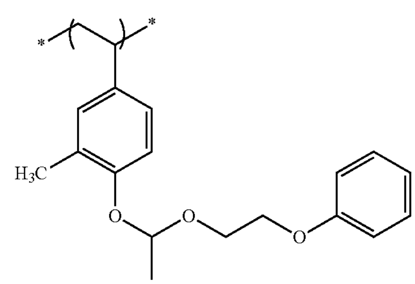

-continued
(VI-38)
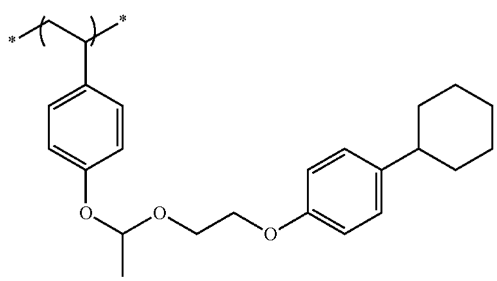
(VI-39)
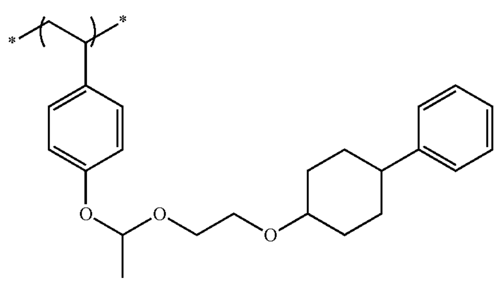
(VI-40)
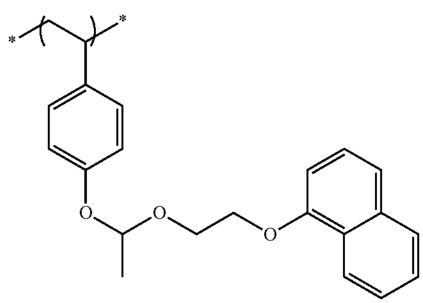
(VI-41)
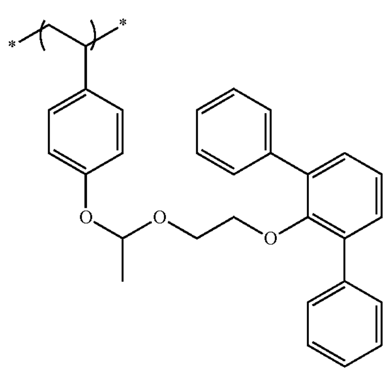
(VI-42)
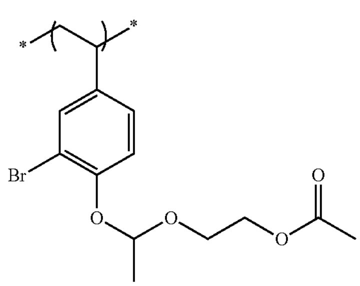
-continued
(VI-43)
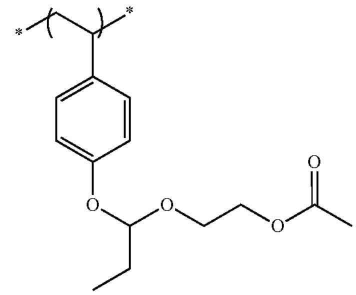
(VI-44)
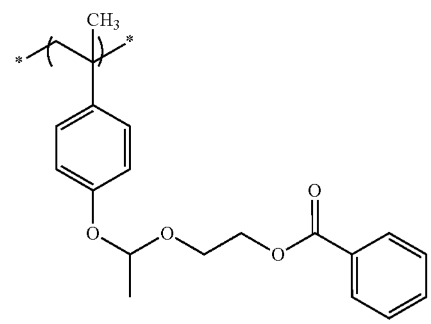
(VI-45)
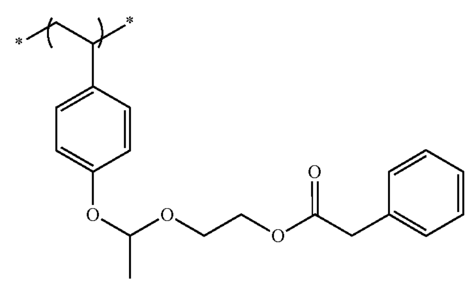
(VI-46)
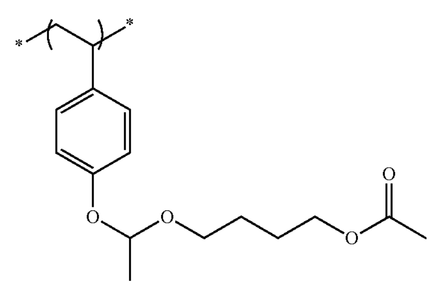
(VI-47)
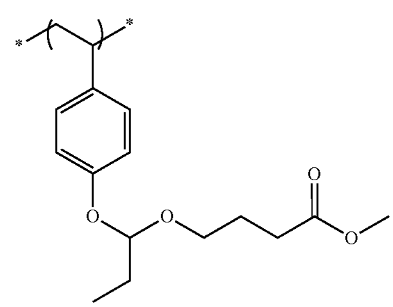

-continued
(VI-48)
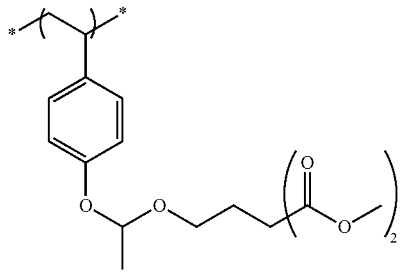
(VI-49)
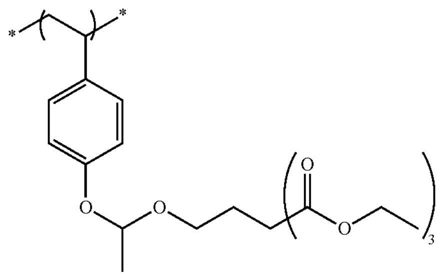
(VI-50)
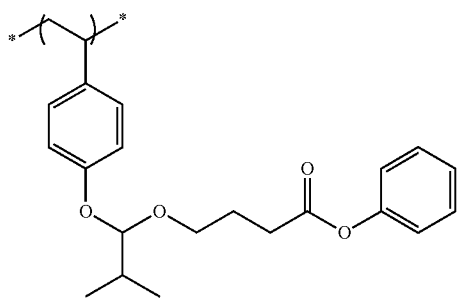
(VI-51)
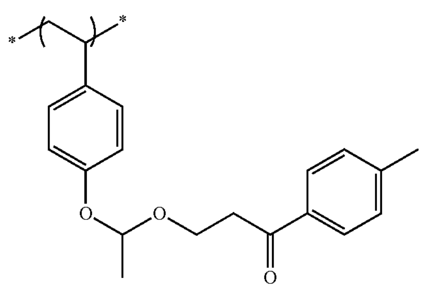
(VI-52)
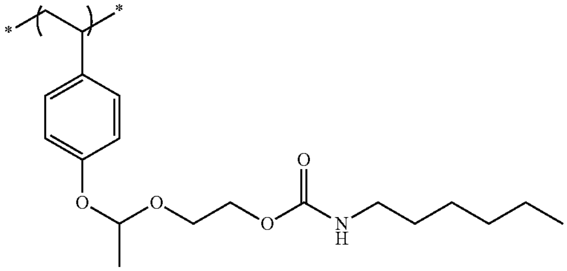
-continued
(VI-53)
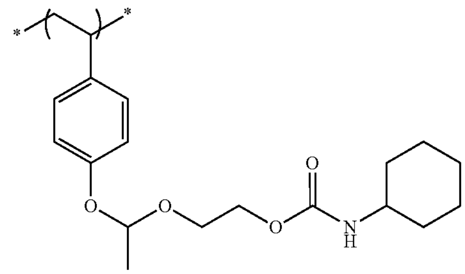
(VI-54)
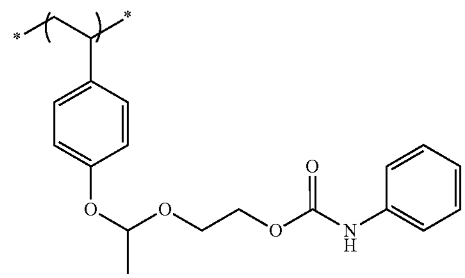
(VI-55)
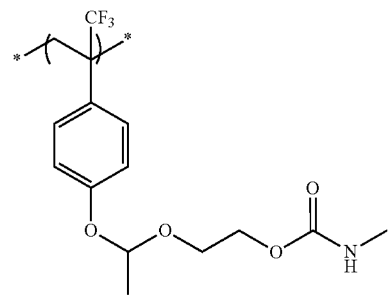
(VI-56)
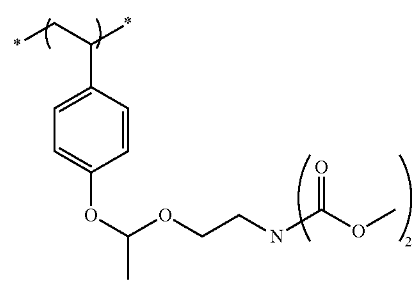
(VI-57)
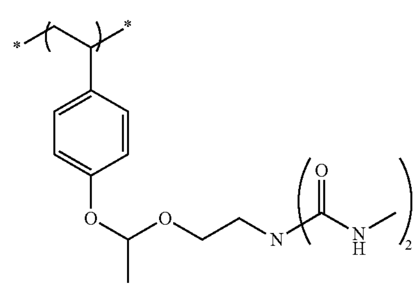

-continued
(VI-58)
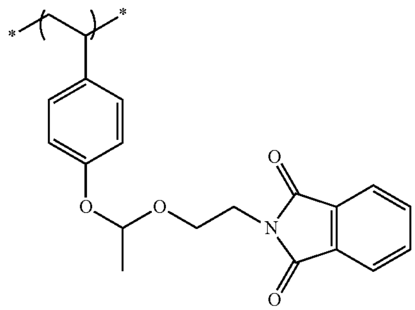
(VI-59)
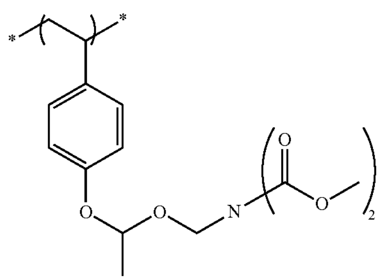
(VI-60)
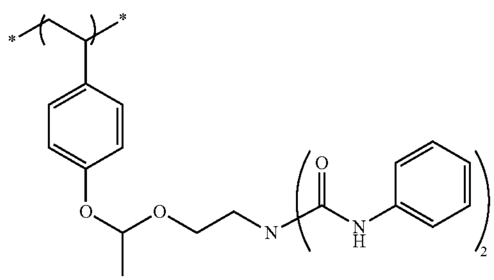
(VI-61)
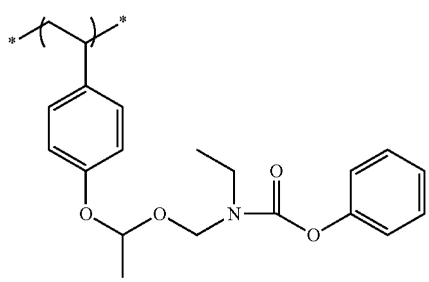
(VI-62)
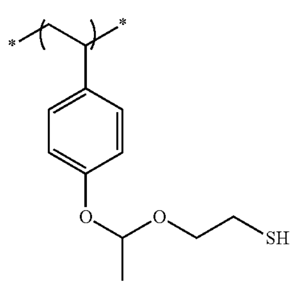
-continued
(VI-63)
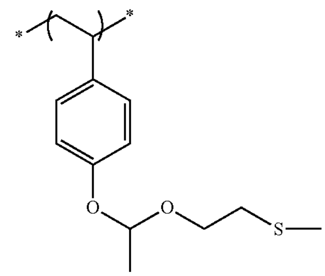
(VI-64)
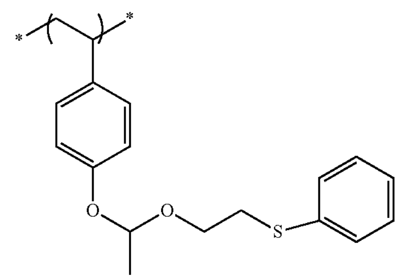
(VI-65)
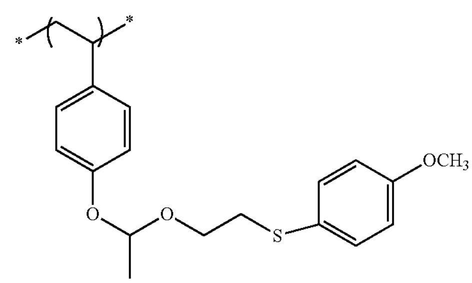
(VI-66)
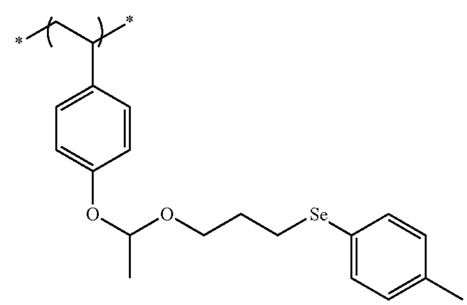
(VI-67)
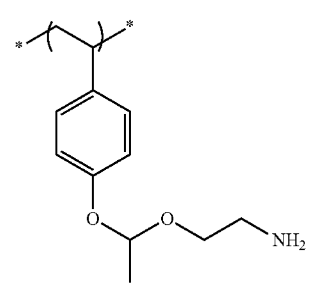

(VI-68)
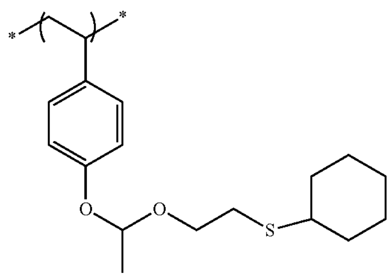
(VI-69)
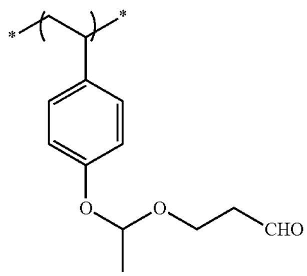
(VI-70)
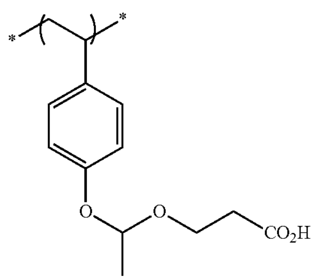
(VI-71)
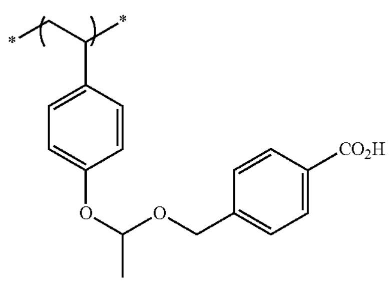
(VI-72)
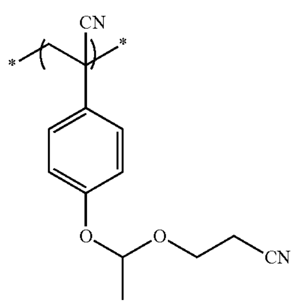
(VI-73)
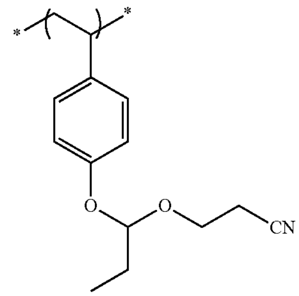
(VI-74)
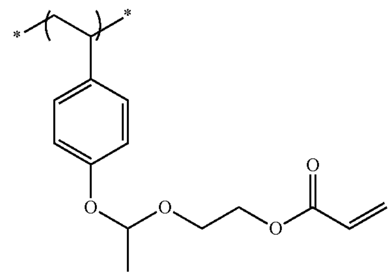
(VI-75)
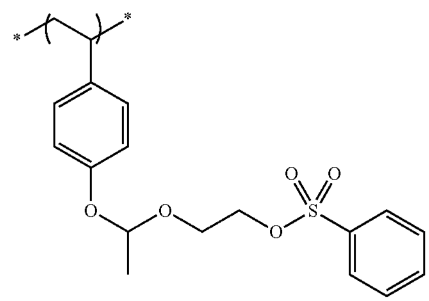
(VI-76)
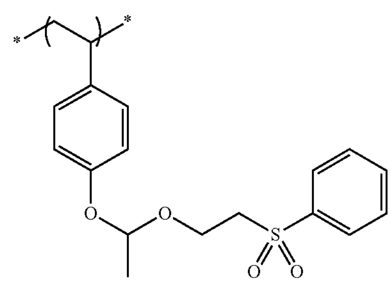
(VI-77)
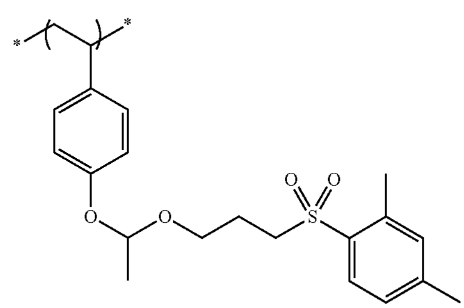

(VI-78)
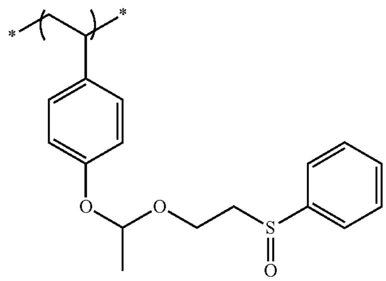
(VI-79)
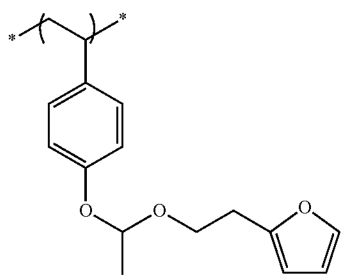
(VI-80)
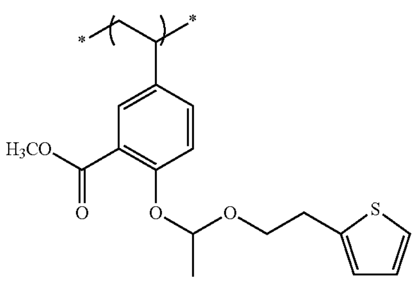
(VI-81)
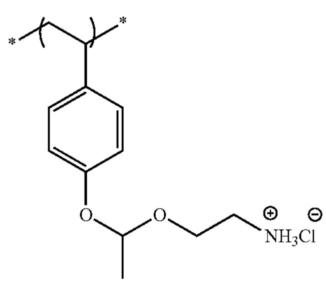
(VI-82)
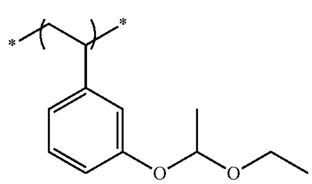
(VI-83)
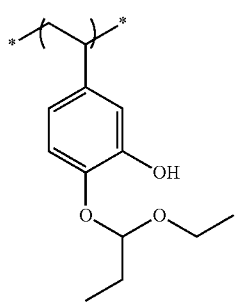
(VI-84)
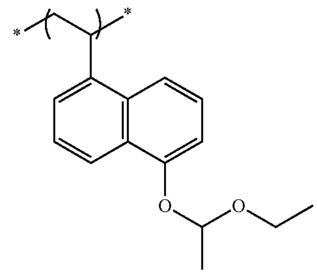
(VI-85)
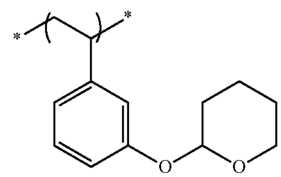
(VI-86)
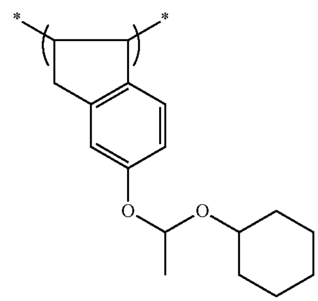
(VI-87)
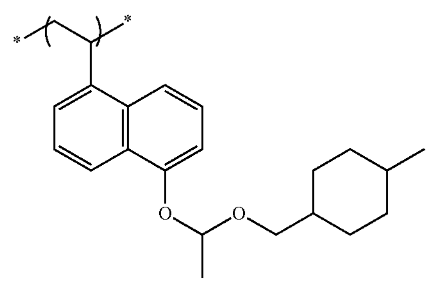
(VI-88)
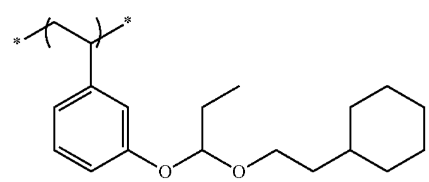
(VI-89)
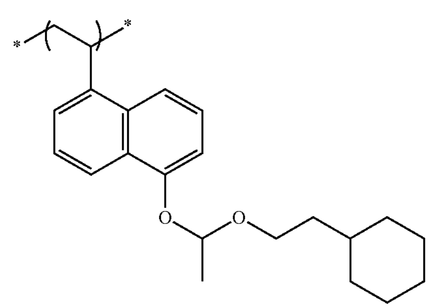

-continued
(VI-90)
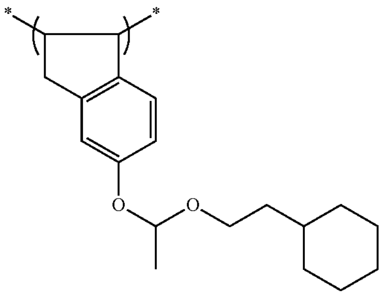
(VI-91)
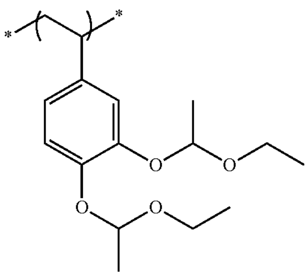
(VI-92)
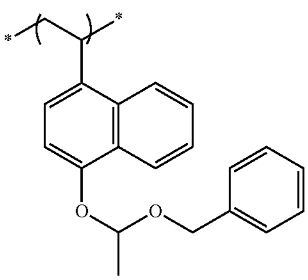
(VI-93)
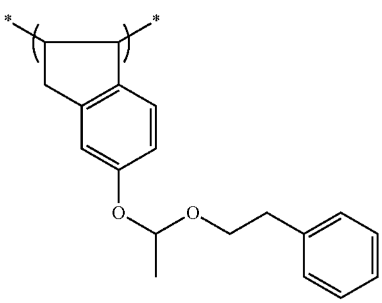
(VI-94)
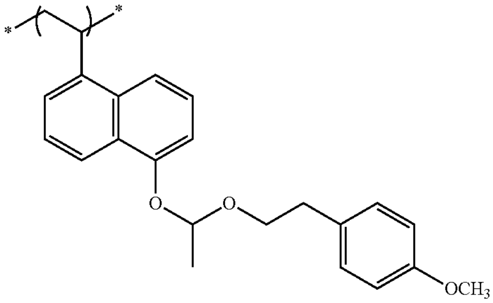
-continued
(VI-95)
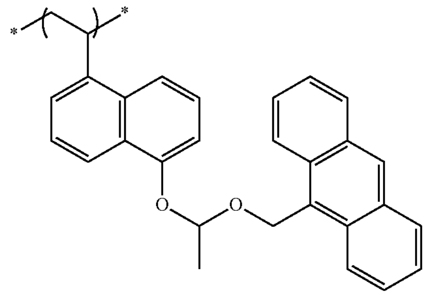
(VI-96)
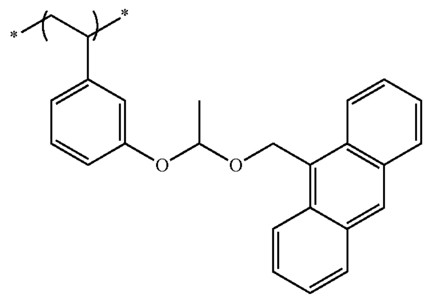
(VI-97)
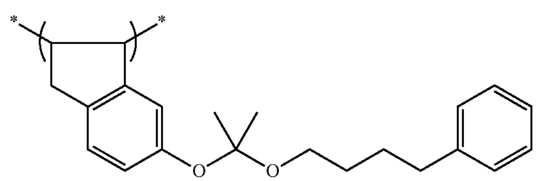
(VI-98)
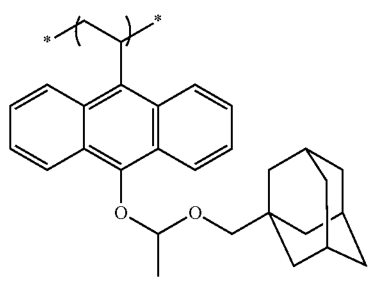
(VI-99)
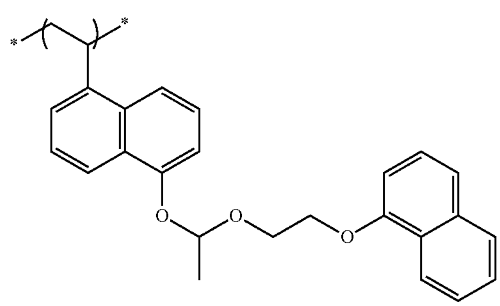

-continued
(VI-100)
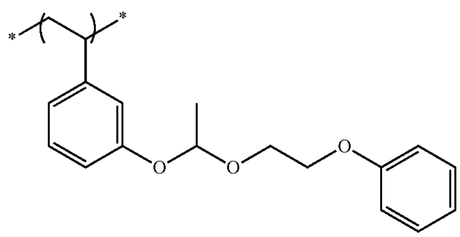
(VI-101)
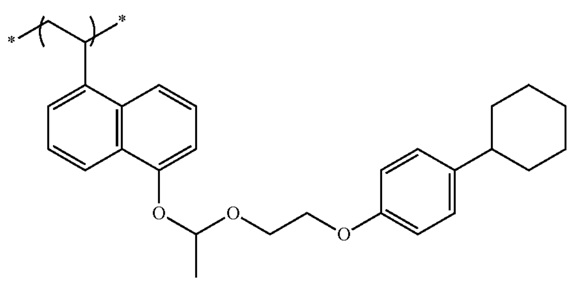
(VI-102)
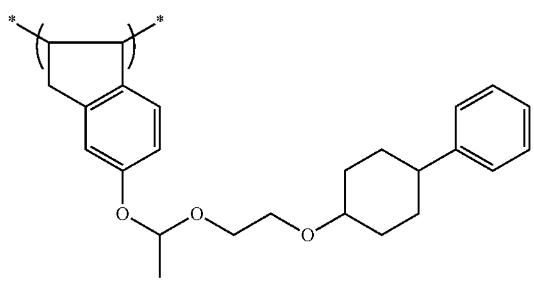
(VI-103)
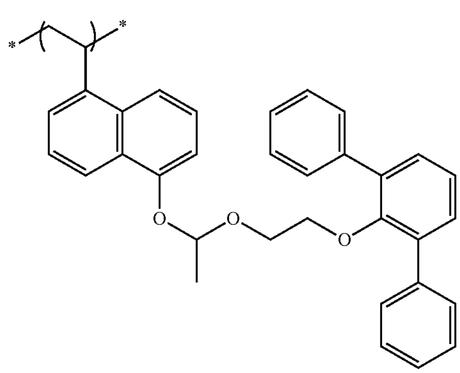
(VI-104)
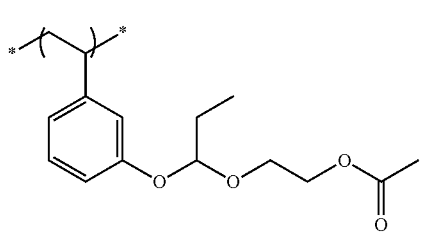
-continued
(VI-105)
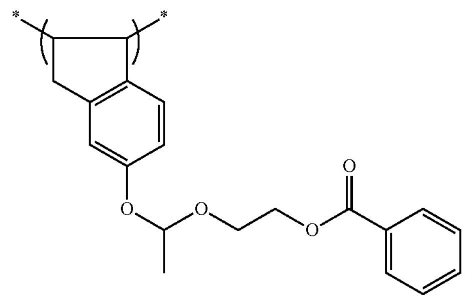
(VI-106)
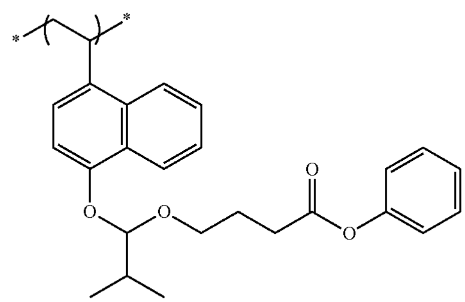
(VI-107)
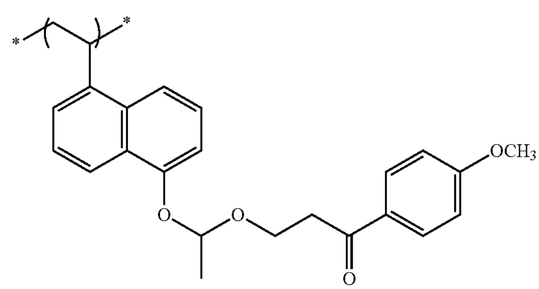
(VI-108)
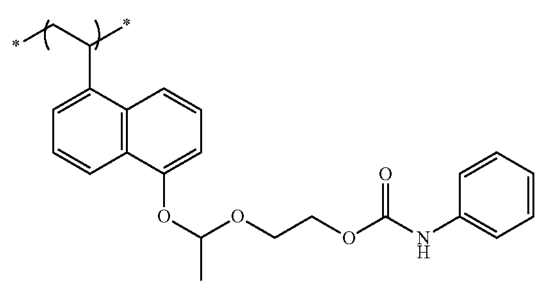
(VI-109)
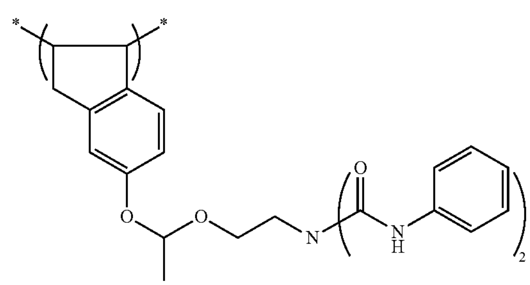

-continued
(VI-110)
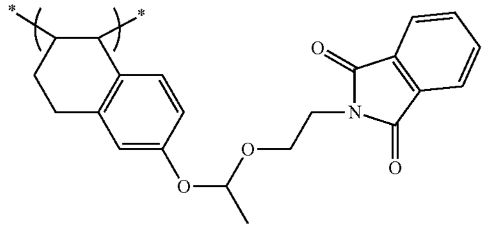
(VI-111)
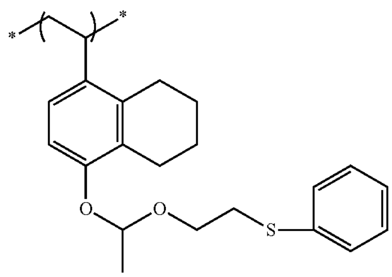
(VI-112)
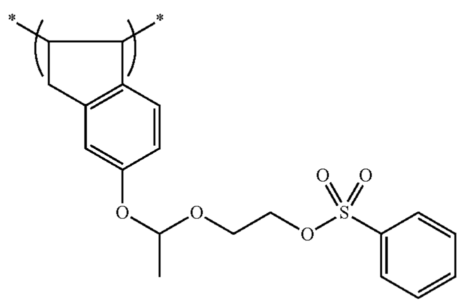
(VI-113)
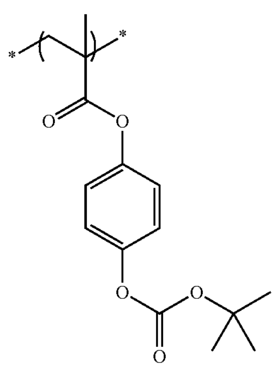
(VI-114)
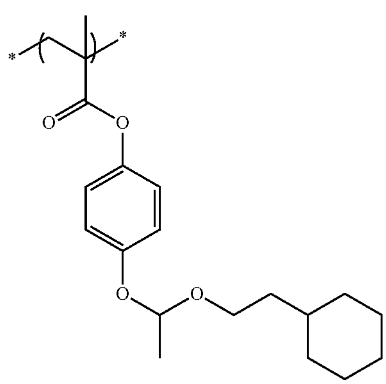
-continued
(VI-115)
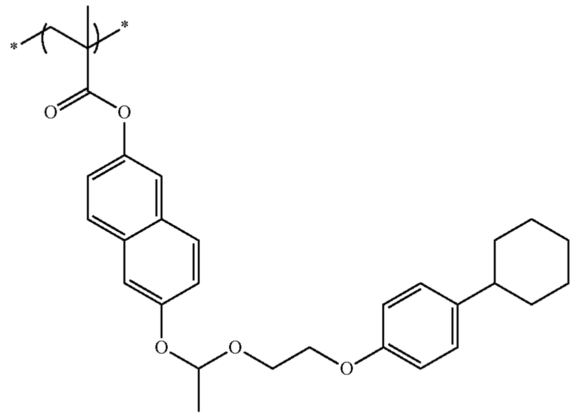
(VI-116)
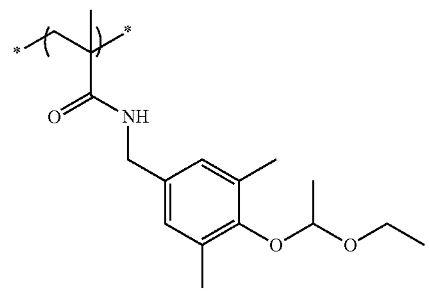
(VI-117)
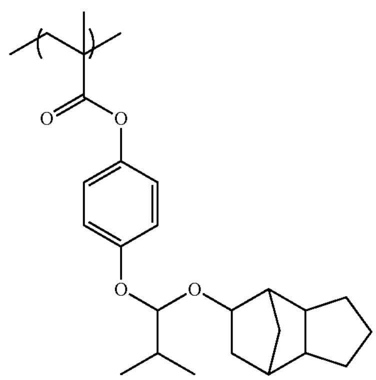
(VI-118)
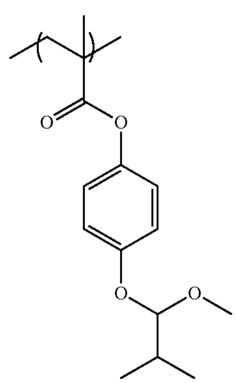

-continued
(VI-119)
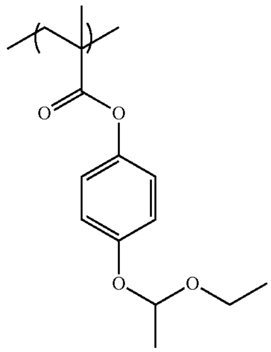
(VI-120)
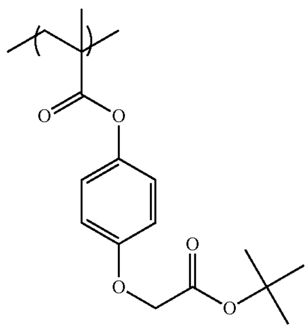
(VI-121)
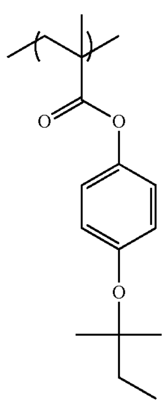
(VI-122)
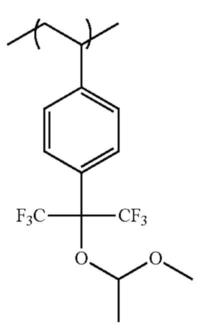
-continued
(VI-123)
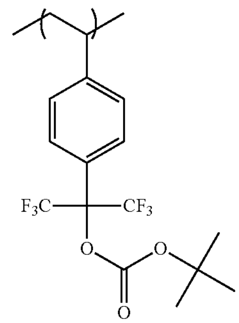
(VI-124)
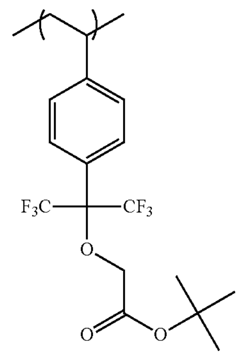
(VI-125)
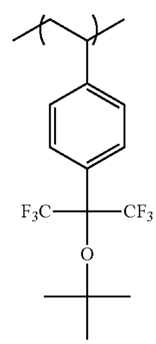
(VI-126)
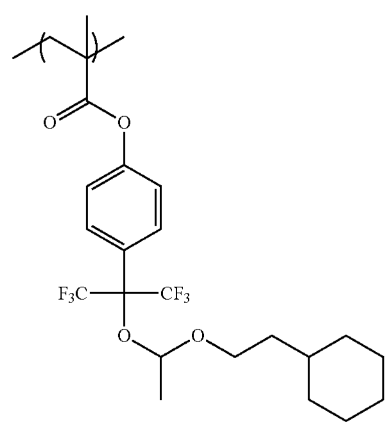

-continued
(VI-127)
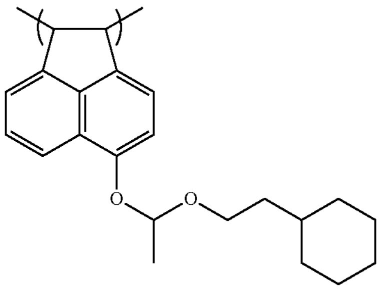
(VI-128)
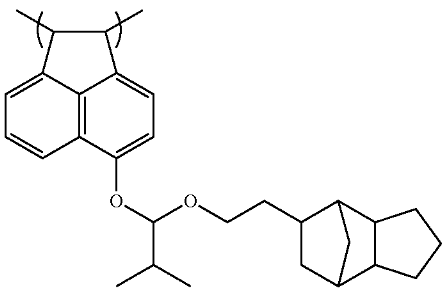
(VI-129)
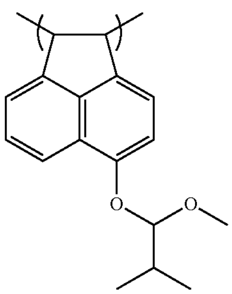
(VI-130)
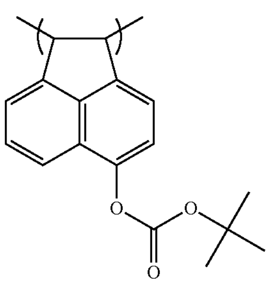
(VI-131)
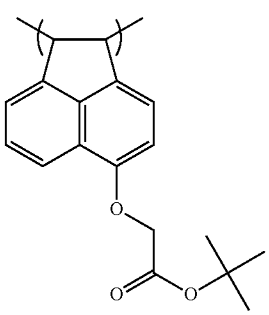
-continued
(VI-132)
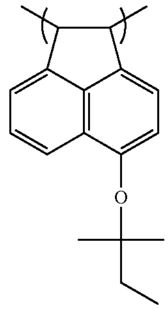
(VI-133)
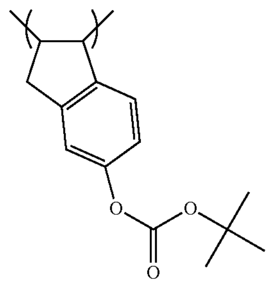
(VI-134)
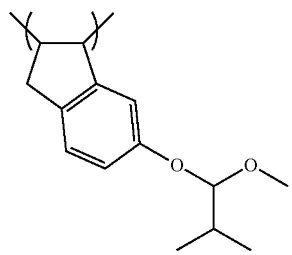
(VI-135)
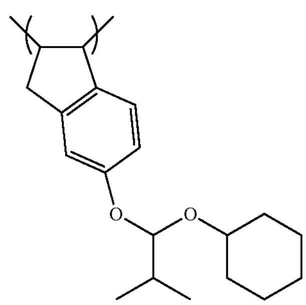
(VI-136)
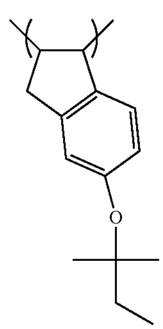

-continued (VI-137)

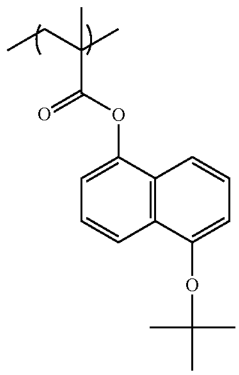

(VI-138)

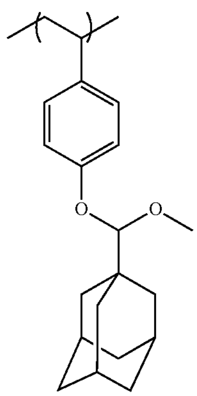

(VI-139)

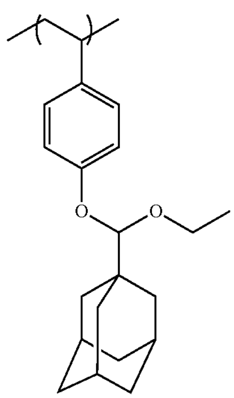

(VI-140)

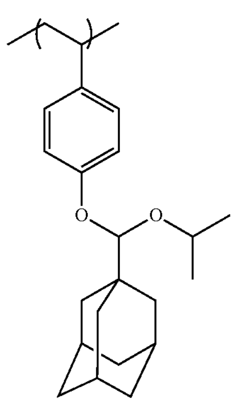

-continued (VI-141)

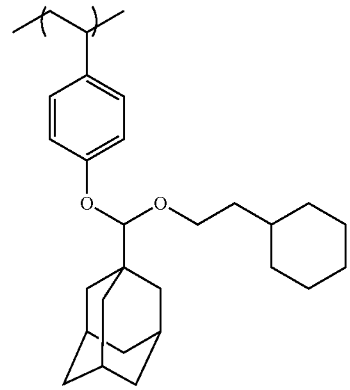

The repeating units having an acid-decomposable group may be used either alone or in combination of two or more thereof.

The content (in a case of containing a plurality of repeating units, the sum thereof) of the repeating unit having an acid-decomposable group in the resin (A) is preferably 5 mol % to 80 mol %, more preferably 5 mol % to 75 mol %, and still more preferably 10 mol % to 65 mol %, based on the entire repeating units in the resin (A).

(b) Repeating Unit Having Polar Group

It is preferred that the resin (A) includes a repeating unit (b) having a polar group. For example, the sensitivity of a composition including the resin may be improved by including the repeating unit (b). It is preferred that the repeating unit (b) is a non-acid-decomposable repeating unit (that is, a repeating unit having no acid-decomposable group).

As the "polar group" which may be contained in the repeating unit (b), for example, the following (1) to (4) may be exemplified. Meanwhile, hereinafter, "electronegativity" means a value according to Pauling.

(1) A functional group including a structure in which an oxygen atom is bonded through a single bond to an atom whose electronegativity exhibits a difference of 1.1 or more from that of the oxygen atom Examples of the polar group include a group including the structure represented by O—H, such as a hydroxyl group.

(2) A functional group including a structure in which a nitrogen atom is bonded through a single bond to an atom whose electronegativity exhibits a difference of 0.6 or more from that of the nitrogen atom Examples of the polar group may include a group including the structure represented by N—H, such as an amino group.

(3) A functional group including a structure in which two atoms whose electronegativity exhibits a difference of 0.5 or more are bonded to each other through a double bond or triple bond Examples of the polar group include a group including the structure represented by C≡N, C═O, N═O, S═O or C═N.

(4) A functional group having an ionic moiety

Examples of the polar group may include a group including a site represented by $N^+$ or $S^+$.

Hereinafter, specific examples of partial structures which "polar group" may include will be described. In the following specific examples, X— represents a counter anion.

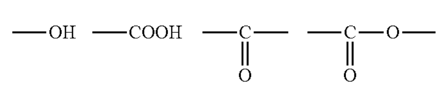

-continued

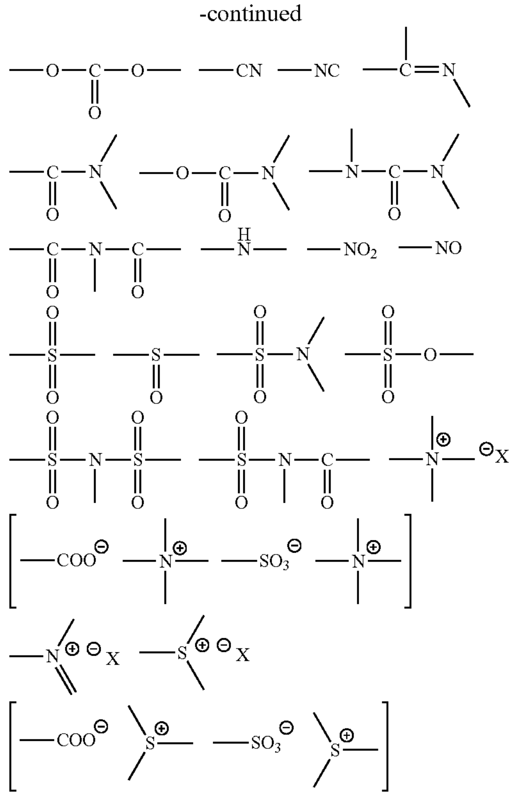

The "polar group" which may be possessed by the repeating unit (b) is preferably at least one selected from the group consisting of, for example, (I) a hydroxyl group, (II) a cyano group, (III) a lactone group, (IV) a carboxylic acid group or a sulfonic acid group, (V) an amide group, a sulfonamide group, or a group corresponding to the derivative thereof, (VI) an ammonium group or a sulfonium group, and a group formed by combining two or more of these groups.

The polar group is preferably selected from a hydroxyl group, a cyano group, a lactone group, a carboxylic acid group, a sulfonic acid group, an amide group, a sulfonamide group, an ammonium group, a sulfonium group, and a group formed by combining two or more of these groups, and particularly preferably an alcoholic hydroxyl group, a cyano group, a lactone group, or a group including a cyanolactone structure.

When a repeating unit having an alcoholic hydroxyl group is further contained in the resin, the exposure latitude (EL) of a composition including the resin may be further improved.

When a repeating unit having a cyano group is further contained in the resin, the sensitivity of a composition including the resin may be further improved.

When a repeating unit having a lactone group is further included in the resin, dissolution contrast in a developer including an organic solvent may be further improved. Further, coatability and adhesion to a substrate of the composition including the resin may be further improved by the above configuration.

When a repeating unit having a group including a lactone structure having a cyano group is further contained in the resin, dissolution contrast in a developer including an organic solvent may be further improved. In addition, sensitivity, coatability and adhesion to a substrate of the composition including the resin may be further improved by the above configuration. Furthermore, the above configuration enables a single repeating unit to bear functions resulting from each of the cyano group and the lactone group, and thus the degree of freedom of design of the resin may further be increased.

When the polar group possessed by the repeating unit (b) is an alcoholic hydroxyl group, the repeating unit (b) is preferably represented by any one of the following Formulae (I-1H) to (I-10H). In particular, the repeating unit (b) is more preferably represented by any one of the following Formulae (I-1H) to (I-3H), and still more preferably represented by the following Formula (I-1H).

(I-1H)

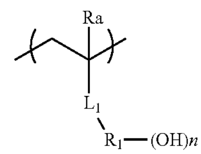

(I-2H)

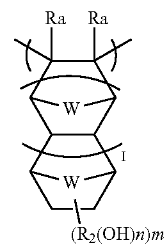

(I-3H)

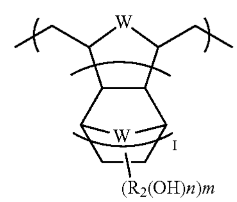

(I-4H)

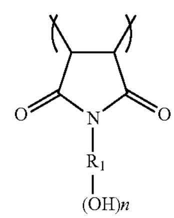

(I-5H)

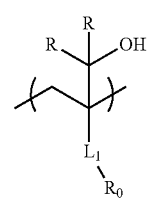

(I-6H)

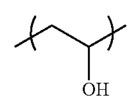

(I-7H)

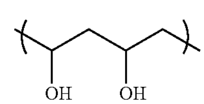

-continued (I-8H)

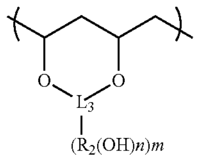

(I-9H)

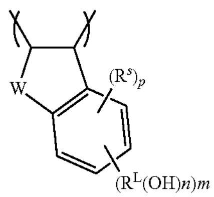

(I-10H)

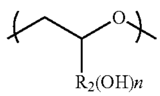

In the formula,

Each Ra independently represents a hydrogen atom, an alkyl group, or a group represented by $—CH_2—O—Ra_2$. Here, $Ra_2$ represents a hydrogen atom, an alkyl group or an acyl group.

$R_1$ represents a (n+1)-valent organic group.

In a case where m≥2, each $R_2$ independently represents a single bond or a (n+1)-valent organic group.

W represents a methylene group, an oxygen atom or a sulfur atom.

n and m represent an integer of 1 or more. Meanwhile, when $R_2$ represents a single bond in Formula (I-2), (I-3) or (I-8), n is 1.

l represents an integer of 0 or more.

$L_1$ represents a linking group represented by —COO— —OCO—, —CONH—, —O—, $—Ar—SO_3—$, or $—SO_2NH—$. Here, Ar represents a divalent aromatic ring group.

Each R independently represents a hydrogen atom or an alkyl group.

$R_0$ represents a hydrogen atom or an organic group.

$L_3$ represents a (m+2)-valent linking group.

In a case where m≥2, each $R^L$ independently represents a (n+1)-valent linking group.

In a case where p≥2, each $R^S$ independently represents a substituent. In a case where p≥2, a plurality of $R^S$'s may be bonded to each other to form a ring.

p represents an integer of 0 to 3.

Ra represents a hydrogen atom, an alkyl group, or a group represented by $—CH_2—O—Ra_2$. Ra is preferably a hydrogen atom or an alkyl group having 1 to 10 carbon atoms, and more preferably a hydrogen atom, or a methyl group.

W represents a methylene group, an oxygen atom or a sulfur atom. W is preferably a methylene group or a hydrogen atom.

$R_1$ represents a (n+1)-valent organic group. $R_1$ is preferably a non-aromatic hydrocarbon group. In this case, $R_1$ may be a chained hydrocarbon group or may be an alicyclic hydrocarbon group. $R_1$ is more preferably an alicyclic hydrocarbon group.

$R_2$ represents a single bond or a (n+1)-valent organic group. $R_2$ is preferably a single bond or a non-aromatic hydrocarbon group. In this case, $R_2$ may be a chained hydrocarbon group or may be an alicyclic hydrocarbon group.

When $R_1$ and/or $R_2$ are/is a chained hydrocarbon group, the chained hydrocarbon group may be straight or a branched. Further, the number of carbon atoms of the chained hydrocarbon group is preferably 1 to 8. For example, when $R_1$ and/or $R_2$ are/is an alkylene group, $R_1$ and/or $R_2$ are/is preferably a methylene group, an ethylene group, an n-propylene group, an isopropylene group, an n-butylene group, an isobutylene group or a sec-butylene group.

When $R_1$ and/or $R_2$ are/is an alicyclic hydrocarbon group, the alicyclic hydrocarbon group may be monocyclic or polycyclic. The alicyclic hydrocarbon group has, for example, a monocyclo, bicyclo, tricyclo or tetracyclo structure. The number of carbon atoms of the alicyclic hydrocarbon group is usually 5 or more, preferably 6 to 30, and more preferably 7 to 25.

Examples of the alicyclic hydrocarbon group include those having the partial structures enumerated below. Each of these partial structures may have a substituent. In addition, in each of the partial structures, the methylene group $(—CH_2—)$ may be substituted with an oxygen atom (—O—), a sulfur atom (—S—), a carbonyl group [—C(═O)—], a sulfonyl group $[—S(═O)_2—]$, a sulfinyl group [—S(═O)—] or an imino group [—N(R)—](R represents a hydrogen atom or an alkyl group).

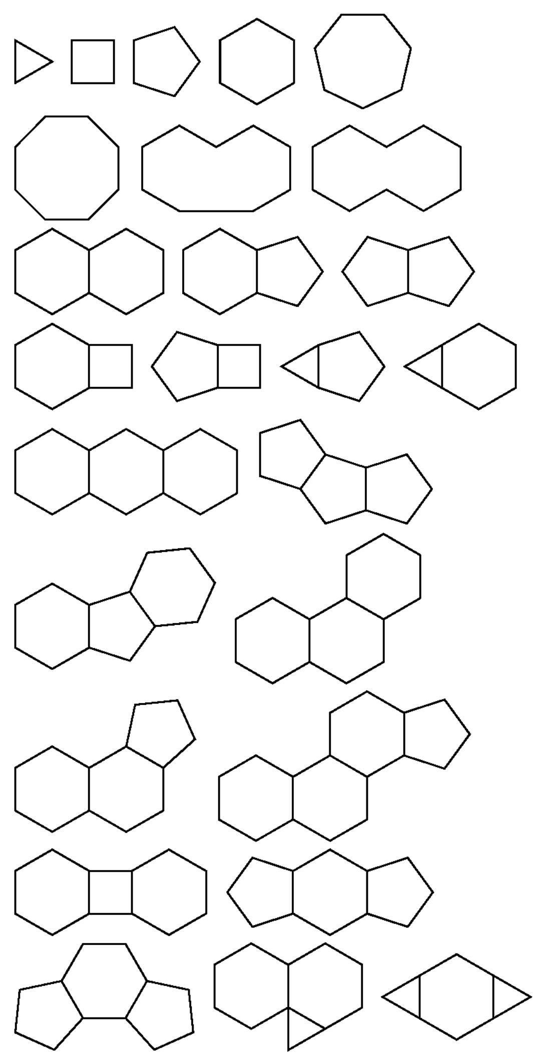

-continued

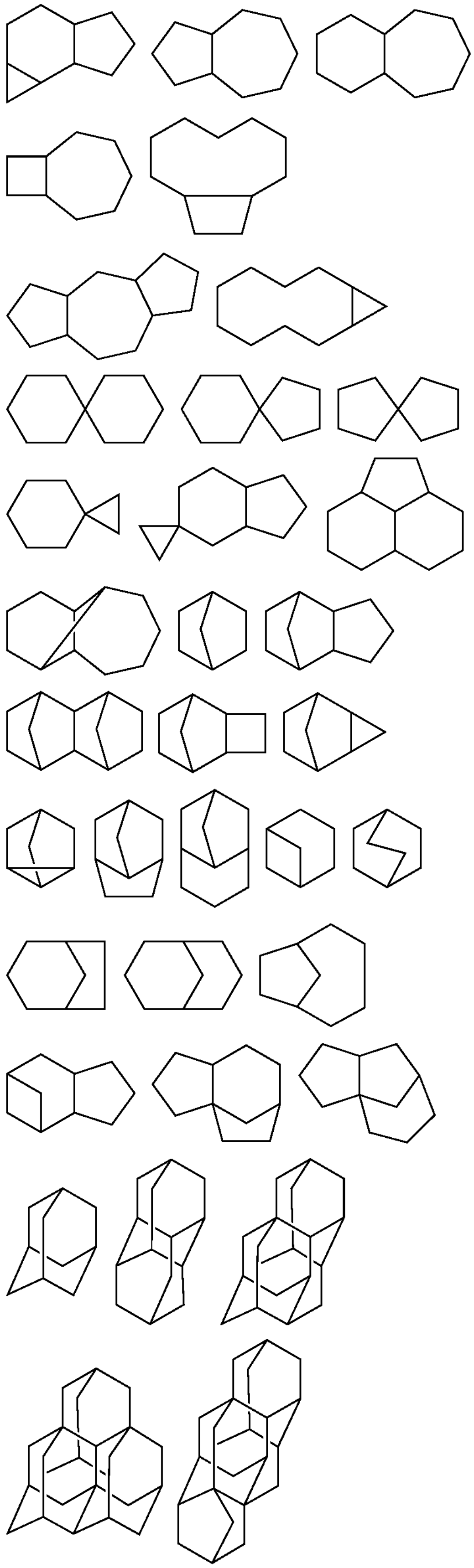

-continued

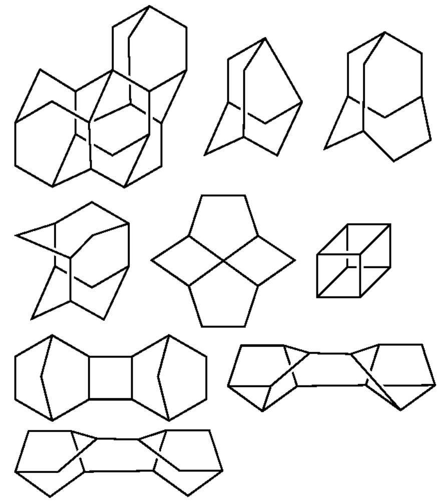

For example, in a case where $R_1$ and/or $R_2$ are/is a cycloalkylene group. $R_1$ and/or $R_2$ are/is preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group, or a cyclododecanylene group, and more preferably an adamantylene group, a norbornylene group, a cyclohexylene group, a cyclopentylene group, a tetracyclododecanylene group, or a tricyclodecanylene group.

The non-aromatic hydrocarbon group represented by $R_1$ and/or $R_2$ may have a substituent. Examples of the substituent may include an alkyl group having 1 to 4 carbon atoms, a halogen atom, a hydroxyl group, an alkoxy group having 1 to 4 carbon atoms, a carboxyl group, and an alkoxycarbonyl group having 2 to 6 carbon atoms. The aforementioned alkyl group, the aforementioned alkoxy group and the aforementioned alkoxycarbonyl group may further have a substituent. Examples of the substituent may include a hydroxyl group, a halogen atom, and an alkoxy group.

$L_1$ represents a linking group represented by —COO— —OCO—, —CONH—, —O—, —Ar—$SO_3$—, or —$SO_2$NH—. Here. Ar represents a divalent aromatic ring group. $L_1$ is preferably a linking group represented by —COO—, —CONH— or —Ar—, and more preferably a linking group represented by —COO— or —CONH—.

R represents a hydrogen atom or an alkyl group. The alkyl group may be straight or branched. The number of carbon atoms of the alkyl group is preferably 1 to 6, and more preferably 1 to 3. R is preferably a hydrogen atom or a methyl group, and more preferably a hydrogen atom.

$R_0$ represents a hydrogen atom or an organic group. Examples of the organic group include an alkyl group, a cycloalkyl group, an aryl group, an alkynyl group and an alkenyl group. $R_0$ is preferably a hydrogen atom or an alkyl group, and more preferably a hydrogen atom or a methyl group.

$L_3$ represents a (n+2)-valent linking group. That is, $L_3$ represents a trivalent or higher linking group. Examples of such linking groups include corresponding groups in the specific examples described below.

$R^L$ represents a (n+1)-valent linking group. That is, $R^L$ represents a divalent or higher linking group. Examples of such linking groups include an alkylene group, a cycloalkylene group, and corresponding groups in the specific examples described below. $R^L$'s may be bonded to each other or bonded with the following $R^S$'s to form a cyclic structure.

$R^S$ represents a substituent. Examples of the substituents may include an alkyl group, an alkenyl group, an alkynyl group, an aryl group, an alkoxy group, an acyloxy group, an alkoxycarbonyl group and a halogen atom.

n is an integer of 1 or more. n is preferably an integer of 1 to 3, and more preferably 1 or 2. Furthermore, when n is 2 or more, it becomes possible to further improve dissolution contrast in a developer including an organic solvent. Accordingly, limiting resolution and roughness characteristics may be further improved by the above configuration.

m is an integer of 1 or more. m is preferably an integer of 1 to 3, and more preferably 1 or 2.

l is an integer of 0 or more. 1 is preferably 0 or 1.

p is an integer of 0 to 3.

When a repeating unit having a group capable of decomposing by the action of an acid to generate an alcoholic hydroxyl group is used in combination with the repeating unit represented by any one of Formulae (I-1H) to (I-10H), it becomes possible to improve exposure latitude (EL) by suppressing diffusion of acid by the alcoholic hydroxyl group and increasing sensitivity by the group capable of decomposing by the action of an acid to generate an alcoholic hydroxyl group without degrading other performances.

The content ratio of the repeating unit having the alcoholic hydroxyl group is preferably 1 to 60 mol %, more preferably 3 to 50 mol %, and still more preferably 5 to 40 mol %, based on the entire repeating units in the resin (A).

Hereinafter, the specific examples of the repeating unit represented by any one of Formulae (I-1H) to (I-10H) will be described. Meanwhile, in the specific examples, Ra has the same meaning as those in Formulae (I-1H) to (I-10H).

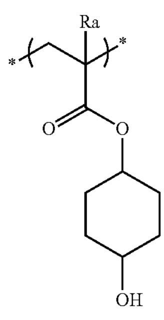

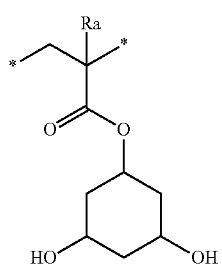

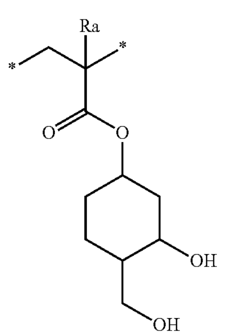

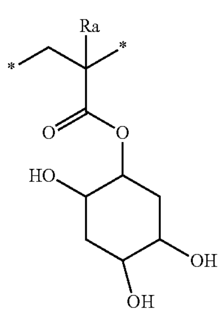

-continued

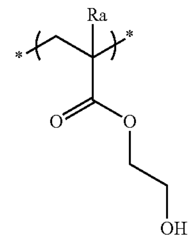

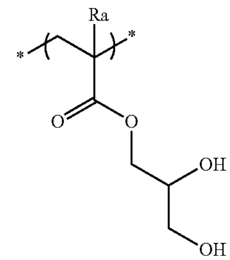

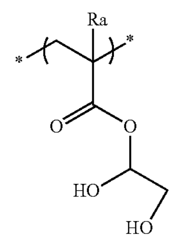

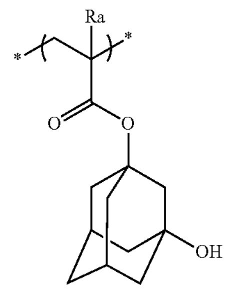

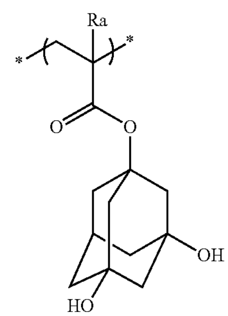

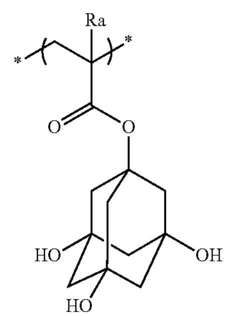

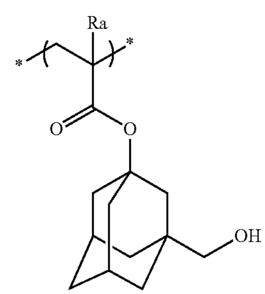

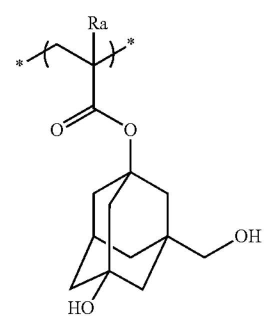

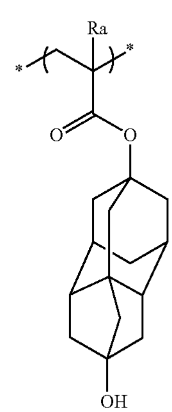

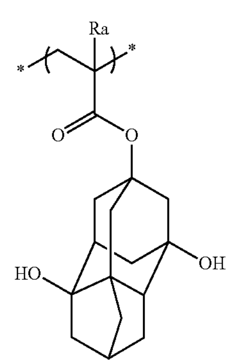

-continued

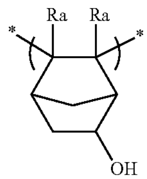
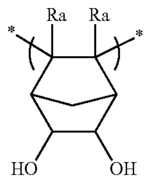
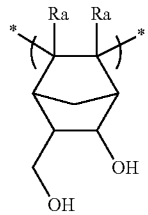
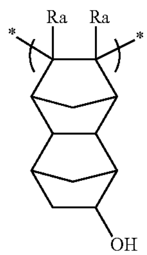
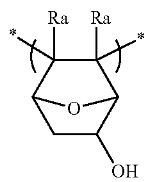
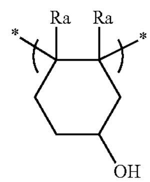
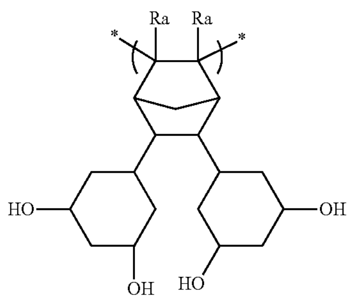
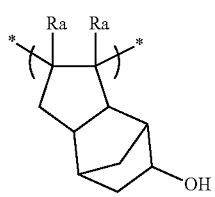
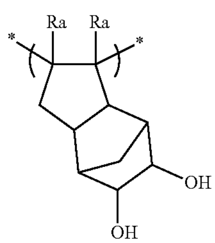
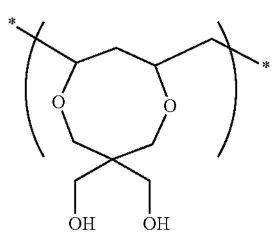

When the polar group possessed by the repeating unit (b) is an alcoholic hydroxyl group or a cyano group, examples of one aspect of preferred repeating unit may include a repeating unit having an alicyclic hydrocarbon structure substituted with a hydroxyl group or a cyano group. In this case, it is preferred not to have an acid-decomposable group. In the alicyclic hydrocarbon structure substituted with a hydroxyl group or a cyano group, an adamantyl group, a diamantyl group and a norbornane group are preferred as the alicyclic hydrocarbon structure. As preferred alicyclic hydrocarbon structure substituted with a hydroxyl group or a cyano group, a partial structure represented by any of the following Formulae (VIIa) to (VIIc) is preferred. Accordingly, adhesion to a substrate and affinity for a developer are improved.

(VIIa)

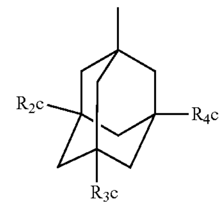

(VIIb)

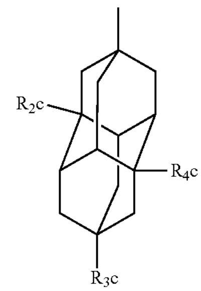

(VIIc)

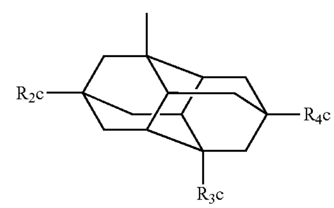

In Formulae (VIIa) to (VIIc),

Each of $R_2c$ to $R_4c$ independently represents a hydrogen atom or a hydroxyl group or a cyano group. However, at least one of $R_2c$ to $R_4c$ represents a hydroxyl group. Preferably, one or two of $R_2c$ to $R_4c$ are a hydroxyl group and the remainder is a hydrogen atom. In Formula (VIIa), more preferably, two of $R_2c$ to $R_4c$ are a hydroxyl group, and the remainder is a hydrogen atom.

Examples of the repeating unit having the partial structure represented by Formulae (VIIa) to (VIIc) may include a repeating unit represented by the following Formulae (AIIa) to (AIIc).

(AIIa)

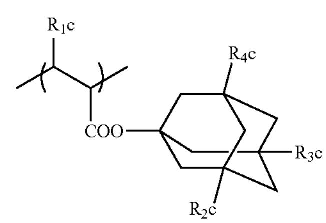

(AIIb)

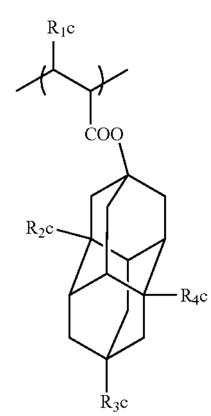

-continued (AIIc)

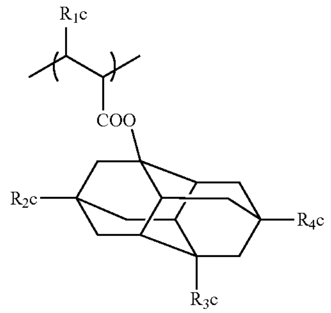

In Formulae (VIIa) to (VIIc), $R_1c$ represents a hydrogen atom, a methyl group, a trifluoromethyl group or a hydroxymethyl group.

$R_2c$ to $R_4c$ have the same meaning as $R_2c$ to $R_4c$ in Formulae (VIIa) to (VIIc).

The resin (A) may contain or may not contain a repeating unit having a hydroxyl group or a cyano group, but when the resin (A) contains the repeating unit, the content of the repeating unit having a hydroxyl group or a cyano group is preferably 1 to 60 mol %, more preferably 3 to 50 mol %, and still more preferably 5 to 40 mol %, based on the entire repeating units in the resin (A).

Specific examples of the repeating unit having a hydroxyl group or a cyano group will be described below, but the present invention is not limited thereto.

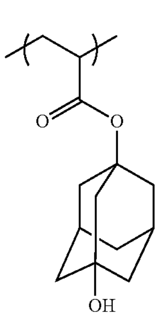

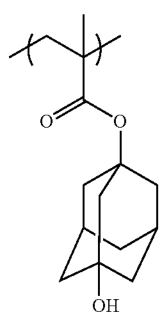

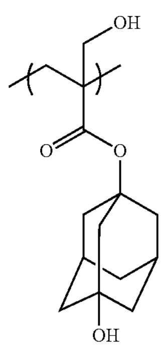

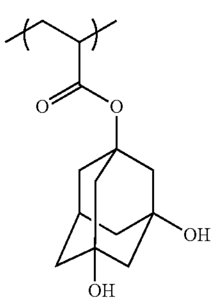

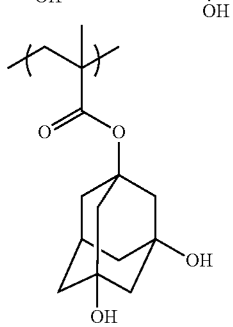

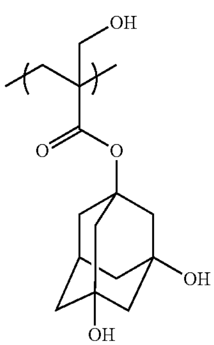

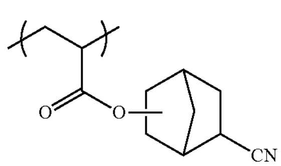

-continued

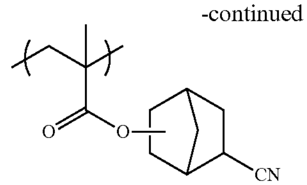

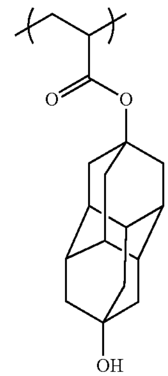

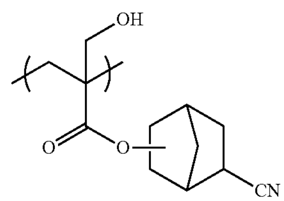

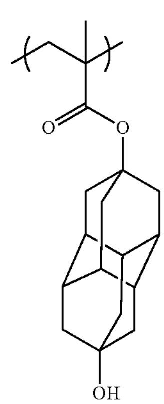

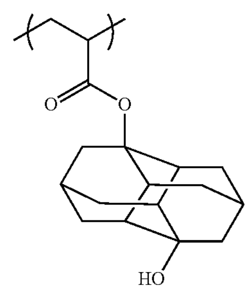

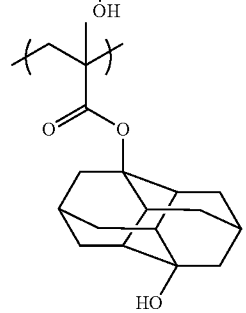

The repeating unit (b) may be a repeating unit having a lactone structure as the polar group.

As the repeating unit having a lactone structure, a repeating unit represented by the following Formula (AII) is more preferred.

(AII)

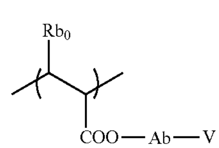

In Formula (AII), $Rb_0$ represents a hydrogen atom, a halogen atom or an alkyl group (preferably having 1 to 4 carbon atoms) which may have a substituent.

Examples of the preferred substituent, which may be possessed by the alkyl group of $Rb_0$, may include a hydroxyl group and a halogen atom. Examples of the halogen atom of $Rb_0$ may include a fluorine atom, a chlorine atom, a bromine atom and an iodine atom. $Rb_0$ is preferably a hydrogen atom, a methyl group, a hydroxymethyl group or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these members. Ab is preferably a single bond, or a divalent linking group represented by $-Ab_1-CO_2-$.

$Ab_1$ is a straight or branched alkylene group or a monocyclic or polycyclic cycloalkylene group, and is preferably a methylene group, an ethylene group, a cyclohexylene group, an adamantylene group or a norbornylene group.

V represents a group having a lactone structure.

As the group having a lactone structure, any group may be used as long as the group has a lactone structure, but the lactone structure is preferably a 5- to 7-membered ring lactone structure, and it is preferred that another ring structure is fused to the 5- to 7-membered ring lactone structure to form a bicyclo or spiro structure. It is more preferred to have a repeating unit having a lactone structure represented by any one of the following Formulae (LC1-1) to (LC1-17). In addition, the lactone structure may be bonded directly to the main chain. Preferred lactone structures are (LC1-1), (LC1-4), (LC1-5), (LC1-6), (LC1-8), (LC1-13) and (LC1-14).

LC1-1

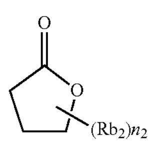

LC1-2

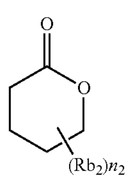

LC1-3

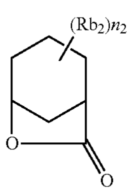

LC1-4

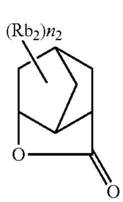

-continued

LC1-5

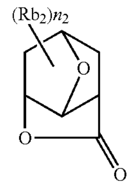

LC1-6

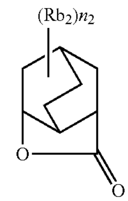

LC1-7

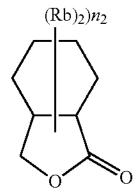

LC1-8

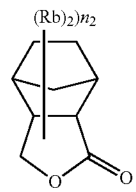

LC1-9

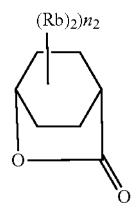

LC1-10

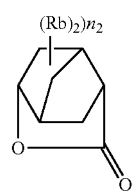

LC1-11

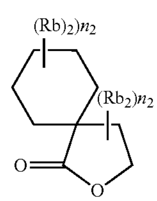

LC1-12

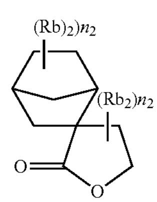

-continued

LC1-13

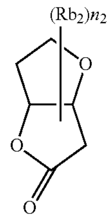

LC1-14

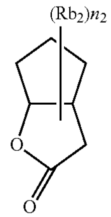

LC1-15

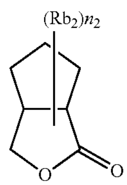

LC1-16

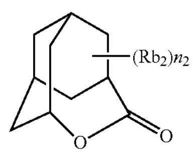

LC1-17

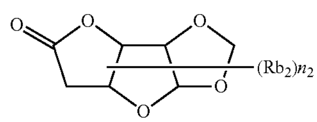

The lactone structure moiety may or may not have a substituent $Rb_2$. Examples of the preferred substituent ($Rb_2$) may include an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group, and the like. An alkyl group having 1 to 4 carbon atoms, a cyano group and an acid-decomposable group are more preferred. $n_2$ represents an integer of 0 to 4. When $n_2$ is 2 or more, a plurality of the substituents ($Rb_2$) may be same as or different, and further, the plurality of substituents ($Rb_2$) may be bonded to each other to form a ring.

The repeating unit having a lactone group usually has an optical isomer, but any optical isomer may be used. In addition, one optical isomer may be used alone or a mixture of a plurality of optical isomers may be used. In a case of mainly using one optical isomer, the optical purity (ee) thereof is preferably 90% or more, and more preferably 95% or more.

The resin (A) may or may not contain the repeating unit having a lactone structure, but in a case of containing the repeating unit having a lactone structure, the content of the repeating unit in the resin (A) is preferably 1 to 70 mol %, more preferably 3 to 65 mol %, and still more preferably 5 to 60 mol %, based on the entire repeating units.

Hereinafter, specific examples of the repeating unit having a lactone structure in the resin (A) will be described, but the present invention is not limited thereto. In the formulae, Rx represents H, $CH_3$, $CH_2OH$ or $CF_3$.

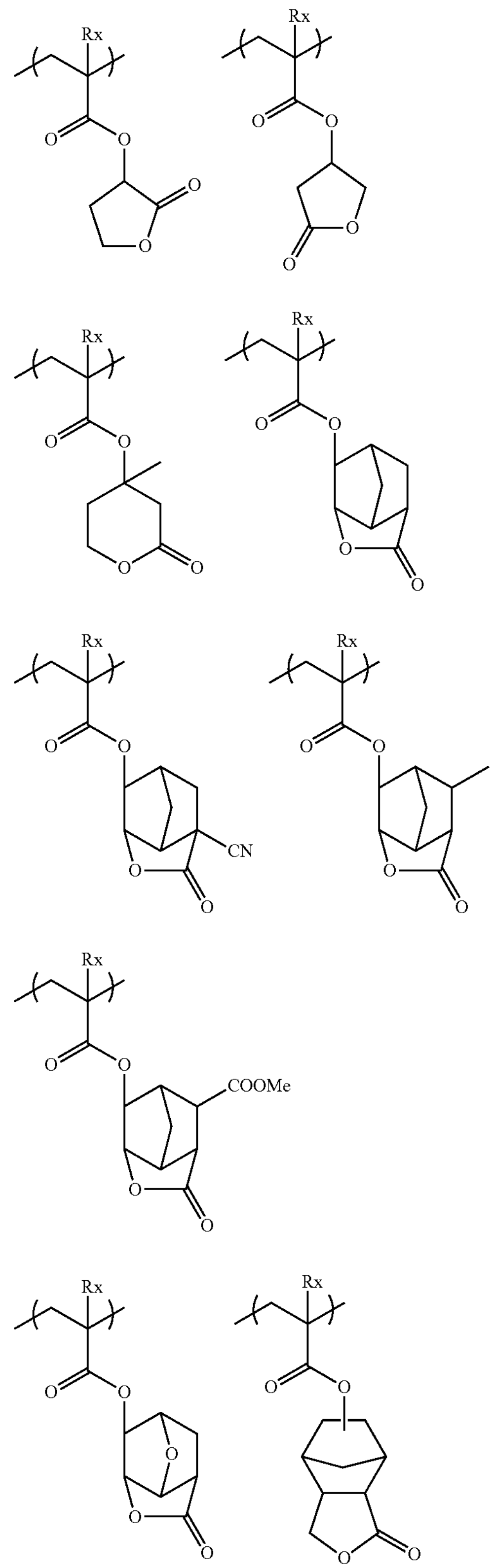

-continued

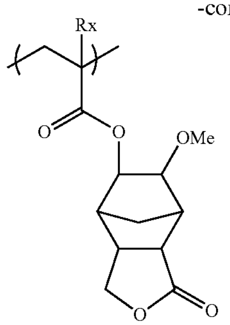

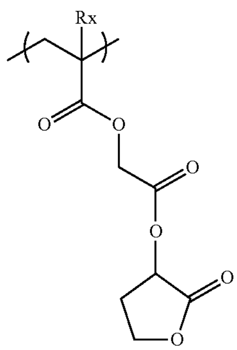

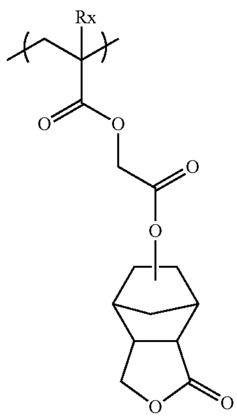

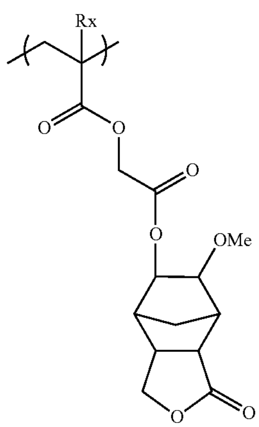

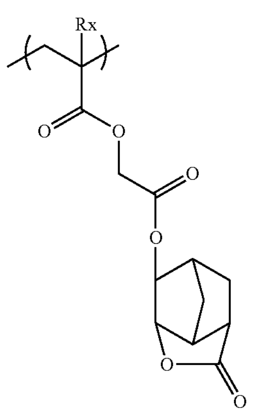

-continued

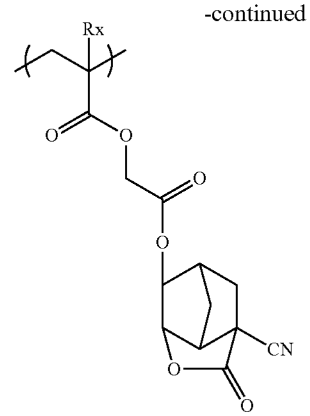

Furthermore, one of the particularly preferred aspects is that the polar group which may be possessed by the repeating unit (b) is an acid group. Examples of a preferred acidic group include a phenolic hydroxyl group, a carboxylic acid group, a sulfonic acid group, a fluorinated alcohol group (for example, a hexafluoroisopropanol group), a sulfonamide group, a sulfonylimide group, an (alkysulfonyl)(alkylcarbonyl)methylene group, an (alkylsulfonyl)(alkylcarbonyl)-imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group. Among them, it is more preferred that the repeating unit (b) is a repeating unit having a carboxyl group. By containing a repeating unit having an acidic group, resolution in a use for a contact hole increases. As the repeating unit having an acidic group, any of a repeating having an acid group directly bonded to the main chain of the resin such as a repeating unit by an acrylic acid or a methacrylic acid, a repeating unit having an acidic group bonded to the main chain of the resin via a linking group, and furthermore, a repeating unit introduced to the terminal of the polymer chain by using a polymerization initiator or a chain transfer agent each having an acidic group at the time of polymerization is preferred. Particularly preferred is a repeating unit by an acrylic acid or a methacrylic acid.

An acidic group which may be possessed by the repeating unit (b) may contain or may not contain an aromatic ring, but in a case of containing an aromatic ring, the acidic group is preferably selected from acidic groups other than a phenolic hydroxyl group. When the repeating unit (b) has an acidic group, the content of the repeating unit having an acidic group is preferably 30 mol % or less, and more preferably 20 mol % or less, based on the entire repeating units in the resin (A). When the resin (A) contains a repeating unit having an acidic group, the content of the repeating unit having an acidic group in the resin (A) is usually 1 mol % or more.

Specific examples of repeating units having an acidic group will be described below, but the present invention is not limited thereto.

In the specific examples, Rx represents H, $CH_3$, $CH_2OH$ or $CF_3$.

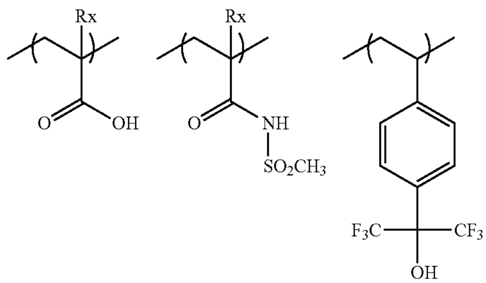

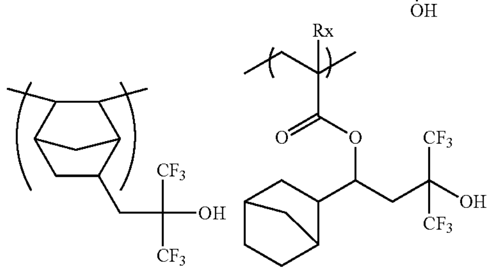

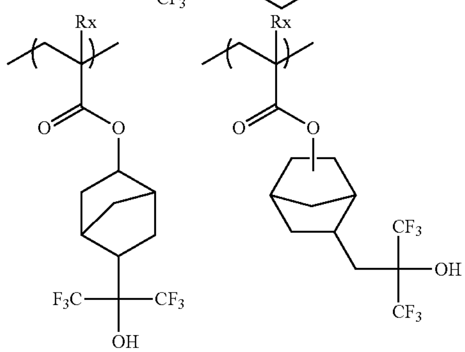

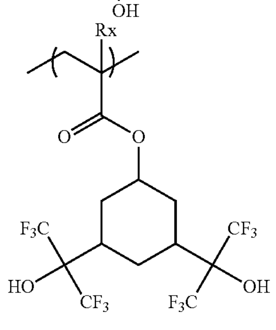

The resin (A) of the present invention may have a non-acid-decomposable repeating unit (b) having a phenolic hydroxyl group. As the repeating unit (b) in this case, a structure represented by the following formula (I) is more preferred.

(I)

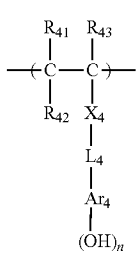

In the formula,

Each of $R_{41}$, $R_{42}$ and $R_{43}$ independently represents a hydrogen atom, an alkyl group, a halogen atom, a cyano group or an alkoxycarbonyl group. However, $R_{42}$ may be bonded with $Ar_4$ to form a ring, and in that case, $R_{42}$ represents a single bond or an alkylene group.

$X_4$ represents a single bond, —COO— or —$CONR_{64}$—, and $R_{64}$ represents a hydrogen atom or an alkyl group.

$L_4$ represents a single bond or an alkylene group.

$Ar_4$ represents a (n+1)-valent aromatic ring group, and in a case of being bonded with $R_{42}$ to form a ring, represents a (n+2)-valent aromatic ring group.

n represents an integer of 1 to 4.

Specific examples of the alkyl group, the cycloalkyl group, the halogen atom, and the alkoxycarbonyl group of $R_{41}$, $R_{42}$ and $R_{43}$ in Formula (I) and the substituents which may be possessed by these groups are the same as the specific examples as described in each group represented by $R_{51}$, $R_{52}$ and $R_{53}$ in Formula (V).

$Ar_4$ represents a (n+1)-valent aromatic ring group. The divalent aromatic ring group in a case where n is 1 may have a substituent, and preferred examples thereof may include an arylene group having 6 to 18 carbon atoms, such as, for example, a phenylene group, a tolylene group, a naphthylene group, and an anthracenylene group, or an aromatic ring group including a heterocyclic ring, such as, for example, thiophene, furan, pyrrole, benzothiophene, benzofuran, benzopyrrole, triazine, imidazole, benzimidazole, triazole, thiadiazole, and thiazole.

Specific examples of the (n+1)-valent aromatic ring group in a case where n is an integer of 2 or more suitably include a group formed by removing (n−1) arbitrary hydrogen atoms from the aforementioned specific examples of divalent aromatic ring groups.

The (n+1)-valent aromatic ring group may further have a substituent.

Examples of the substituents, which may be possessed by the alkyl group, the cycloalkyl group, the alkoxycarbonyl group, the alkylene group, and the (n+1)-valent aromatic ring group described above, may include an alkyl group, a methoxy group, an ethoxy group, a hydroxyethoxy group, a propoxy group, a hydroxypropoxy group, an alkoxy group such as a butoxy group, and an aryl group such as a phenyl group, which are exemplified in $R_{51}$ to $R_{53}$ in Formula (V).

Examples of an alkyl group of $R_{64}$ in —$CONR_4$— ($R_{64}$ represents a hydrogen atom and an alkyl group) represented by $X_4$ include the groups such as the alkyl group of $R_{61}$ to $R_{63}$.

As $X_4$, a single bond, —COO—, and —CONH— are preferred, and a single bond and —COO— are more preferred.

Preferred examples of the alkylene group in $L_4$ include an alkylene group having 1 to 8 carbon atom, such as a methylene group, an ethylene group, a propylene group, a butylene group, a hexylene group, and an octylene group, each of which groups may have a substituent.

As $Ar_4$, an aromatic ring group having 6 to 18 carbon atoms which may have a substituent is more preferred, and a benzene ring group, a naphthalene ring group and a biphenylene ring group are particularly preferred.

It is preferred that the repeating unit (b) has a hydroxystyrene structure. That is, $Ar_4$ is preferably a benzene ring group.

Hereinafter, specific examples of the repeating unit (b) represented by Formula (I) will be described, but the present invention is not limited thereto. In the formula, a represents an integer of 1 or 2.

(B-1)
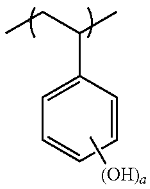
(B-2)
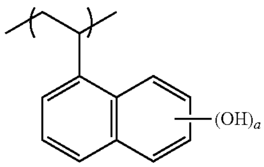
(B-3)
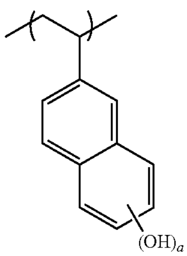
(B-4)
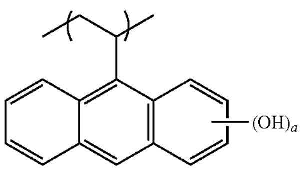
(B-5)
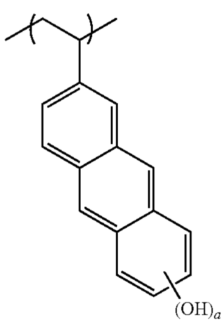
(B-6)
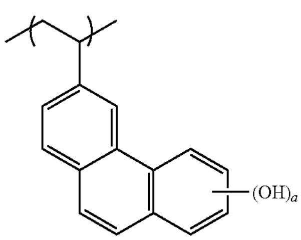
(B-7)
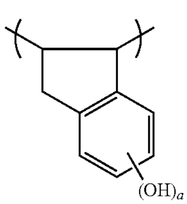
-continued
(B-8)
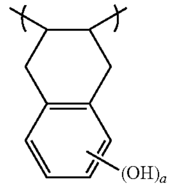
(B-9)
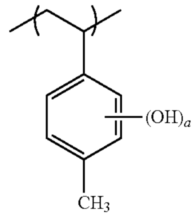
(B-10)
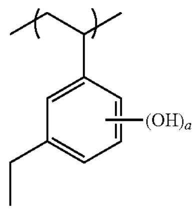
(B-11)
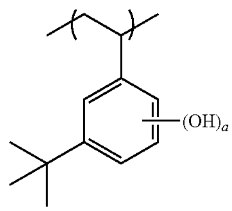
(B-12)
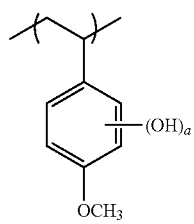
(B-13)
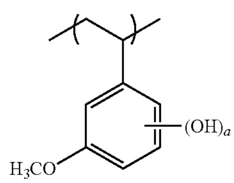
(B-14)
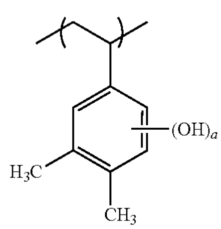

(B-15)
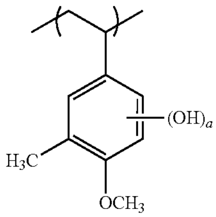
(B-16)
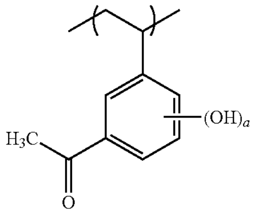
(B-17)
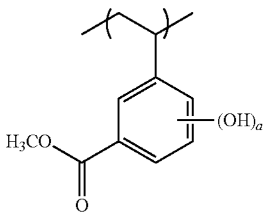
(B-18)
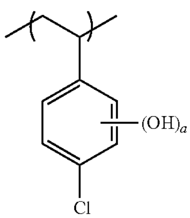
(B-19)
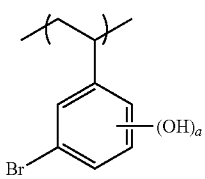
(B-20)
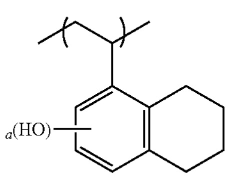
(B-21)
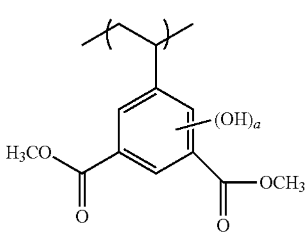
(B-22)
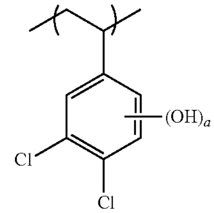
(B-23)
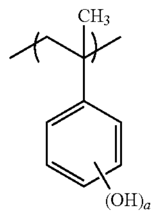
(B-24)
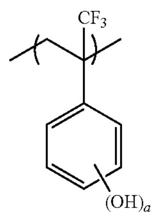
(B-25)
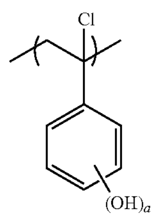
(B-26)
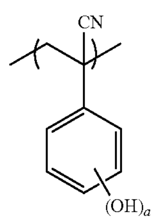
(B-27)
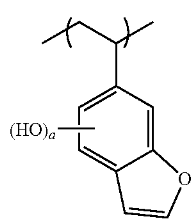
(B-28)
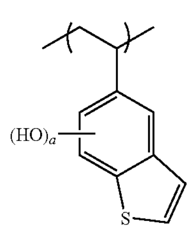

-continued (B-29)

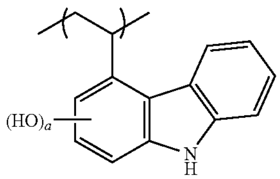

(B-30)

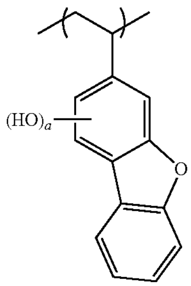

(B-31)

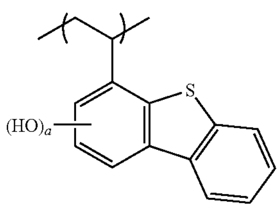

(B-32)

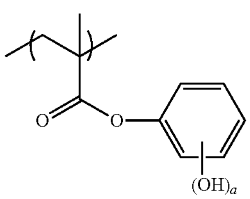

(B-33)

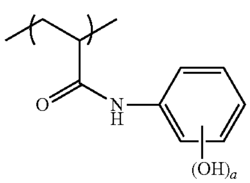

(B-34)

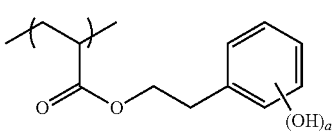

(B-35)

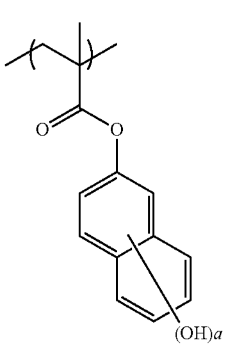

-continued (B-36)

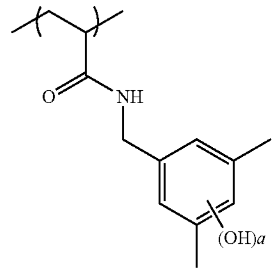

(B-37)

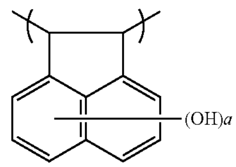

(B-38)

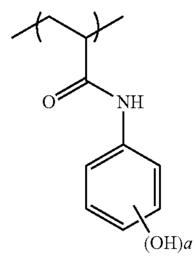

The resin (A) may include two or more of repeating units represented by Formula (I).

Further, the resin (A) may contain a repeating unit having a group capable of generating an acid upon irradiation with an actinic ray or radiation.

Examples of the repeating unit having the group capable of generating an acid upon irradiation with an actinic ray or radiation include a repeating unit having an onium cation, which is contained in each of Resin P-65 to P-70 of specific examples of the resin (A) to be described below, and the like.

In the resin (A) used in the composition of the present invention, the content molar ratio of each repeating structural unit is appropriately set in order to adjust the suitability for a standard developer of the resist, adhesion to the substrate, resist profile, and furthermore, generally required performances of the resist such as resolution, heat resistance and sensitivity.

The form of the resin (A) of the present invention may be any of random, block, comb and star shapes.

The resin (A) may be synthesized by, for example, radical polymerization, cationic polymerization, or anionic polymerization of the unsaturated monomer corresponding to each structure. In addition, it is also possible to obtain a target resin by performing polymerization using an unsaturated monomer corresponding to the precursor of each structure, and then performing a polymeric reaction.

Examples of a general synthesizing method include a batch polymerization method of performing polymerization by dissolving an unsaturated monomer and a polymerization initiator in a solvent and heating, and a drop polymerization of adding dropwise a solution of an unsaturated monomer and a polymerization initiator to a heated solvent for 1 to 10 hours, and the drop polymerization method is preferred.

Examples of a solvent used in polymerization include solvents which may be used in preparing an actinic ray-sensitive or radiation-sensitive resin composition to be described below, and more preferably, it is preferred to perform polymerization by using the same solvents as the solvents used in the composition of the present invention. Accordingly, generation of particles during storage may be suppressed.

The polymerization reaction is preferably carried out under the atmosphere of an inert gas such as nitrogen or argon. Polymerization is initiated using a commercially available radical initiator as a polymerization initiator (azo-based initiators, peroxides and the like). Azo-based initiators are preferred as the radical initiator, and azo-based initiator initiators having an ester group, a cyano group, or a carboxyl group are preferred. Examples of the preferred initiators may include azobisisobutyronitrile, azobisdimethylvaleronitrile, dimethyl-2,2'-azobis(2-methylpropionate), and the like. If necessary, polymerization may be performed in the presence of a chain transfer agent (for example, alkyl mercaptan and the like).

The reaction concentration is 5 to 70% by mass, and preferably 10 to 50%/by mass. The reaction temperature is usually 10° C. to 150° C., preferably 30° C. to 120° C., and more preferably 40° C. to 100° C.

The reaction time is usually 1 to 48 hours, preferably 1 to 24 hours, and more preferably 1 to 12 hours.

After termination of the reaction, the temperature is allowed to be cooled to room temperature, and followed by purification. Ordinary methods, such as purification methods in a solution state, such as a liquid-liquid extraction method of removing residual monomers and oligomer components by washing with water or combining appropriate solvents, or ultrafiltration of extracting and removing only the components having a molecular weight equal to or lower than a predetermined molecular weight, or purification methods in a solid state, such as a reprecipitation method of removing residual monomers and the like by dropwise adding a resin solution into a poor solvent to coagulate the resin in the poor solvent, or washing the resin slurry separated by filtration with a poor solvent, may be applied to the purification. For example, the resin is precipitated as a solid by bringing the solvent (poor solvent) in which the resin is poorly soluble or insoluble into contact with the reaction solution in a volume amount of the solvent of 10 times or less of the reaction solution, preferably in a volume amount of 10 to 5 times.

As the solvents (precipitation or reprecipitation solvents) used when the operation of precipitation or reprecipitation from the polymer solution is performed, a poor solvent of the polymer is sufficient, and it is possible to appropriately select and use the poor solvent from hydrocarbon, hydrocarbon halide, a nitro compound, ether, ketone, ester, carbonate, alcohol, carboxylic acid, water, mixed solvents containing these solvents, and the like, according to the kinds of polymers. Among these solvents, solvents containing at least alcohol (particularly, methanol, and the like) or water are preferred as the precipitation or reprecipitation solvents.

The amount of the precipitation or reprecipitation solvent used may be appropriately selected in consideration of efficiency or yield, and the like, but is generally 100 to 10,000 parts by mass, preferably 200 to 2,000 parts by mass, and more preferably 300 to 1,000 parts by mass, based on 100 parts by weight of the polymer solution.

The temperature at the time of precipitation or reprecipitation may be appropriately selected in consideration of efficiency or operability, but is usually 0 to 50° C. or so, and preferably around room temperature (for example, approximately 20 to 35° C.). Precipitation or reprecipitation may be operated by publicly known methods such as a batch system or continuous system using a commonly-used mixing vessel, such as a stirring tank.

A precipitated or reprecipitated polymer is usually subjected to a commonly-used solid-liquid separation such as filtration or centrifugation, dried, and then used. Filtration is preferably performed under pressure using a solvent-resistant filter material. Drying is carried out under normal pressure or reduced pressure (preferably under reduced pressure) at temperature of approximately 30 to 100° C., and preferably approximately 30 to 50° C.

Meanwhile, a resin may be once precipitated and separated, and then again dissolved in a solvent and brought into contact with the solvent in which the resin is poorly soluble or insoluble. That is, after termination of the above radical polymerization reaction, the reaction solution may be purified even by a method including processes of bringing the reaction solution into contact with the solvent, in which the polymer is poorly soluble or insoluble, to precipitate the resin (process a), separating the resin from the solution (process b), dissolving the resin again in a solvent to prepare resin solution A (process c), and then bringing the solvent, in which the resin is poorly soluble or insoluble, into contact with resin solution A in a volume amount of the solvent less than 10 times of resin solution A (preferably in a volume amount of 5 times or less) to precipitate the solid of the resin (process d), and separating the precipitated resin (process e).

The polymerization reaction is preferably carried out under the atmosphere of an inert gas such as nitrogen or argon. Polymerization is initiated using a commercially available radical initiator as a polymerization initiator (azo-based initiators, peroxides and the like). Azo-based initiators are preferred as the radical initiator, and azo-based initiator initiators having an ester group, a cyano group or a carboxyl group are preferred. Examples of the preferred initiators include azobisisobutyronitrile, azobisdimethylvaleronitrile, dimethyl-2,2'-azobis(2-methylpropionate), and the like. The initiator is added if necessary, or added in parts, and after termination of the reaction, the reaction solution is put into a solvent and a desired polymer is recovered by a method, such as powder or solid recovery. The reaction concentration is 5 to 50% by mass, and preferably 10 to 30% by mass. The reaction temperature is usually 10° C. to 150° C., preferably 30° C. to 120° C., and more preferably 60° C. to 100° C.

The molecular weight of the resin (A) according to the present invention is not particularly limited, but the weight average molecular weight is preferably in a range of 1,000 to 100,000, more preferably in a range of 1,500 to 60.000, and particularly preferably in a range of 2,000 to 30,000. By setting the weight average molecular weight within a range of 1,000 to 100,000, deterioration of heat resistance or dry etching resistance may be prevented, and degradation of developability or film-forming property due to high viscosity may also be prevented. Here, the weight average molecular weight of the resin indicates the polystyrene equivalent molecular weight as measured by GPC (carrier: THF or N-methyl-2-pyrrolidone (NMP)).

Furthermore, polydispersity (Mw/Mn) is preferably 1.00 to 5.00, more preferably 1.03 to 3.50, and still more preferably 1.05 to 2.50. The smaller the molecular weight distribution is, the better are resolution and resist form, and further, the side wall of the resist pattern is smooth and excellent in roughness.

The resin (A) of the present invention may be used either alone or in combination of two or more thereof. The content ratio of the resin (A) is preferably 20 to 99% by mass, more preferably 30 to 89% by mass, and particularly preferably 40 to 79% by mass, based on the total solid content in the actinic ray-sensitive or radiation-sensitive resin compositions of the present invention.

Hereinafter, specific examples of the resin (A) will be shown, but the present invention is not limited thereto. In addition, the composition ratio of each repeating unit of the following polymer structure is a molar ratio.

P-1

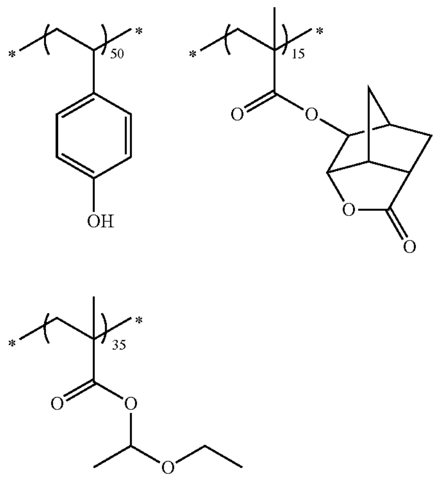

P-2

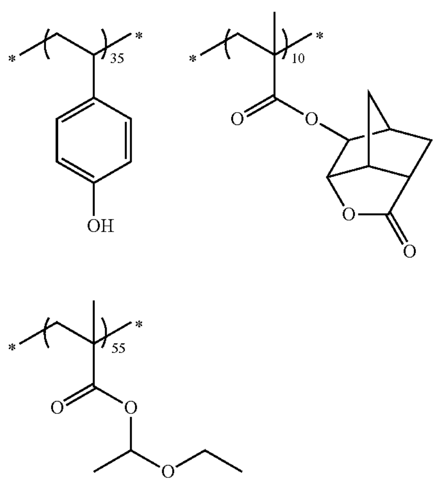

P-3

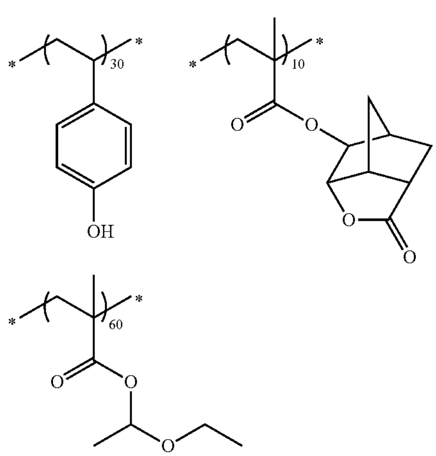

-continued

P-4

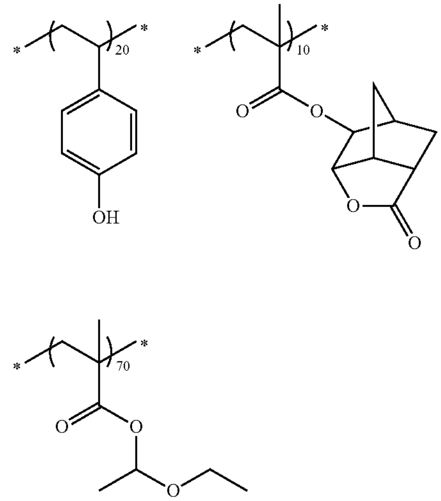

P-5

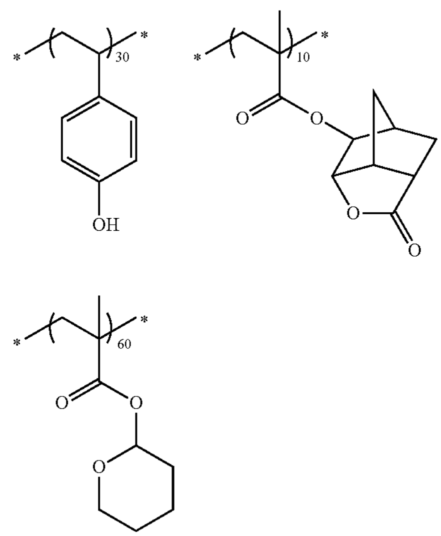

P-6

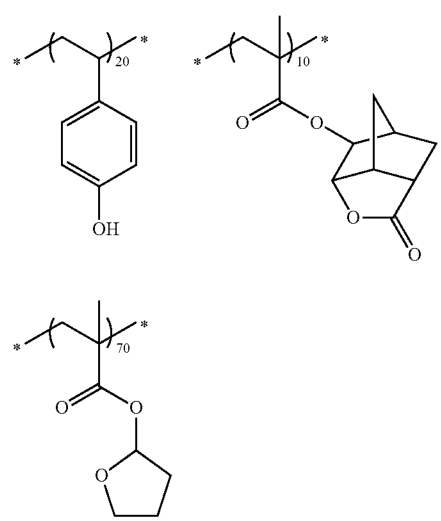

-continued
P-7
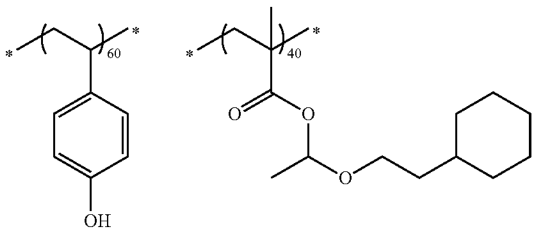
P-8
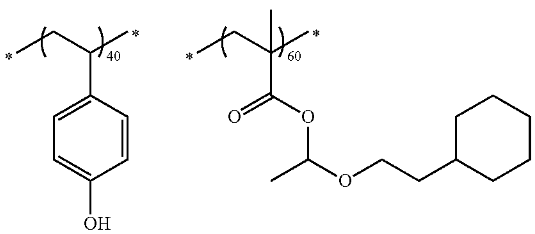
P-9
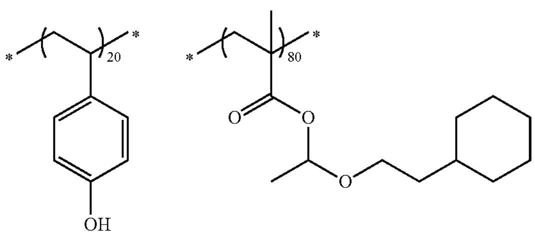
P-10
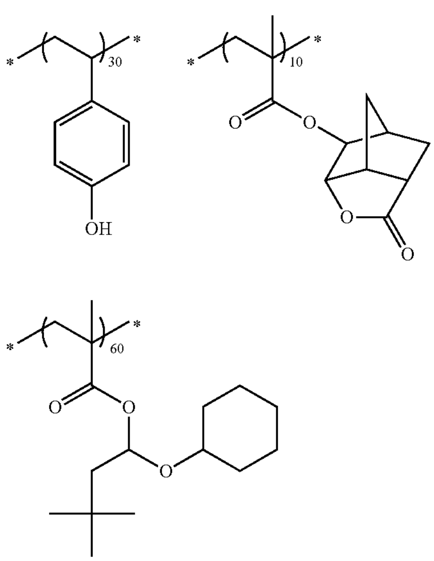
P-11
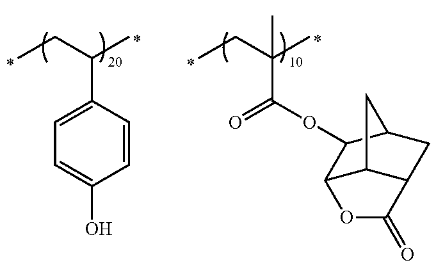
-continued
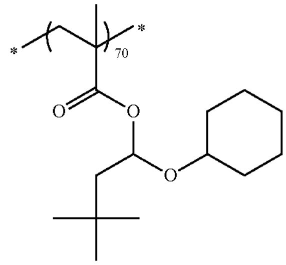
P-12
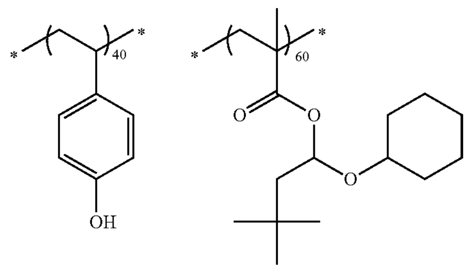
P-13
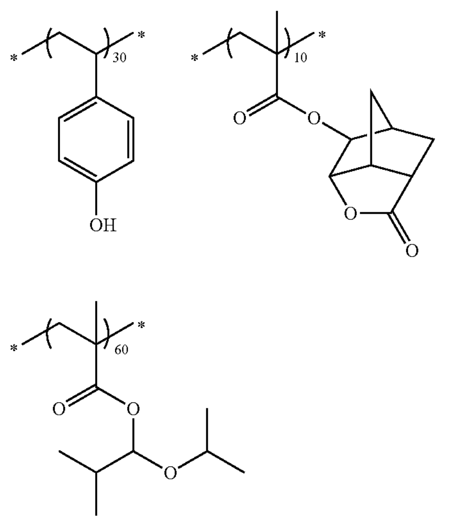
P-14
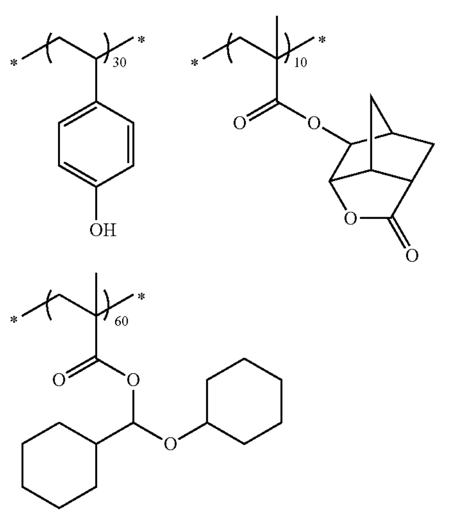

-continued
P-15
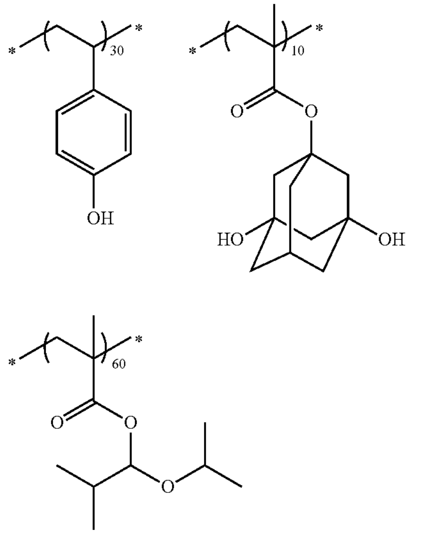
P-16
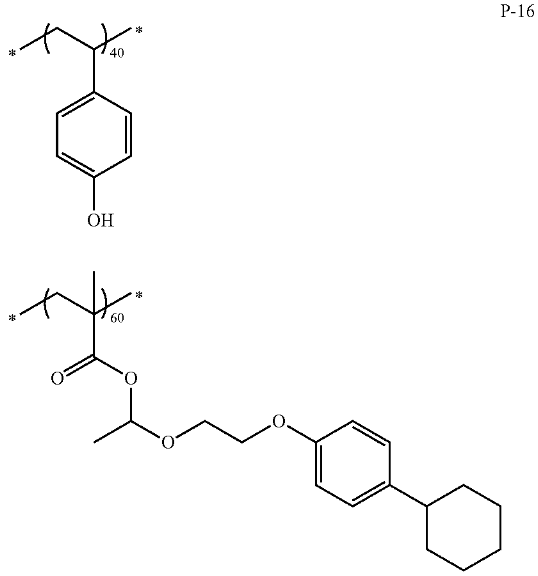
P-17
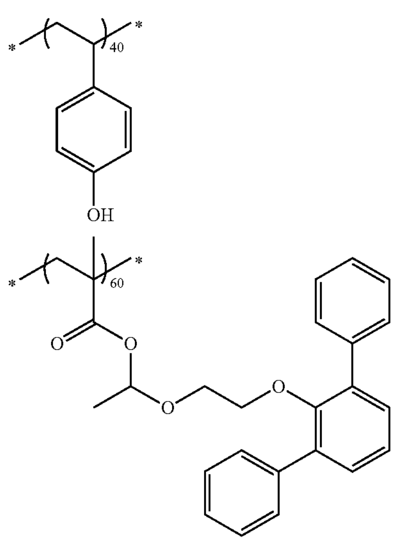
-continued
P-18
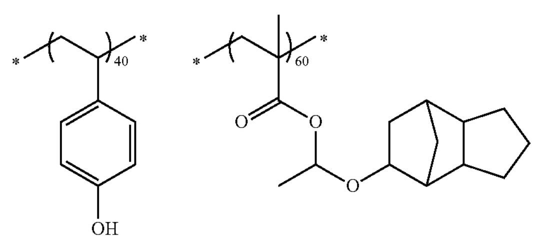
P-19
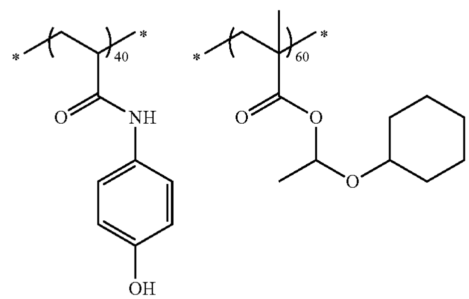
P-20
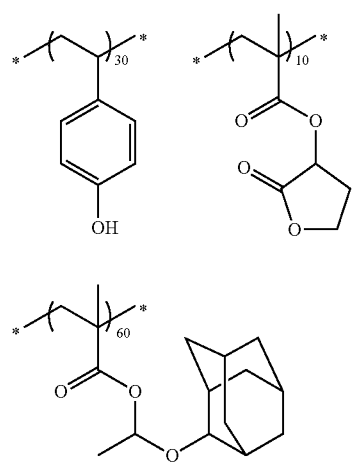
P-21
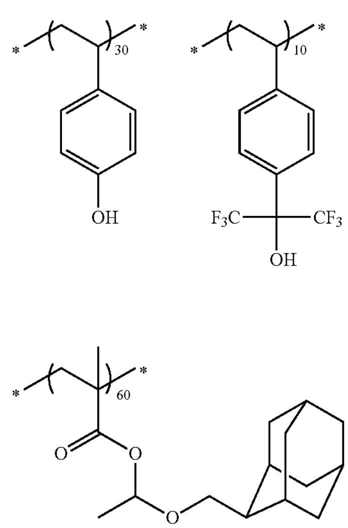

-continued
P-22
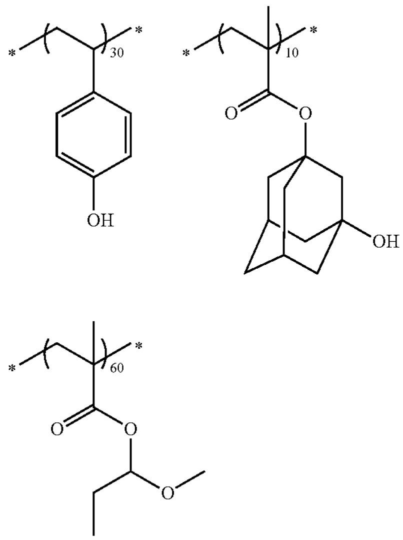
P-23
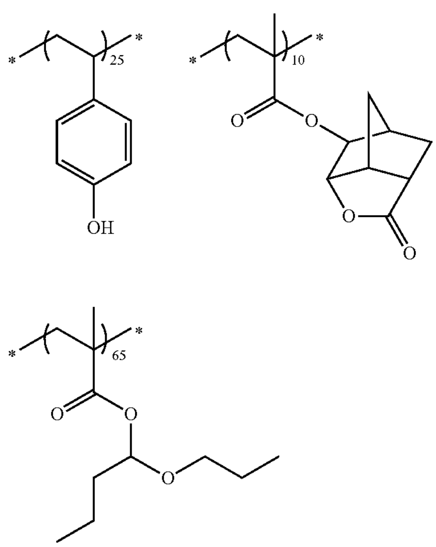
P-24
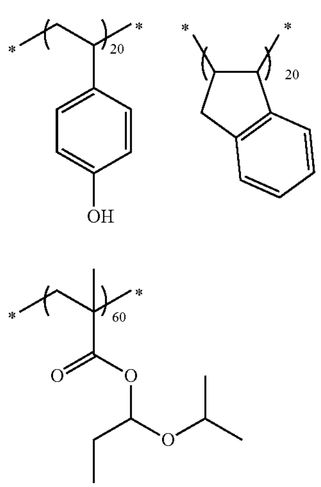
-continued
P-25
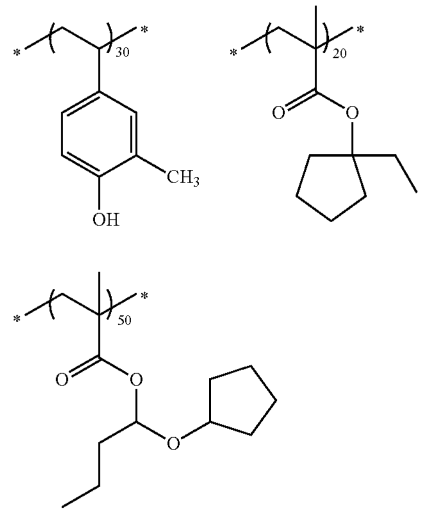
P-26
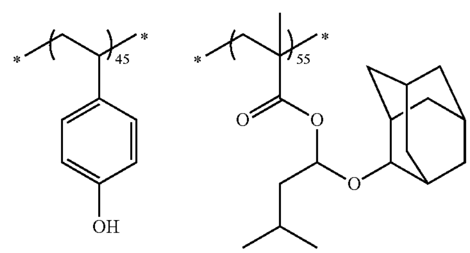
P-27
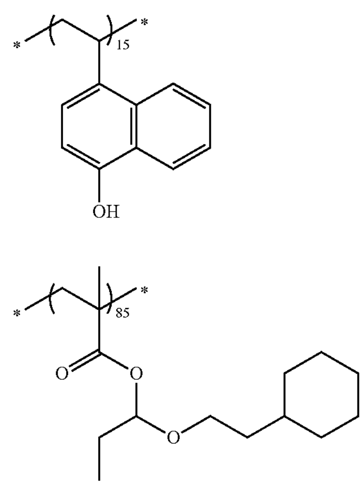
P-28
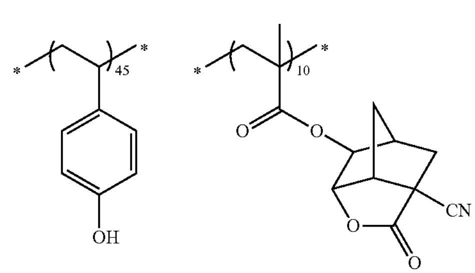

-continued
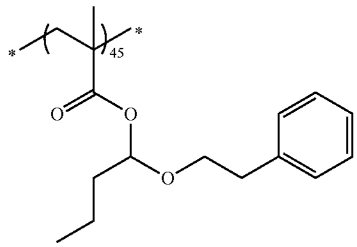
P-29
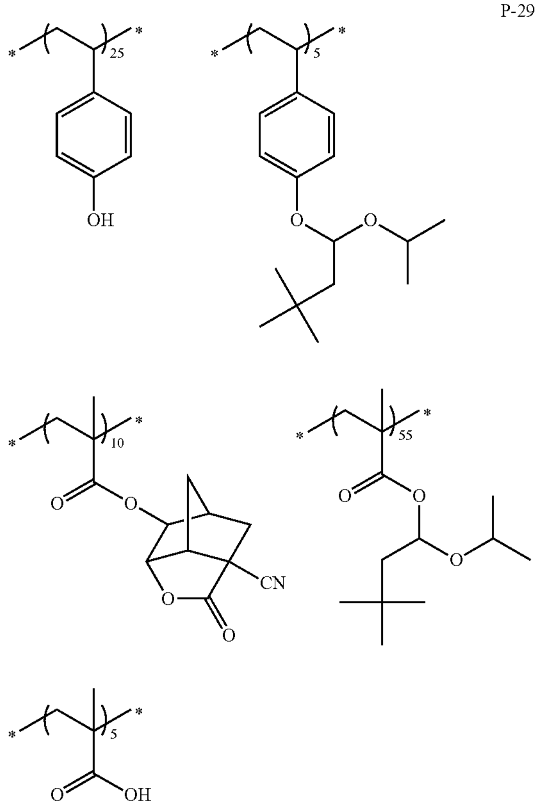
P-30
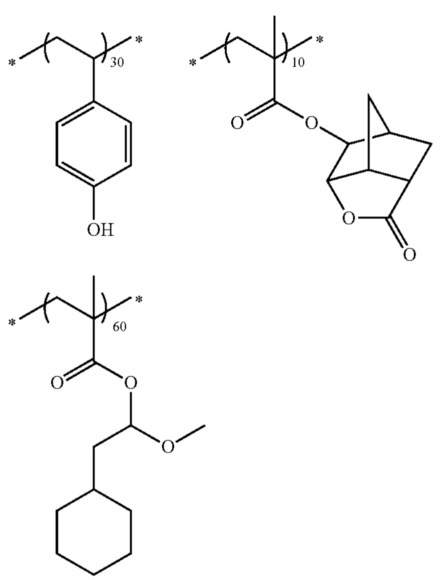
-continued
P-31
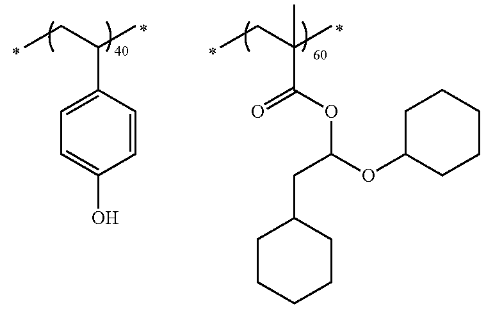
P-32
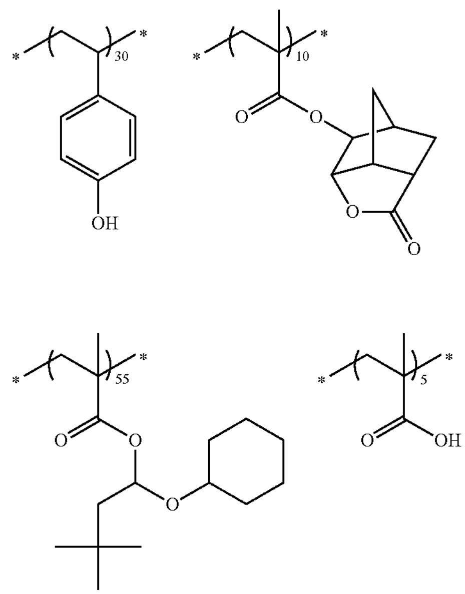
P-33
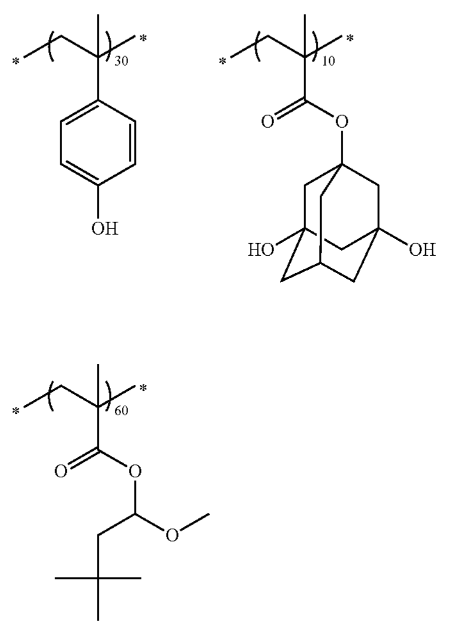

-continued
P-34
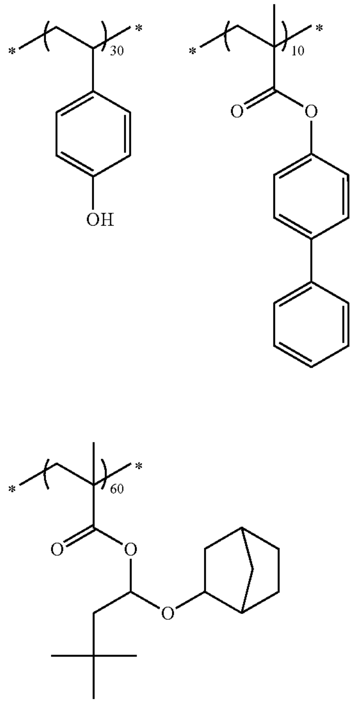
P-35
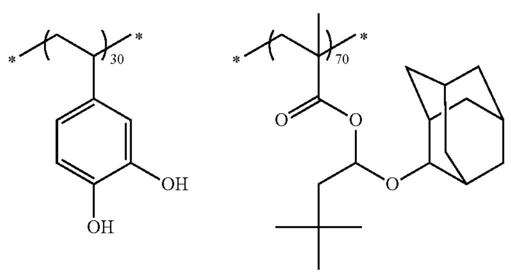
P-36
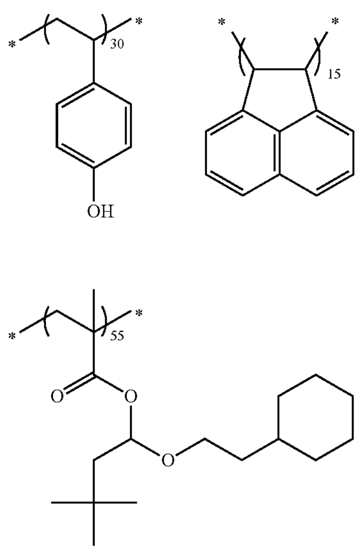
-continued
P-37
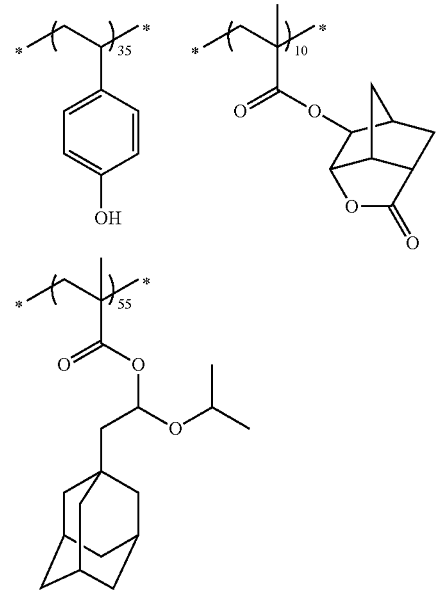
P-38
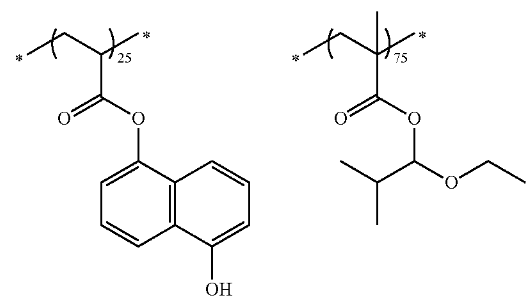
P-39
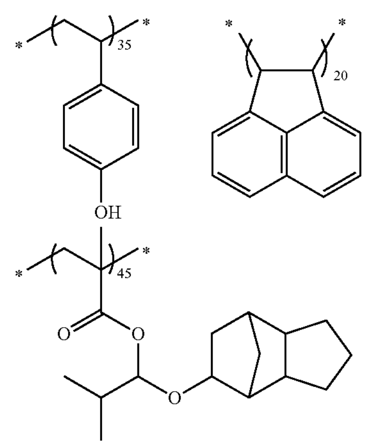
P-40
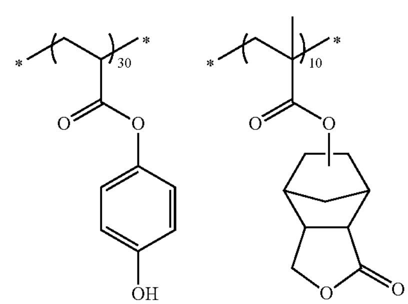

-continued
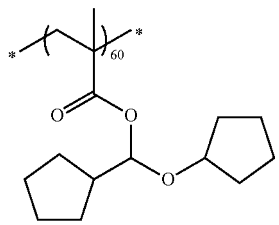
P-41
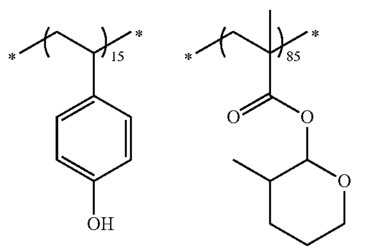
P-42
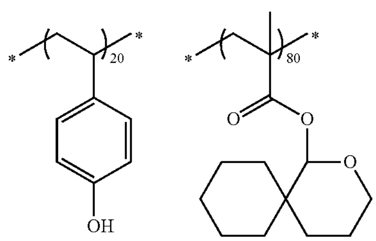
P-43
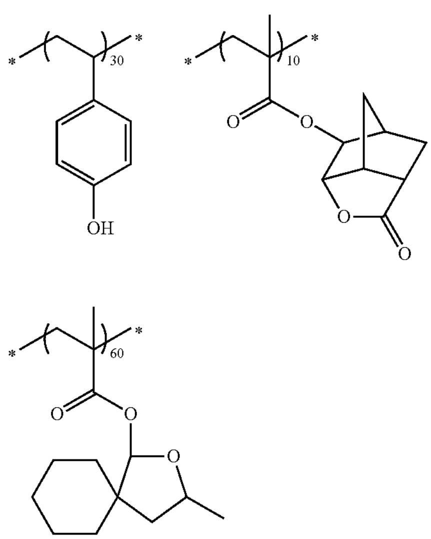
P-44
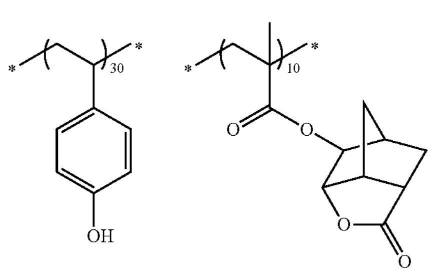
-continued
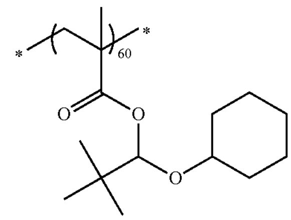
P-45
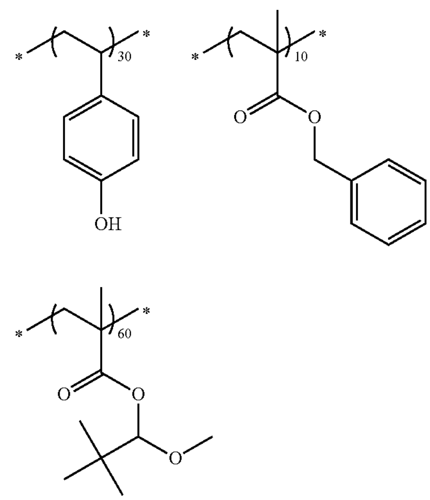
P-46
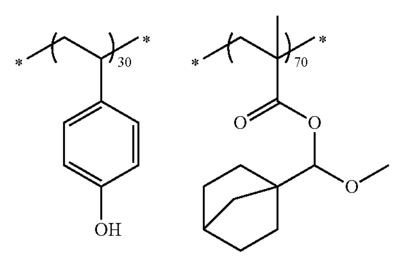
P-47
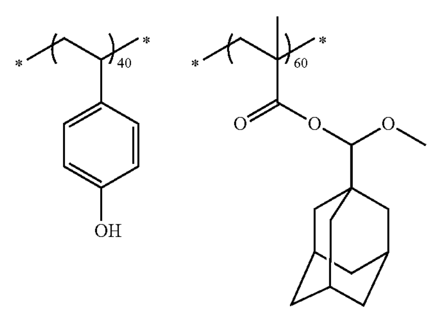
P-48
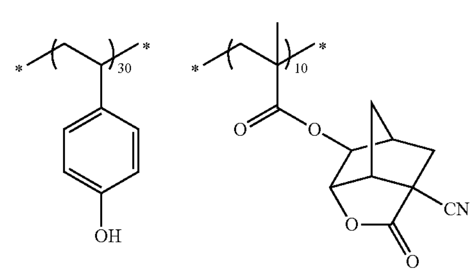

-continued
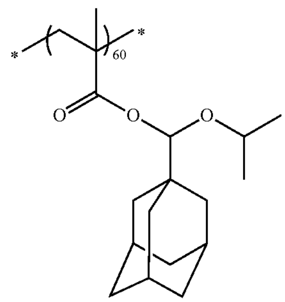
P-49
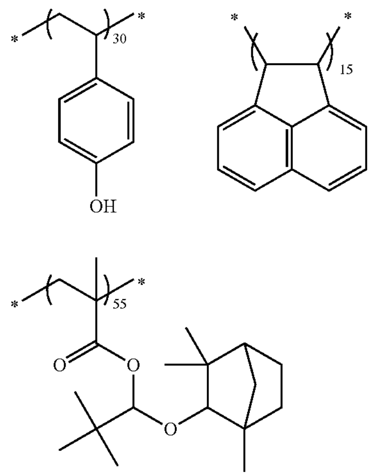
P-50
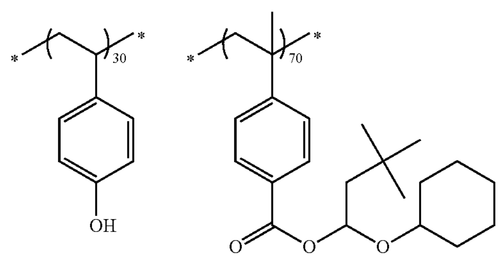
P-51
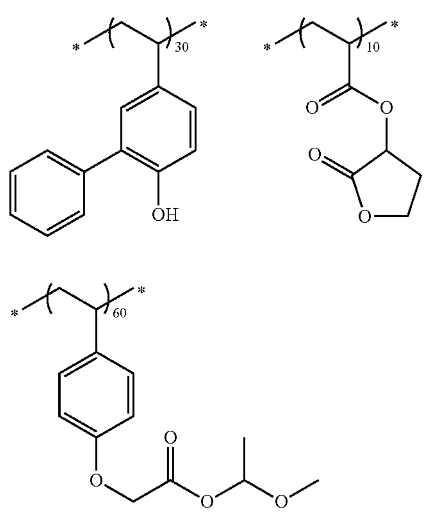
-continued
P-52
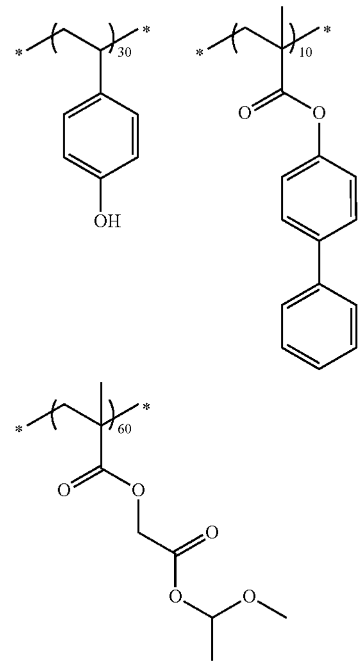
P-53
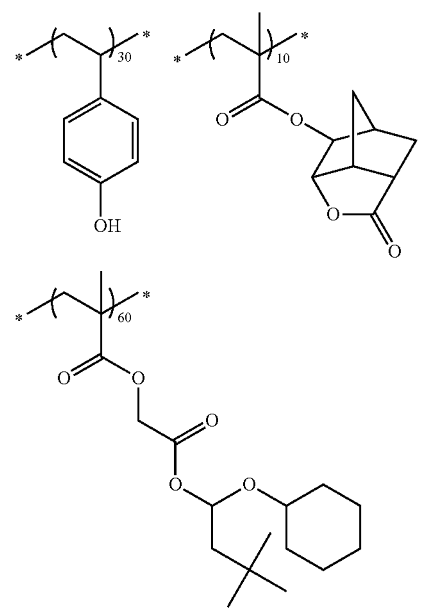
P-54
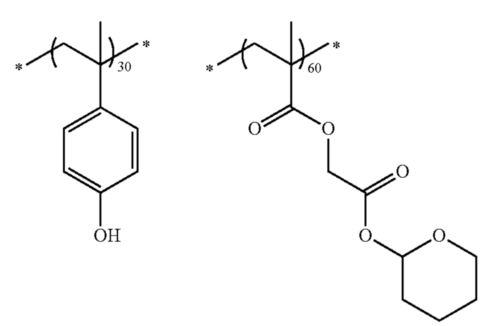

-continued
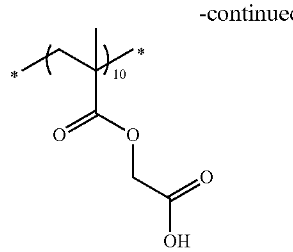
P-55
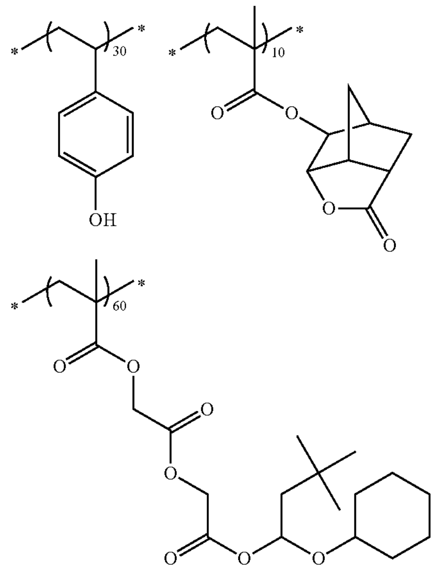
P-56
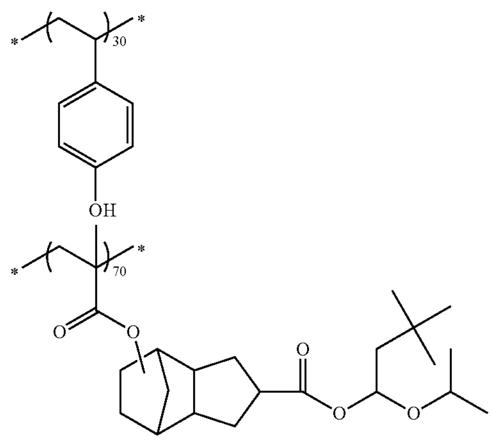
P-57
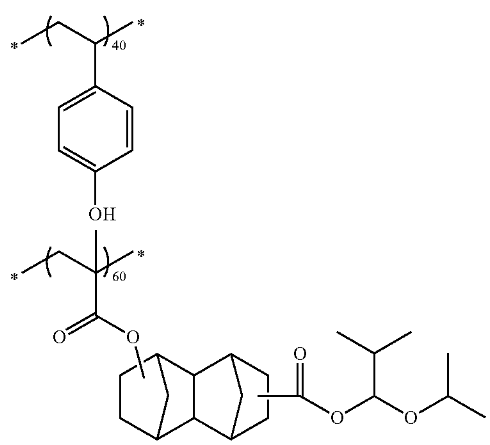
-continued
P-58
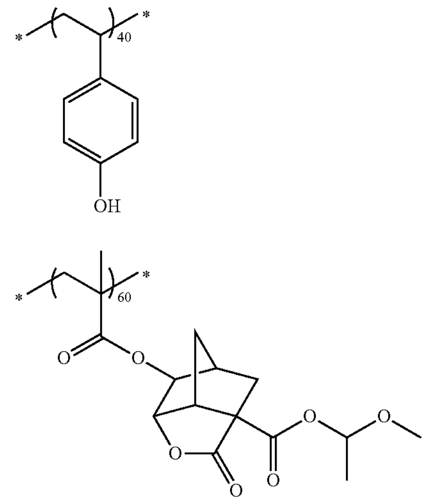
P-59
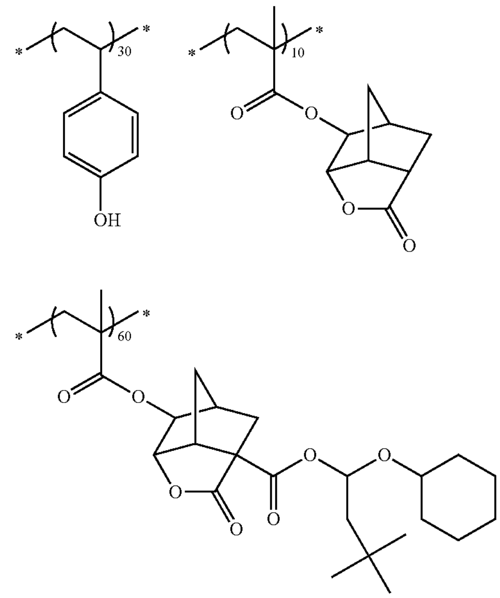
P-60
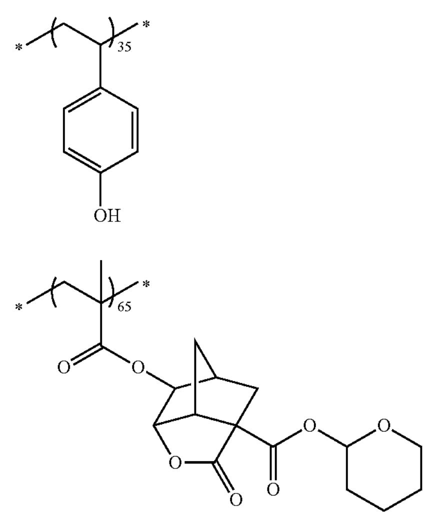

-continued
P-61
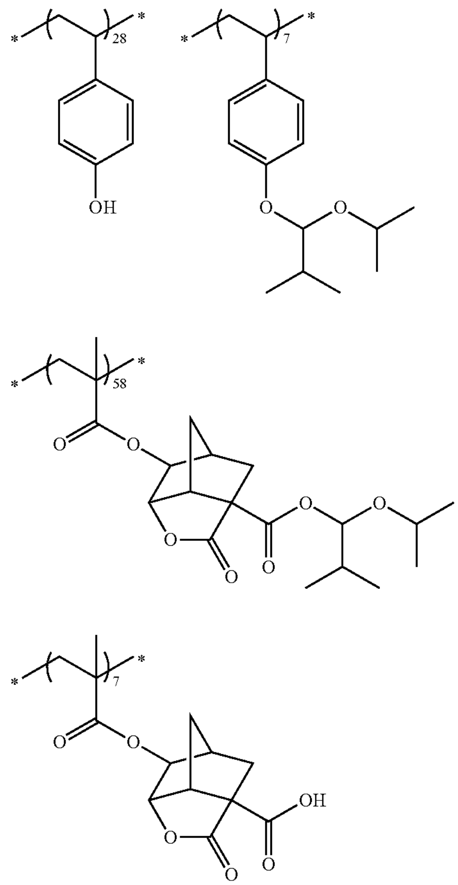
P-62
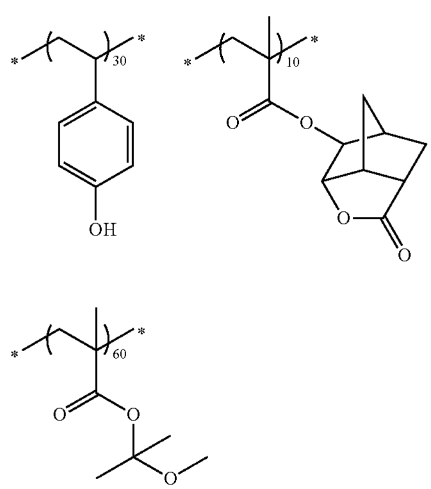
P-63
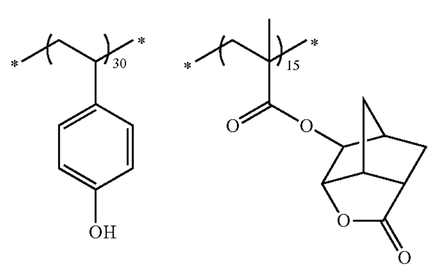
-continued
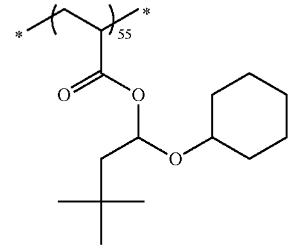
p-64
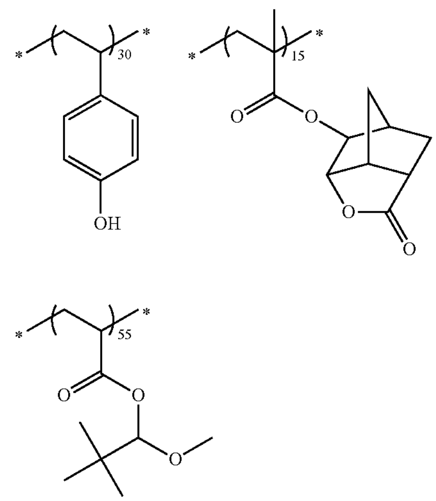
p-65
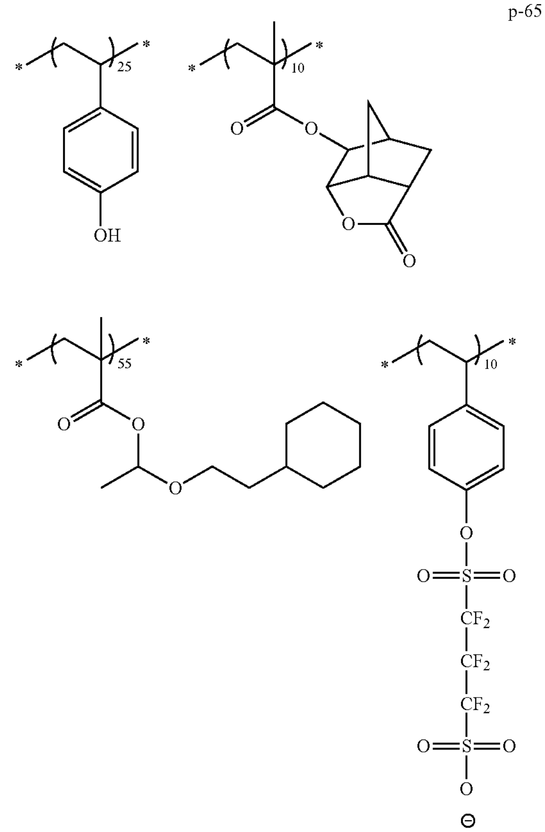

-continued
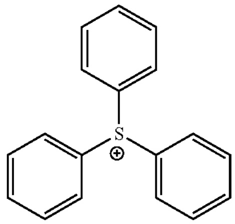
P-66
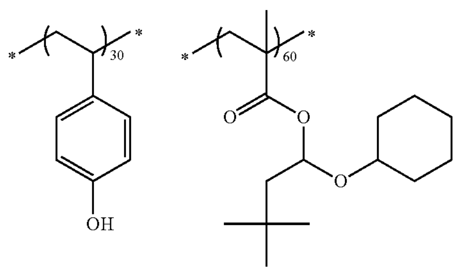
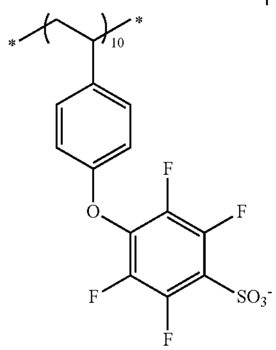
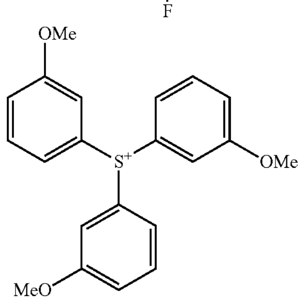
P-67
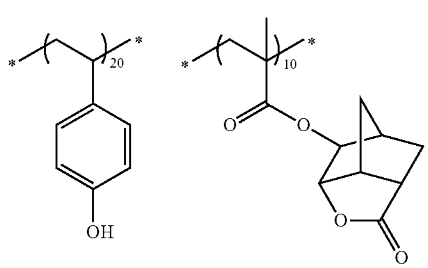
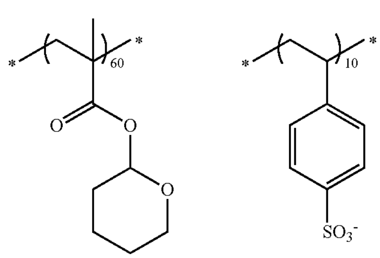
-continued
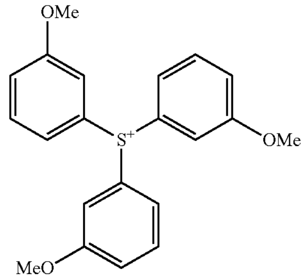
P-68
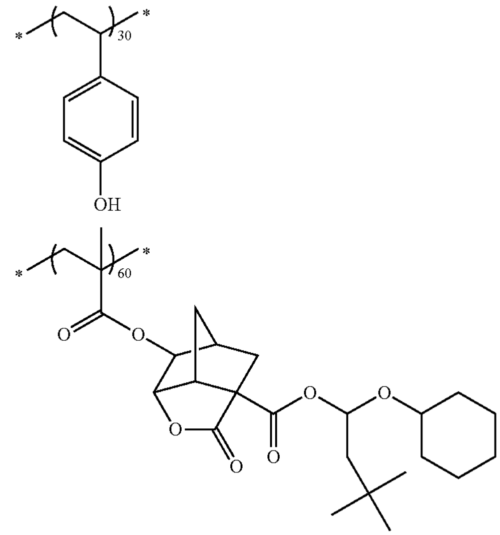
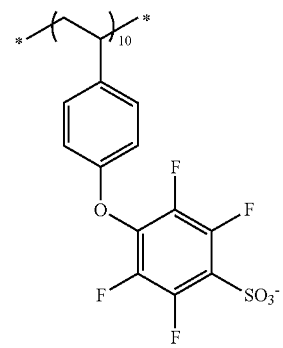
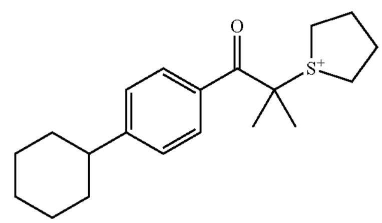
P-69
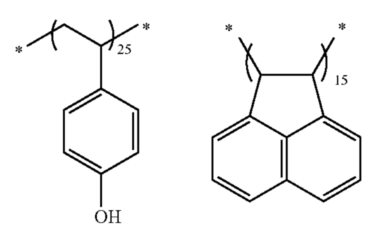

-continued

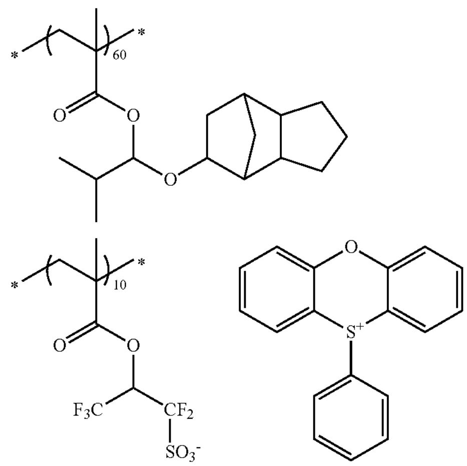

P-70

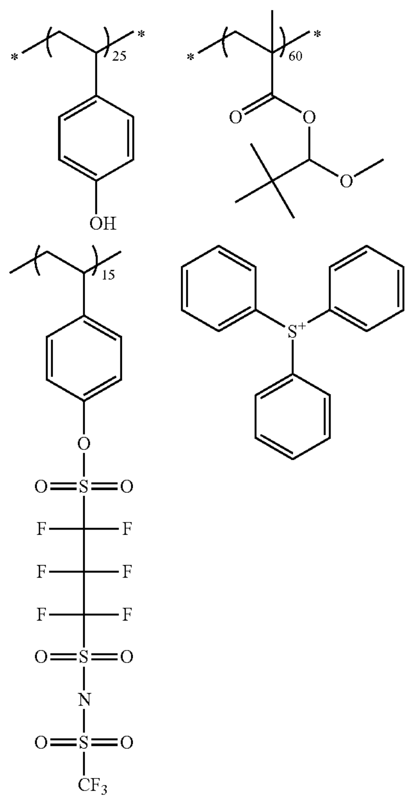

[2] Compound Capable of Generating Acid Upon Irradiation with Actinic Ray or Radiation It is preferred that the composition of the present invention contains a compound (hereinafter, also referred to as "an acid generator") capable of generating an acid upon irradiation with an actinic ray or radiation.

The acid generator is not particularly limited as long as the acid generator is publicly known, but compounds capable of generating an organic acid, for example, at least any one of a sulfonic acid, bis(alkylsulfonyl)imide or tris(alkylsulfonyl)methide upon irradiation with an actinic ray or radiation are preferred.

More preferably, a compound represented by the following Formula (ZI), (ZII) and (ZII) may be exemplified.

(ZI)

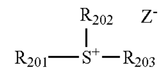

(ZII)

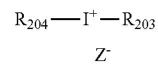

(ZIII)

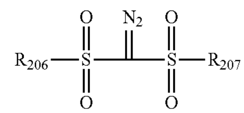

In Formula (ZI),

Each of $R_{201}$, $R_{202}$ and $R_{203}$ independently represents an organic group.

The number of carbon atoms of the organic groups as $R_{201}$, $R_{202}$ and $R_{203}$ is generally 1 to 30, and preferably 1 to 20.

Furthermore, two of $R_{201}$ to $R_{203}$ may be bonded to each other to form a cyclic structure, and an oxygen atom, a sulfur atom, an ester bond, an amide bond, or a carbonyl group may be included in the ring. Examples of a group to be formed by two of $R_{201}$ to $R_{203}$ bonded to each other may include an alkylene group (for example, a butyrene group and a pentylene group).

Z' represents a non-nucleophilic anion (an anion which is extremely low in capability of causing a nucleophilic reaction).

Examples of the non-nucleophilic anion may include a sulfonate anion (an aliphatic sulfonate anion, an aromatic sulfonate anion, a camphor sulfonate anion), a carboxylate anion (an aliphatic carboxylate anion, an aromatic carboxylate anion, an aralkylcarboxylate anion), a sulfonylimide anion, a bis(alkylsulfonyl)imide anion, a tris(alkylsulfonyl) methide anion, and the like.

The aliphatic sites in the aliphatic sulfonate anion and the aliphatic carboxylate anion may be an alkyl group or a cycloalkyl group, and preferred examples thereof may include a straight or branched alkyl group having 1 to 30 carbon atoms and a cycloalkyl group having 3 to 30 carbon.

The aromatic group in the aromatic sulfonate anion and the aromatic carboxylate anion is preferably an aryl group having 6 to 14 carbon atoms, and examples thereof may include a phenyl group, a tolyl group, a naphthyl group, and the like.

The alkyl group, the cycloalkyl group and the aryl group exemplified above may have a substituent. Specific examples thereof may include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms), and the like. With respect to the aryl group and the cyclic structure, which each group has, an alkyl group (preferably having 1 to 15 carbon atoms) as the substituent may be further exemplified.

The aralkyl group in the aralkylcarboxylate anion is preferably an aralkyl group having 7 to 12 carbon atoms, and examples thereof may include a benzyl group, a phenethyl group, a naphthylmethyl group, a naphthylethyl group, a naphthylbuthyl group, and the like.

Examples of the sulfonylimide anion may include a saccharin anion.

The alkyl group in the bis(alkylsulfonyl)imide anion and tris(alkylsulfonyl)methide anion is preferably an alkyl group having 1 to 5 carbon atoms. As the substituents of these alkyl groups, examples thereof may include a halogen atom, an alkyl group substituted with a halogen atom, an alkoxy group, an alkylthio group, an alkyloxysulfonyl group, an aryloxysulfonyl group, a cycloalkylaryloxysulfonyl group, and the like, and a fluorine atom or an alkyl group substituted with a fluorine atom is preferred.

Further, the alkyl groups in the bis(alkylsulfonyl)imide anion may be bonded to each other to form a cyclic structure. Accordingly, acid strength is increased.

As other non-nucleophilic anions, examples thereof may include fluorinated phosphorus (for example, $PF_6^-$), fluorinated boron (for example, $BF_4^-$), fluorinated antimony (for example, $SbF_6^-$), and the like.

As the non-nucleophilic anions, an aliphatic sulfonate anion in which at least the α-position of the sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, and a tris(alkylsulfonyl)methide anion in which the alkyl group is substituted with a fluorine atom are preferred. The non-nucleophilic anions are more preferably an aliphatic perfluorosulfonate anion (further preferably having 4 to 8 carbon atoms), and a benzenesulfonate anion having a fluorine atom, and still more preferably a nonafluorobutanesulfonate anion, a perfluorooctanesulfonate anion, a pentafluorobenzenesulfonate anion, and a 3,5-bis(trifluoromethyl)benzenesulfonate anion.

From the viewpoint of acid strength, a generated acid having a pKa of −1 or less is preferred for improving sensitivity.

In addition, as non-nucleophilic anion, an anion represented by the following Formula (AN1) may also be exemplified as a preferred aspect.

(AN1)

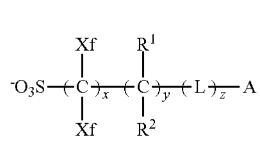

In the formula.

Each Xf independently represents a fluorine atom or an alkyl group substituted with at least one fluorine atom.

Each of $R^1$ and $R^2$ independently represents a hydrogen atom, a fluorine atom, or an alkyl group, and a plurality of $R^1$'s and $R^2$'s may be same or different.

L represents a divalent linking group, and a plurality of L's may be same or different.

A represents a cyclic organic group.

x represents an integer of 1 to 20, y represents an integer of 0 to 10, and z represents an integer of 0 to 10.

Formula (AN1) will be described in more detail.

The alkyl group in the alkyl group substituted with a fluorine atom of Xf is preferably an alkyl group having 1 to 10 carbon atoms, and more preferably 1 to 4 carbon atoms. Furthermore, the alkyl group substituted with a fluorine atom of Xf is preferably a perfluoroalkyl group.

Xf is preferably a fluorine atom or a perfluoroalkyl group having 1 to 4 carbon atoms. Specific examples of Xf may include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2C_2C_3F_7$, $CH_2C_4F_9$, and $CH_2CH_2C_4F_9$, and among them, a fluorine atom and $CF_3$ are preferred. In particular, it is preferred that both Xf are a fluorine atom.

The alkyl group of $R^1$ or $R^2$ may have a substituent (preferably a fluorine atom), and an alkyl group having 1 to 4 carbon atoms is preferred. More preferably, the alkyl group is a perfluoroalkyl group having 1 to 4 carbon atoms. Specific examples of the alkyl group of $R^1$ or $R^2$ having a substituent may include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_2C_4F_9$, and among them, $CF_3$ is preferred.

$R^1$ and $R^2$ are preferably a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent linking group of L is not particularly limited, and examples thereof may include —COO—, —OCO—, —CO—, —O—, —S—, —SO—, —$SO_2$—, an alkylene group, a cycloalkylene group, an alkenylene group, or a linking group obtained by linking a plurality of these groups, and the like, and a linking group having total carbon atoms of 12 or less is preferred. Among them, —COO—, —OCO—, —CO—, and —O— are preferred, and —COO— and —OCO— are more preferred.

The cyclic organic group of A is not particularly limited as long as the organic group has a cyclic structure, and examples thereof may include an alicyclic group, an aryl group, a heterocyclic group (including not only those having an aromatic property but also those having no aromatic property), and the like.

The alicyclic group may be monocyclic or polycyclic, and monocyclic cycloalkyl groups, such as a cyclopentyl group, a cyclohexyl group, and a cyclooctyl group, and polycyclic cycloalkyl groups, such as a norbornyl group, a tricyclodecanyl group, a tetracyclodecanyl group, a tetracyclododecanyl group, and an adamantyl group are preferred. Among them, alicyclic groups having 7 or more carbon atoms and a bulky structure, such as a norbornyl group, a tricyclodecanyl group, a tetracyclodecanyl group, a tetracyclododecanyl group, and an adamantyl group, are preferred from the viewpoint of the improvement of MEEF because it is possible to suppress diffusibility in a film in the heating process after exposure.

Examples of the aryl group may include a benzene ring, a naphthalene ring, a phenanthrene ring, and an anthracene ring.

Examples of the heterocyclic group may include groups derived from a furan ring, a thiophene ring, a benzofuran ring, a benzothiophenc ring, a dibenzofuran ring, a dibenzothiophene ring, or a pyridine ring. Among them, those derived from a furan ring, a thiophene ring, and a pyridine ring are preferred.

Furthermore, examples of the cyclic organic group also include lactone structures, and specific examples thereof may include a lactone structures represented by any of the above-described Formulae (LC-1) to (LC1-17) which may be possessed by the resin (A).

The above cyclic organic groups may have a substituent, and examples of the substituent include an alkyl group (which may be straight, branched or cyclic, and preferably has 1 to 12 carbon atoms), a cycloalkyl group (which may be monocyclic, polycyclic or spirocyclic, and preferably has 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, a sulfonic ester group, and the like. Meanwhile, carbon atoms for constituting the cyclic organic group (carbon atoms contributing to the formation of a ring) may be carbonyl carbon atoms.

Examples of the organic groups of $R_{201}$, $R_{202}$ and $R_{203}$ may include an aryl group, an alkyl group, a cycloalkyl group, and the like.

It is preferred that at least one of $R_{201}$, $R_{202}$ and $R_{203}$ is an aryl group, and more preferred that all of three are an aryl group. As the aryl group, in addition to a phenyl group, a naphthyl group, and the like, a heteroaryl group such as an indole residue and a pyrrole residue is also possible. Preferred examples of the alkyl group and the cycloalkyl group of $R_{201}$ to $R_{203}$ include a straight or branched alkyl group having 1 to 10 carbon atoms, and a cycloalkyl group having 3 to 10 carbon atoms. More preferred examples of the alkyl group include a methyl group, an ethyl group, an n-propyl group, an i-propyl group, an n-butyl group, and the like. More preferred examples of the cycloalkyl group include a cyclopropyl group, a cyclobutyl group, a cyclopentyl group, a cyclohexyl group, a cycloheptyl group, and the like. These groups may further have a substituent. Examples of the substituent may include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), and the like, but the substituent is not limited thereto.

Further, when two of $R_{201}$ to $R_{203}$ are bonded to each other to form a cyclic structure, the structure is preferably a structure represented by the following Formula (A1).

(A1)

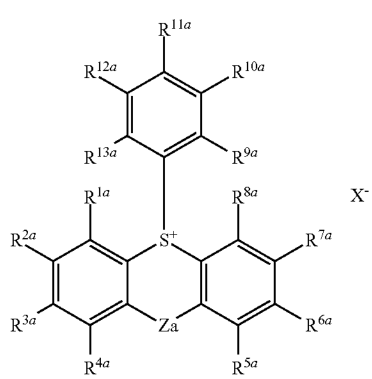

In Formula (A1),

Each of $R^{1a}$ to $R^{13a}$ independently represents a hydrogen atom or a substituent.

Substituents in which one to three of $R^{1a}$ to $R^{13a}$ are not a hydrogen atom are preferred, and substituents in which any one of $R^{9a}$ to $R^{13a}$ is not a hydrogen atom are more preferred.

Za is a single bond or a divalent linking group.

$X^-$ has the same meaning as $Z^-$ in Formula (ZI).

When each of $R^{1a}$ to $R^{13a}$ is not a hydrogen atom, the specific examples thereof may include a halogen atom, a straight, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinylamino group, a phosphono group, a silyl group, a hydrazino group, a ureido group, a boronic acid group ($—B(OH)_2$), a phosphato group ($—OPO(OH)_2$), a sulfato group ($—OSO_3H$), and other publicly known substituents.

When each of $R^{1a}$ to $R^{13a}$ is not a hydrogen atom, a straight, branched or cyclic alkyl group substituted with a hydroxyl group is preferred.

Examples of the divalent linking group of Za may include an alkylene group, an arylene group, a carbonyl group, a sulfonyl group, a carbonyloxy group, a carbonylamino group, a sulfonylamide group, an ether bond, a thioether bond, an amino group, a disulfide group, $—(CH_2)_n—CO—$, $—(CH_2)—SO_2—$, $—CH{=}CH—$, an aminocarbonylamino group, an aminosulfonylamino group, and the like (n is an integer of 1 to 3).

Meanwhile, examples of preferred structures in a case where at least one of $R_{201}$, $R_{202}$ and $R_{203}$ is not an aryl group include cationic structures, such as the compounds exemplified in paragraphs 0046, 0047 and 0048 of Japanese Patent Application Laid-Open No. 2004-233661 and paragraphs 0040 to 0046 of Japanese Patent Application Laid-Open No. 2003-35948, compounds exemplified as Formulae (I-1) to (I-70) of U.S. Patent Application Publication No. 2003/0224288A1, and compounds exemplified as Formulae (IA-1) to (IA-54) and Formulae (IB-1) to (IB-24) in U.S. Patent Application Publication No. 2003/0077540A1.

In Formulae (ZII) and (ZIII),

Each of $R_{204}$ to $R_{207}$ independently represents an aryl group, an alkyl group or a cycloalkyl group.

The aryl group, the alkyl group and the cycloalkyl group of $R_{204}$ to $R_{207}$ are the same as the aryl group described as the alkyl group, the alkyl group, and the cycloalkyl group of $R_{201}$ to $R_{203}$ in the above-described compound (ZI).

The aryl group, the alkyl group and the cycloalkyl group of $R_{204}$ to $R_{207}$ may have a substituent. Examples of the substituent may include those which may be possessed by the aryl group, the alkyl group and the cycloalkyl group of $R_{201}$ to $R_{203}$ in the above-described compound (ZI).

$Z^-$ represents a non-nucleophilic anion, and examples thereof may include those which are the same as the non-nucleophilic anions of Z in Formula (ZI).

Examples of the acid generator may also include the compounds represented by the following Formulae (ZIV), (ZV) and (ZVI).

(ZIV)

$$Ar_3—SO_2—SO_2—Ar_4$$

(ZV)

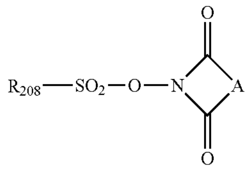

(ZVI)

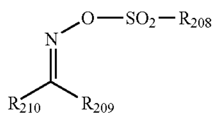

In Formulae (ZIV) to (ZVI),

Each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$, and $R_{210}$ may include those which are the same as specific examples of the aryl group as $R_{201}$, $R_{202}$ and $R_{203}$ in Formula (ZI).

Specific examples of the alkyl group and the cycloalkyl group of $R_{208}$, $R_{209}$ and $R_{210}$ may include those which are the same as specific examples of the alkyl group and the cycloalkyl group as $R_{201}$, $R_{202}$ and $R_{203}$ in Formula (ZI), respectively.

Examples of the alkylene group of A may include an alkylene group having 1 to 12 carbon atoms (for example, a methylene group, an ethylene group, a propylene group, an isopropylene group, a butylene group, an isobutylene group, and the like), examples of the alkenylene group of A may include an alkenylene group having 2 to 12 carbon atoms (for example, an ethynylene group, a propenylene group, a butenylene group, and the like), and examples of the arylene group of A may include an arylene group having 6 to 10 carbon atoms (for example, a phenylene group, a tolylene group, a naphthylene group, and the like).

Among the acid generators, particularly preferred examples will be shown below.

(z1)

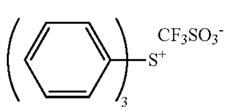

(z2)

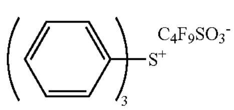

(z3)

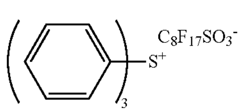

-continued (z4)

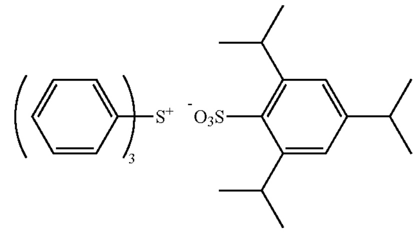

(z5)

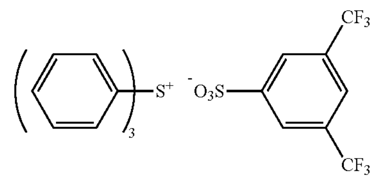

(z6)

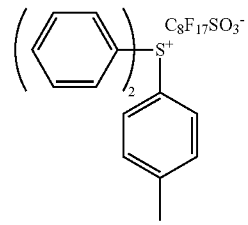

(z7)

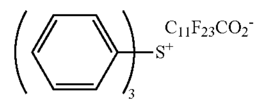

(z8)

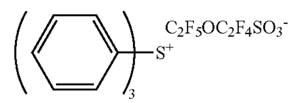

(z9)

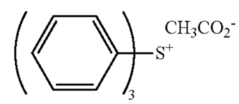

(z10)

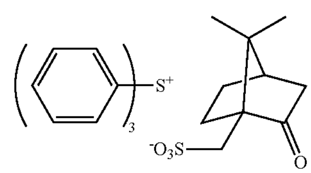

(z11)

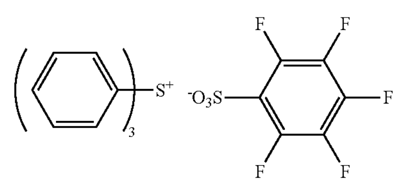

(z12)

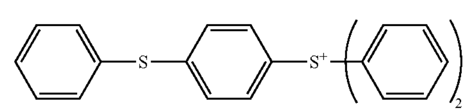

(z13)

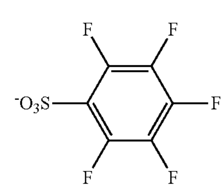

-continued
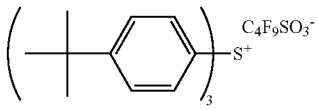
(z14)
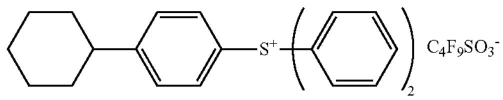
(z15)
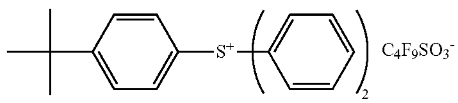
(z16)
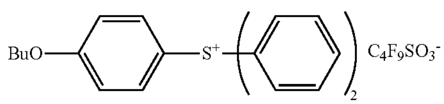
(z17)
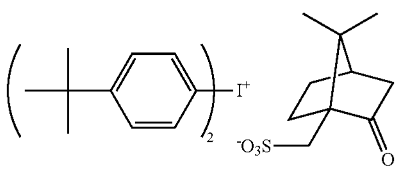
(z18)
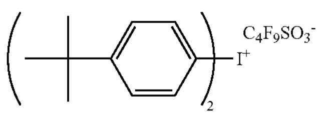
(z19)
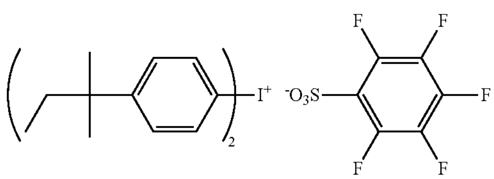
(z20)
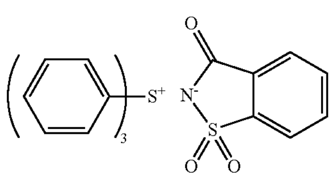
(z21)
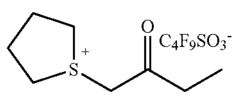
(z22)
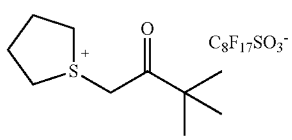
(z23)
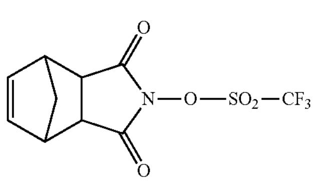
-continued
(z24)
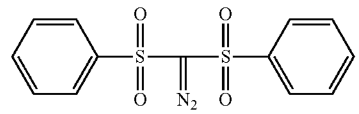
(z25)
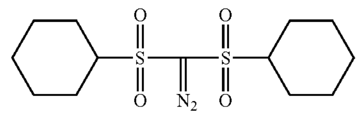
(z26)
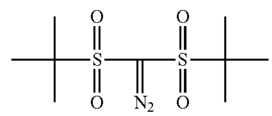
(z27)
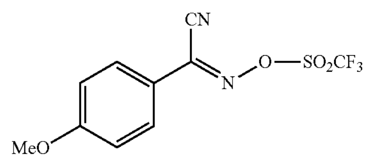
(z28)
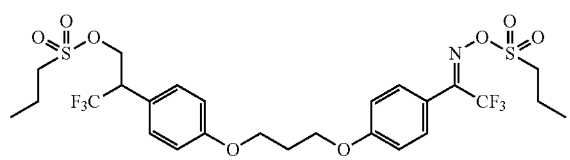
(z29)
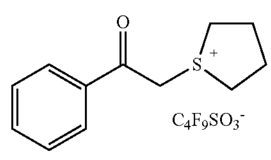
(z30)
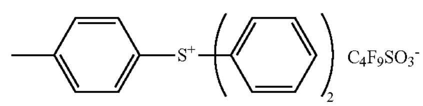
(z31)
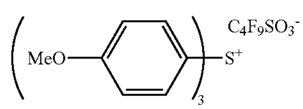
(z32)
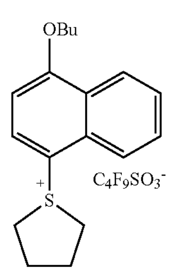
(z33)
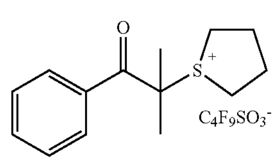

-continued
(z34)
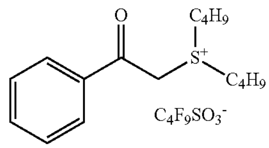
(z35)
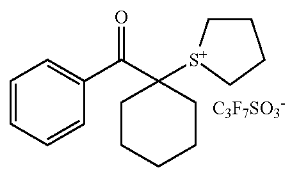
(z36)
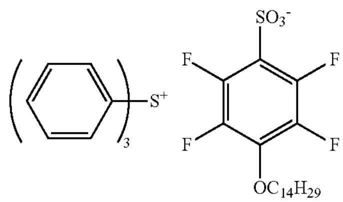
(z37)
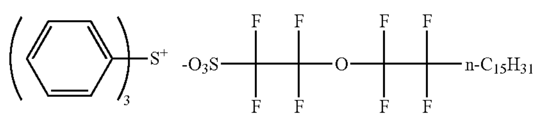
(z38)
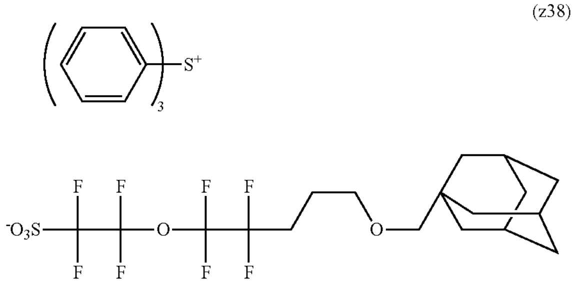
(z39)
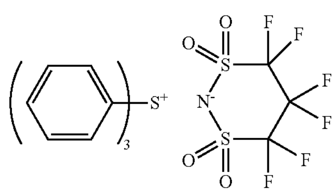
(z40)
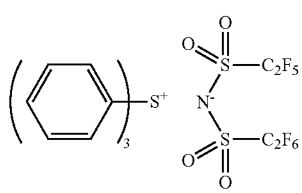
(z41)
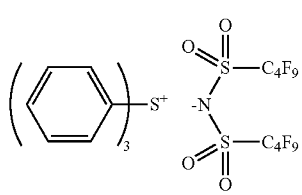
-continued
(z42)
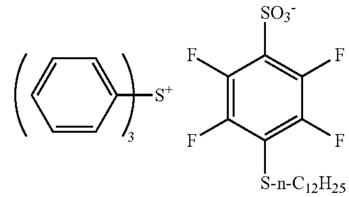
(z43)
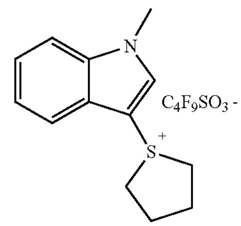
(z44)
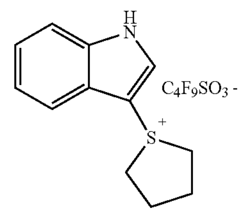
(z45)
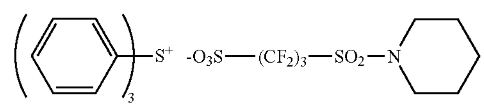
(z46)
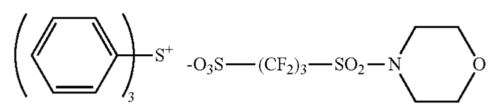
(z47)
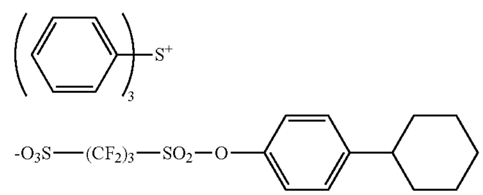
(z48)
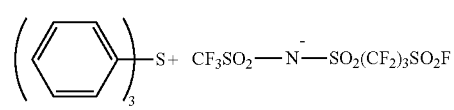
(z49)
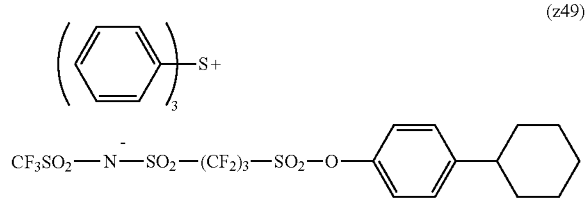
(z50)
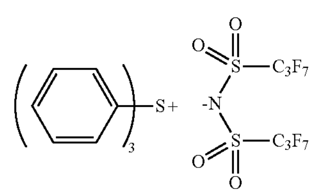

-continued
(z51)
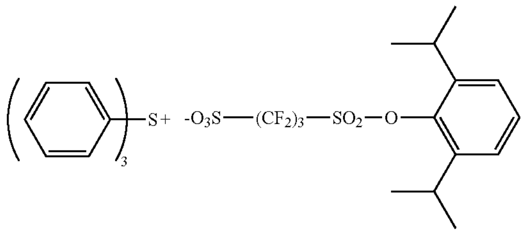
(z52)
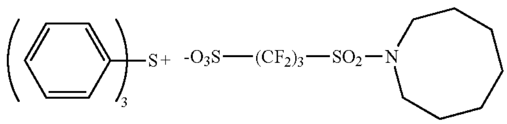
(z53)
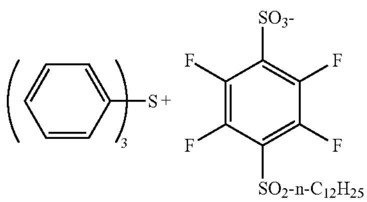
(z54)
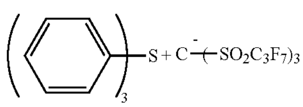
(z55)
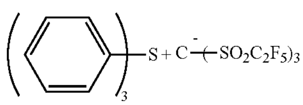
(z56)
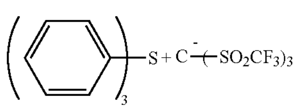
(z57)
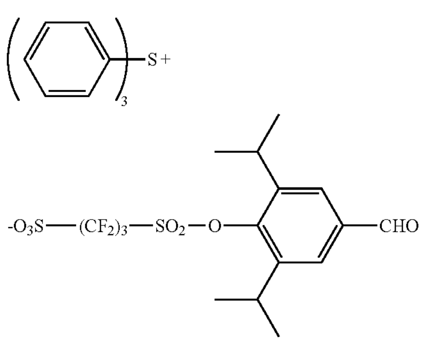
(z58)
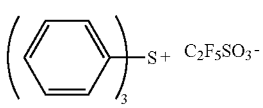
(z59)
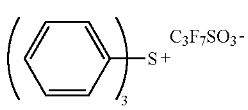
(z60)
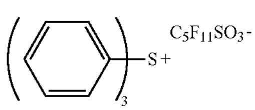
-continued
(z61)
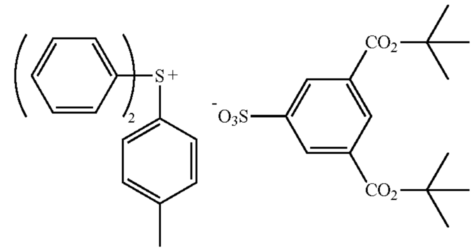
(z62)
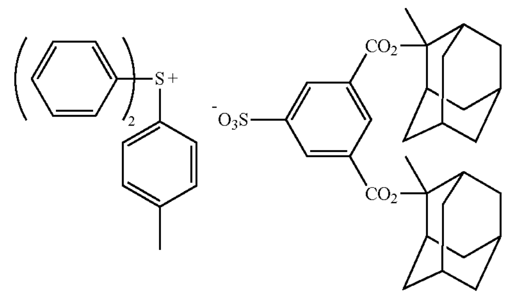
(z63)
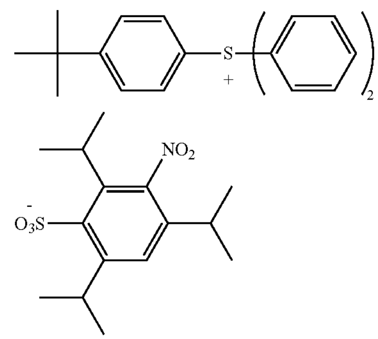
(z64)
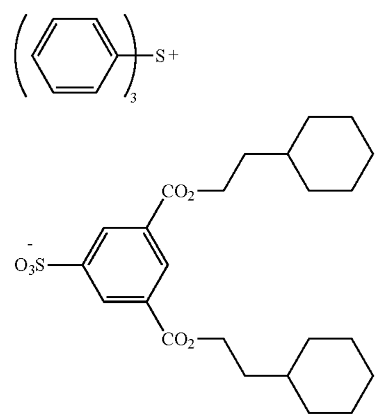
(z65)
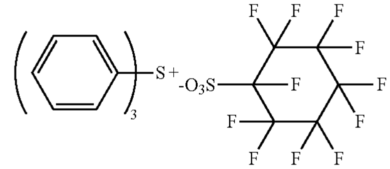
(z66)
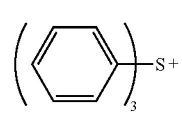

-continued
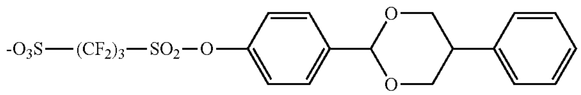
(z67)
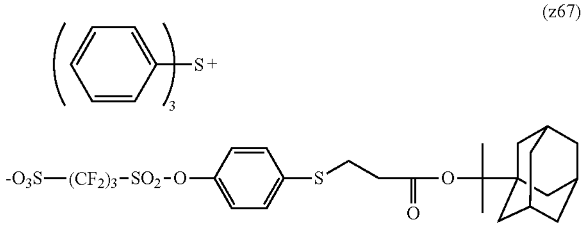
(z68)
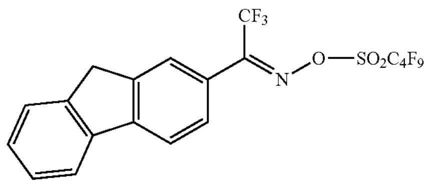
(z69)
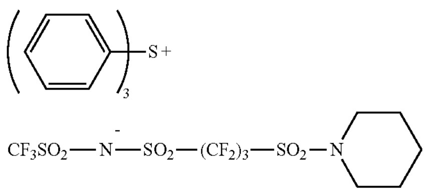
(z70)
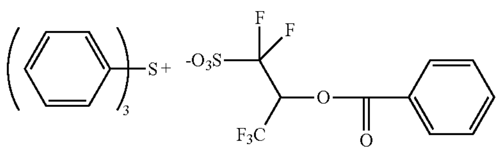
(z71)
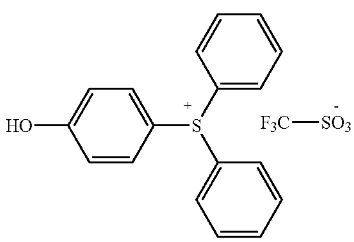
(z72)
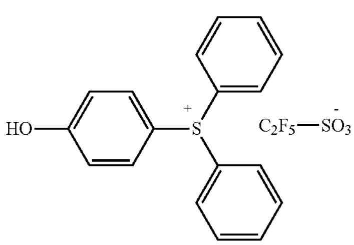
(z73)
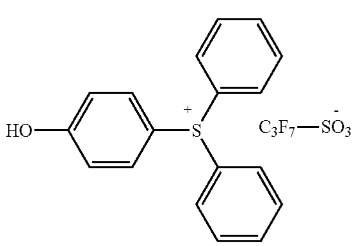
-continued
(z74)
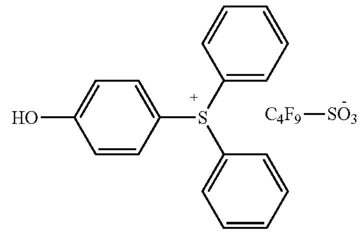
(z75)
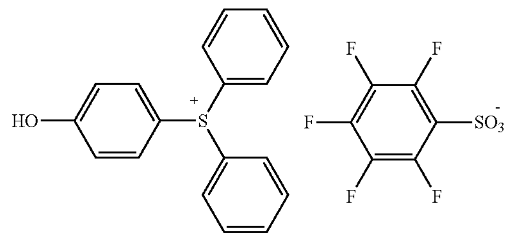
(z76)
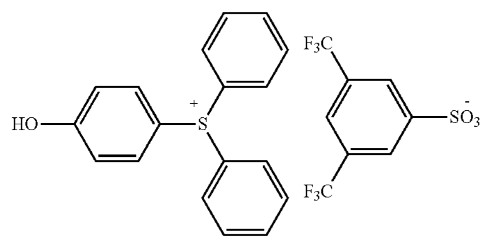
(z77)
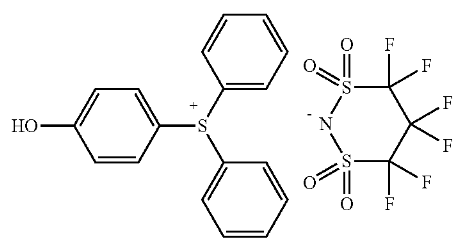
(z78)
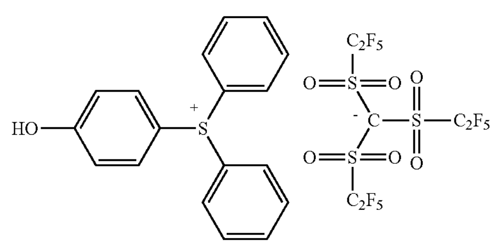
(z79)
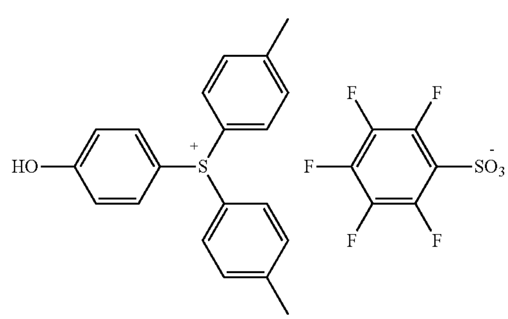

-continued
(z80)
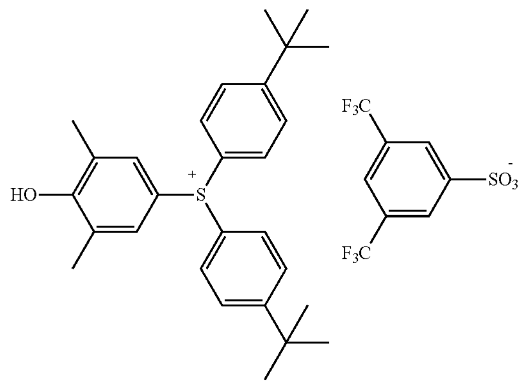
(z81)
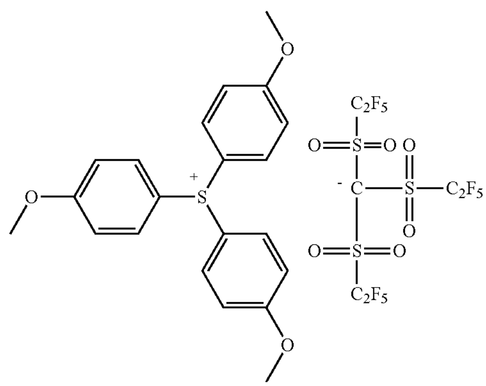
(z82)
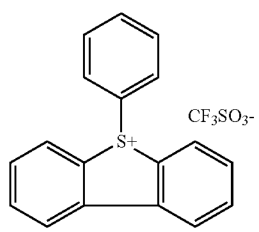
(z83)
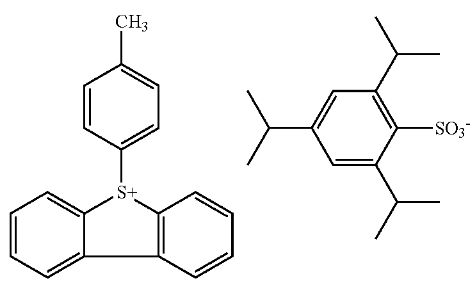
(z84)
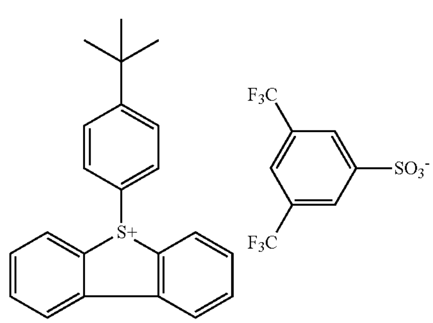
-continued
(z85)
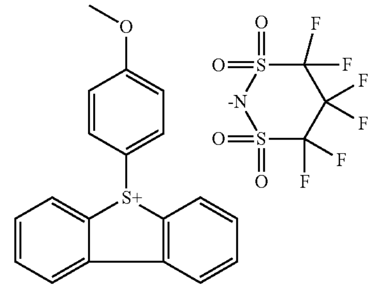
(z86)
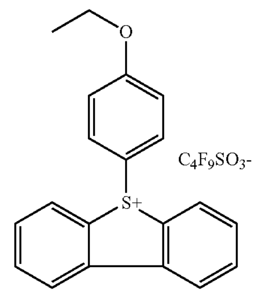
(z87)
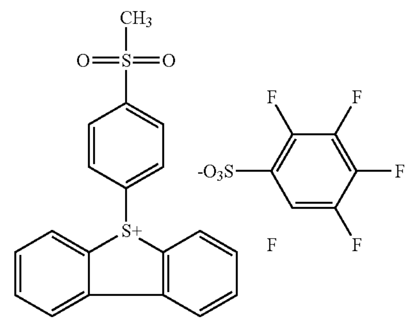
(z88)
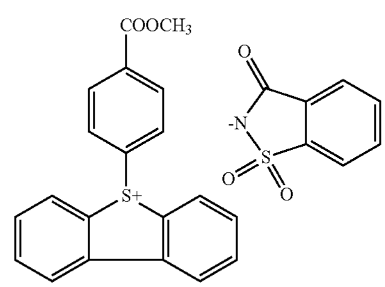
(z89)
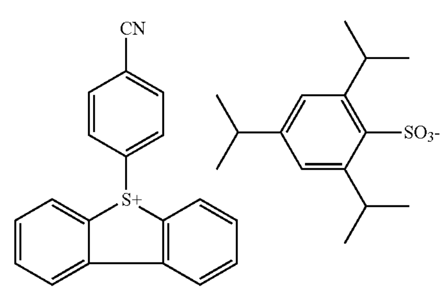

-continued
(z90)
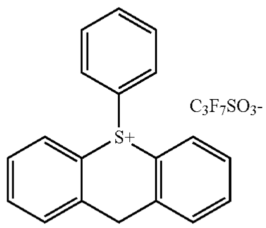
(z91)
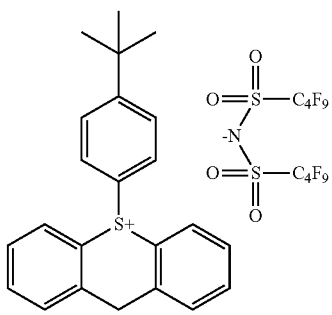
(z92)
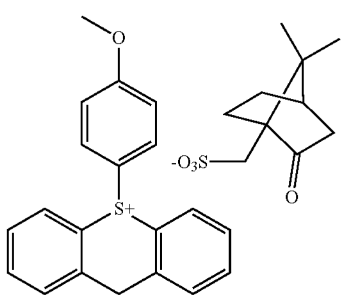
(z93)
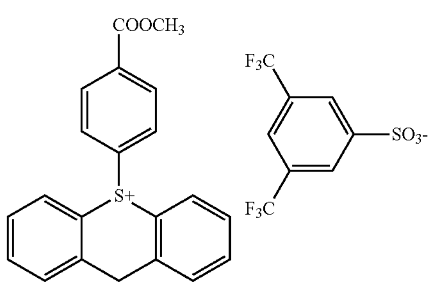
(z94)
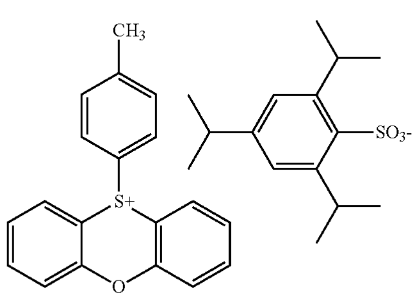
-continued
(z95)
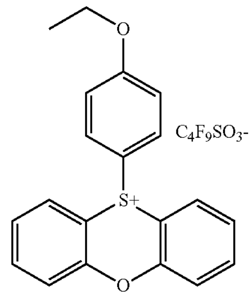
(z96)
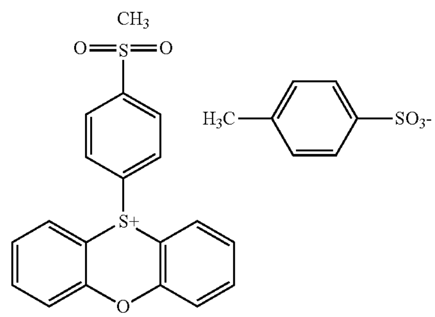
(z97)
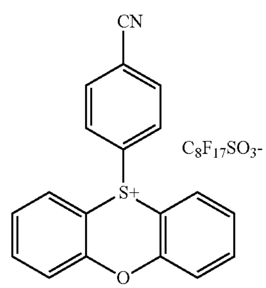
(z98)
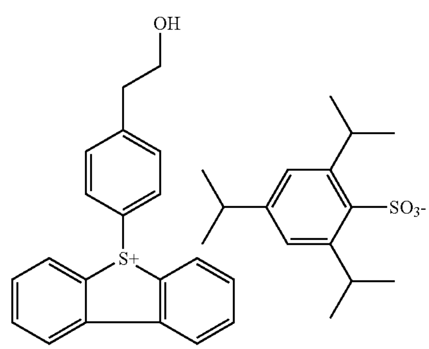
(z99)
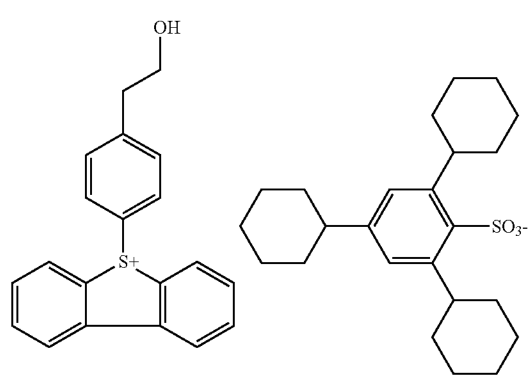

-continued
(z100)
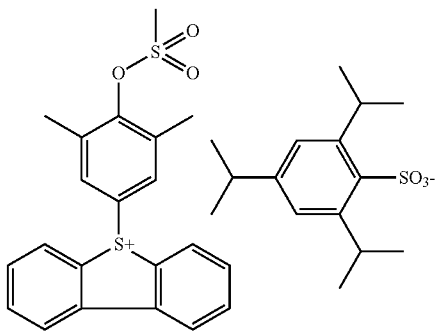
(z101)
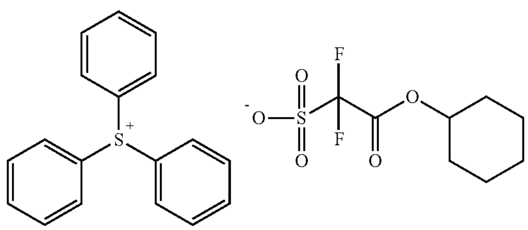
(z102)
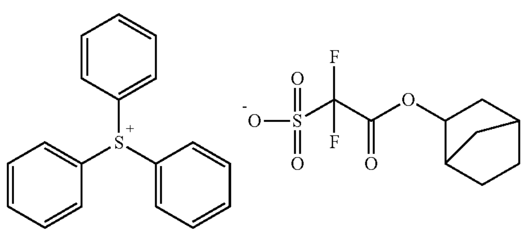
(z103)
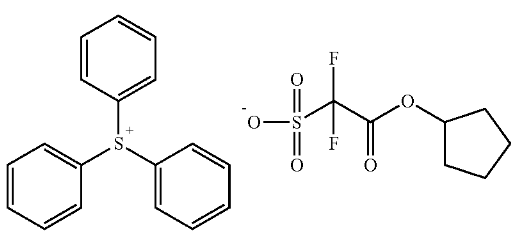
(z104)
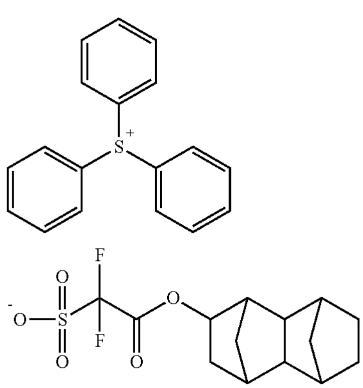
-continued
(z105)
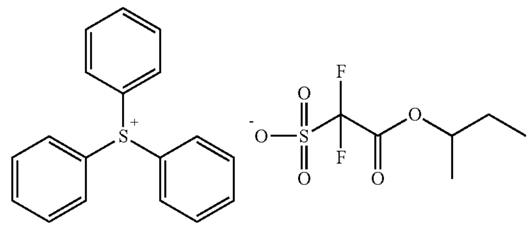
(z106)
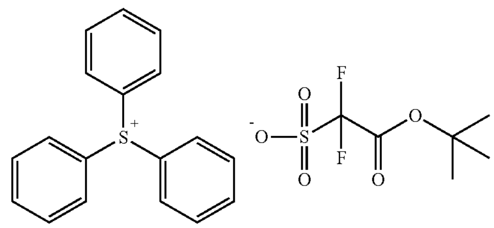
(z107)
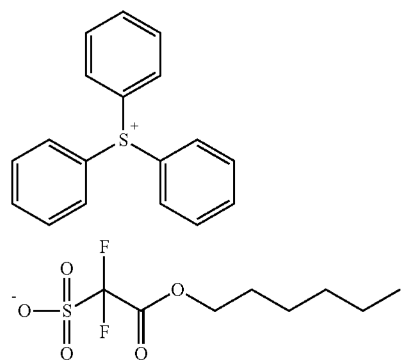
(z108)
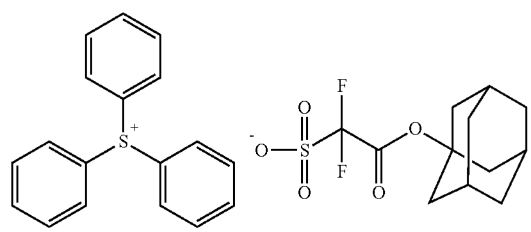
(z109)
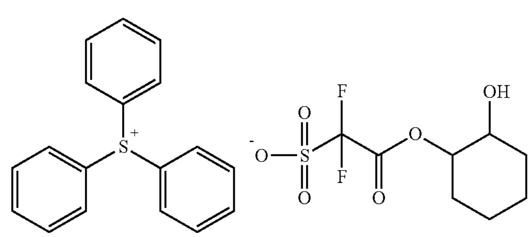
(z110)
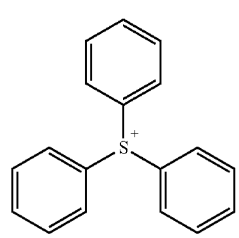

-continued
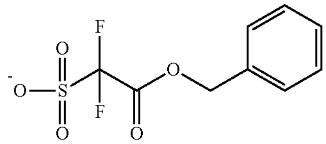
(z111)
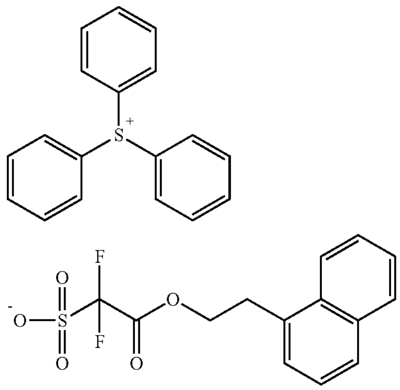
(z112)
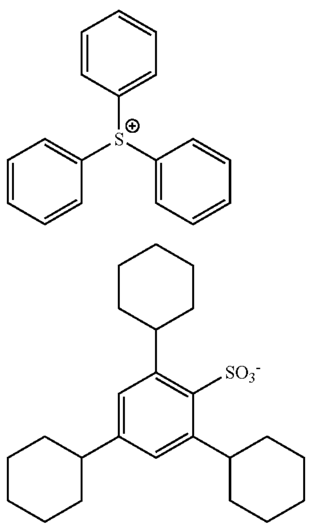
(z113)
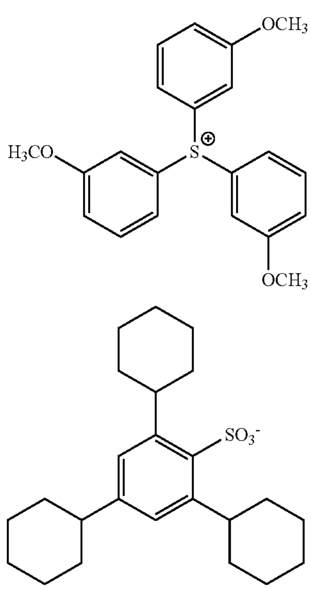
-continued
(z114)
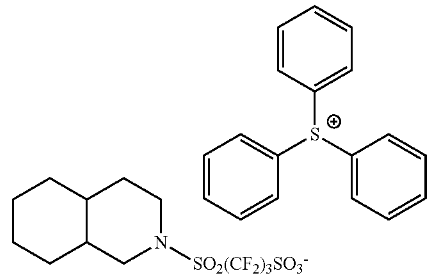
(z115)
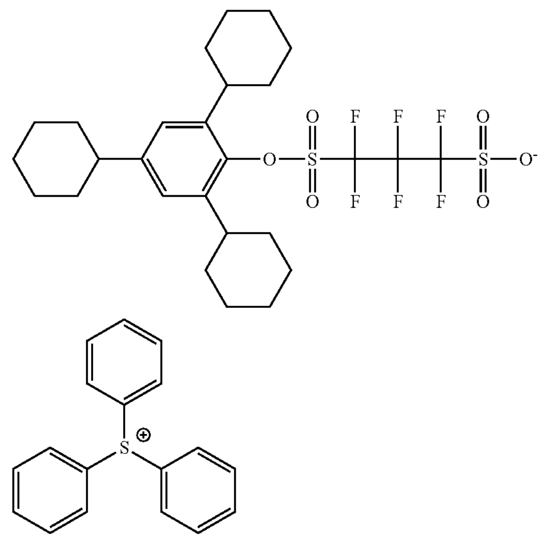
(z116)
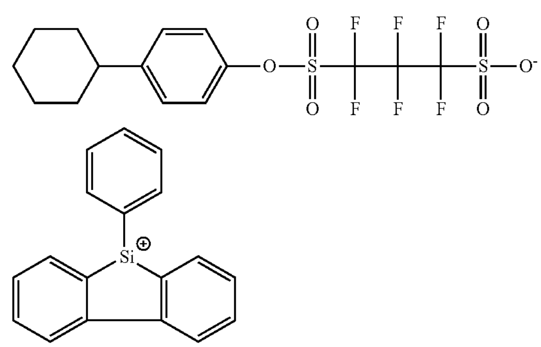
(z117)
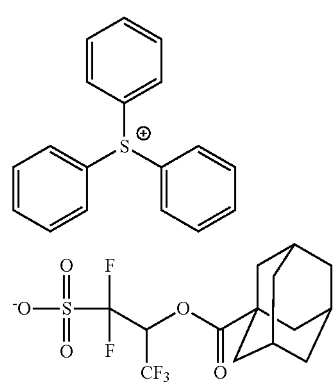

-continued
(z118)
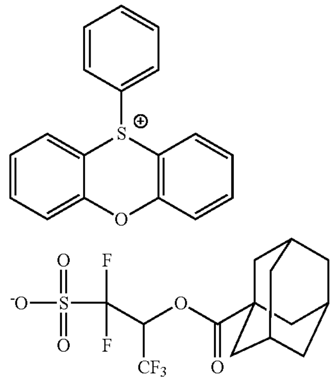
(z119)
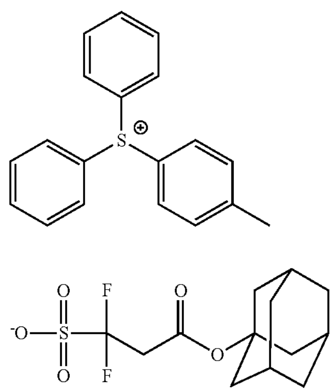
(z120)
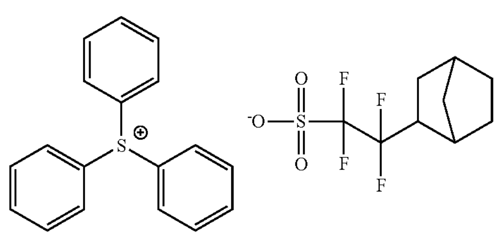
(z121)
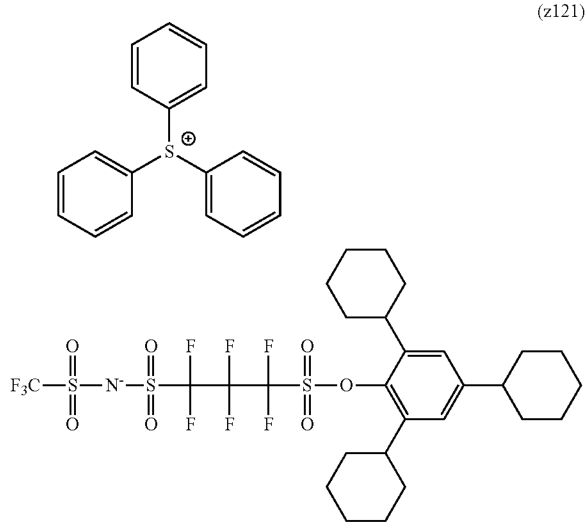
-continued
(z122)
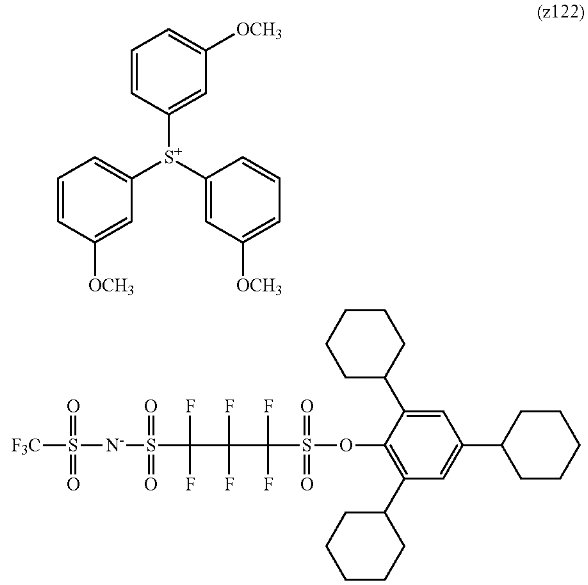
(z123)
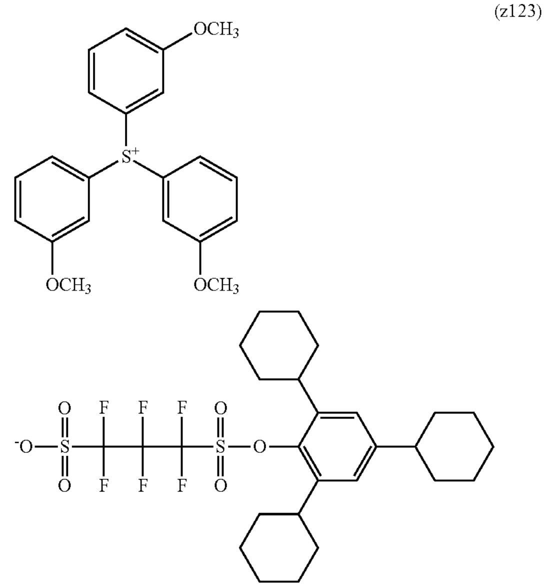
(z124)
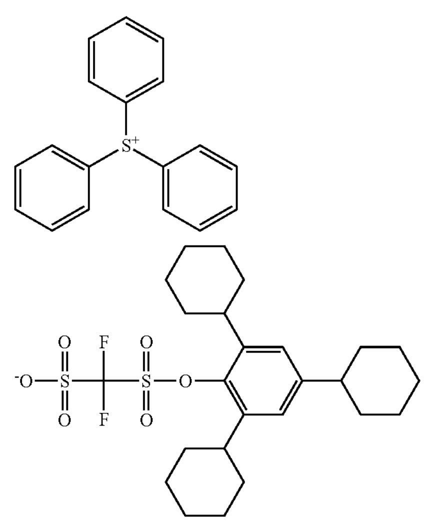

-continued (z125)

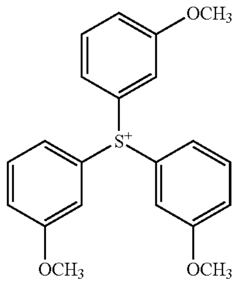

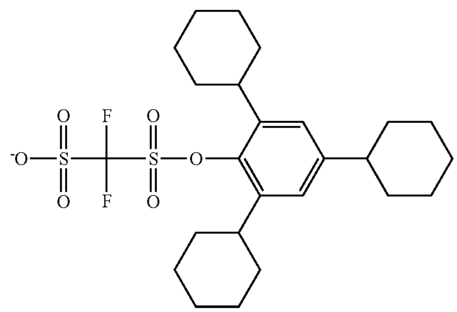

(z126)

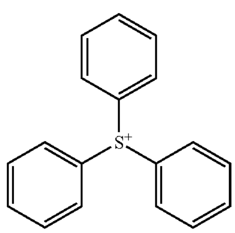

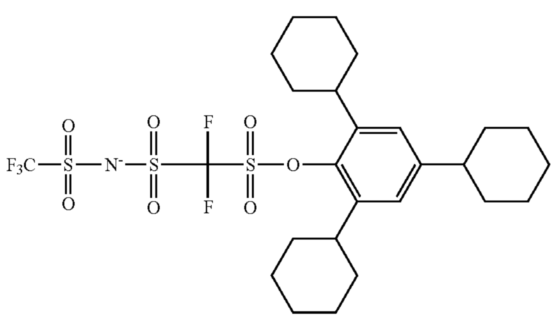

(z127)

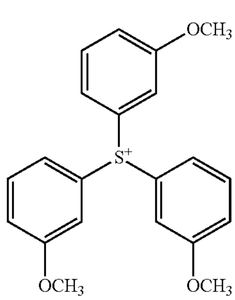

-continued

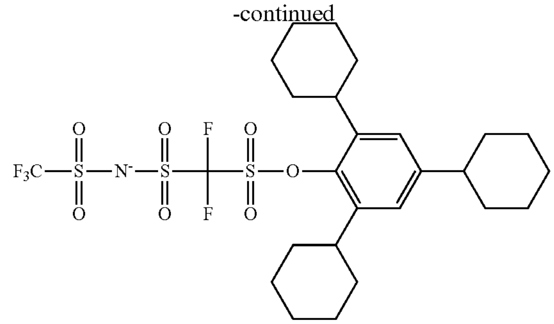

The acid generators may be used either alone or in combination of two or more thereof.

In addition, the content of the acid generator is 0.1 to 50% by mass, more preferably 0.5 to 45% by mass, and still more preferably 1 to 40% by mass, based on the total solid content of the composition.

[3] Solvent (Coating Solvent)

The solvents which may be used in preparing the composition are not particularly limited as long as the solvents dissolve each component, but examples thereof may include alkylene glycol monoalkyl ether carboxylate (propylene glycol monomethyl ether acetate (PGMEA; also known as 1-methoxy-2-acetoxypropane), and the like), alkylene glycol monoalkyl ether (propylene glycol monomethyl ether (PGME; 1-methoxy-2-propanol, and the like), alkyl lactate esters (ethyl lactate, methyl lactate, and the like), cyclic lactone (γ-butyrolactone, and the like, preferably having 4 to 10 carbon atoms), chained or cyclic ketone (2-heptanone, cyclohexanone, and the like, preferably having 4 to 10 carbon atoms), alkylene carbonate (ethylene carbonate, propylene carbonate, etc.), alkyl carboxylate (alkyl acetate such as butyl acetate is preferred), alkyl alkoxyacetate (ethyl ethoxypropionate), and the like. Examples of other usable solvents include the solvents described from paragraph no. [0244] of U.S. Patent Application Publication No. 2008/0248425A1.

Among the aforementioned solvents, alkylene glycol monoalkyl ether carboxylate and alkylene glycol monoalkyl ether are preferred.

These solvents may be used either alone or in mixture of two or more thereof. When two or more kinds are mixed, it is preferred to mix a solvent which has a hydroxyl group and a solvent which does not have a hydroxyl group. The mass ratio of the organic solvent which has a hydroxyl group and the organic solvent which does not have a hydroxyl group is 1/99 to 99/1, preferably 10/90 to 90/10, and more preferably 20/80 to 60/40.

As the solvent which has a hydroxyl group, alkylene glycol monoalkyl ether is preferred, and as the solvent which does not have a hydroxyl group, alkylene glycol monoalkyl ether carboxylate is preferred.

[4] Basic Compound

The actinic ray-sensitive or radiation-sensitive composition according to the present invention may further include a basic compound. The basic compound is preferably a compound which is more basic than phenol. Furthermore, the basic compound is preferably an organic basic compound, and more preferably a nitrogen-containing basic compound.

Usable nitrogen-containing basic compounds are not particularly limited but, for example, compounds classified into the following (A) to (G) may be used.

(A) Compound Represented by Formula (BS-1)

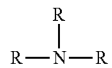

(BS-1)

In Formula (BS-1),

Each R independently represents a hydrogen atom or an organic group. However, at least one of three R's is an organic group. The organic group is a straight or branched alkyl group, a monocyclic or polycyclic cycloalkyl group, an aryl group, or an aralkyl group.

The number of carbon atoms of the alkyl group as R is not particularly limited, but is usually 1 to 20, and preferably 1 to 12.

The number of carbon atoms of the cycloalkyl group as R is not particularly limited, but is usually 3 to 20, and preferably 5 to 15.

The number of carbon atoms of the aryl group as R is not particularly limited, but is usually 6 to 20, and preferably 6 to 10. Specific examples thereof may include a phenyl group, a naphthyl group, and the like.

The number of carbon atoms of the aralkyl group as R is not particularly limited, but is usually 7 to 20, and preferably 7 to 11. Specific examples thereof may include a benzyl group, and the like.

In the alkyl group, the cycloalkyl group, the aryl group, and the aralkyl group as R, a hydrogen atom may be substituted with a substituent. Examples of the substituent may include an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group, and the like.

Meanwhile, it is preferred that at least two of the R's in the compound represented by Formula (BS-1) are organic groups.

Specific examples of the compound represented by Formula (BS-1) may include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropyl aniline, and 2,4,6-tri(t-butyl)aniline.

Further, examples of the preferable basic compound represented by Formula (BS-1) may include an alkyl group in which at least one of R's is substituted with a hydroxyl group. Specifically, examples thereof may include triethanolamine and N,N-dihydroxy ethyl aniline.

Meanwhile, the alkyl group as R may have an oxygen atom in the alkyl chain. That is, an oxyalkylene chain may be formed. As the oxyalkylene chain, —$CH_2CH_2O$— is preferred. Specifically, examples thereof may include tris(methoxyethoxyethyl)amine, and compounds which are exemplified from column 3, line 60 in U.S. Pat. No. 6,040,112.

Examples of the basic compound represented by Formula (BS-1) include the following compounds.

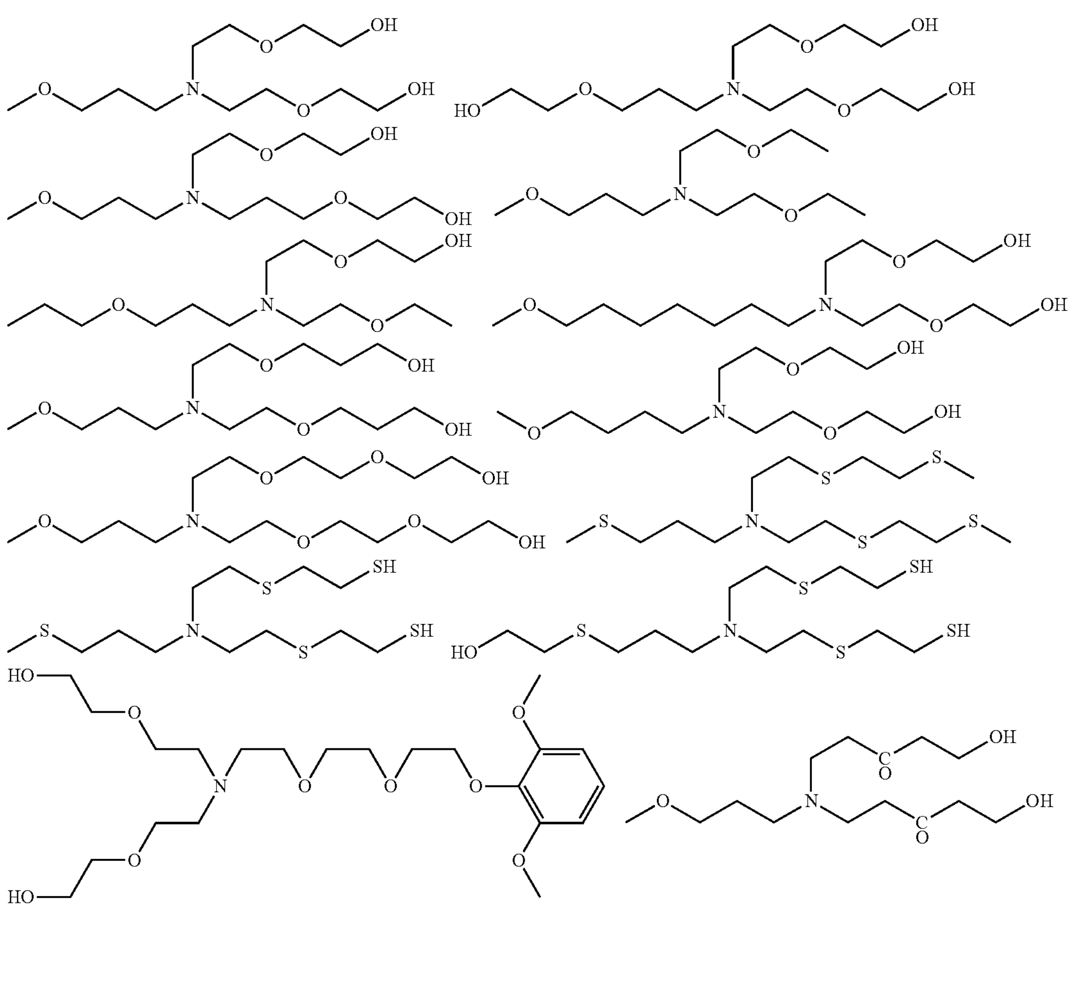

-continued

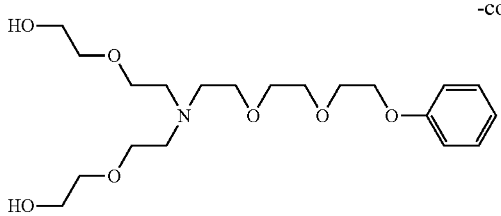

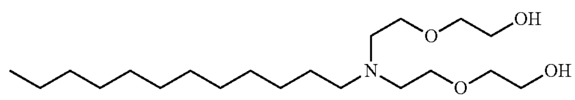

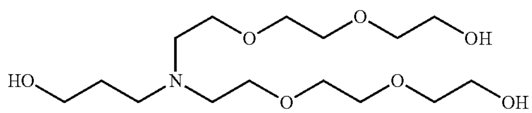

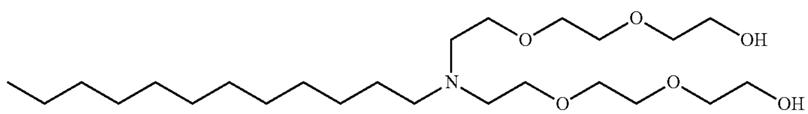

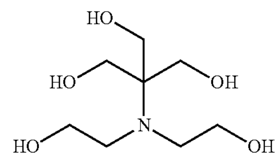

Compound Having Nitrogen-Containing Heterocyclic Structure

The nitrogen-containing heterocycle may or may not have an aromatic property. In addition, the nitrogen-containing heterocycle may have a plurality of nitrogen atoms. Furthermore, the heterocycle may contain a heteroatom other than nitrogen. Specifically, examples thereof may include a compound having an imidazole structure (2-phenylbenzimidazole, 2,4,5-triphenylimidazole, and the like), a compound having a piperidine structure (N-hydroxyethylpiperidine, bis(1,2,2,6,6-pentamethyl-4-piperidyl)sebacate, and the like), a compound having a pyridine structure (4-dimethylaminopyridine and the like), and a compound having an antipyrine structure (antipyrine, hydroxyantipyrine, and the like).

In addition, a compound having two or more ring structures may also be suitably used. Specifically, examples thereof may include 1,5-diazabicyclo[4.3.0]nona-5-ene and 1,8-diazabicyclo[5.4.0]undeca-7-ene.

(3) Amine Compound Having Phenoxy Group

An amine compound having a phenoxy group is a compound where a phenoxy group is provided at the terminal at the side opposite to the N atom of the alkyl group which the amine compound includes. The phenoxy group may have a substituent such as, for example, an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group.

The compound more preferably has at least one oxyalkylene chain between the phenoxy group and the nitrogen atom. The number of oxyalkylene chains in one molecule is preferably 3 to 9, and more preferably 4 to 6. Among the oxyalkylene chains, —$CH_2CH_2O$— is particularly preferred.

Specific examples may include 2-[2-2-(2,2-dimethoxyphenoxyethoxy)ethyl-bis-(2-methoxyethyl)]-amine, and Compounds (C1-1) to (C3-3) exemplified in paragraph no. [0066] of US2007/0224539A1.

The amine compound having a phenoxy group is, for example, obtained by reacting a primary or secondary amine having a phenoxy group with a haloalkyl ether under heating, adding an aqueous solution of strong base such as sodium hydroxide, potassium hydroxide and tetraalkylammonium, and then performing extraction with an organic solvent such as ethyl acetate and chloroform. Furthermore, the amine compound having a phenoxy group may also be obtained by reacting a primary or secondary amine with a haloalkyl ether having a phenoxy group at the terminal under heating, adding an aqueous solution of strong base such as sodium hydroxide, potassium hydroxide and tetraalkylammonium, and then performing extraction with an organic solvent such as ethyl acetate and chloroform.

(D) Ammonium Salt

As the basic compound, an ammonium salt may also be appropriately used. Examples of the anion of the ammonium salt include halide, sulfonate, borate, and phosphate. Among them, halide and sulfonate are particularly preferred.

As the halide, chloride, bromide and iodide are particularly preferred.

As the sulfonate, an organic sulfonate having 1 to 20 carbon atoms is particularly preferred. Examples of the organic sulfonate include an alkyl sulfonate and an aryl sulfonate each having 1 to 20 carbon atoms.

The alkyl group included in the alkyl sulfonate may have a substituent. Examples of the substituent may include a fluorine atom, a chlorine atom, a bromine atom, an alkoxy group, an acyl group, and an aryl group. Specific examples of the alkyl sulfonate may include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate.

Examples of the aryl group included in the aryl sulfonate include a phenyl group, a naphthyl group, and an anthryl group. These aryl groups may further have a substituent. Preferred examples of the substituent include a straight or branched alkyl group having 1 to 6 carbon atoms and a cycloalkyl group having 3 to 6 carbon atoms. Specifically, preferred examples thereof may include a methyl group, an ethyl group, an n-propyl group, an isopropyl group, an n-butyl group, an i-butyl group, a t-butyl group, an n-hexyl group, and a cyclohexyl group. Examples of another substituent may include an alkoxy group having 1 to 6 carbon atoms, a halogen atom, a cyano group, a nitro group, an acyl group, and an acyloxy group.

The ammonium salt may be hydroxide or carboxylate. In this case, the ammonium salt is particularly preferably a tetraalkylammonium hydroxide having 1 to 8 carbon atoms (tetraalkylammonium hydroxide, such as tetramethylammonium hydroxide, tetraethylammonium hydroxide and tetra-(n-butyl)ammonium hydroxide).

Preferred examples of the basic compound may include guanidine, aminopyridine, aminoalkylpyridine, aminopyrrolidine, indazole, imidazole, pyrazole, pyrazine, pyrimidine, purine, imidazoline, pyrazoline, piperazine, amino morpholine, and ammoalkylmorpholine. These compounds may further have a substituent.

Preferred examples of the substituent may include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound may include guanidine, 1,1-dimethyl guanidine, 1,1,3,3-tetramethyl guanidine, imidazole, 2-methylimidazole, 4-methylimidazole, N-methylimidazole, 2-phenyl imidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino 5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-S methylpyrazine, pyrimidine, 2,4-diaminopyrimidine, 4,6-dihydroxypyrimidine, 2-pyrazoline, 3-pyrazoline, N-aminomorpholine, and N-(2-aminoethyl) morpholine.

(E) Compound (PA) containing a functional group with proton acceptor properties and capable of decomposing upon the action of irradiation with an actinic ray or radiation to generate a compound exhibiting reduced proton acceptor properties, no proton acceptor properties, or acid properties from the proton acceptor properties The composition according to the present invention may further include, as a basic compound, a compound (hereinafter also referred to as Compound (PA)) which contains a functional group with proton acceptor properties, and is capable of decomposing by the action of irradiation with an actinic ray or radiation to generate a compound exhibiting reduced proton acceptor properties, no proton acceptor properties, or acid properties from the proton acceptor properties.

The functional group with proton acceptor properties refers to a functional group having a group or an electron, which is capable of electrostatically interacting with a proton, and for example, means a functional group with a macrocyclic structure, such as a cyclopolyether, or a functional group containing a nitrogen atom with an unshared electron pair not contributing to π-conjugation. The nitrogen atom with an unshared electron pair not contributing to π-conjugation is, for example, a nitrogen atom having a partial structure represented by the following general formula.

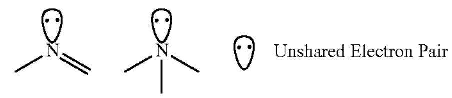

Preferred examples of the partial structure of the functional groups with proton acceptor properties include crown ether, azacrown ether, primary to tertiary amine, pyridine, imidazole, pyrazine structures, and the like.

Compound (PA) is decomposed upon irradiation with an actinic ray or radiation to generate a compound exhibiting reduced proton acceptor properties, no proton acceptor properties, or acid properties from the proton acceptor properties. Here, exhibiting deterioration in proton acceptor properties, no proton acceptor properties, or acid properties from the proton acceptor properties means the change of proton acceptor properties due to the proton being added to the functional groups with proton acceptor properties, and specifically, a decrease in the equilibrium constant at chemical equilibrium when a proton adduct is generated from Compound (PA) having the functional groups with proton acceptor properties and the proton.

Hereinafter, specific examples of Compound (PA) will be shown, but the present invention is not limited thereto.

(PA-1)

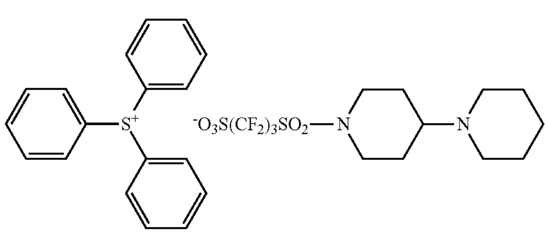

(PA-2)

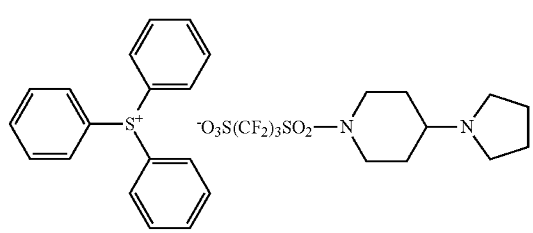

(PA-3)

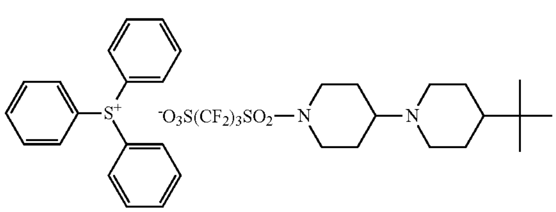

(PA-4)

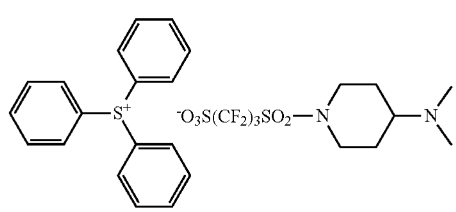

-continued
(PA-5)
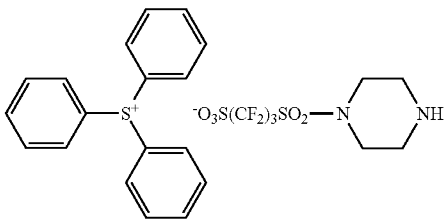
(PA-6)
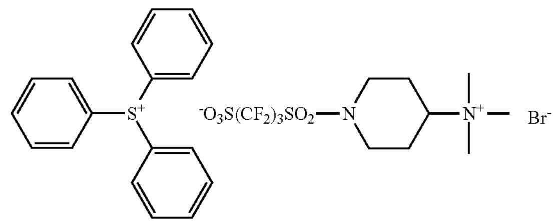
(PA-7)
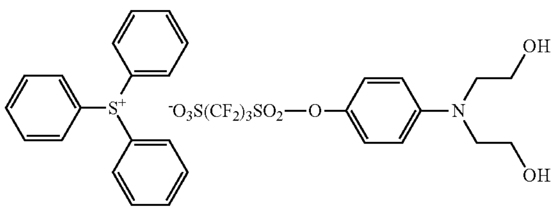
(PA-8)
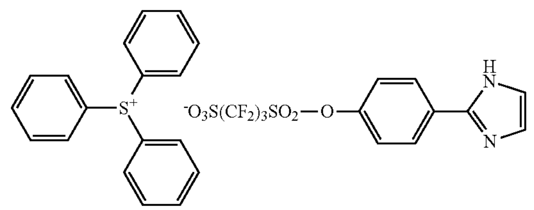
(PA-9)
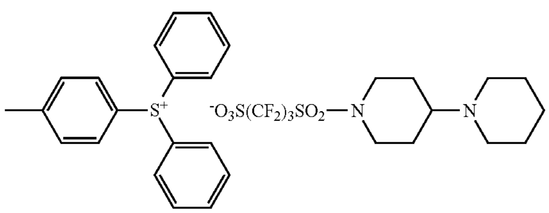
(PA-10)
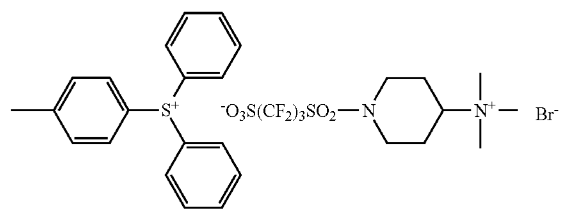
(PA-11)
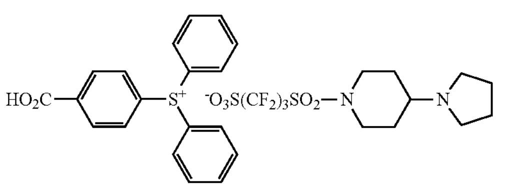
(PA-12)
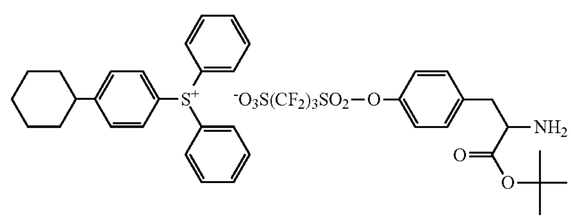
(PA-13)
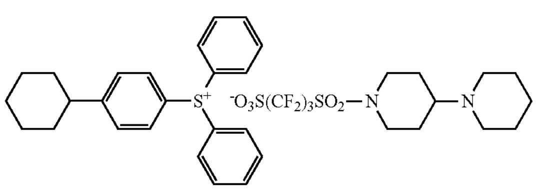
(PA-14)
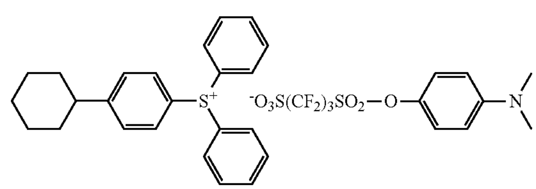
(PA-15)
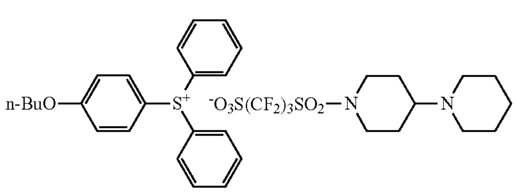
(PA-16)
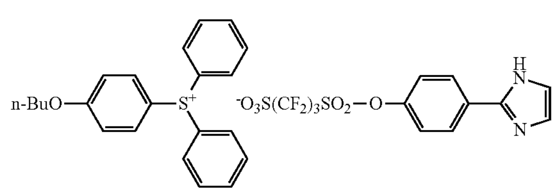
(PA-17)
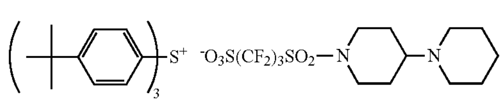
(PA-18)
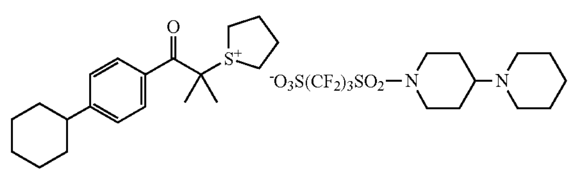

-continued
(PA-19)
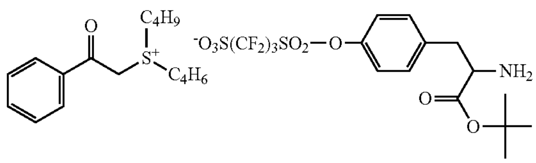
(PA-20)
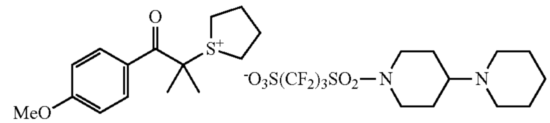
(PA-21)
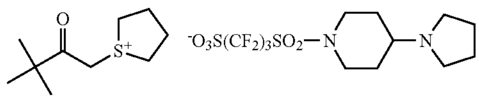
(PA-22)
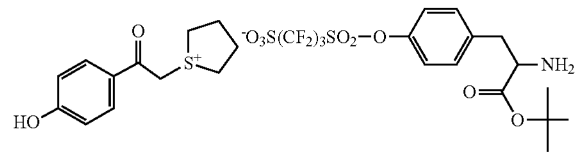
(PA-23)
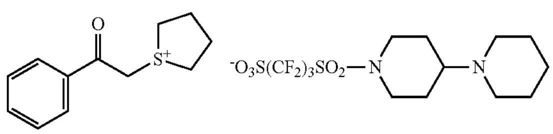
(PA-24)
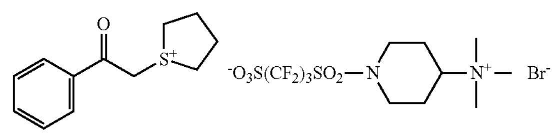
(PA-25)
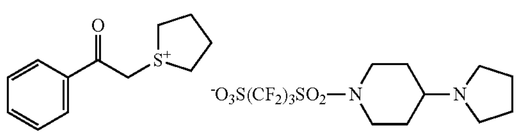
(PA-26)
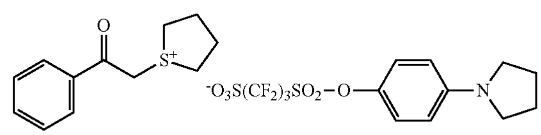
(PA-27)
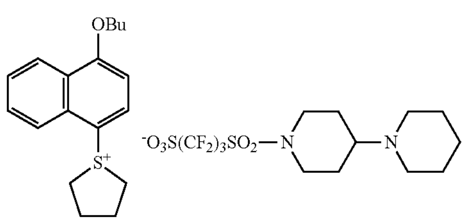
(PA-28)
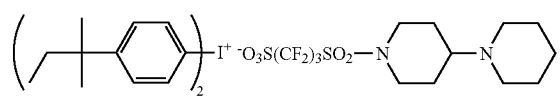
(PA-29)
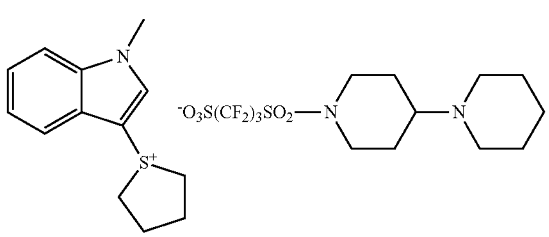
(PA-30)
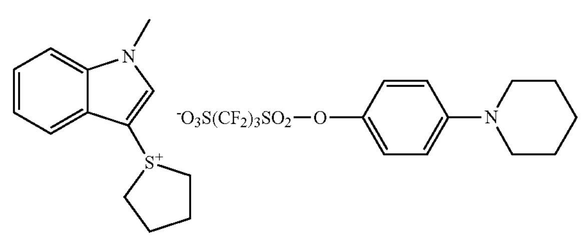
(PA-31)
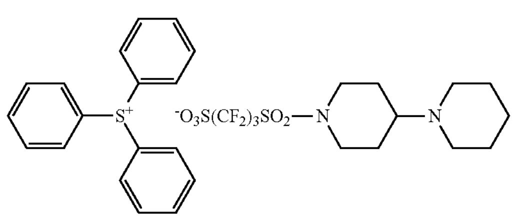
(PA-32)
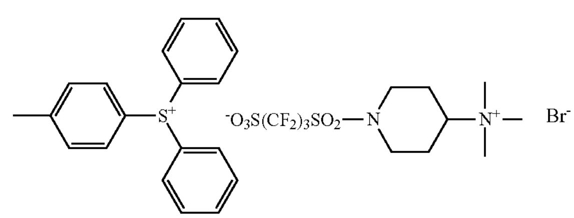

-continued
(PA-33)
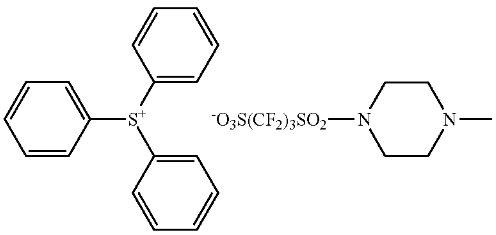
(PA-34)
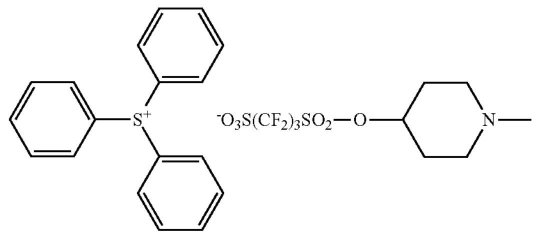
(PA-35)
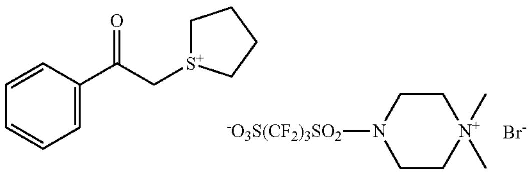
(PA-36)
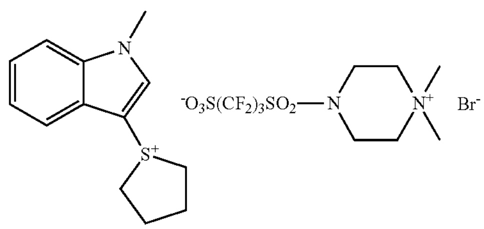
(PA-37)
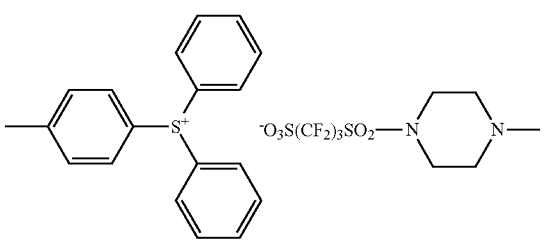
(PA-38)
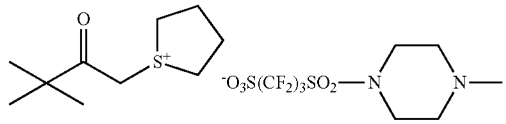
(PA-39)
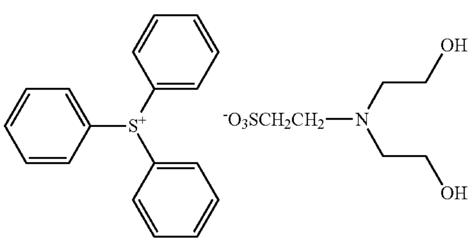
(PA-40)
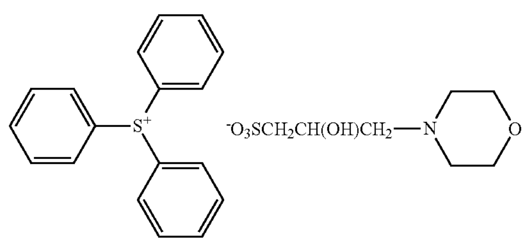
(PA-41)
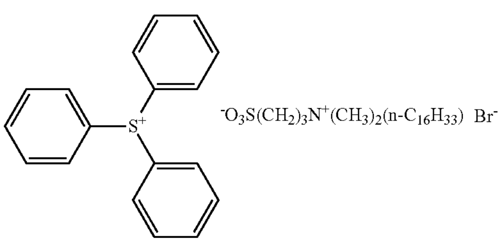
(PA-42)
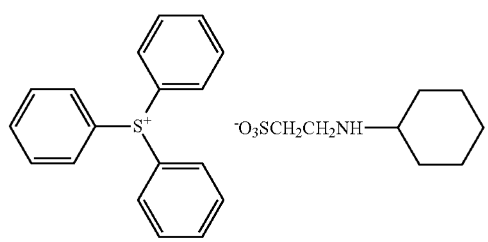
(PA-43)
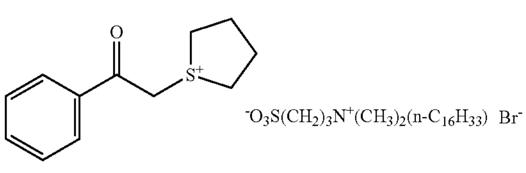
(PA-44)
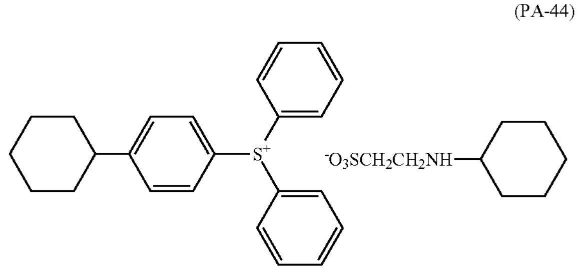

-continued
(PA-45)
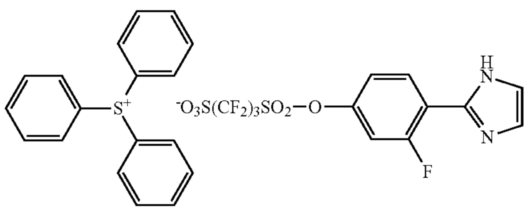
(PA-46)
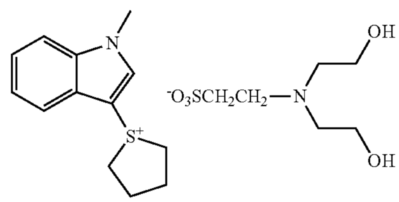
(PA-47)
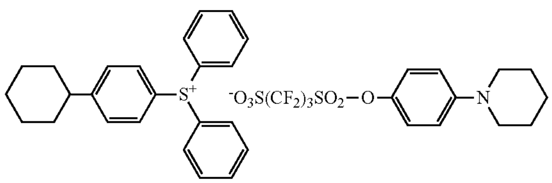
(PA-48)
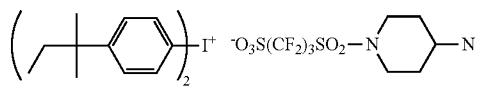
(PA-49)
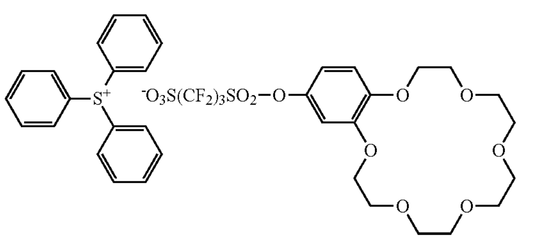
(PA-50)
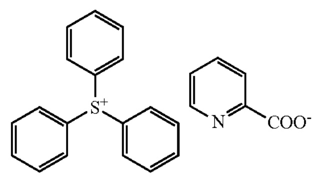
(PA-51)
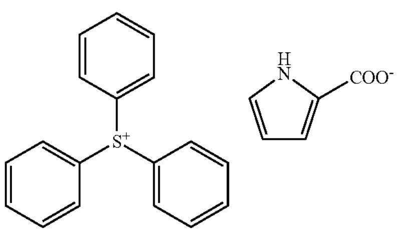
(PA-52)
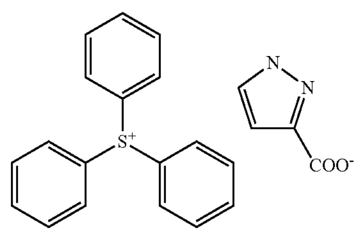
(PA-53)
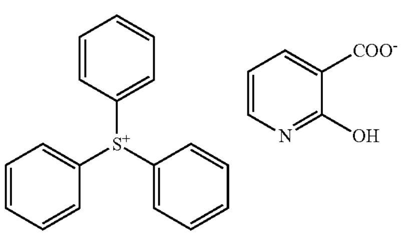
(PA-54)
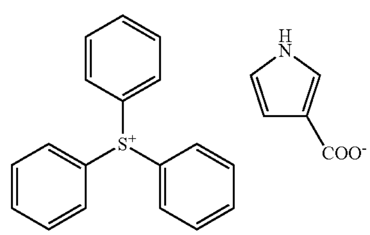
(PA-55)
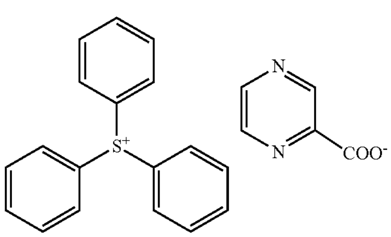
(PA-56)
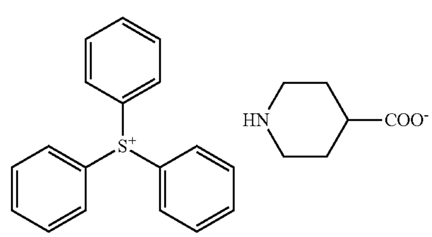
(PA-57)
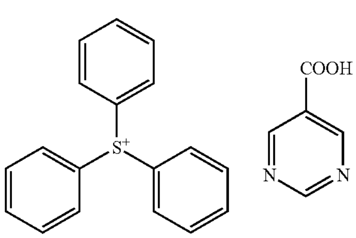
(PA-58)
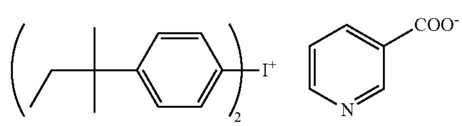

-continued
(PA-59)
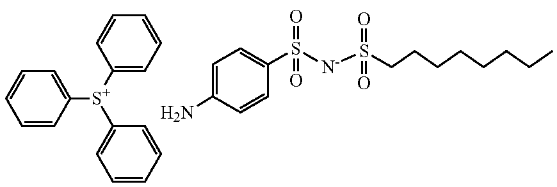
(PA-60)
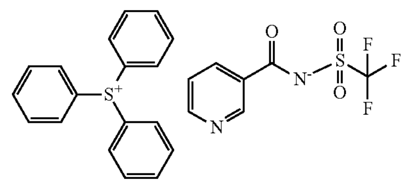
(PA-61)
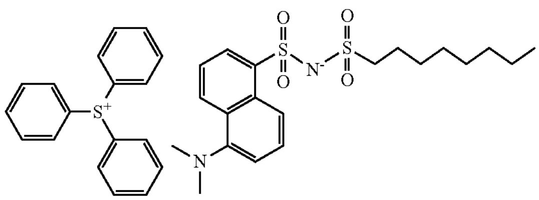
(PA-62)
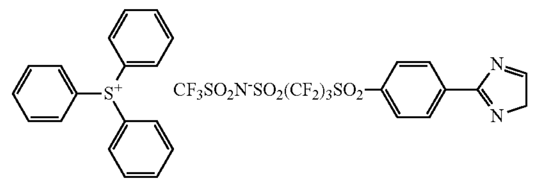
(PA-63)
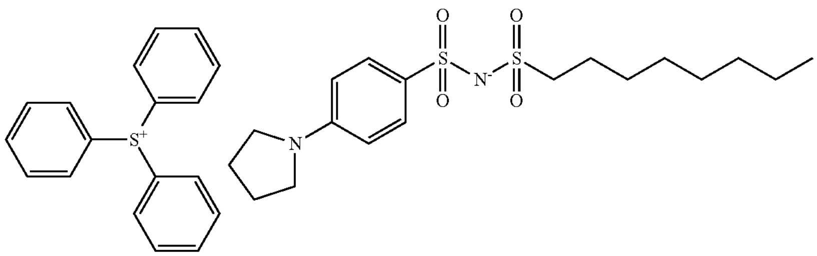
(PA-64)
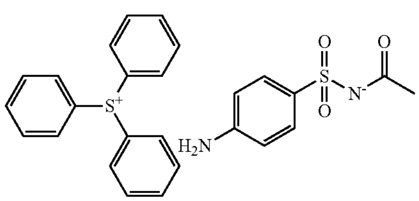
(PA-65)
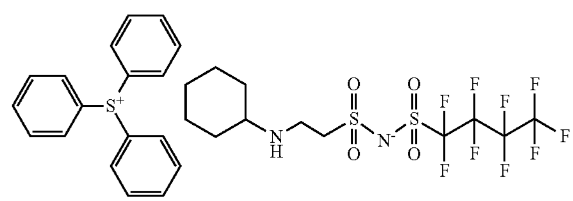
(PA-66)
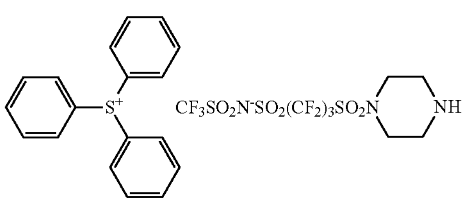
(PA-67)
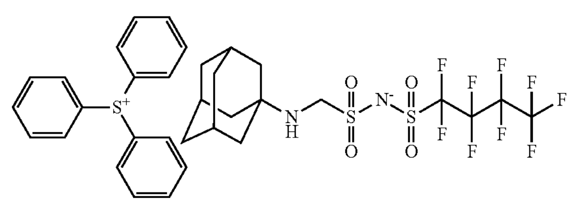
(PA-68)
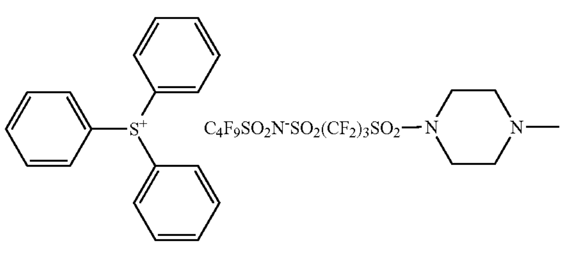
(PA-69)
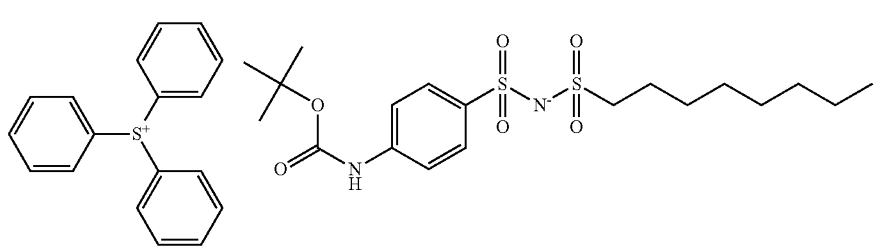

-continued
(PA-70)
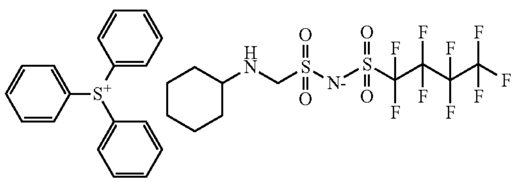
(PA-71)
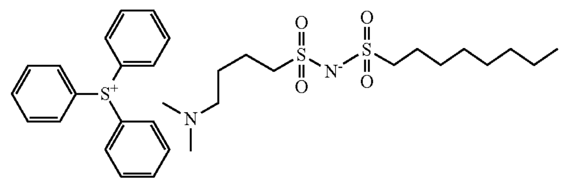
(PA-72)
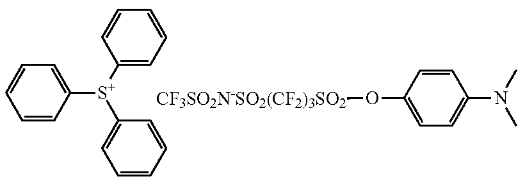
(PA-73)
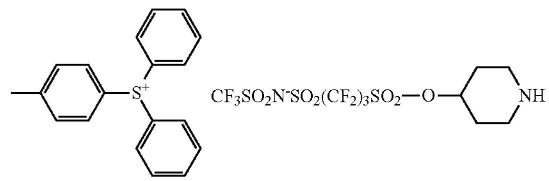
(PA-74)
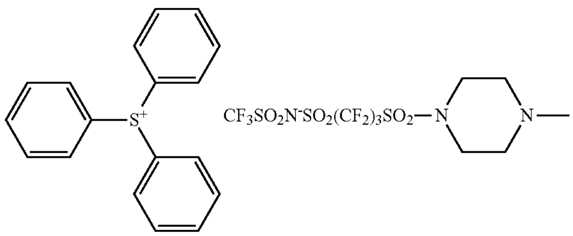
(PA-75)
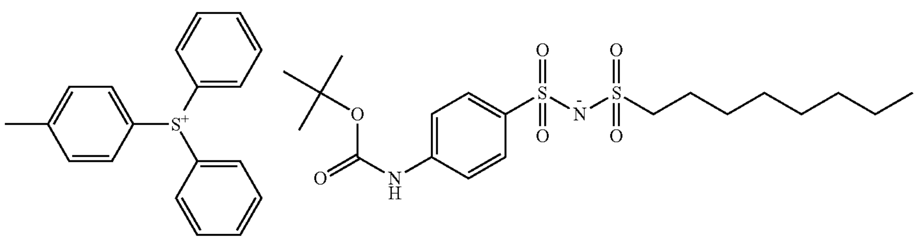
(PA-76)
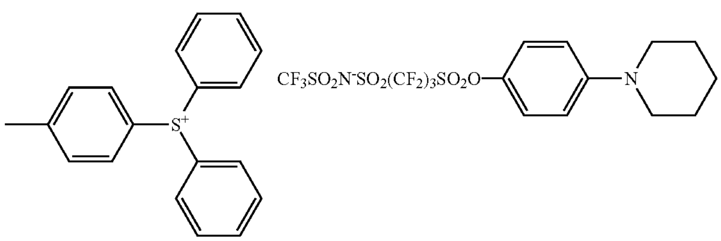
(PA-77)
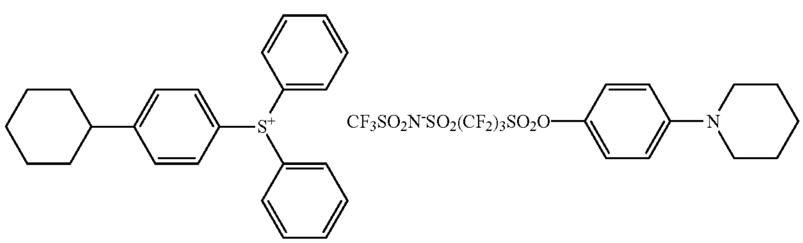
(PA-78)
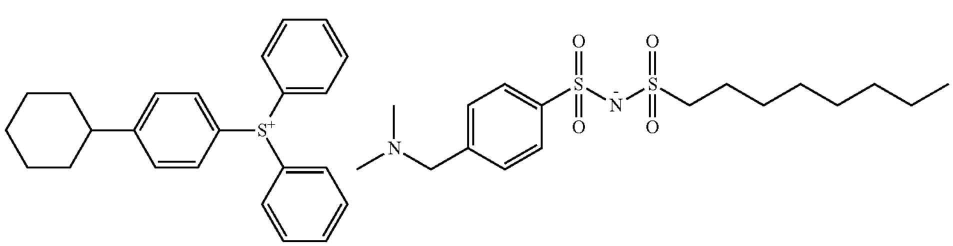

-continued
(PA-79)
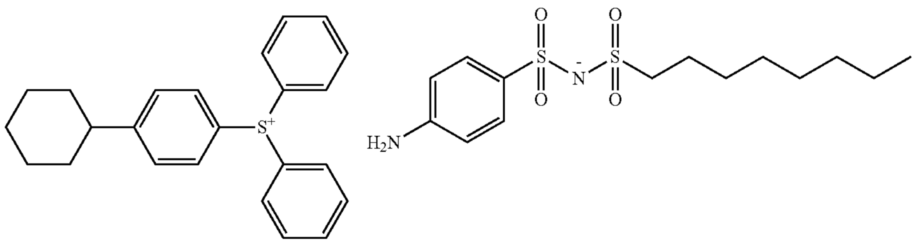
(PA-80)
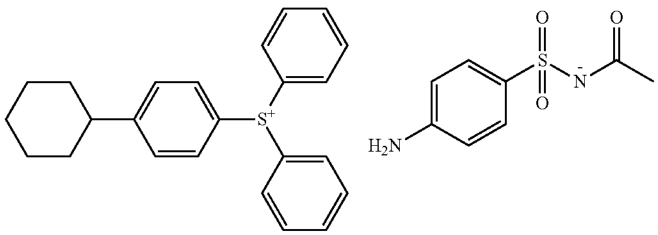
(PA-81)
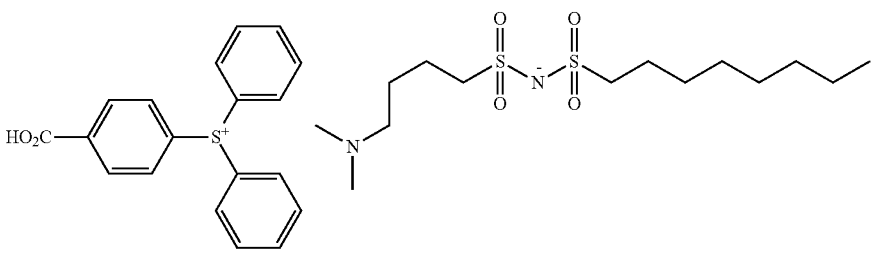
(PA-82)
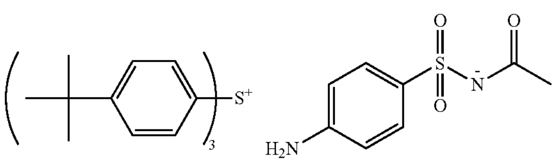
(PA-83)
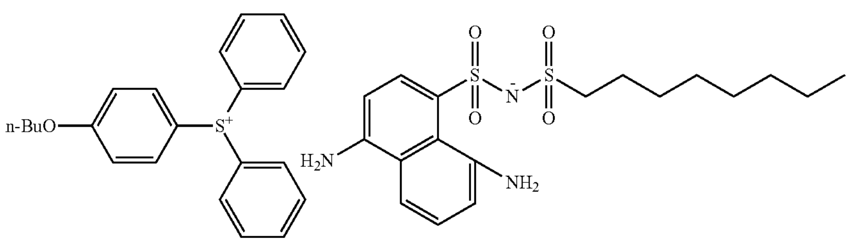
(PA-84)
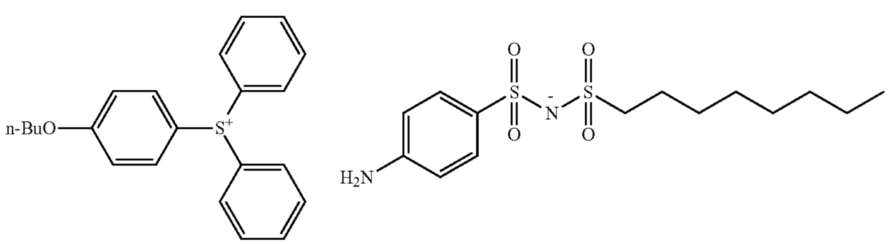
(PA-85)
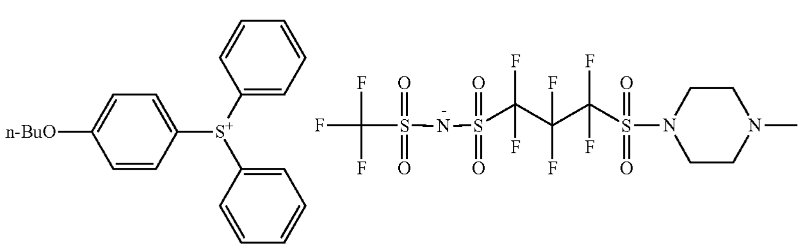

-continued
(PA-86)
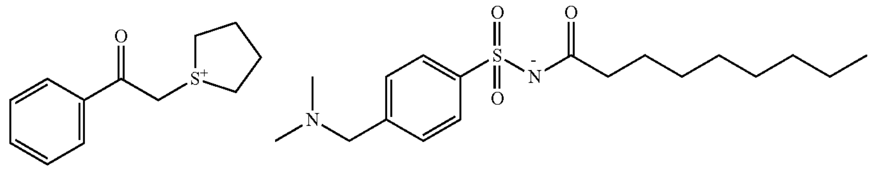
(PA-87)
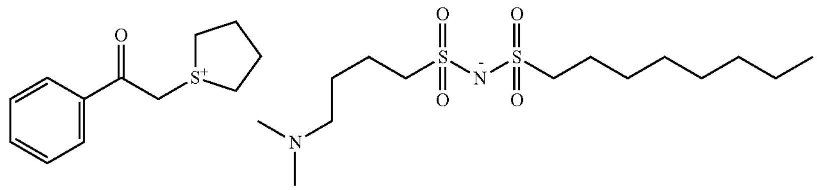
(PA-88)
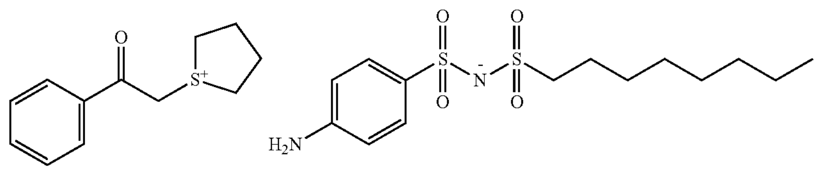
(PA-89)
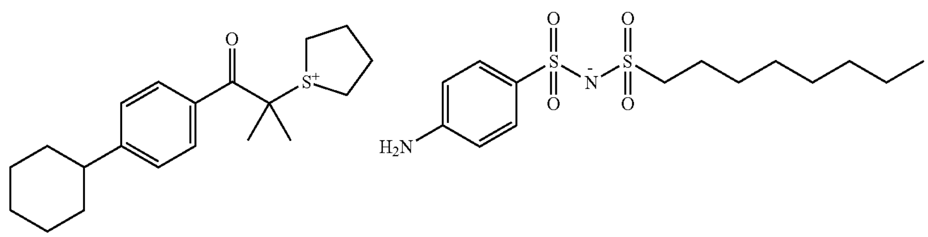
(PA-90)
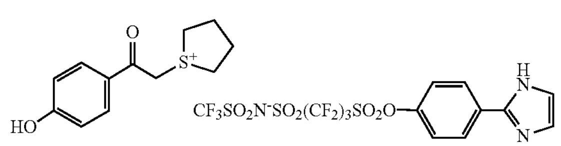
(PA-91)
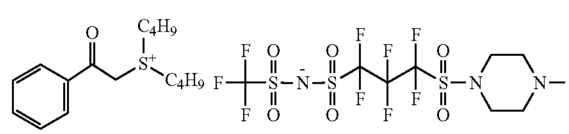
(PA-92)
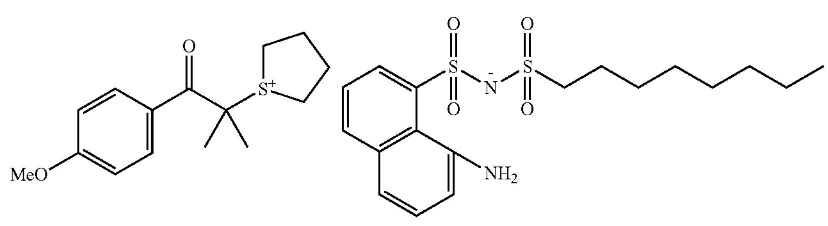
(PA-93)
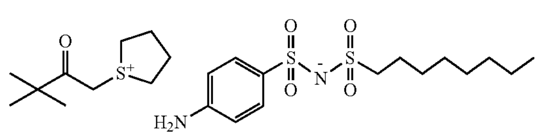
(PA-94)
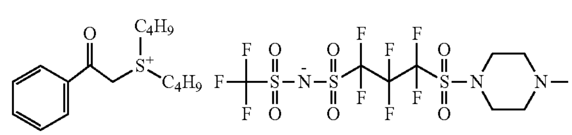
(PA-95)
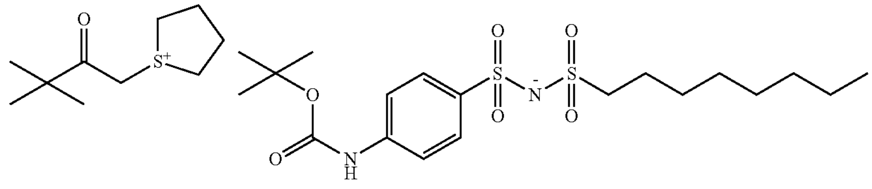

-continued (PA-96)

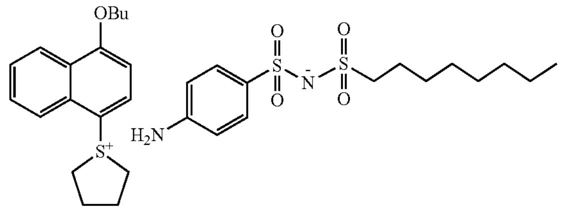

(PA-97)

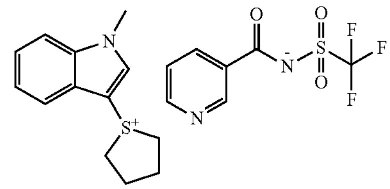

(PA-98)

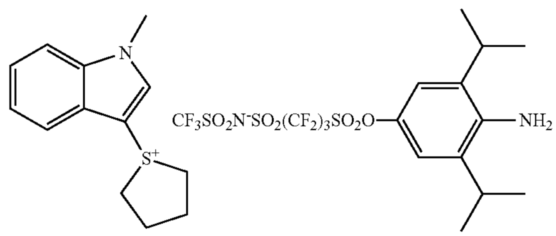

(PA--99)

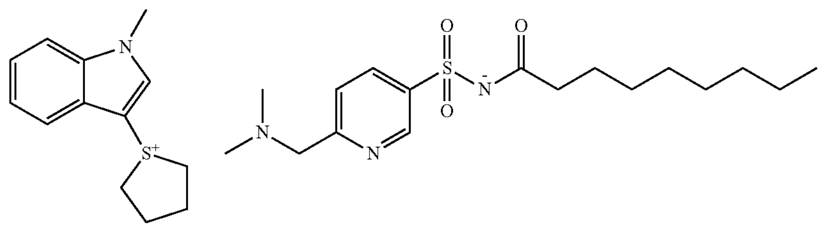

(PA-100)

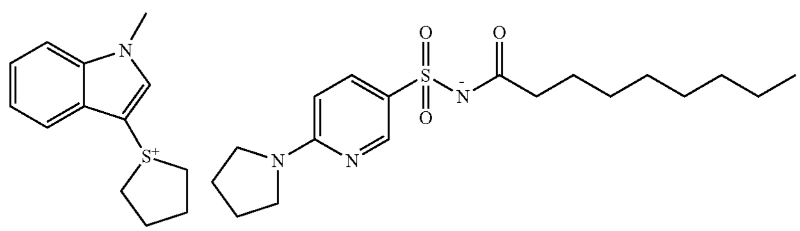

(PA-101)

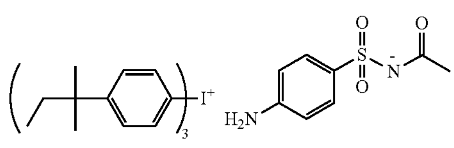

(PA-102)

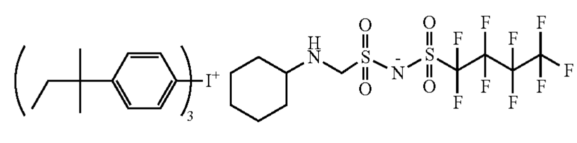

Further, in the present invention, it is also possible to appropriately select a compound (PA) other than the compound which generates a compound represented by Formula (PA-1). For example, as an ionic compound, a compound having a proton acceptor site in the cation moiety may also be used. More specifically, examples thereof may include a compound represented by the following Formula (7), and the like.

$$\overset{X^-}{(R)_m \overset{+}{A} (R_N)_n} \quad (7)$$

In the formula, A represents a sulfur atom or an iodine atom.

m represents 1 or 2, and n represents 1 or 2. However, when A is a sulfur atom, m+n=3, and when A is an iodine atom, m+n=2.

R represents an aryl group.

$R_N$ represents an aryl group substituted with functional group with proton acceptor properties.

$X^-$ represents a counter anion.

Specific examples of $X^-$ may include those which are the same as $X^-$ in Formula (ZI) described above.

Specific examples of the aryl group of R and $R_N$ may preferably include a phenyl group.

Specific examples of the functional group with proton acceptor properties, which $R_N$ has, are the same as the functional group with proton acceptor properties described in the above-described Formula (PA-1).

In the composition of the present invention, the blending ratio of Compound (PA) in the entire composition is preferably 0.1 to 10% by mass, and more preferably 1 to 8% by mass, based on the total solid content of the composition.

(F) Guanidine Compound

The composition of the present invention may further contain a guanidine compound having a structure represented by the following formula.

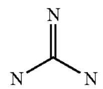

The guanidine compound exhibits strong basicity because dispersion of positive electric charges of a conjugate acid is stabilized by three nitrogen atoms.

As for the basicity of Guanidine compound (A) of the present invention, the pKa of the conjugate acid is preferably 6.0 or more, more preferably 7.0 to 20.0 due to high neutralization reactivity with an acid and excellence in roughness characteristics, and more preferably 8.0 to 16.0.

Due to such strong basicity, the compound may suppress the diffusion of an acid, and contribute to the formation of an excellent pattern shape.

Meanwhile, the "pKa" as used herein indicates pKa in an aqueous solution and is described, for example, in Chemical Handbook (II) (revised 4th edition, 1993, compiled by the Chemical Society of Japan, Maruzen Company, Limited), and a lower value indicates higher acid strength. Specifically, the pKa in an aqueous solution may be actually measured by using an infinite-dilution aqueous solution and measuring the acid dissociation constant at 25° C., or a value based on the Hammett substituent constants and the database of publicly known literature data may also be obtained by computation using the following software package 1. The values of pKa described in the present specification indicate a value determined by computation using this software package.

Software Package 1: Advanced Chemistry Development (ACD/Labs) Software V8.14 for Solaris (1994-2007 ACD/Labs).

In the present invention, the log P is a logarithmic value of the n-octanol/water partition coefficient (P), and is an effective parameter capable of characterizing the hydrophilicity/hydrophobicity for compounds over a wide range. The partition coefficient is generally determined by computation regardless of experiments, and indicates a value computed using CS ChemDraw Ultra Ver. 8.0 software package (Crippen's fragmentation method) in the present invention.

In addition, the log P of Guanidine Compound (A) is preferably 10 or less. When the log P is the value or less, the compound may be uniformly contained in the resist film.

The log P of Guanidine Compound (A) in the present invention is preferably in a range of 2 to 10, more preferably in a range of 3 to 8, and still more preferably in a range of 4 to 8.

Furthermore, it is preferred that Guanidine Compound (A) in the present invention has no nitrogen atom other than the guanidine structure.

Hereinafter, specific examples of the guanidine compound will be shown, but the present invention is not limited thereto.

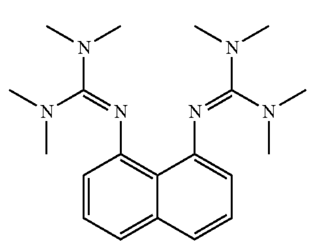

Log P: 4.29

-continued

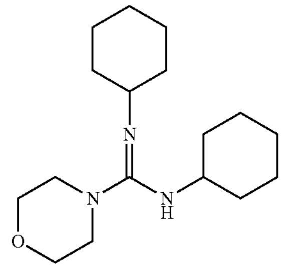

Log P: 3.32

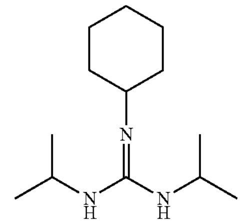

Log P: 3.1

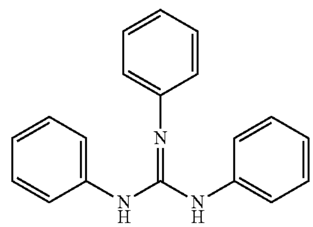

Log P: 5.24

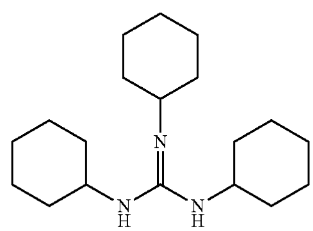

Log P: 4.89

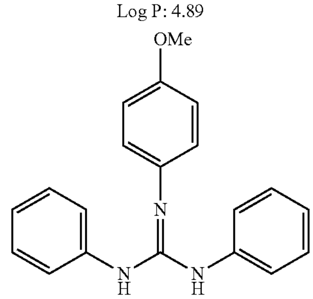

Log P: 5.11

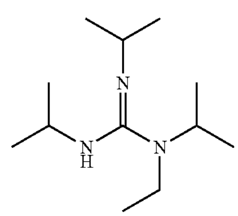

Log P: 2.61

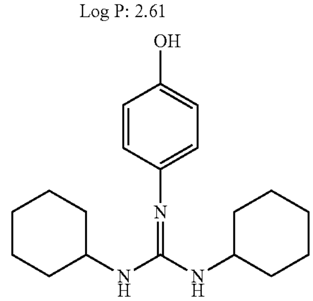

Log P: 4.61

-continued

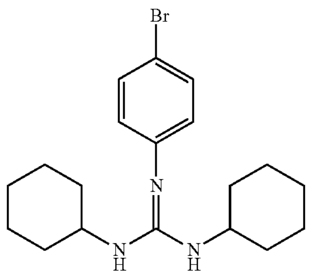

Log P: 5.83

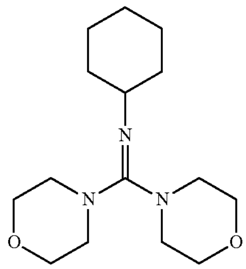

Log P: 1.75

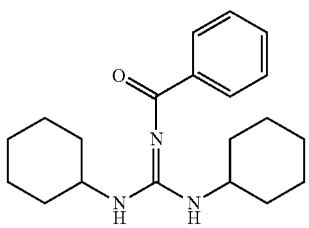

Log P: 4.95

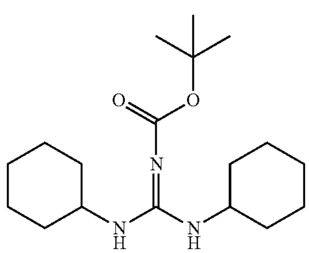

Log P: 4.51

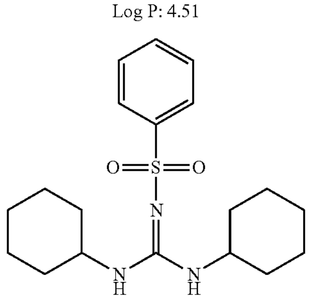

Log P: 4.55

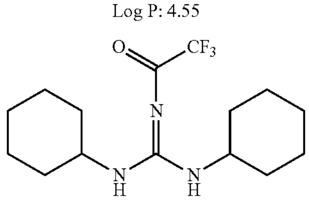

Log P: 4.43

-continued

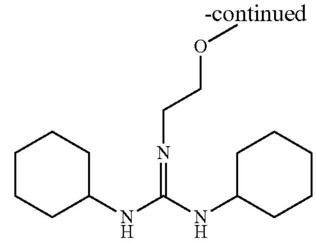

Log P: 3.18

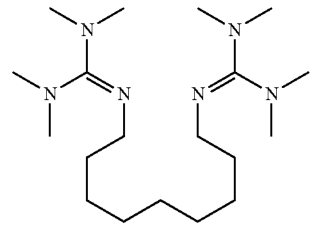

Log P: 4.4

(G) Low-Molecular Compound Having Nitrogen Atom, and Having Group Capable of Leaving by Action of Acid The composition of the present invention has a nitrogen atom, and may contain a low-molecular compound (hereinafter, also referred to as a "low-molecular compound (D)" or a "compound (D)") having a group capable of leaving by the action of an acid. It is preferred that the low-molecular compound (D) has basicity after a group capable of leaving by the action of an acid is left.

The group capable of leaving by the action of an acid is not particularly limited, but is preferably an acetal group, a carbonate group, a carbamate group, a tertiary ester group, a tertiary hydroxyl group and a hemiaminal ether group, and particularly preferably a carbamate group and a hemiaminal ether group.

The molecular weight of the low-molecular compound (D) having a group capable of leaving by the action of an acid is preferably 100 to 1,000, more preferably 100 to 700, and particularly preferably 100 to 500.

As the compound (D), an amine derivative having a group capable of leaving by the action of an acid on a nitrogen atom is preferred.

The compound (D) may have a carbamate group having a protective group on a nitrogen atom. The protective group constituting the carbamate group may be represented by the following Formula (d-1).

(d-1)

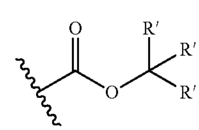

In Formula (d-1),

Each R independently represents a hydrogen atom, a straight or branched alkyl group, a cycloalkyl group, an aryl group, an aralkyl group, or an alkoxyalkyl group. R's may be bonded to each other to form a ring.

R' is preferably a straight or branched alkyl group, a cycloalkyl group, or an aryl group. R' is more preferably a straight or branched alkyl group or a cycloalkyl group.

A specific structure of the group will be shown below.

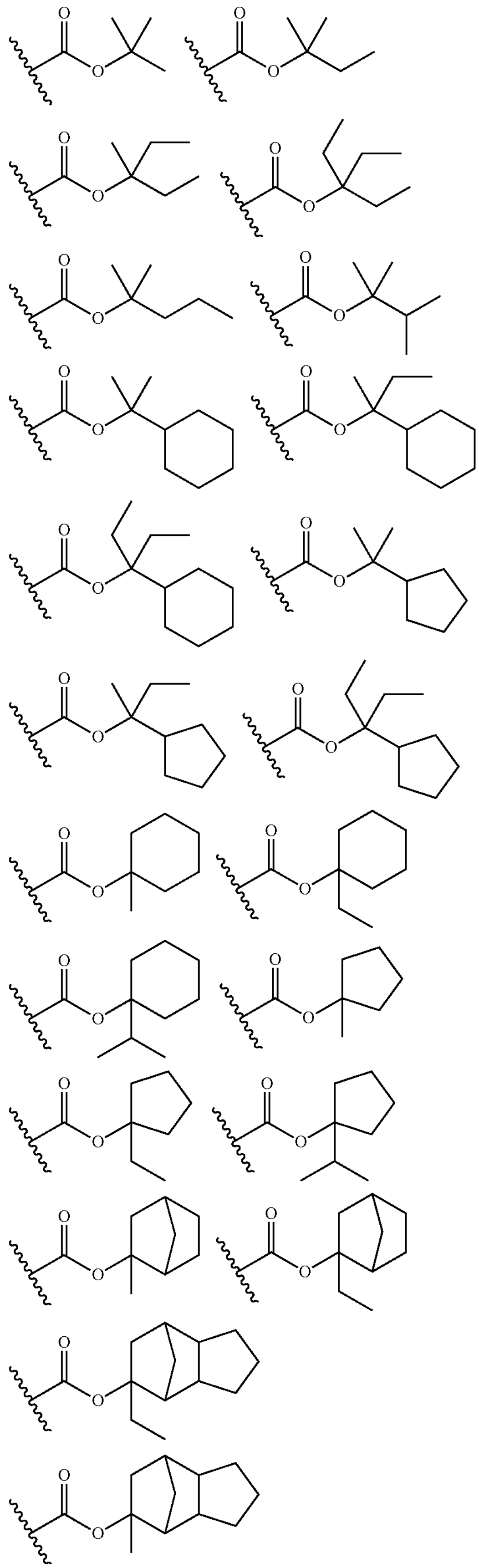
-continued
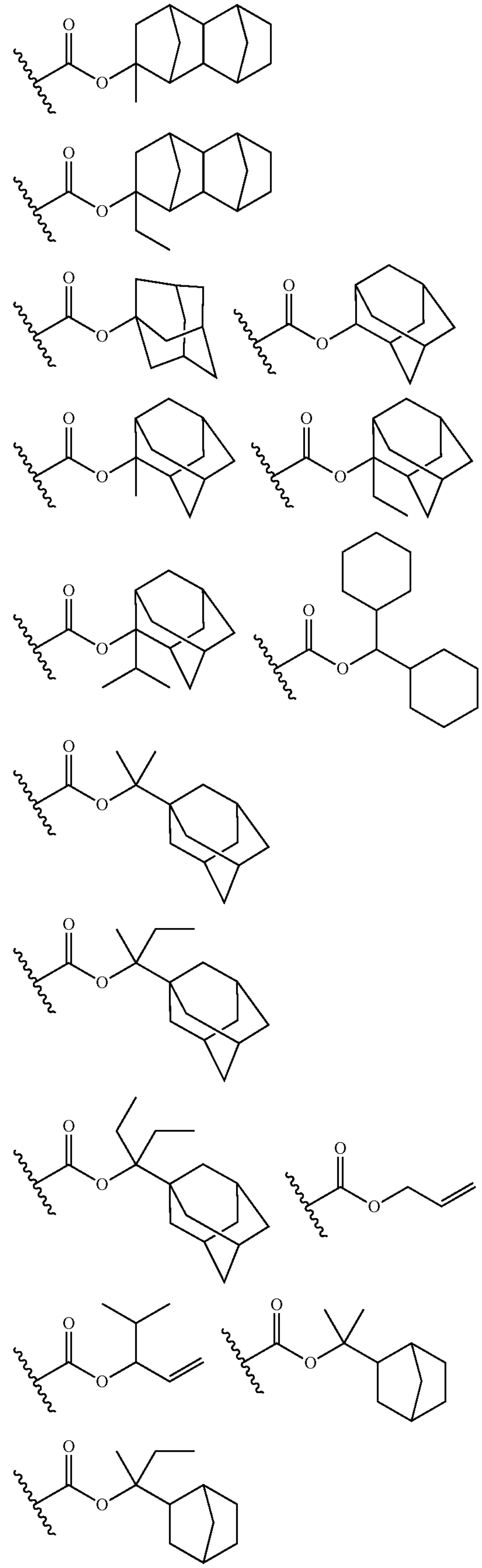

-continued

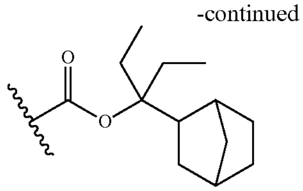

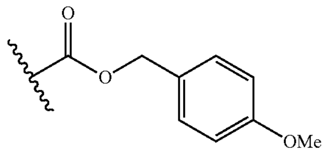

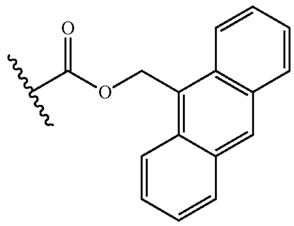

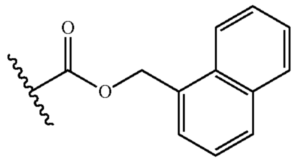

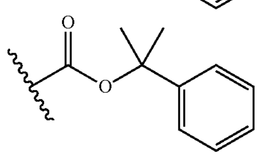

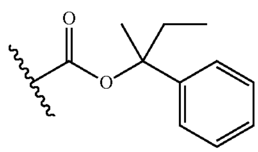

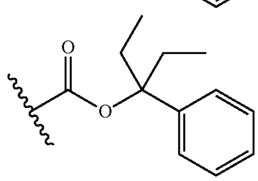

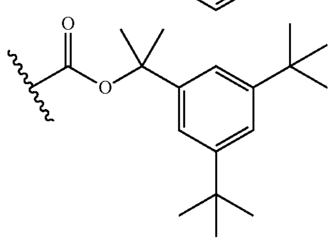

The compound (D) may also be composed by arbitrarily combining a basic compound with the structure represented by Formula (d-1).

It is particularly preferred that the compound (D) has a structure represented by the following Formula (A).

Meanwhile, the compound (D) may be a compound corresponding to the aforementioned basic compound as long as the compound is a low-molecular compound having a group capable of leaving by the action of an acid.

(A)

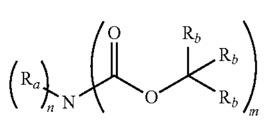

In Formula (A), Ra represents a hydrogen atom, an alkyl group, a cycloalkyl group, an aryl group or an aralkyl group.

Further, when n=2, two Ra's may be same or different, and two Ra's may be bonded to each other to form a divalent heterocyclic hydrocarbon group (preferably having 20 or less carbon atoms) or a derivative thereof.

Each Rb independently represents a hydrogen atom, an alkyl group, a cycloalkyl group, an aryl group, an aralkyl group, or an alkoxyalkyl group. However, when one or more Rb's in —C(Rb)(Rb)(Rb) are a hydrogen atom, at least one of the remaining Rb's is a cyclopropyl group, a 1-1-alkoxyalkyl group or an aryl group.

At least two Rb's may be bonded to each other to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In Formula (A), the alkyl group, the cycloalkyl group, the aryl group and the aralkyl group, which are represented by Ra and Rb, may be substituted with a functional group such as a hydroxyl group, a cyano group, an amino group, a pyrrolidino group, a piperidino group, a morpholino group and an oxo group, an alkoxy group or a halogen atom. The same also applies to an alkoxyalkyl group represented by Rb.

Examples of the alkyl group, the cycloalkyl group, the aryl group and the aralkyl group (each of these alkyl, cycloalkyl, aryl and aralkyl groups may be substituted with the aforementioned functional group, an alkoxy group or a halogen atom) of Ra and/or Rb may include:

a group derived from a straight or branched alkane such as methane, ethane, propane, butane, pentane, hexane, heptane, octane, nonane, decane, undecane and dodecane, or a group in which the group derived from an alkane is substituted with one or more in kind or number of a cycloalkyl group, such as, for example, a cyclobutyl group, a cyclopentyl group and cyclohexyl group;

a group derived from a cycloalkane such as cyclobutane, cyclopentane, cyclohexane, cycloheptane, cyclooctane, norbornane, adamantane and noradamantane, or a group in which the group derived from a cycloalkane is substituted with one or more in kind or number of straight or branched alkyl groups such as, for example, a methyl group, an ethyl group, an n-propyl group, an i-propyl group, an n-butyl group, a 2-methylpropyl group, a 1-methylpropyl group and a t-butyl group;

a group derived from an aromatic compound such as benzene, naphthalene and anthracene, or a group in which the group derived from an aromatic compound is substituted with one or more in kind or number of straight or branched alkyl groups such as, for example, a methyl group, an ethyl group, an n-propyl group, an i-propyl group, an n-butyl group, a 2-methylpropyl group, a 1-methylpropyl group and a t-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, a group in which the group derived from a heterocyclic compound is substituted with one or more in kind or number of a straight or branched alkyl group and an aromatic compound-derived group a group in which the group derived from a straight or branched alkane or the group derived from a cycloalkane is substituted with one or more in kind or number of aromatic compound-derived groups such as a phenyl group, a naphthyl group and an anthracenyl group, or a group in which the aforementioned substituent is substituted with a functional group such as hydroxyl group, a cyano group, an amino group, a pyrrolidino group, a piperidino group, a morpholino group and an oxo group; or the like.

Further, examples of the divalent heterocyclic hydrocarbon group (preferably having 1 to 20 carbon atoms) formed by Ra's bonded to each other or a derivative thereof may include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, a group in which the group derived from a heterocyclic compound is substituted with one or more in kind or number of a straight or branched alkane-derived group, a cycloalkane-derived group, an aromatic compound-derived group, a heterocyclic compound-derived group and a functional group such as a hydroxyl group, a cyano group, an amino group, a pyrrolidino group, a piperidino group, a morpholino group and an oxo group, and the like.

Particularly preferred compounds (D) in the present invention will be shown, but the present invention is not limited thereto.

(D-1)

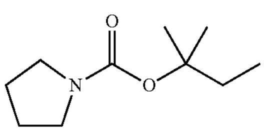

(D-2)

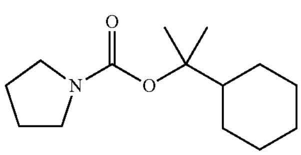

(D-3)

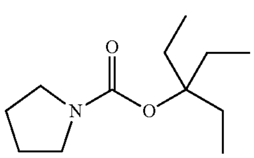

(D-4)

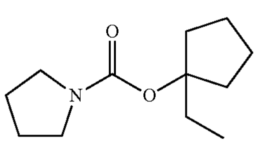

(D-5)

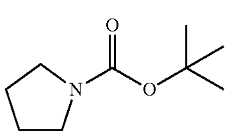

(D-6)

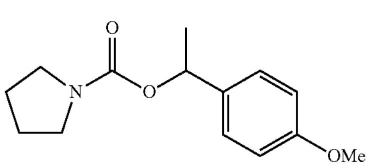

-continued (D-7)

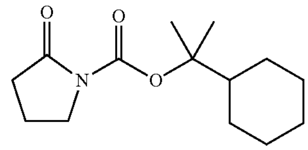

(D-8)

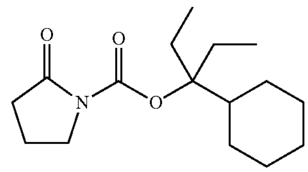

(D-9)

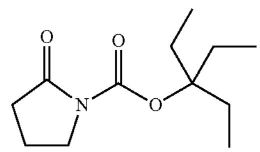

(D-10)

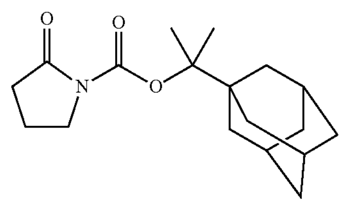

(D-11)

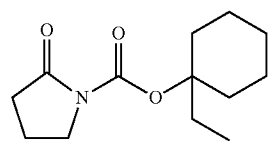

(D-12)

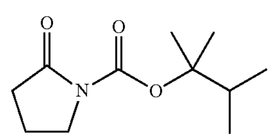

(D-13)

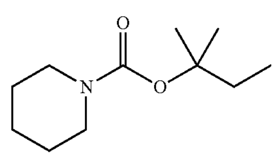

(D-14)

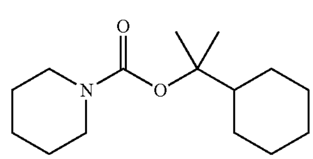

(D-15)

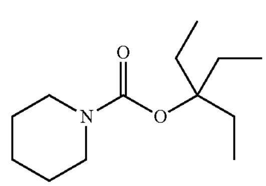

-continued
(D-16)
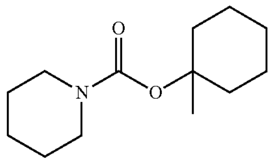
(D-17)
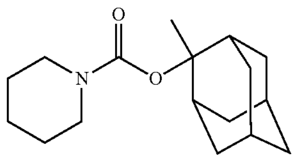
(D-18)
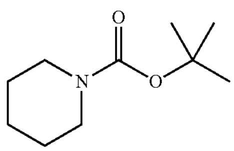
(D-19)
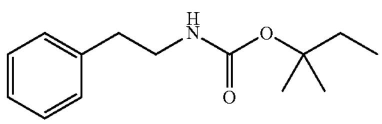
(D-20)
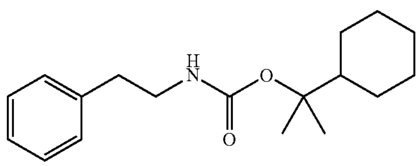
(D-21)
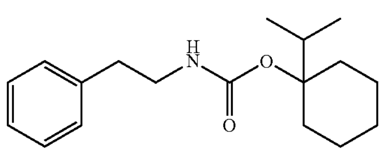
(D-22)
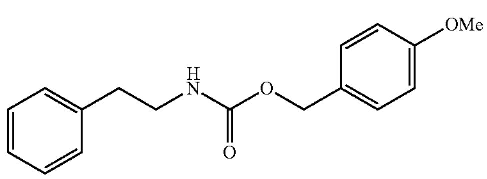
(D-23)
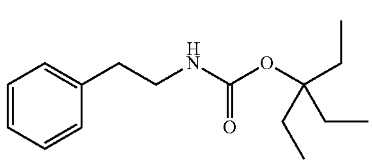
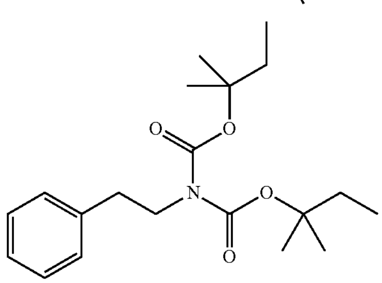
-continued
(D-25)
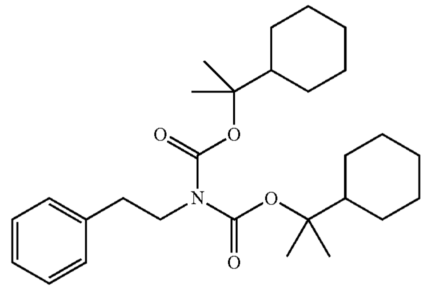
(D-26)
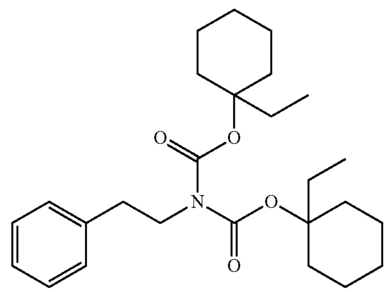
(D-27)
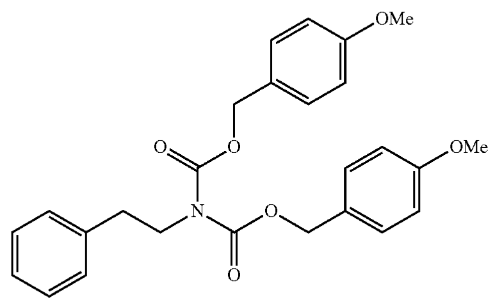
(D-28)
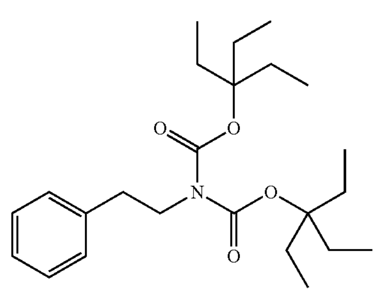
(D-29)
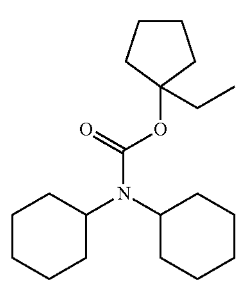

-continued
(D-30)
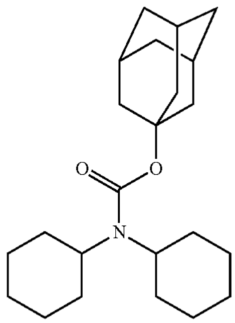
(D-31)
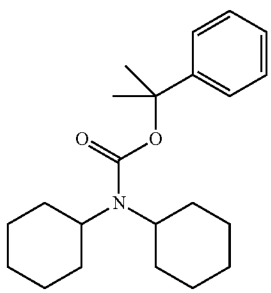
(D-32)
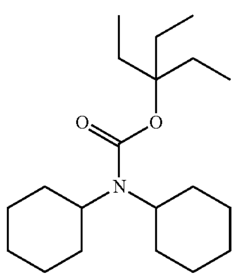
(D-33)
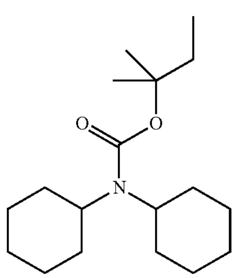
(D-34)
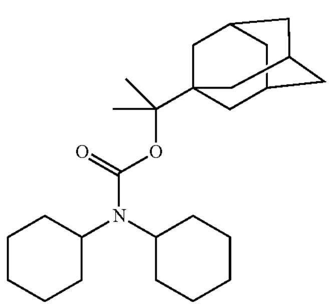
-continued
(D-35)
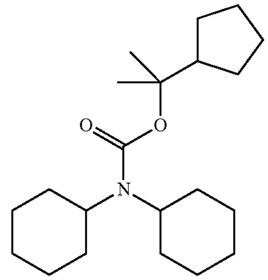
(D-36)
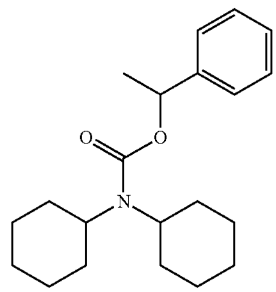
(D-37)
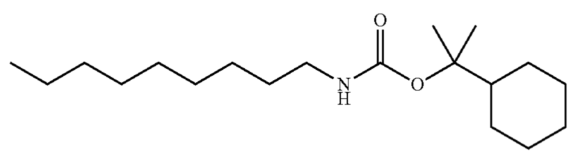
(D-38)
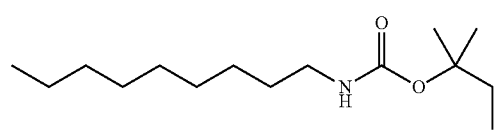
(D-39)
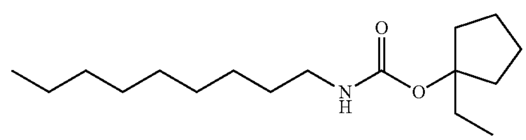
(D-40)
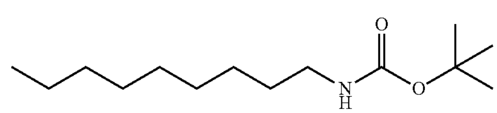
(D-41)
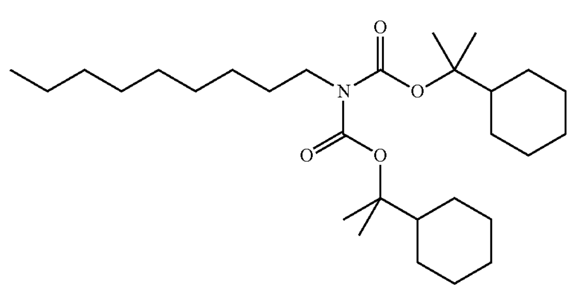

-continued
(D-42)
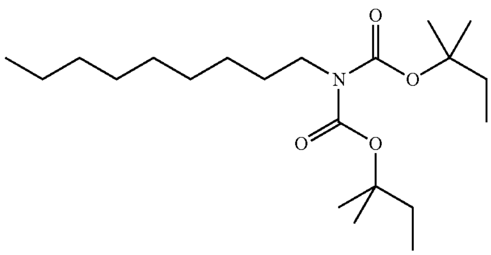
(D-43)
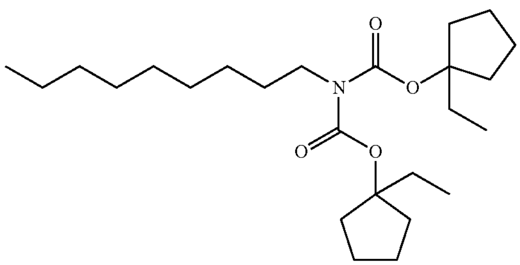
(D-44)
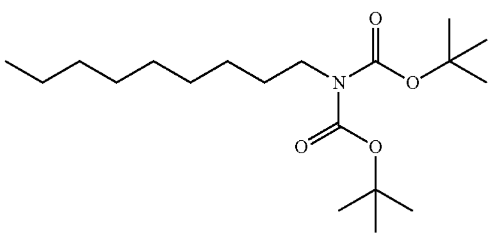
(D-45)
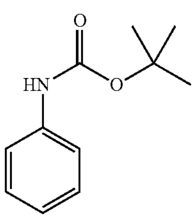
(D-46)
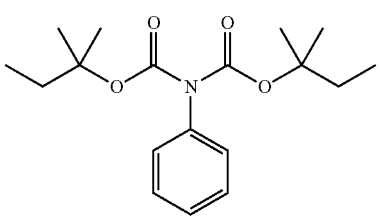
(D-47)
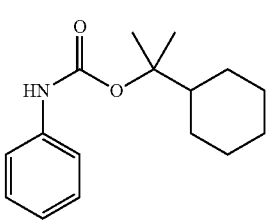
-continued
(D-48)
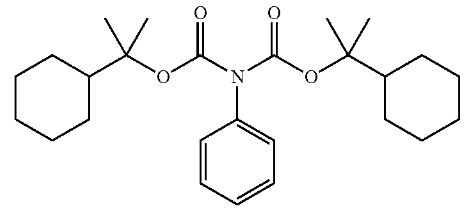
(D-49)
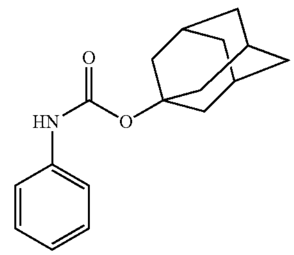
(D-50)
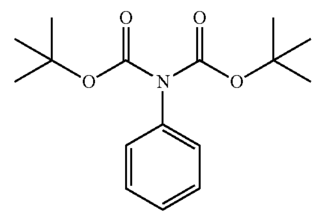
(D-51)
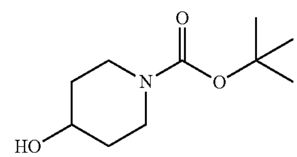
(D-52)
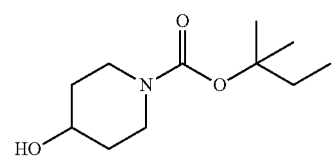
(D-53)
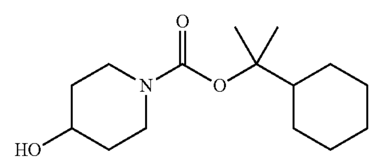
(D-54)
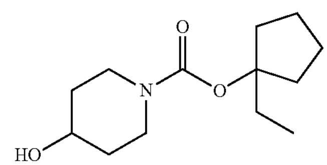
(D-55)
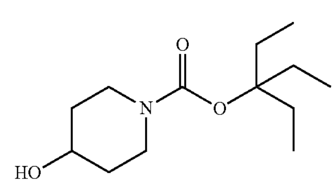

-continued (D-56)

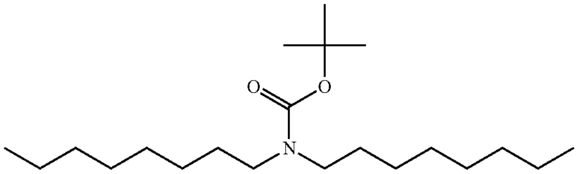

(D-57)

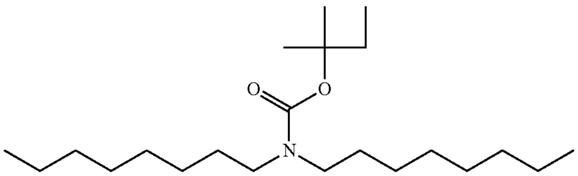

(D-58)

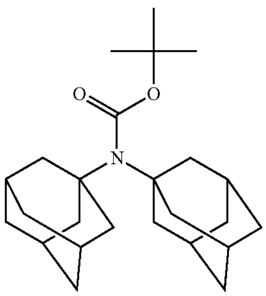

(D-59)

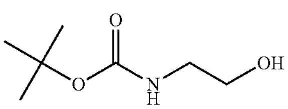

(D-60)

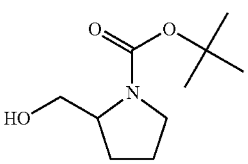

(D-61)

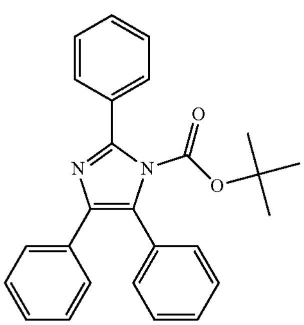

(D-62)

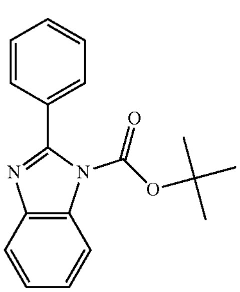

-continued (D-63)

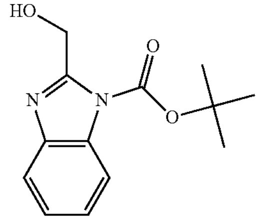

(D-64)

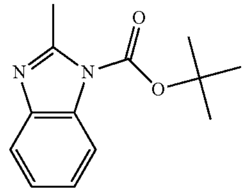

(D-65)

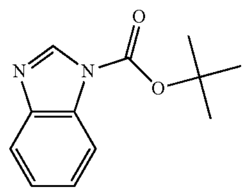

The compound represented by Formula (A) may be synthesized based on Japanese Patent Application Laid-Open Nos. 2007-298569 and 2009-199021, and the like.

In the present invention, the low-molecular compound (D) may be used either alone or in mixture of two or more thereof.

The composition of the present invention may or may not contain the low-molecular compound (D), but in a case of containing the low-molecular compound (D), the content of the compound (D) is usually 0.001 to 20% by mass, preferably 0.001 to 10% by mass, and more preferably 0.01 to 5% by mass, based on the total solid content of the composition combined with the above-described basic compound.

In addition, when the composition of the present invention contains an acid generator, the ratio of the acid generator and the compound (D) used in the composition is preferably acid generator/[Compound (D)+the following basic compound](molar ratio)=from 2.5 to 300. That is, the molar ratio is preferably 2.5 or more from the viewpoint of sensitivity and resolution, and preferably 300 or less from the viewpoint of suppressing the reduction in resolution due to thickening of the resist pattern as time after exposure until heat treatment passes. The acid generator/[Compound (D)+the basic compound](molar ratio) is more preferably 5.0 to 200, and still more preferably 7.0 to 150.

In addition, examples of a compound which may be used in the composition according to the present invention may include compounds synthesized in the Examples of Japanese Patent Application Laid-Open No. 2002-363146, compounds described in paragraph no. 0108 of Japanese Patent Application Laid-Open No. 2007-298569, and the like.

As the basic compound, a photosensitive basic compound may also be used. As the photosensitive basic compound, it is possible to use, for example, compounds described in Japanese Unexamined Patent Application Publication No. 2003-524799, J. Photopolym. Sci & Tech. Vol. 8. P. 543-553 (1995), and the like.

The molecular weight of the basic compound is usually 100 to 1,500, preferably 150 to 1,300, and more preferably 200 to 1,000.

These basic compounds may be used either alone or in combination of two or more thereof.

When the composition according to the present invention includes a basic compound, the content thereof is preferably 0.01 to 8.0% by mass, more preferably 0.1 to 5.0% by mass, and particularly preferably 0.2 to 4.0% by mass, based on the total solid content of the composition.

The molar ratio of the basic compound to the photo-acid generator is preferably 0.01 to 10, more preferably 0.05 to 5, and still more preferably 0.1 to 3. When the molar ratio is excessively large, the sensitivity and/or resolution may be reduced in some cases. When the molar ratio is excessively small, thinning of the pattern may occur between exposure and heating (post-baking). The molar ratio is more preferably 0.05 to 5, and still more preferably 0.1 to 3.

[5] Hydrophobic Resin (HR)

The actinic ray-sensitive or radiation-sensitive resin composition of the present invention may have a hydrophobic resin (HR) separately from the resin (A).

The hydrophobic resin (HR) is unevenly distributed in the film surface, and thus preferably contains a fluorine atom-containing group, a silicon atom-containing group or a hydrocarbon group having 5 or more carbon atoms. These groups may be present in the main chain of the resin, or may be substituted with the side chain. Hereinafter, specific examples of the hydrophobic resin (HR) will be shown.

(HR-1)

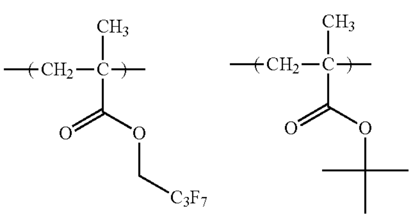

(HR-2)

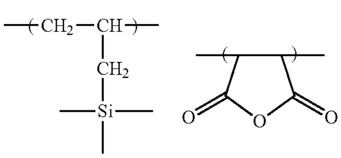

(HR-3)

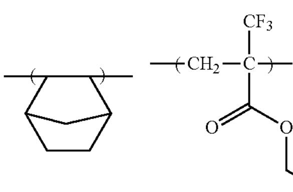

(HR-4)

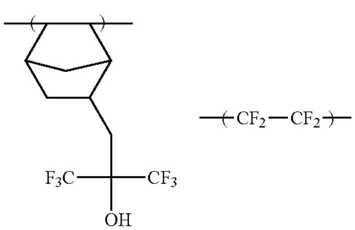

-continued (HR-5)

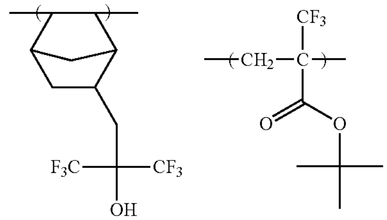

(HR-6)

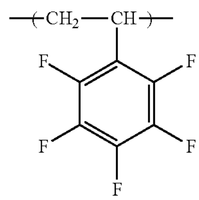

(HR-7)

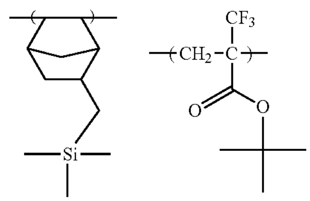

(HR-8)

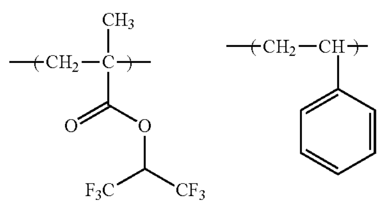

(HR-9)

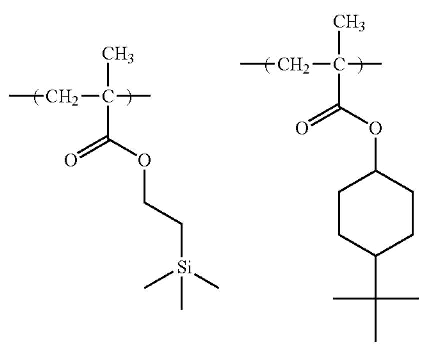

(HR-10)

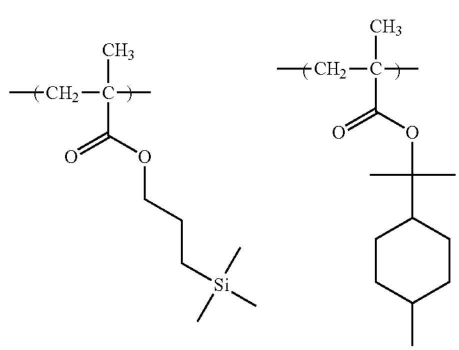

-continued
(HR-11)
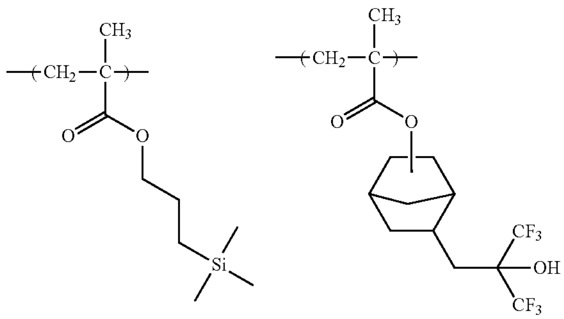
(HR-12)
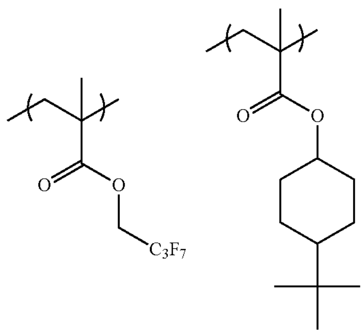
(HR-13)
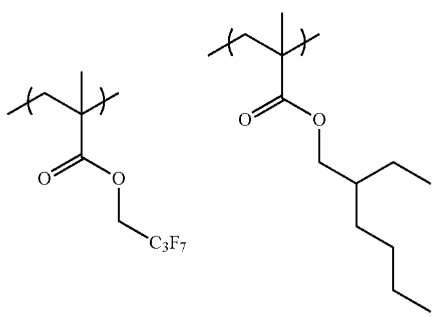
(HR-14)
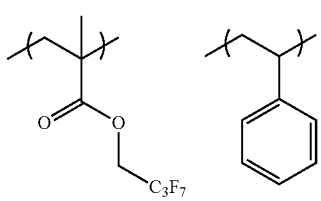
(HR-15)
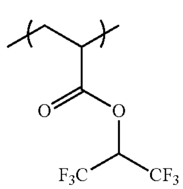
(HR-16)
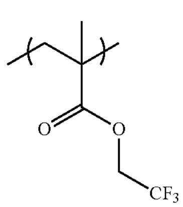
-continued
(HR-17)
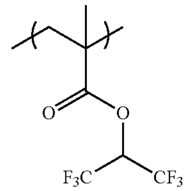
(HR-18)
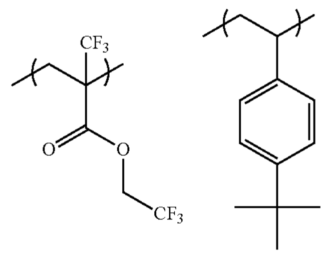
(HR-19)
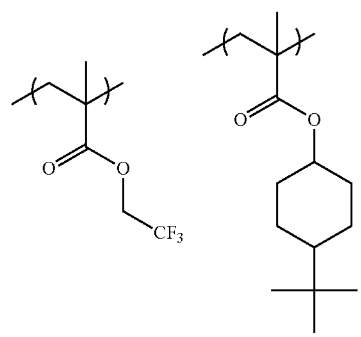
(HR-20)
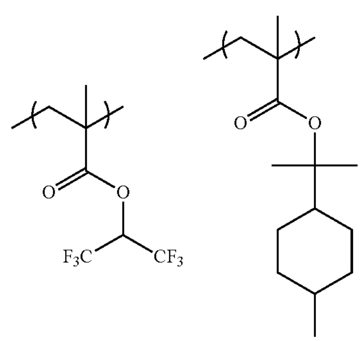
(HR-21)
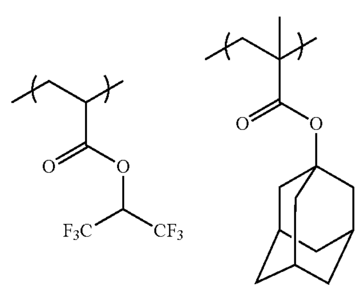
(HR-22)
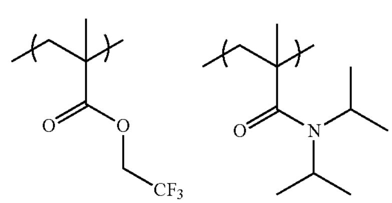

-continued (HR-23)

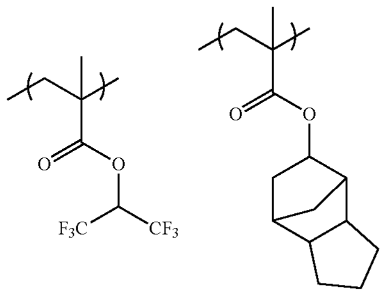

(HR-24)

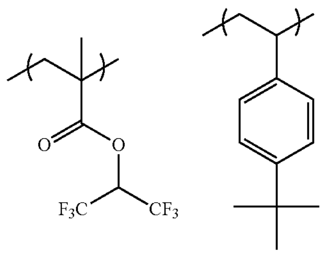

(HR-25)

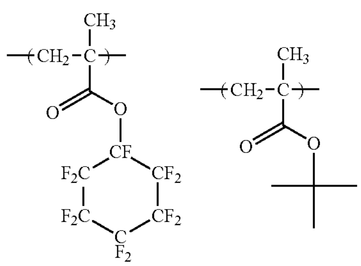

(HR-26)

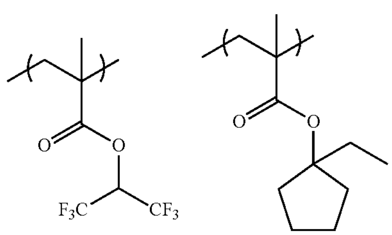

(HR-27)

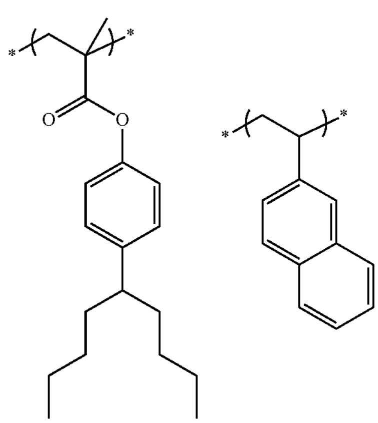

-continued (HR-28)

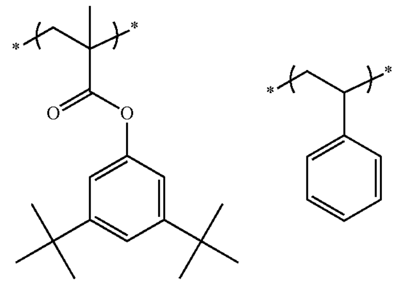

Meanwhile, as the hydrophobic resin, in addition, those described in Japanese Patent Application Laid-Open Nos. 2011-248019, 2010-175859 and 2012-032544 may also be preferably used.

[6] Surfactant

The actinic ray-sensitive or radiation-sensitive composition according to the present invention may further include a surfactant. As the surfactant, a fluorine-based surfactant and/or a silicone-based surfactant are/is particularly preferred.

Examples of the fluorine-based and/or silicone-based surfactant may include: Megafac F176 and Megafac R08 manufactured by Dainippon Ink and Chemicals, Inc.; PF656 and PF6320 manufactured by OMNOVA Solutions, Inc.; Troysol S-366 manufactured by Troy Chemical Corp.; Florad FC430 manufactured by Sumitomo 3M Ltd.; and Polysiloxane Polymer KP-341 manufactured by Shin-Etsu Chemical Co., Ltd.

A surfactant other than the fluorine-based surfactant and/or the silicone-based surfactant may also be used. Examples of the surfactant may include a nonionic surfactant such as polyoxyethylene alkyl ethers and polyoxyethylene alkylaryl ethers.

In addition, publicly known surfactants may be appropriately used. Examples of the surfactant which may be used may include surfactants described from paragraph no. 102731 of U.S. Patent Application Publication No. 2008/0248425A1.

The surfactants may be used either alone or in combination of two or more thereof.

When the composition according to the present invention further includes a surfactant, the amount of surfactant used is preferably 0.0001 to 2% by mass, and more preferably 0.001 to 1% by mass, based on the total solid content of the composition.

[7] Other Additives

The composition of the present invention may appropriately contain, in addition to the components described above, carboxylic acid, an onium carboxylate, a dissolution inhibiting compound having a molecular weight of 3,000 or less described in Proceeding of SPIE, 2724, 355 (1996) and the like, a dye, a plasticizer, a photosensitizer, a light absorber, an antioxidant, and the like.

In particular, carboxylic acid is suitably used for enhancing the performance. As the carboxylic acid, an aromatic carboxylic acid such as benzoic acid and naphthoic acid is preferred.

The content of the carboxylic acid is preferably 0.01 to 10% by mass, more preferably 0.01 to 5% by mass, and still more preferably 0.01 to 3% by mass, based on the total solid content concentration of the composition.

The actinic ray-sensitive or radiation-sensitive resin composition in the present invention is preferably used in a film thickness of 10 to 250 nm, more preferably 20 to 200 nm, and still more preferably 30 to 100 nm, from the viewpoint of enhancing the resolution. Such a film thickness may be achieved by setting the solid content concentration in the composition to an appropriate range, thereby imparting an appropriate viscosity to enhance the coatability and film-forming property.

The solid content concentration of the actinic ray-sensitive or radiation-sensitive resin composition in the present invention is usually 1.0 to 10% by mass, preferably 2.0 to 5.7% by mass, and more preferably 2.0 to 5.3% by mass. By setting the solid content concentration to the range above, the resist solution may be uniformly coated on a substrate, and furthermore, a resist pattern excellent in the line width roughness may be formed. The reason therefor is not clear, but it is considered that probably by setting a solid content concentration to 10% by mass or less, preferably 5.7% by mass or less, aggregation of materials, particularly, a photo-acid generator, in the resist solution is suppressed, and as a result, a uniform resist film may be formed.

The solid content concentration is a weight percentage of the weight of the other resist components excluding the solvent, based on the total weight of the actinic ray-sensitive or radiation-sensitive resin composition.

The actinic ray-sensitive or radiation-sensitive resin composition in the present invention is used by dissolving the aforementioned components in a predetermined organic solvent, preferably in the mixed solvent, filtering the solution, and then coating the filtrate on a predetermined support (substrate). The filter used for filtration through a filter is preferably a polytetratluoroethylene-, polyethylene- or nylon-made filter having a pore size of 0.1 μm or less, more preferably 0.05 μm or less, and still more preferably 0.03 μm or less. In the filtration through a filter, as described, for example, in Japanese Patent Application Laid-Open No. 2002-62667, circulating filtration may be performed, or the filtration may be performed by connecting a plurality of filters in series or in parallel. Further, the composition may be filtered a plurality of times. Furthermore, the composition may be subjected to deaeration treatment or the like before and after filtration through a filter.

(2) Exposure Process

The wavelength of a light source used in the exposure device in the present invention is not limited, but examples thereof may include infrared light, visible light, ultraviolet light, far ultraviolet light, extreme ultraviolet light (EUV light), X-ray, electron beam (EB), and examples of the light source include an far ultraviolet light having a wavelength of preferably 250 nm or less, more preferably 220 nm or less, and particularly preferably 1 to 200 nm, specific examples thereof may include KrF excimer laser (248 nm), ArF excimer laser (193 nm), F2 excimer laser (157 nm), X-ray, EUV light (13 nm), electron beam (EB), and the like, KrF excimer laser, ArF excimer laser, X-ray, EUV light or electron beam is preferred, and electron beam, X-ray or EUV light is more preferred.

When the extreme ultraviolet light (EUV light) or the like is used as an exposure source, EUV light (near 13 nm) is preferably irradiated on the formed corresponding film through a predetermined mask. When the electron beam (EB) is irradiated, a drawing (a direct drawing) without using the mask is common.

With respect to the film formed of the resist composition according to the present invention, upon irradiation with an actinic ray or radiation, a liquid (liquid immersion medium) having a refractive index higher than that of the air may be filled between the film and the lens, and the exposure (liquid immersion exposure) may be performed. Accordingly, the resolution may be improved. Any available liquid immersion medium may be used as long as the medium is a liquid having a refractive index higher than that of the air, but pure water is preferred.

The immersion liquid used at the time of the liquid immersion exposure will be described below.

The immersion liquid is preferably a liquid which is transparent to light at the exposure wavelength and has a temperature coefficient of refractive index as small as possible in order to minimally suppress the distortion of an optical image projected on the resist film, but water is preferably used, from the viewpoint of easy availability and easy handleability in addition to the above-described viewpoint.

Further, from the viewpoint of further improving the refractive index, a medium having a refractive index of 1.5 or more may also be used. This medium may be an aqueous solution or an organic solvent.

When water is used as the immersion liquid, an additive (liquid) capable of making the effect on the optical coating at the undersurface of the lens element negligible may be added in a small ratio without dissolving the resist film on the wafer in order to decrease the surface tension of water and simultaneously increase the interfacial activity. Such an additive is preferably an aliphatic alcohol having a refractive index almost equal to that of water, and specific examples thereof may include methyl alcohol, ethyl alcohol, isopropyl alcohol and the like. By adding an alcohol having a refractive index almost equal to that of water, even though the alcohol component in water is evaporated and the content concentration thereof is changed, it is possible to obtain an advantage in that a change in the refractive index of the liquid as a whole may be made very small. Meanwhile, when an impurity greatly different from water in the refractive index is incorporated, the distortion of the optical image projected on the resist film may be incurred, and thus the water used is preferably distilled water. In addition, pure water filtered through an ion exchange filter or the like may be used.

The electrical resistance of water is preferably 18.3 MΩcm or more, TOC (organic concentration) is preferably 20 ppb or less, and the water is preferably subjected to deaeration treatment.

Furthermore, the lithography performance may be enhanced by increasing the refractive index of the immersion liquid. From this viewpoint, an additive for increasing the refractive index may be added to water, or deuterium ($D_2O$) may be used instead of water.

Between the film according to the composition of the present invention and the immersion liquid, in order not to bring the film into direct contact with the immersion liquid, a film (hereinafter, also referred to as a "topcoat") that is poorly soluble in the immersion liquid may be formed. Examples of a function required for the topcoat may include coating suitability to the upper layer portion of the composition film, and poor solubility in the immersion liquid. It is preferred that the topcoat may be uniformly coated onto the upper layer of the composition film without being mixed with the composition film.

Specific examples of the topcoat may include a hydrocarbon polymer, an acrylic acid ester polymer, polymethacrylic acid, polyacrylic acid, polyvinyl ether, a silicone-containing polymer, a fluorine-containing polymer, and the like. From the viewpoint that the optical lens is contaminated when impurities are eluted from the topcoat to the immersion liquid, it is preferred that the amounts of residual monomer components of the polymer included in the topcoat are small.

When the topcoat is peeled off, a developer may be used, or a separate peeling agent may be used. As the peeling agent, a solvent which minimally penetrates the film is preferred. From the viewpoint that the peeling process may be performed simultaneously with the developing treatment process of the film, it is preferred that the topcoat may be peeled off by the developer including an organic solvent.

In a case where there is no difference in the refractive index between the topcoat and the immersion liquid, the resolution is improved. When water is used as the immersion liquid, it is preferred that the topcoat has a refractive index close to the refractive index of the immersion liquid. From the viewpoint of setting the refractive index close to that of the immersion liquid, it is preferred that the topcoat has a fluorine atom. Further, from the viewpoint of transparency and refractive index, the topcoat is preferably a thin film.

It is preferred that the topcoat is not mixed with the film nor with the immersion liquid. From this viewpoint, when the immersion liquid is water, it is preferred that the solvent used for the topcoat is poorly soluble in the solvent used for the composition of the present invention and is a water-insoluble medium. In addition, when the immersion liquid is an organic solvent, the topcoat may be water-soluble or water-insoluble.

(Baking)

After the exposure, it is preferred that the baking (heating) is performed before the development process is performed.

The heating temperature is performed preferably at 60 to 150° C., more preferably at 80 to 150° C., and still more preferably at 90 to 140° C.

The heating time is not particularly limited, but is preferably 30 to 300 seconds, more preferably 30 to 180 seconds, and still more preferably 30 to 90 seconds.

The heating may be performed by a means equipped with a common exposure•developing machine, or may also be performed by using a hot plate or the like.

By baking, the reaction of the exposure portion may be promoted, and the sensitivity or the pattern profile is improved. Furthermore, it is preferred that the heating process (post bake) is also included after the rinsing process. The heating temperature and the heating time are the same as those described above. By baking, the developer and the rinse liquid remaining between patterns and inside of the pattern are removed.

(3) Organic Solvent Developing Process

In the organic solvent developing process, by developing the exposed film using a developer including an organic solvent, it is possible to form a negative-type pattern having a space part obtained by removing a part of the film and a residual film part which has not been removed by the development, Developer The vapor pressure of the developer (the whole vapor pressure in a case of a mixed solvent) is preferably 5 kPa or less, more preferably 3 kPa or less, and particularly preferably 2 kPa or less, at 20° C. By adjusting the vapor pressure of the organic solvent to 5 kPa or less, the evaporation of the developer on a substrate or in the development cup is suppressed, so that the temperature uniformity in the wafer plane is improved, and as a result, the dimensional uniformity in the wafer plane is improved.

As an organic solvent used in a developer, various organic solvents may be widely used, and for example, a solvent such as an ester-based solvent, a ketone-based solvent, an alcohol-based solvent, an amide-based solvent, an ether-based solvent, and a hydrocarbon-based solvent may be used.

In the present invention, the ester-based solvent refers to a solvent having an ester group in the molecule, the ketone-based solvent refers to a solvent having a ketone group in the molecule, the alcohol-based solvent refers to a solvent having an alcoholic hydroxyl group in the molecule, the amide-based solvent refers to a solvent having an amide group in the molecule, and the ether-based solvent refers to as a solvent having an ether bond in the molecule. Among them, there are solvents having several kinds of the functional groups in one molecule, and that case corresponds to all kinds of solvents which contain functional groups which the solvent has. For example, diethylene glycol monomethyl ether corresponds to any of the alcohol-based solvent and the ether-based solvent in the above classification. In addition, the hydrocarbon-based solvent refers to a hydrocarbon solvent having no substituent.

In particular, the developer may be preferably a developer containing at least one kind of solvent selected from a ketone-based solvent, an ester-based solvent, an alcohol-based solvent and an ether-based solvent.

Examples of the ester-based solvent may include methyl acetate, ethyl acetate, butyl acetate, pentyl acetate, isopropyl acetate, amyl acetate, isoamyl acetate, methoxy ethyl acetate, ethoxy ethyl acetate, propylene glycol monomethyl ether acetate (PGMEA; also known as 1-methoxy-2-acethoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutylacetate, 3-methoxybutylacetate, 4-methoxybutylacetate, 3-methyl-3-methoxybutylacetate, 3-ethyl-3-methoxybutylacetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoactate, ethyl acetoactate, methyl propionate, ethyl propionate, propyl propionate, isopropyl propionate, methyl 2-hydroxy propionate, ethyl 2-hydroxy propionate, methyl-3-methoxy propionate, ethyl-3-methoxy propionate, ethyl-3-ethoxy propionate, propyl-3-methoxy propionate, and the like.

Examples of the ketone-based solvent may include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, γ-butyrolactone, and the like.

Examples of the alcohol-based solvent may include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 2-hexyl alcohol, n-heptyl alcohol, n-octyl alcohol, n-decanol and 3-methoxy-1-butanol, a glycol-based solvent such as ethylene glycol, diethylene glycol and triethylene glycol, a glycol ether-based solvent containing a hydroxyl group such as ethylene glycol monomethyl ether, propylene glycol monomethyl ether (PGME; also known as 1-methoxy-2-propaneol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether, and the like. Among them, it is preferred to use a glycol ether-based solvent.

Examples of the ether-based solvent may include, in addition to the glycol ether-based solvents containing a hydroxyl group, a glycol ether-based solvents containing no hydroxyl group, such as propylene glycol dimethyl ether, propylene glycol diethyl ether, diethylene glycol dimetyl ether and dietylene glycol diethyl ether, an aromatic ether solvent such as anisole and phenetol, dioxane, tetrahyrofuran, tetrahydropyran, perfluoro-2-butyl tetrahydrofuran, perfluoro tetrahyrofuran, 1,4-dioxane, and the like. Preferably, the glycol ether-based solvent or the aromatic ether solvent such as anisole is used.

As the amide-based solvent, it is possible to use, for example, N-methyl-2-pyrrolidone, N,N-dimethylacetamide, N,N-dimethylformamide, hexamethylphosphoric triamide, 1,3-dimethyl-2-imidazolidinone, and the like.

Examples of the hydrocarbon-based solvent may include an aliphatic hydrocarbon-based solvent such as pentane, hexane, octane, decane, 2,2,4-trimethylpentane, 2,2,3-trimethylhexane, perfluorohexane and perfluoroheptane, and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among them, the aromatic hydrocarbon-based solvent is preferred.

A plurality of the solvents may be mixed, or the solvents may be used in a mixture with a solvent other than those described above or with water. However, in order to sufficiently exhibit the effects of the present invention, the water content ratio of the entire developer is preferably less than 10% by mass, and it is more preferred that the developer contains substantially no moisture.

The concentration (content) of the organic solvent in the developer (the sum in a case of a mixture of a plurality thereof) is preferably 50% by mass to 100% by mass, more preferably 70% by mass to 100% by mass, and still more preferably 90% by mass to 100% by mass, based on the total amount of the developer. Particularly preferably, the developer is a case of a developer substantially consisting of only an organic solvent. Meanwhile, the case of a developer substantially consisting of only an organic solvent includes the case where the solvent contains a small amount of surfactants, antioxidants, stabilizers, anti-foaming agent, and the like.

Among the solvents, those containing one or more selected from the group of butyl acetate, pentyl acetate, isopentyl acetate, propylene glycol monomethyl ether acetate, and anisole are more preferred.

Examples of the organic solvent used as a developer may suitably include an ester-based solvent.

As the ester-based solvent, the solvents represented by Formula (S1) to be described below or the solvents represented by Formula (S2) to be described below are more preferably used, the solvents represented by Formula (S1) are still more preferably used, alkyl acetate is particularly preferably used, and butyl acetate, pentyl acetate or isopentyl acetate is most preferably used.

R—C(═O)—O—R' Formula (S1)

In Formula (S1),

Each of R and R' independently represents a hydrogen atom, an alkyl group, a cycloalkyl group, an alkoxyl group, an alkoxycarbonyl group, a carboxyl group, a hydroxyl group, a cyano group or a halogen atom. R and R' may be bonded to each other to form a ring.

The alkyl group, the alkoxyl group and the alkoxycarbonyl group for R and R' have preferably in a range of 1 to 15 carbon atoms, and the cycloalkyl group has preferably 3 to 15 carbon atoms.

R and R' are preferably a hydrogen atom or an alkyl group, the alkyl group, the cycloalkyl group, the alkoxyl group and the alkoxycarbonyl group for R and R' and the ring formed by combining R and R' with each other may be substituted with a hydroxyl group, a group including a carbonyl group (for example, an acyl group, an aldehyde group, an alkoxycarbonyl group, and the like), a cyano group, and the like.

Examples of the solvent represented by Formula (S1) may include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxy methyl propionate, 2-hydroxy ethyl propionate, and the like.

Among them, R and R' are preferably an unsubstituted alkyl group.

The solvent represented by Formula (S1) is preferably alkyl acetate, and more preferably butyl acetate, pentyl acetate or isopentyl acetate.

The solvent represented by Formula (S1) may be used in combination with one or more kinds of other organic solvents. The combined solvent in this case is not particularly limited as long as the combined solvent may be mixed without being separated from the solvent represented by Formula (S1), the solvents represented by Formula (S1) may be used in combination with each other, and the solvent represented by Formula (S1) may be used in a mixture with a solvent selected from other ester-based solvents, ketone-based solvents, alcohol-based solvents, amide-based solvents, ether-based solvents and hydrocarbon-based solvents. One or more kinds of the combined solvents may be used, but one kind of the combined solvent is preferred in order to obtain a stable performance. In a case of using a mixture of one or more kinds of the combined solvents, the mixing ratio of the solvent represented by Formula (S1) and the combined solvent is usually 20:80 to 99:1, preferably 50:50 to 97:3, more preferably 60:40 to 95:5, and most preferably 60:40 to 90:10 by mass.

R''—C(═O)—O—R'''—O—R'''' Formula (S2)

In Formula (S2),

Each of R'' and R'''' independently represents a hydrogen atom, an alkyl group, a cycloalkyl group, an alkoxyl group, an alkoxycarbonyl group, a carboxyl group, a hydroxyl group, a cyano group or a halogen atom. R'' and R'''' may be bonded to each other to form a ring.

R'' and R'''' are preferably a hydrogen atom or an alkyl group. The alkyl group, the alkoxyl group and the alkoxycarbonyl group for R'' and R'''' have preferably in a range of 1 to 15 carbon atoms, and the cycloalkyl group has preferably 3 to 15 carbon atoms.

R''' represents an alkylene group or a cycloalkylene group. R''' is preferably an alkylene group. The alkylene group for R''' has preferably in a range of 1 to 10 carbon atoms. The cycloalkylene group for R''' has preferably in a range of 3 to 10 carbon atoms.

The alkyl group, the cycloalkyl group, the alkoxyl group and the alkoxycarbonyl group for R'' and R'''', the alkylene group and the cycloalkylene group for R''', and the ring formed by combining R'' and R'''' with each other may be substituted with a hydroxyl group, a group including a carbonyl group (for example, an acyl group, an aldehyde group, an alkoxycarbonyl, and the like), a cyano group, and the like.

The alkylene group of R''' in Formula (S2) may have an ether bond in the alkylene chain.

Examples of the solvent represented by Formula (S2) may include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, methoxy ethyl acetate, ethoxy ethyl acetate, 2-methoxybutylacetate, 3-methoxybutylacetate, 4-methoxybutylacetate, 3-methyl-3-methoxybutylacetate, 3-ethyl-3-methoxybutylacetate, 2-ethoxybutylacetate, 4-ethoxybutylacetate, 4-propoxy butylacetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, and the like, and propylene glycol monomethyl ether acetate is preferred.

Among them, R'' and R'''' are an unsubstituted alkyl group, R''' is preferably an unsubstituted alkylene group, R'' and R'''' may be more preferably any one of a methyl group and an ethyl group, and R'' and R'''' are still more preferably a methyl group.

The solvent represented by Formula (S2) may be used in combination with one or more kinds of other organic solvents. The combined solvent in this case is not particularly limited as long as the combined solvent may be mixed without being separated from the solvent represented by Formula (S2), the solvents represented by Formula (S2) may be used in combination with each other, and the solvent represented by Formula (S2) may be used in a mixture with a solvent selected from other ester-based solvents, ketone-based solvents, alcohol-based solvents, amide-based solvents, ether-based solvents and hydrocarbon-based solvents. One or more kinds of the combined solvents may be used, but one kind of the combined solvent is preferred in order to obtain a stable performance. In a case of using a mixture of one or more kinds of the combined solvents, the mixing ratio of the solvent represented by Formula (S2) and the combined solvent is usually 20:80 to 99:1, preferably 50:50 to 97:3, more preferably 60:40 to 95:5, and most preferably 60:40 to 90:10, by mass.

Furthermore, examples of the organic solvent used as a developer may suitably include an ether-based solvent.

Examples of the available ether-based solvent may include the above-described ether-based solvents, and among them, an ether-based solvent including one or more aromatic rings is preferred, a solvent represented by the following Formula (S3) is more preferred, and anisole is most preferred.

(S3)

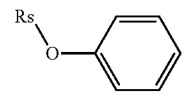

In Formula (S3), $R_5$ represents an alkyl group. As the alkyl group, an alkyl group having 1 to 4 carbon atoms is preferred, a methyl group or an ethyl group is more preferred, and a methyl group is most preferred.

In the present invention, the water content ratio of the developer is usually 10% by mass or less, preferably 5% by mass or less, and more preferably 1% by mass or less, and it is most preferred that the developer contains substantially no moisture.

Surfactant

The developer including an organic solvent may contain a surfactant in an appropriate amount, if necessary.

As a surfactant, it is possible to use those which are the same as the surfactant used in the actinic ray-sensitive or radiation-sensitive resin composition, which will be described below.

The amount of the surfactant used is usually 0.001 to 5% by mass, preferably 0.005 to 2% by mass, and more preferably 0.01 to 0.5% by mass, based on the total amount of the developer.

Developing Method

As for the developing method, it is possible to apply, for example, a method of dipping a substrate in a bath filled with a developer for a predetermined time (dipping method), a method of performing development by raising a developer on a substrate surface sufficiently by a surface tension and keeping the substrate for a predetermined time (puddle method), a method of spraying a developer on a substrate surface (spraying method), a method of continuously ejecting a developer on a substrate spinning at a predetermined speed while scanning a developer ejecting nozzle at a constant rate (dynamic dispense method) and the like.

In addition, the process of stopping development while substituting the solvent with other solvents may be carried out after the process of performing development.

The time of development is not particularly limited to as long as the resin of the unexposed portion melts sufficiently, and the time is usually 10 to 300 seconds, and preferably 20 to 120 seconds.

The temperature of the developer is preferably 0° C. to 50° C., and more preferably 15° C. to 35° C.

(Rinse)

The pattern forming method of the present invention may include a process of performing the cleaning using a rinse liquid including an organic solvent, after the development process (3).

Rinse Liquid

The vapor pressure (the whole vapor pressure in a case of a mixed solvent) of the rinse liquid used after the development is preferably 0.05 kPa to 5 kPa, more preferably 0.1 kPa to 5 kPa, and most preferably 0.12 kPa to 3 kPa, at 20° C. By setting the vapor pressure of the rinse liquid to 0.05 kPa to 5 kPa, the temperature uniformity in the wafer plane is improved, and furthermore, swelling caused by permeation of the rinse liquid is suppressed, so that the dimensional uniformity in the wafer plane is improved.

As the rinse liquid, various organic solvents are used, but it is preferred to use a rinse liquid containing at least one organic solvent selected from a hydrocarbon-based solvent, a ketone-based solvent, an ester-based solvent, an alcohol-based solvent, an amide-based solvent and an ether-based solvent, or water.

More preferably, after the development, a process of performing washing using a rinse liquid containing at least one organic solvent selected from a ketone-based solvent, an ester-based solvent, an alcohol-based solvent, an amide-based solvent or a hydrocarbon-based solvent is performed. Still more preferably, after the development, a process of performing washing using a rinse liquid containing an alcohol-based solvent or a hydrocarbon-based solvent is performed.

Particularly preferably, a rinse liquid containing at least one kind selected from the group of a monohydric alcohol and a hydrocarbon-based solvent is used.

Here, examples of the monohydric alcohol used in the rinsing process after the development may include a straight, branched or cyclic monohydric alcohol, and specifically, it is possible to use 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 3-methyl-3-pentanol, cyclopentane, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexane, 5-methyl-2-hexanol, 4-methyl-2-hexanol, 4,5-dityl-2-hexanol, 6-methyl-2-heptanol, 7-methyl-2-octanol, 8-methyl-2-nonanol, 9-methyl-2-decanol, and the like, preferred examples thereof may include 1-hexanol, 2-hexanol, 1-pentanol, 3-methyl-1-butanol, 3-methyl-2-pentanol, 3-methyl-3-pentanol, 4-methyl-2-pentanol, and 4-methyl-3-pentanol, and most preferred examples thereof may include 1-hexanol or 4-methyl-2-pentanol.

Examples of hydrocarbon-based solvent may include an aromatic hydrocarbon-based solvent such as toluene and xylene, and an aliphatic hydrocarbon-based solvent such as octane and decane.

The rinse liquid contains more preferably at least one kind selected from the group of 1-hexanol, 4-methyl-2-pentanol and decane.

A plurality of the components may be mixed, or the components may be used in a mixture with an organic solvent other than those described above. The solvent may be mixed with water, but the content ratio of water in the rinse liquid is usually 60% by mass or less, preferably 30% by mass or less, more preferably 10% by mass or less, and most preferably 5% by mass or less. By setting the water content ratio to 60% by mass or less, good rinse characteristics may be obtained.

The rinse liquid may also be used by adding an appropriate amount of a surfactant thereto.

As a surfactant, it is possible to use those which are the same as the surfactant used as in the actinic ray-sensitive or radiation-sensitive resin composition, which will be described below, and the amount of the surfactant used is usually 0.001 to 5% by mass, preferably 0.005 to 2% by mass, and more preferably 0.01 to 0.5% by mass, based on the total amount of the rinse liquid.

Rinsing Method

In the rinsing process, the wafer subjected to development is subjected to washing treatment by using the aforementioned rinse liquid including the organic solvent.

The method of washing treatment is not particularly limited, but it is possible to apply, for example, a method of continuously ejecting a rinse liquid on a substrate spinning at a predetermined speed (spin ejection method), a method of dipping a substrate in a bath filled with a rinse liquid for a predetermined time (dipping method), a method of spraying a rinse liquid on a substrate surface (spraying method), and the like, and among them, it is preferred that the rinsing treatment is performed by the spin ejection method and after the rinsing, the substrate is spun at a number of revolutions of 2,000 rpm to 4,000 rpm to remove the rinse liquid from the substrate.

The time of rinsing is not particularly limited, but is usually 10 to 300 seconds, preferably 10 to 180 seconds, and most preferably 20 to 120 seconds.

The temperature of the rinse liquid is preferably 0° C. to 50° C., and more preferably 15° C. to 35° C.

In addition, after the development treatment or rinsing treatment, the process of removing the developer or the rinse liquid attached onto the pattern by supercritical fluid may be performed.

Furthermore, after the development treatment or rinsing treatment or the treatment by supercritical fluid, the heating treatment may be performed in order to remove a residual solvent in the pattern. The heating temperature is not particularly limited as long as the heating temperature may obtain a good resist pattern, and is usually 40° C. to 160° C. The heating temperature is preferably 50° C. to 150° C., and most preferably 50° C. to 110° C. The heating time is not particularly limited as long as the heating time may obtain a good resist pattern, and is usually 15 to 300 seconds, and preferably 15 to 180 seconds.

(4) a process of forming a resist film for reversing a pattern on the negative-type pattern, so as to be embedded in the space part in the negative-type pattern In the process (4), it is preferred that the resist film for reversing a pattern is formed using a composition for forming a resist film for reversing a pattern, which contains an organic silicon compound having a siloxane bond. In this composition for forming a resist film for reversing a pattern, an oxide of an element belonging to Group III, Group IV, and Group V other than silicon may be blended.

The composition for forming a resist film for reversing a pattern is coated on the negative-type pattern by a suitable coating method, such as spin coater, so as to be embedded in the space part in the negative-type pattern. Then, the composition is dried to form a resist film for reversing a pattern. In the drying step, it is preferred that heating is performed.

The film thickness is not particularly limited, but is adjusted to preferably in a range of 10 to 500 nm, more preferably in a range of 10 to 200 nm, and still more preferably in a range of 10 to 80 nm.

The heating temperature is performed preferably at 60 to 200° C., more preferably at 80 to 150° C., and still more preferably at 90 to 160° C.

The heating time is not particularly limited, but is preferably 30 to 300 seconds, more preferably 30 to 180 seconds, and still more preferably 30 to 90 seconds.

The heating may be performed using a hot plate and the like.

The resist film for reversing a pattern is preferably a resist film for reversing a pattern with a dissolution rate into an alkaline wet-etching liquid (alkali developer) used in the reversing process (5) to be described below, the dissolution rate being 0.02 nm/second to 2 nm/second, and preferably 0.05 nm/second to 1 nm/second. When the dissolution rate is slower than 0.02 nm/second, the reverse film for reversing a pattern is not dissolved till the part to cover the upper surface of the negative-type pattern, so that there is a possibility that a long time is required, or a pattern is not reversed, or the outer layer of the reversed resist pattern becomes an anticlimax. When the rate is faster than 2 nm/second, there is a possibility that there occurs a disadvantage in that a remaining film of the resist film for reversing a pattern is reduced or the dot dimension of the reversed resist pattern is increased.

In this case, it is preferred that in order to form a pattern such as an isolated line by suitably dissolving the film surface particularly during the alkali development, the alkali-dissolution rate is adjusted to a range of 0.05 nm/second to 1 nm/second. When the dissolution rate is faster than this rate, a film loss at the time of development is too large, and when the dissolution rate is slower than this rate, there is a possibility that the film surface is not dissolved, and a pattern such as an isolated line is not formed. To adjust an appropriate dissolution rate, a material with an optimum dissolution rate may be made by copolymerizing a unit having an alkali-dissolution rate of 1 nm/second or more and a unit having an alkali-dissolution rate of 0.05 nm/second or less and optimizing the copolymerization ratio.

A film (resist film for reversing a pattern) with the dissolution rate into an alkali developer used in the pattern forming method of the present aspect, the dissolution rate being 0.02 nm/second to 2 nm/second may be formed of a composition for forming a resist film for reversing a pattern, which contains an organic silicon compound having at least a siloxane bond and may include an oxide of an element belonging to Group III, Group IV, and Group V other than silicon.

The organic silicon compound having a siloxane bond, which is used in the composition, is obtained by a hydrolysis-condensation reaction of a monomer. As a preferred preparation method, the following method will be exemplified, but the present invention is not limited thereto.

The monomer of the organic silicon-containing compound may be represented by the following Formula (11).

$R^{4}_{m1}R^{42}_{m2}R^{43}_{m3}Si(OR^{40})_{(4-m1-m2-m3)}$ (11)

(In the formula, $R^{40}$ represents a hydrogen atom or an alkyl group having 1 to 6, particularly 1 to 3 carbon atoms, $R^{41}$, $R^{42}$, and $R^{43}$ each represent a hydrogen atom or a monovalent organic group having 1 to 30 carbon atoms, each of m1, m2, and m3 is 0 or 1, m1+m2+m3 is an integer of 0 to 3, particularly preferably 0 or 1)

Here, the organic group means a group including a carbon, and further includes a hydrogen, and may include a nitrogen, an oxygen, a sulfur, a silicon, a fluorine, and the like.

Examples of the organic group of $R^{41}$, $R^{42}$, and $R^{43}$ include a hydrogen atom, an unsubstituted monovalent hydrocarbon group such as a straight, branched or cyclic alkyl group, an alkenyl group, an alkynyl group, an aryl group, and an aralkyl group, and a group in which one or more of hydrogen atom of these groups may be substituted with an epoxy group, an alkoxy group, a hydroxyl group, and the like, and a group intervened by —O—, —CO—, —OCO—, —COO—, and —OCOO—, an organic group including a hexafluoroisopropanol group, a carboxyl group, a phenolic hydroxyl group, a silicon-silicon bond, and the like.

Examples of preferred $R^{40}$, $R^{42}$, and $R^{43}$ of monomers represented by Formula (11) include: a hydrogen atom; an alkyl group such as a methyl group, an ethyl group, a n-propyl group, an iso-propyl group, an n-butyl group, an iso-butyl group, a sec-butyl group, a t-butyl group, an n-pentyl group, a 2-ethylbutyl group, a 3-ethylbutyl group, a 2,2-diethyl propyl group, a cyclopentyl group, an n-hexyl group, and a cyclohexyl group; an alkenyl group such as a vinyl group and an allyl group; an alkynyl group such as an ethynyl group; an aryl group such as a phenyl group and a tolyl group; and an aralkyl group such as a benzyl group and a phenethyl group.

For example, examples of a tetraalkoxy silane, in which m1=0, m2=0, and m3=0 include tetramethoxysilane, tetraethoxysilane, tetra-n-propoxysilane, and tetra-iso-propoxysilane as a monomer. Tetramethoxysilane and tetraethoxysilane are preferred.

Examples of a trialkoxysilane, in which m1=1, m2=0, and m3=0, may include trimethoxysilane, triethoxysilane, tri-n-propoxysilane, tri-iso-propoxysilane, methyl trimethoxysilane, methyl triethoxysilane, methyl tri-n-propoxysilane, methyl tri-iso-propoxysilane, ethyl trimethoxysilane, ethyl triethoxysilane, ethyl tri-n-propoxysilane, ethyl tri-iso-propoxysilane, vinyl trimethoxysilane, vinyl triethoxysilane, vinyl tri-n-propoxysilane, vinyl tri-iso-propoxysilane, n-propyl trimethoxysilane, n-propyl triethoxysilane, n-propyl tri-n-propoxysilane, n-propyl tri-iso-propoxysilane, i-propyl trimethoxysilane, i-propyl triethoxysilane, i-propyl tri-n-propoxysilane, i-propyl tri-iso-propoxysilane, n-butyl trimethoxysilane, n-butyl triethoxysilane, n-butyl tri-n-propoxysilane, n-butyl tri-iso-propoxysilane, sec-butyl trimethoxysilane, sec-butyl triethoxysilane, sec-butyl tri-n-propoxysilane, sec-butyl tri-iso-propoxysilane, t-butyl trimethoxysilane, t-butyl triethoxysilane, t-butyl tri-n-propoxysilane, t-butyl tri-iso-propoxysilane, cyclopropyl trimethoxysilane, cyclopropyl triethoxysilane, cyclopropyl tri-n-propoxysilane, cyclopropyl tri-iso-propoxysilane, cyclobutyl trimethoxysilane, cyclobutyl triethoxysilane, cyclobutyl tri-n-propoxysilane, cyclobutyl tri-iso-propoxysilane, cyclopentyl trimethoxysilane, cyclopentyl triethoxysilane, cyclopentyl tri-n-propoxysilane, cyclopentyl tri-iso-propoxysilane, cyclohexyl trimethoxysilane, cyclohexyl triethoxysilane, cyclohexyl tri-n-propoxysilane, cyclohexyl tri-iso-propoxysilane, cyclohexenyl trimethoxysilane, cyclohexenyl triethoxysilane, cyclohexenyl tri-n-propoxysilane, cyclohexenyl tri-iso-propoxysilane, cyclohexenylethyl trimethoxysilane, cyclohexenylethyl triethoxysilane, cyclohexenyl ethyl tri-n-propoxysilane, cyclohexenylethyl tri-iso-propoxysilane, cyclooctanyl trimethoxysilane, cyclooctanyl triethoxysilane, cyclooctanyl tri-n-propoxysilane, cyclooctanyl tri-iso-propoxysilane, cyclopentadienyl propyl trimethoxysilane, cyclopentadienyl propyl triethoxysilane, cyclopentadienyl propyl tri-n-propoxysilane, cyclopentadienyl propyl tri-iso-propoxysilane, bicycloheptenyl trimethoxysilane, bicycloheptenyl triethoxysilane, bicycloheptenyl tri-n-propoxysilane, bicycloheptenyl tri-iso-propoxysilane, bicycloheptyl trimethoxysilane, bicycloheptyl triethoxysilane, bicycloheptyl tri-n-propoxysilane, bicycloheptyl tri-iso-propoxysilane, adamantyl trimethoxysilane, adamantyl triethoxysilane, adamantyl tri-n-propoxysilane, adamantyl tri-iso-propoxysilane, and the like. Further, examples of a monomer containing an aromatic group include phenyl trimethoxysilane, phenyl triethoxysilane, phenyl tri-n-propoxysilane, phenyl tri-iso-propoxysilane, benzyl trimethoxysilane, benzyl triethoxysilane, benzyl tri-n-propoxysilane, benzyl tri-iso-propoxysilane, tolyl trimethoxysilane, tolyl triethoxysilane, tolyl tri-n-propoxysilane, tolyl tri-iso-propoxysilane, phenetyl trimethoxysilane, phenetyl triethoxysilane, phenetyl tri-n-propoxysilane, phenetyl tri-iso-propoxysilane, naphtyl trimethoxysilane, naphtyl triethoxysilane, naphtyl tri-n-propoxysilane, naphtyl tri-iso-propoxysilane, and the like.

Examples of a dialkoxysilane, in which m1=1, m2=1, and m3=0, may include dimethyl dimethoxysilane, dimethyl diethoxysilane, methylethyl dimethoxysilane, methylethyl diethoxysilane, dimethyl di-n-propoxysilane, dimethyl di-iso-propoxysilane, diethyl dimethoxysilane, diethyl diethoxysilane, diethyl di-n-propoxysilane, diethyl di-iso-propoxysilane, di-n-propyl dimethoxysilane, di-n-propyl diethoxysilane, di-n-propyl-di-n-propoxysilane, di-n-propyl di-iso-propoxysilane, di-iso-propyl dimethoxysilane, di-iso-propyl diethoxysilane, di-iso-propyl-di-n-propoxysilane, di-iso-propyl-di-iso-propoxysilane, di-n-butyl dimethoxysilane, di-n-butyl diethoxysilane, di-n-butyl-di-n-propoxysilane, di-n-butyl-di-iso-propoxysilane, di-sec-butyl dimethoxysilane, di-sec-butyl diethoxysilane, di-sec-butyl-di-n-propoxysilane, di-sec-butyl-di-iso-propoxysilane, di-t-butyl dimethoxysilane, di-t-butyl diethoxysilane, di-t-butyl-di-n-propoxysilane, di-t-butyl-di-isopropoxysilane, dicyclopropyl dimethoxysilane, dicyclopropyl diethoxysilane, dicyclopropyl-di-n-propoxysilane, dicyclopropyl-di-iso-propoxysilane, dicyclobutyl dimethoxysilane, dicyclobutyl diethoxysilane, dicyclobutyl-di-n-propoxysilane, dicyclobutyl-di-iso-propoxysilane, dicyclopentyl dimethoxysilane, dicyclopentyl diethoxysilane, dicyclopentyl-di-n-propoxysilane, dicyclopentyl-di-iso-propoxysilane, dicyclohexyl dimethoxysilane, dicyclohexyl diethoxysilane, dicyclohexyl-di-n-propoxysilane, dicyclohexyl-di-iso-propoxysilane, dicyclohexenyl dimethoxysilane, dicyclohexenyl diethoxysilane, dicyclohexenyl-di-n-propoxysilane, dicyclohexenyl-di-iso-propoxysilane, dicyclohexenylethyl dimethoxysilane, dicyclohexenylethyl diethoxysilane, dicyclohexenylethyl-di-n-propoxysilane, dicyclohexenylethyl-di-iso-propoxysilane, dicyclooctanyl dimethoxysilane, dicyclooctanyl diethoxysilane, dicyclooctanyl-di-n-propoxysilane, dicyclooctanyl-di-iso-propoxysilane, dicyclopentadienylpropyl dimethoxysilane, dicyclopentadienylpropyl diethoxysilane, dicyclopentadienylpropyl-di-n-propoxysilane, dicyclopentadienylpropyl-di-iso-propoxysilane, bis-bicycloheptenyl dimethoxysilane, bis-bicycloheptenyl diethoxysilane, bis-bicycloheptenyl-di-n-propoxysilane, bis-bicycloheptenyl-di-iso-propoxysilane, bis-bicycloheptyl-dimethoxysilane, bis-bicycloheptyl diethoxysilane, bis-bicycloheptyl-di-n-propoxysilane, bis-bicycloheptyl-di-iso-propoxysilane, bis-adamantyl dimethoxysilane, bis-adamantyl diethoxysilane, bis-adamantyl-di-n-propoxysilane, bis-adamantyl-di-iso-propoxysilane, and the like. Furthermore, examples of a monomer containing an aromatic group include diphenyl dimethoxysilane, diphenyl diethoxysilane, methylphenyl dimethoxysilane, methylphenyl diethoxysilane, diphenyl-di-n-propoxysilane, diphenyl-di-iso-propoxysilane, and the like.

Examples of monoalkoxy silane, in which m1=1, m2=1, and m3=1, may include trimethyl methoxysilane, trimethyl ethoxysilane, dimethylethyl methoxysilane, dimethylethyl ethoxysilane, and the like. Further, examples of a monomer containing an aromatic group include dimethylphenyl methoxysilane, dimethylphenyl ethoxysilane, dimethylbenzyl methoxysilane, dimethylbenzyl ethoxysilane, dimethylphenethyl methoxysilane, dimethylphenethyl ethoxysilane, and the like.

It is preferred that a silicon-containing resist film for reversing a pattern exhibits a slight solubility into an alkali developer. In order to control alkali solubility, it is preferred to have a hydrophilic group such as a silanol group, a carboxyl group, a hydroxyl group, a phenolic hydroxyl group, an α-trifluoromethylhydroxyl group, and a lactone ring. A silanol group is converted into silanol while generating a hydrogen gas in alkaline water, when any or all of $R^{41}$, $R^{42}$, and $R^{43}$ in Formula (11) is or are a hydrogen atom. In addition, a silanol may also be generated in the resulting polymer by performing a partial hydrolysis-condensation reaction of a monomer to achieve a partial bonding with a siloxane bond.

A repeating unit having a carboxyl group, an α-trifluoromethylhydroxyl group, and a phenolic hydroxyl group may be represented by the following Formula (11-a).

(11-a)

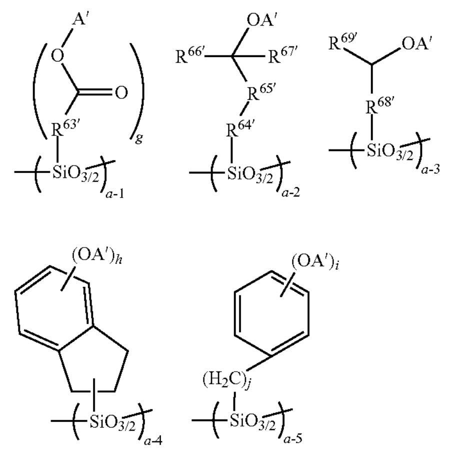

Here, $R^{63'}$, $R^{64'}$, and $R^{68'}$ are a straight, branched, or cyclic alkylene group having 1 to 20 carbon atoms or an arylene group having 6 to 20 carbon atoms, and may be substituted with a fluorine atom or a trifluoromethyl group. $R^{65'}$ is a single bond, or a straight, branched or cyclic alkyl group having 1 to 6 carbon atoms. $R^{66'}$ and $R^{67'}$ are a hydrogen atom, a fluorine atom, or a straight or branched alkyl group having 1 to 4 carbon atoms, or a fluorinated alkyl group, and at least one of $R^{66'}$ and $R^{67'}$ includes one or more fluorine atoms. $R^{69'}$ is a fluorine atom or a trifluoromethyl group. A' is a hydrogen atom, a straight, branched or cyclic alkyl group having 1 to 10 carbon atoms, an acyl group, an alkoxycarbonyl group, or an acid-decomposable group, g, h, and i are 1 or 2, and j is an integer of 0 to 4.

Repeating Unit a-1 may be exemplified below.

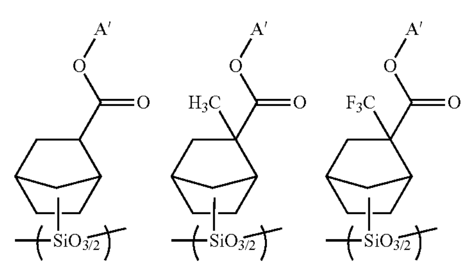

-continued
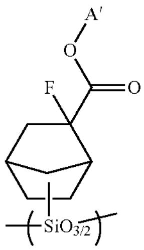
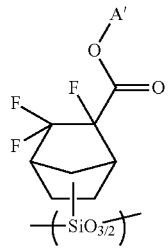
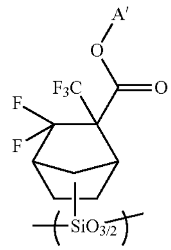
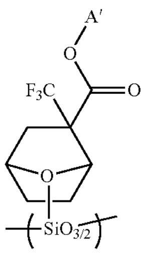
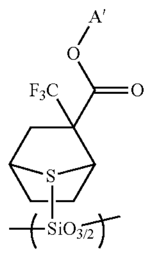
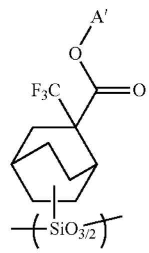
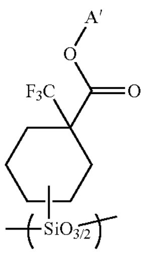
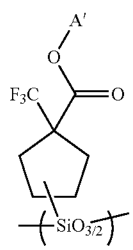
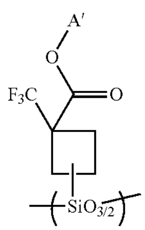
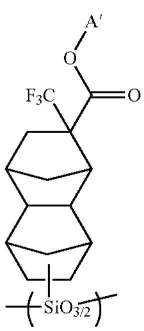
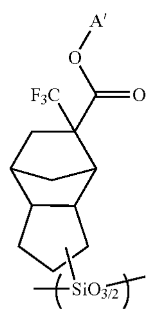
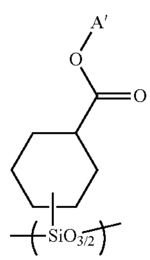
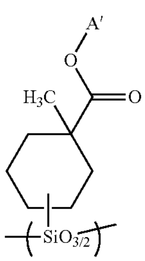
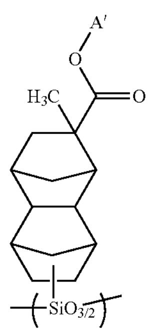
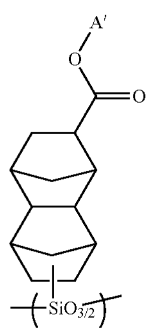
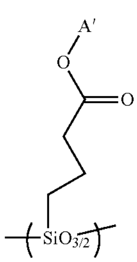
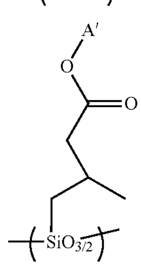
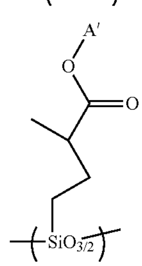
-continued
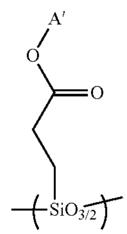
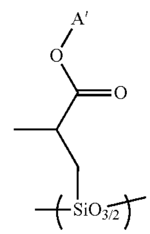
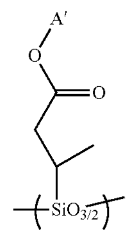
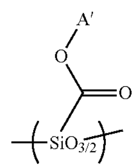
Subsequently, Repeating Unit a-2 may be exemplified below.
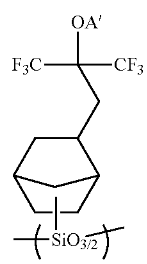
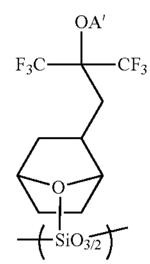
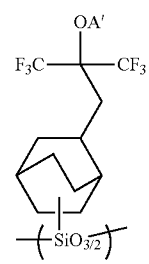
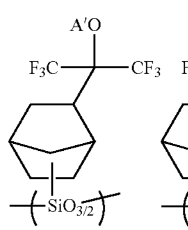
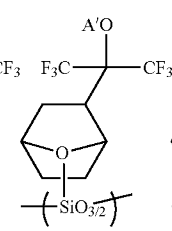
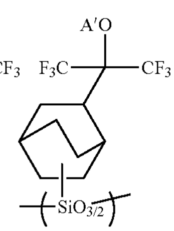
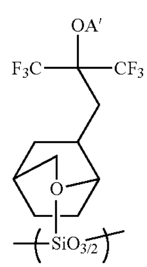
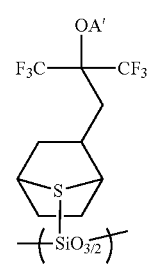
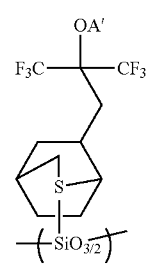
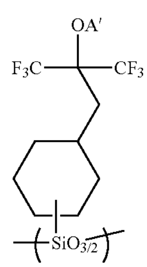
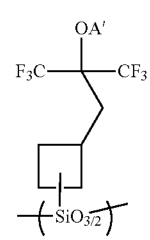
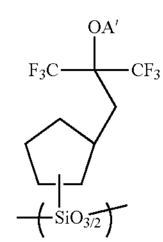

-continued
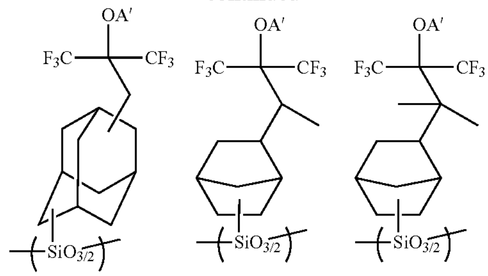
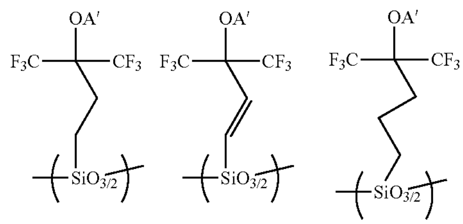
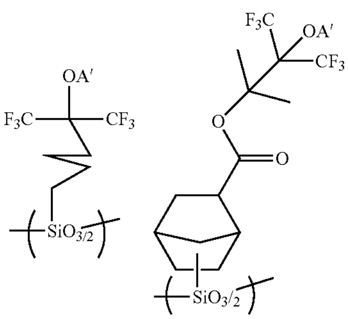
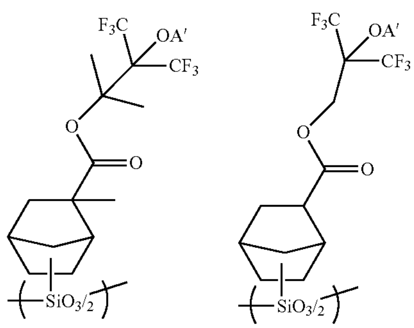
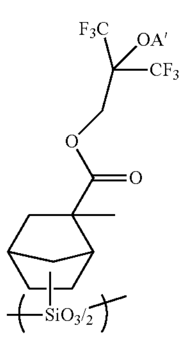
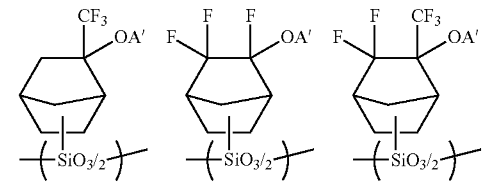
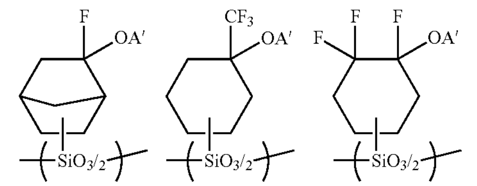
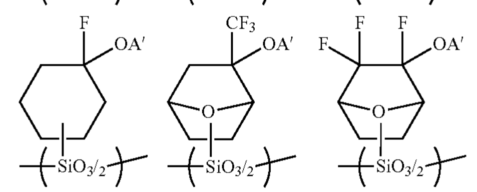
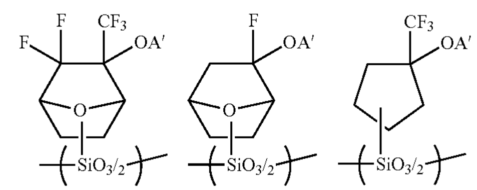
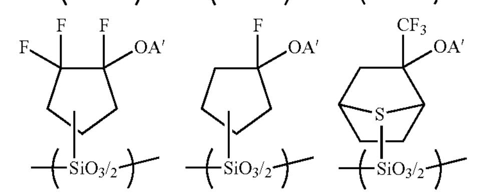
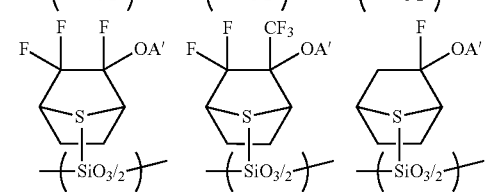
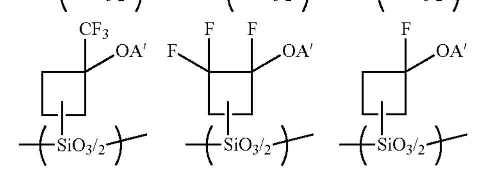
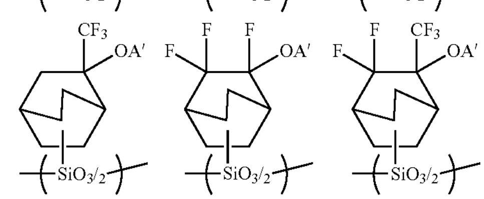
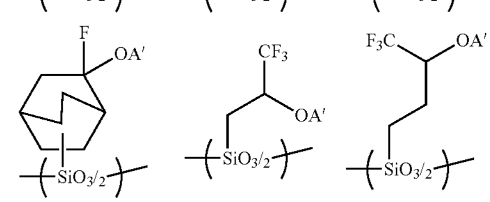
Subsequently, Repeating Unit a-3 may be exemplified below.
Repeating Units a-4 and a-5 may be exemplified below.

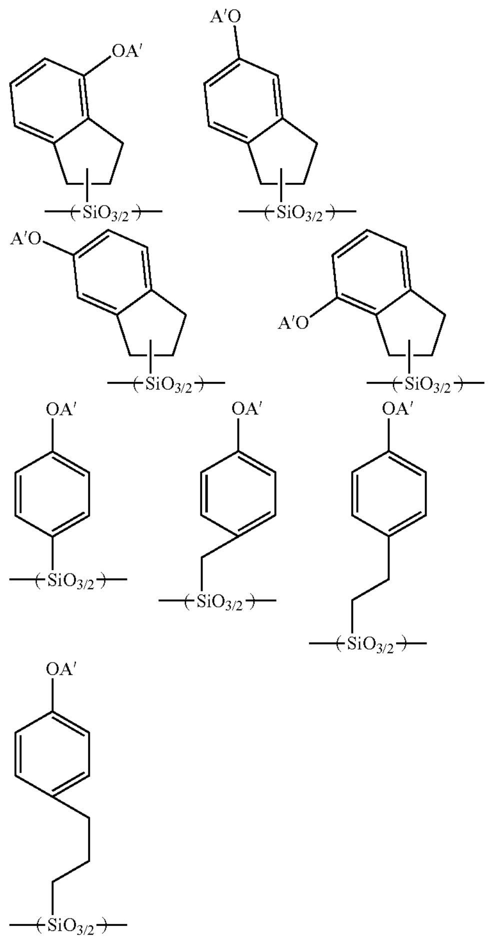

Polysilsesquioxane for a resist film for reversing a pattern in the present invention may copolymerize, in addition to a repeating unit in which alkali solubility is improved by an acid represented by Formula (11), a repeating unit having a hydrophilic group, which has adhesion property. An adhesive group is mainly composed of an oxygen atom such as an alcohol group, a carboxyl group, an ether group, an ester group, an acetyl group, a formyl group, a carbonate group, a lactone ring, a sulfonamide group, a cyano group, and a carboxylic acid anhydride.

Specific examples may be shown below.

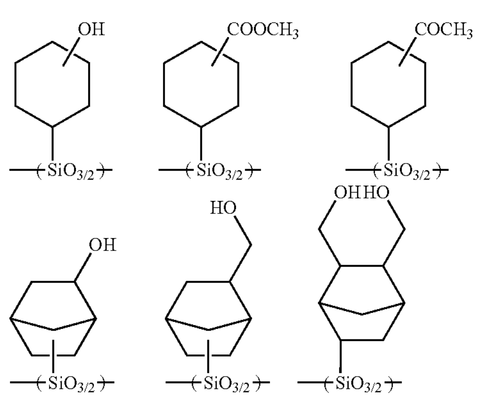

-continued

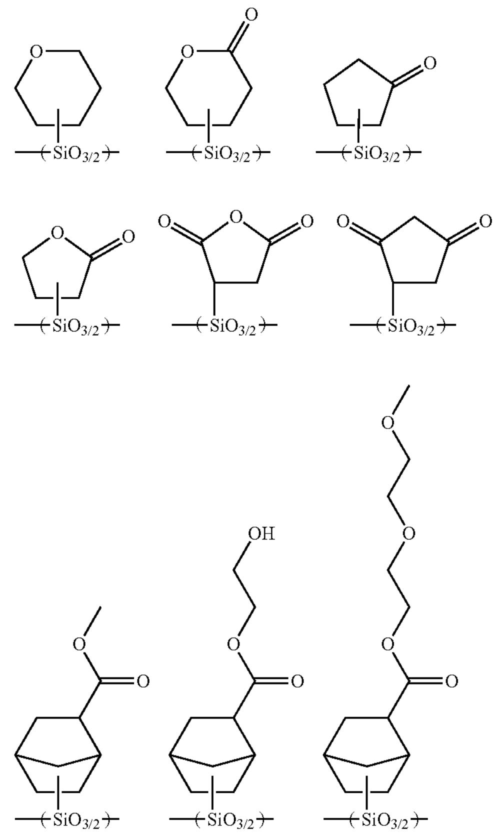

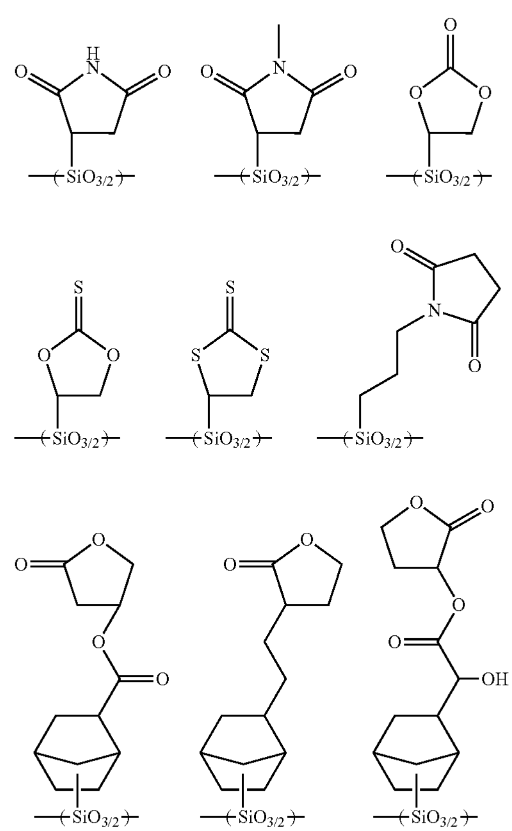

-continued
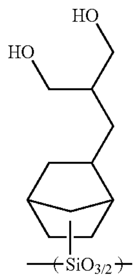
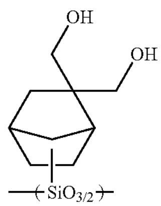
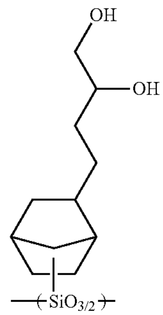
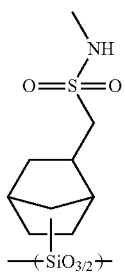
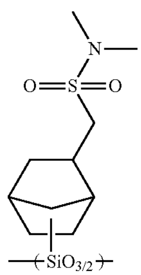
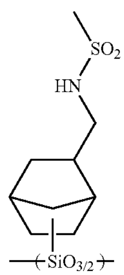
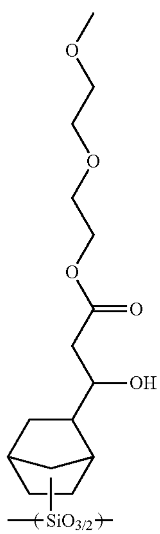
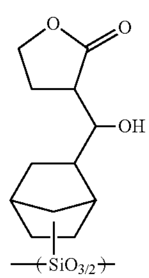
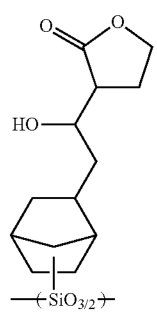
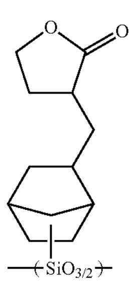
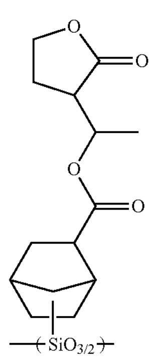
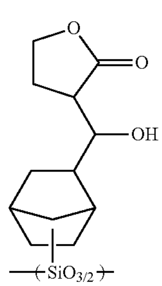
-continued
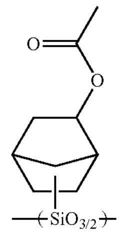
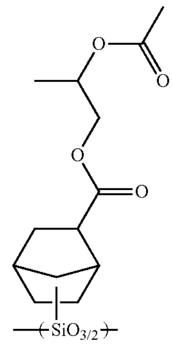
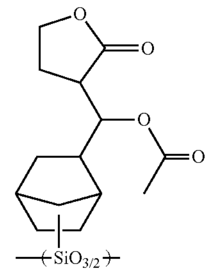
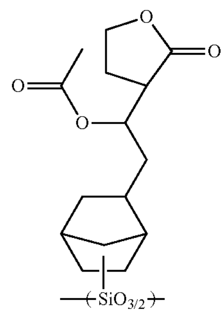
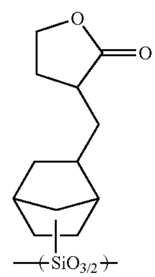
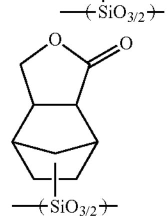
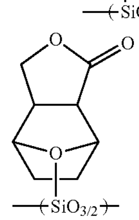
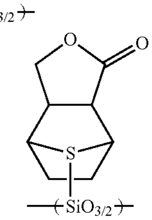
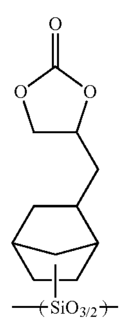
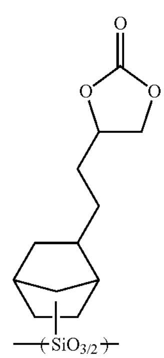
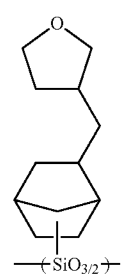
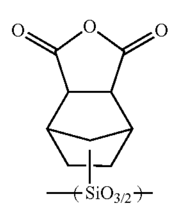
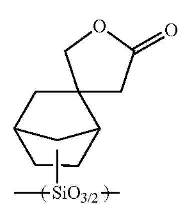
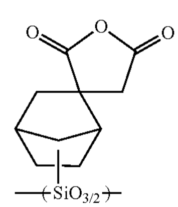
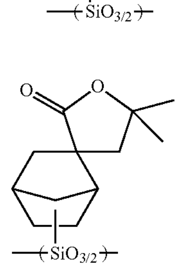
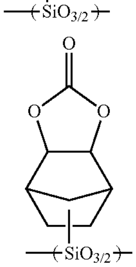
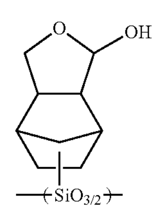

-continued
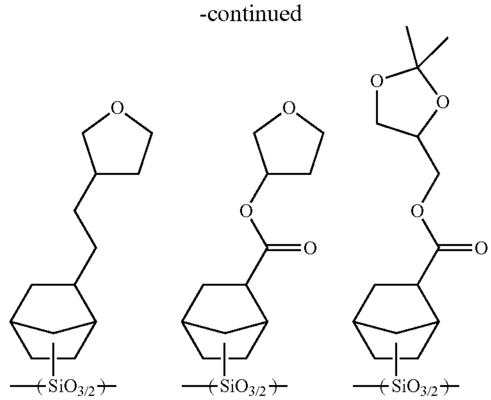
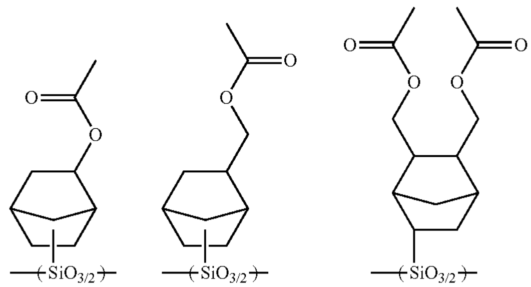
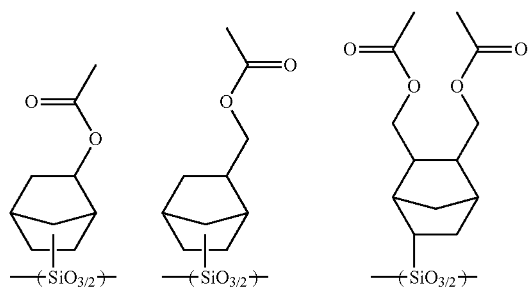
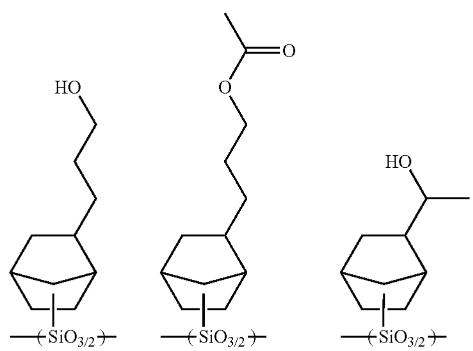
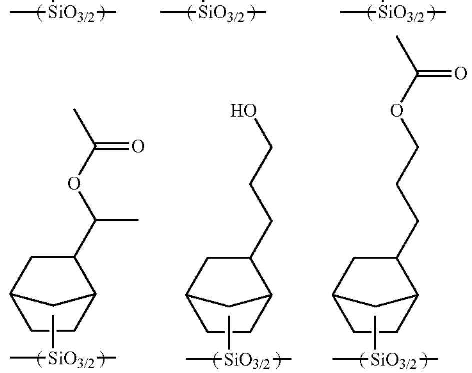
-continued
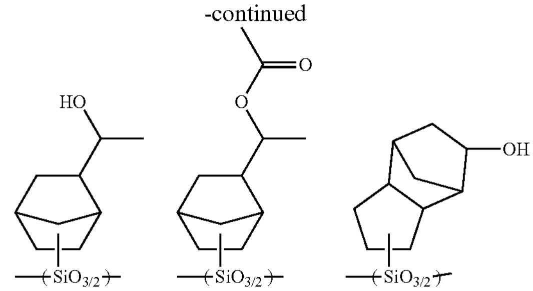
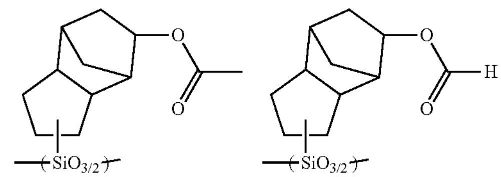
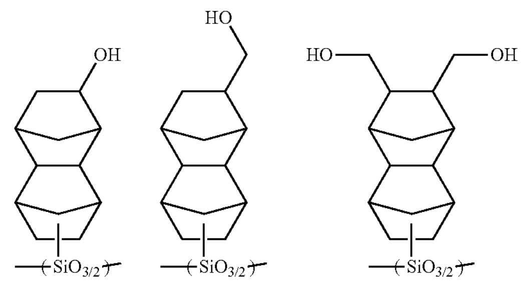
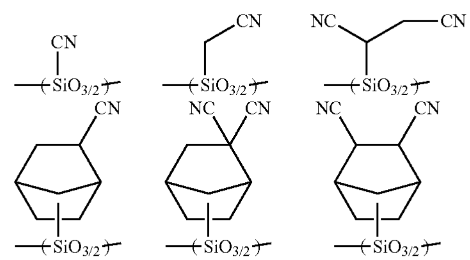
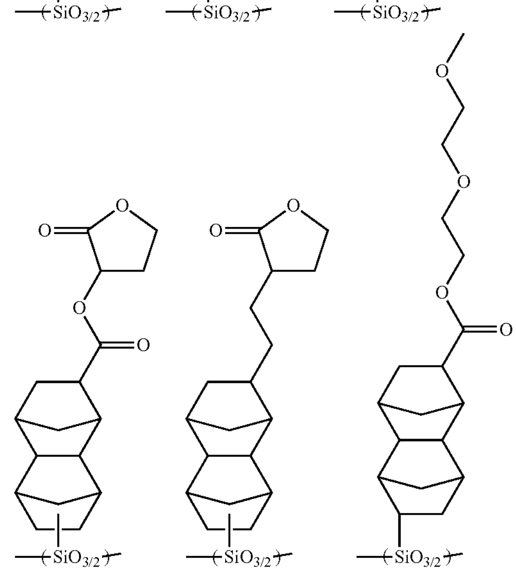
As an example of organic groups of $R^{41}$, $R^{42}$ and $R^{43}$, an organic group including a silicon-silicon bond may also be used. Specifically, the following repeating units may be exemplified.

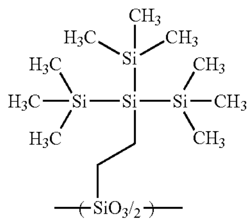

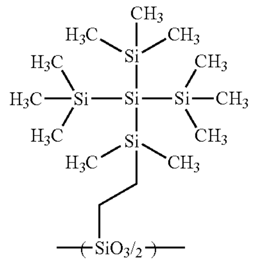

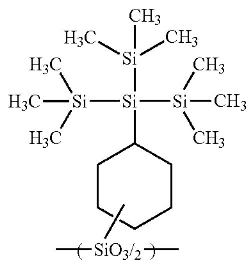

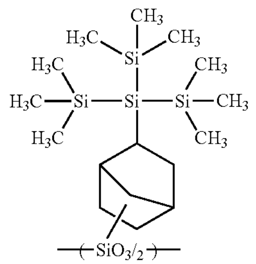

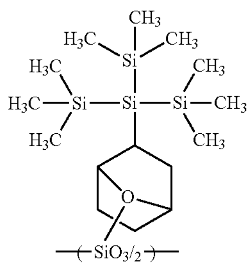

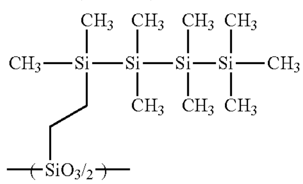

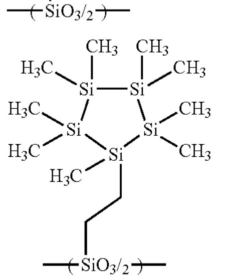

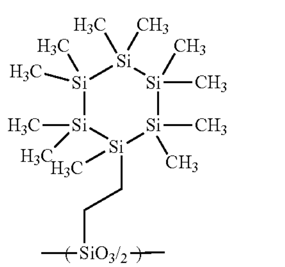

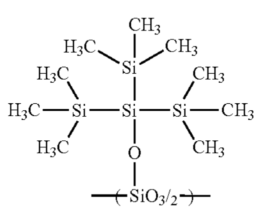

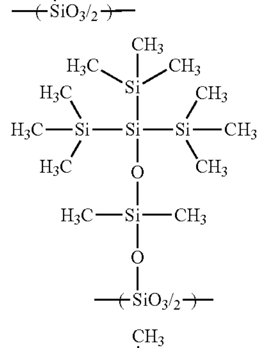

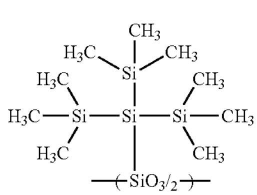

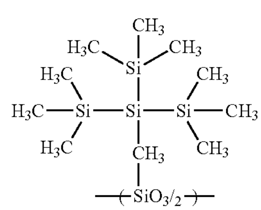

-continued

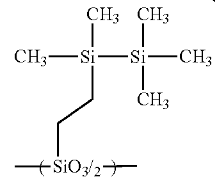

A reaction material (monomer), except for the above-mentioned silicon, for a composition for forming a resist film for reversing a pattern, which includes an organic silicon compound, an oxide of an element belonging to Group III, Group IV, and Group V other than silicon atom, may be represented by the following Formula (12).

$$U(OR^{44})_{m4}(OR^{45})_{m5} \quad (12)$$

(In the formula $R^{44}$ and $R^{45}$ are an organic group having 1 to 30 carbon atoms, m4+m5 is a valency determined by the kind of U, m4 and m5 are an integer of 0 or more, and U is an element belonging to Group III, Group IV, and Group V in the Periodic Table except for silicon.)

Here, the organic group means a group including a carbon, and further includes a hydrogen, and may include a nitrogen, an oxygen, a sulfur, a silicon, and the like. Examples of $R^{44}$ and $R^{45}$ may include an unsubstituted monovalent hydrocarbon group such as a straight, branched or cyclic alkyl group, an alkenyl group, an alkynyl group, an aryl group, and an aralkyl group, and a group in which one or more hydrogen atoms of these groups may be substituted with an epoxy group, an alkoxy group, a hydroxyl group, and the like, a group intervened by —O—, —CO—, —OCO—, —COO—, and —OCOO—, or the like.

When U is boron, examples of the compound represented by Formula (12) may include boron methoxide, boron ethoxide, boron propoxide, boron butoxide, boron amyloxide, boron hexyloxide, boron cyclopentoxide, boron cyclohexyloxide, boron aryloxide, boron phenoxide, boron methoxyethoxide, and the like as a monomer.

When U is aluminum, examples of the compound represented by Formula (12) may include aluminum methoxide, aluminum ethoxide, aluminum propoxide, aluminum butoxide, aluminum amyloxide, aluminum hexyloxide, aluminum cyclopentoxide, aluminum cyclohexyloxide, aluminum aryloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum 2,4-pentanedionate, aluminum 2,2,6,6-tetramethyl-3,5-heptanedionate, and the like as a monomer.

When U is gallium, examples of the compound represented by Formula (12) may include gallium methoxide, gallium ethoxide, gallium propoxide, gallium butoxide, gallium amyloxide, gallium hexyloxide, gallium cyclopentoxide, gallium cyclohexyloxide, gallium aryloxide, gallium phenoxide, gallium methoxyethoxide, gallium ethoxyethoxide, gallium dipropoxyethyl acetoacetate, gallium dibutoxyethyl acetoacetate, gallium propoxy bisethyl acetoacetate, gallium butoxy bisethyl acetoacetate, gallium 2,4-pentanedionate, gallium 2,2,6,6-tetramethyl-3,5-heptanedionate, and the like as a monomer.

When U is yttrium, examples of the compound represented by Formula (12) may include yttrium methoxide, yttrium ethoxide, yttrium propoxide, yttrium butoxide, yttrium amyloxide, yttrium hexyloxide, yttrium cyclopentoxide, yttrium cyclohexyloxide, yttrium aryloxide, yttrium phenoxide, yttrium methoxyethoxide, yttrium ethoxyethoxide, yttrium dipropoxyethyl acetoacetate, yttrium dibutoxyethyl acetoacetate, yttrium propoxy bisethyl acetoacetate, yttrium butoxy bisethyl acetoacetate, yttrium 2,4-pentanedionate, yttrium 2,2,6,6-tetramethyl-3,5-heptanedionate, and the like as a monomer.

When U is germanium, examples of the compound represented by Formula (12) may include germanium methoxide, germanium ethoxide, germanium propoxide, germanium butoxide, germanium amyloxide, germanium hexyloxide, germanium cyclopentoxide, germanium cyclohexyloxide, germanium aryloxide, germanium phenoxide, germanium methoxyethoxide, germanium ethoxyethoxide, and the like as a monomer.

When U is titanium, examples of the compound represented by Formula (12) may include titanium methoxide, titanium ethoxide, titanium propoxide, titanium butoxide, titanium amyloxide, titanium hexyloxide, titanium cyclopentoxide, titanium cyclohexyloxide, titanium aryloxide, titanium phenoxide, titanium methoxyethoxide, titanium ethoxyethoxide, titanium dipropoxy bisethyl acetoacetate, titanium dibutoxy bisethyl acetoacetate, titanium dipropoxy bis-2,4-pentanedionate, titanium dibutoxy bis-2,4-pentanedionate, and the like as a monomer.

When U is hafnium, examples of the compound represented by Formula (12) may include hafnium methoxide, hafnium ethoxide, hafnium propoxide, hafnium butoxide, hafnium amyloxide, hafnium hexyloxide, hafnium cyclopentoxide, hafnium cyclohexyloxide, hafnium aryloxide, hafnium phenoxide, hafnium methoxyethoxide, hafnium ethoxyethoxide, hafnium dipropoxy bisethyl acetbacetate, hafnium dibutoxy bisethyl acetoacetate, hafnium dipropoxy bis-2,4-pentanedionate, hafnium dibutoxy bis-2,4-pentanedionate, and the like as a monomer.

When U is tin, examples of the compound represented by Formula (12) may include methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, and the like as a monomer.

When U is arsenic, examples of the compound represented by Formula (12) may include methoxy arsenic, ethoxy arsenic, propoxy arsenic, butoxy arsenic, phenoxy arsenic, and the like as a monomer.

When U is antimony, examples of the compound represented by Formula (12) may include methoxy antimony, ethoxy antimony, propoxy antimony, butoxy antimony, phenoxy antimony, antimony acetate, antimony propionate, and the like as a monomer.

When U is niobium, examples of the compound represented by Formula (12) may include methoxy niobium, ethoxy niobium, propoxy niobium, butoxy niobium, phenoxy niobium, and the like as a monomer.

When U is tantalum, examples of the compound represented by Formula (12) may include methoxy tantalum, ethoxy tantalum, propoxy tantalum, butoxy tantalum, phenoxy tantalum, and the like as a monomer.

When U is bismuth, examples of the compound represented by Formula (12) may include methoxy bismuth, ethoxy bismuth, propoxy bismuth, butoxy bismuth, phenoxy bismuth, and the like as a monomer.

When U is phosphorus, examples of the compound represented by Formula (12) may include trimethyl phosphite, triethyl phosphite, tripropyl phosphite, trimethyl phosphate, triethyl phosphate, tripropyl phosphate, and the like as a monomer.

When U is vanadium, examples of the compound represented by Formula (12) may include vanadium oxide bis(2,4-pentanedionate), vanadium 2,4-pentanedionate, vanadium tributoxide oxide, vanadium tripropoxide oxide, and the like as a monomer.

When U is zirconium, examples of the compound represented by Formula (12) may include methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), and the like as a monomer.

When U is lead, examples of the compound represented by Formula (12) may include dimethoxy lead, diethoxy lead, dipropoxy lead, dibutoxy lead, diphenoxy lead, methoxyphenoxy lead, and the like as a monomer.

When U is scandium, examples of the compound represented by Formula (12) may include trimethoxy scandium, triethoxy scandium, tripropoxy scandium, tributoxy scandium, triphenoxy scandium, methoxydiphenoxy scandium, and the like as a monomer.

When U is indium, examples of the compound represented by Formula (12) may include trimethoxy indium, triethoxy indium, tripropoxy indium, tributoxy indium, triphenoxy indium, methoxydiphenoxy indium, and the like as a monomer.

When U is thallium, examples of the compound represented by Formula (12) may include tetramethoxy thallium, tetraethoxy thallium, tetrapropoxy thallium, tetrabutoxy thallium, tetraphenoxy thallium, and the like as a monomer.

From these monomers, one or two or more of those represented by Formula (11), or one or two or more of those represented by Formula (12) may be selected, and mixed before or during a reaction to prepare a reaction raw material which forms a composition for forming a resist film for reversing a pattern, which includes an organic silicon compound having a siloxane bond, or includes an oxide of an element belonging to Group ill, Group IV, and Group V other than silicon in the organic silicon compound.

A silicon-containing organic compound and a compound containing a metal oxide other than silicon, which are contained in a composition for forming a resist film for reversing a pattern, may be prepared by performing a hydrolysis-condensation reaction of a monomer of Formula (11) and Formula (12), preferably one or more compounds selected from an inorganic acid, an aliphatic sulfonic acid, and an aromatic sulfonic acid by using an acid catalyst or a base catalyst.

Examples of the acid catalyst used in this case may include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid, and examples of the base catalyst include ammonia, trimethylamine, triethylamine, triethanol amine, tetramethyl ammonium hydroxide, tetraethyl ammonium hydroxide, choline hydroxide 1,8-diazabicyclo[5.4.0]-7-undecene (DBU), 1,5-diazabicyclo[4.3.0]-5-nonene (DBN), sodium hydroxide, potassium hydroxide, barium hydroxide, and calcium hydroxide.

The amount of the catalyst used is $10^{-6}$ to 10 moles, preferably $10^{-5}$ to 5 moles, and more preferably $10^{-4}$ to 1 moles, based on 1 mole of a silicon monomer.

The amount of water when a silicon-containing organic compound and a metal oxide-containing compound are obtained from these monomers by a hydrolysis-condensation reaction is preferably 0.01 to 100 moles, more preferably 0.05 to 50 moles, and still more preferably 0.1 to 30 moles, per 1 mole of a hydrolyzable substituent bonded to the monomer. Addition of more than 100 moles merely excessively increases equipment used in the reaction, and thus, is uneconomical.

As an operation method, a hydrolysis-condensation reaction is initiated by adding a monomer to an aqueous catalyst solution. In this case, an organic solvent may be added to an aqueous catalyst solution, or a monomer may be diluted with an organic solvent, or both may be performed. The reaction temperature is 0 to 100° C., and preferably 5 to 80° C. A method of maintaining the temperature at 5 to 80° C. when the monomer is dropwise added, and then performing an aging at 20 to 80° C. is preferred.

Preferred examples of an organic solvent which may be added into an aqueous catalyst solution or may dilute a monomer may include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethyelene glycol dimethyl ether, propylene glycol monomethyl ether acetate, propylene glycol monoethyl ether acetate, ethyl piruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, a mixture thereof, and the like.

Among these solvents, a water-soluble solvent is preferred. Examples thereof may include alcohols such as methanol, ethanol, 1-propanol, and 2-propanol, polyhydric alcohols such as ethylene glycol and propylene glycol, polyhydric alcohol condensation derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether, acetone, acetonitrile, tetrahydrofuran, and the like. Among them, a solvent with a boiling point of 100° C. or less is particularly preferred.

Meanwhile, the amount of an organic solvent used is 0 to 1,000 ml, and particularly preferably 0 to 500 ml, based on 1 mole of a monomer. When the amount of the organic solvent used is large, a reaction vessel becomes excessively large, which is uneconomical.

Thereafter, a neutralization reaction of a catalyst is performed, if necessary, and then an alcohol produced in a hydrolysis-condensation reaction is removed under a reduced pressure to obtain an aqueous reaction mixture solution. In this case, the amount of an acidic or alkaline material, which may be used for neutralization, is preferably 0.1 to 2 equivalents based on an acid or a base used in a catalyst. Any material may be used as the alkaline material as long as the material shows properties of an acid or an alkali in water.

Subsequently, it is preferred to remove by-products such as an alcohol produced by the hydrolysis-condensation reaction from the reaction mixture. In this case, a temperature at which the reaction mixture is heated varies depending on the kinds of added organic solvent and an alcohol produced in the reaction, but is preferably 0 to 100° C., more preferably 10 to 90° C., and still more preferably 15 to 80° C. Further, a degree of vacuum in this case varies depending on the kinds of organic solvent and alcohol to be removed, the exhausting device, the condensation device, and the heating temperature, but is preferably an atmospheric pressure or less, more preferably 80 kPa or less in absolute pressure, and still more preferably 50 kPa or less in absolute pressure. It is difficult to exactly know the amount of alcohol to be removed, approximately 80% or more by weight of a produced alcohol and the like is preferably removed.

Subsequently, an acid or base catalyst used in the hydrolysis-condensation reaction may be removed from the reaction mixture. As a method of removing an acid or base catalyst, water is mixed with a silicon-containing organic compound and a compound containing a metal oxide other than silicon, and then the silicon-containing organic compound and the compound containing a metal oxide other than silicon are extracted with an organic solvent. As an organic solvent used in this case, an organic solvent, which may dissolve the silicon-containing organic compound and the compound containing a metal oxide other than silicon and may be separated into two layers when mixed with water, is preferred. Examples thereof may include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl-2-n-amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethyelene glycol dimethyl ether, propylene glycol monomethyl ether acetate, propylene glycol monoethyl ether acetate, ethyl piruvate, butyl acetate, methyl 3-methoxypropionate, ethyl 3-ethoxypropionate, tert-butyl acetate, tert-butyl propionate, propylene glycol mono-tert-butyl ether acetate. γ-butyrolactone, methyl isobutyl ketone, cyclopentyl methyl ether, and the like, and a mixture thereof.

Furthermore, it is also possible to use a mixture of a water-soluble organic solvent and a slightly water-soluble organic solvent. For example, preferred are a combination, such as methanol+ethyl acetate, ethanol+ethyl acetate, 1-propanol+ethyl acetate, 2-propanol+ethyl acetate, butanediol monomethyl ether+ethyl acetate, propylene glycol monomethyl ether+ethyl acetate, ethylene glycol monomethyl ether, butanediol monoethyl ether+ethyl acetate, propylene glycol monoethyl ether+ethyl acetate, ethylene glycol monoethyl ether+ethyl acetate, butanediol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, I-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate, but the combination is not limited thereto.

Meanwhile, the mixing ratio of the water-soluble organic solvent to the slightly water-soluble organic solvent is appropriately selected, but the amount of the water-soluble organic solvent is 0.1 to 1,000 parts by mass, preferably 1 to 500 parts by mass, and more preferably 2 to 100 parts by mass, based on 100 parts by mass of the slightly water-soluble organic solvent.

Subsequently, washing by neutral water is performed. As the water, so-called de-ionized water or ultrapure water may be used. An amount of this water is 0.01 to 100 L, preferably 0.05 to 50 L, and more preferably 0.05 to 50 L, based on 1 L of a solution of a silicon-containing organic compound and a compound containing a metal oxide other than silicon. The washing method may be performed in such a way that both solutions are put into the same vessel and mixed, and then left to stand, thereby separating a water layer. The number of times of washing is 1 or more, and preferably 1 to 5, because an effect worth washing of 10 times or more is not obtained even though washing of 10 times or more is performed.

Examples of the other methods of removing the acid catalyst include a method by an ion-exchange resin, or a method of neutralizing the acid catalyst with an epoxy compound such as ethylene oxide and propylene oxide, and then removing the acid catalyst. These methods may be appropriately selected according to the acid catalyst used in the reaction.

Meanwhile, in the aforementioned operation of removing the catalyst, a substantial removal of the catalyst means that the catalyst used in the reaction is allowed to remain in an amount of 10% by mass or less, and preferably 5% by mass, as a tolerable level, based on the amount of catalyst added to the silicon-containing organic compound and the compound containing a metal oxide other than silicon when the reaction is initiated.

The number of times of washing and the amount of washing water may be appropriately selected in consideration of effects of catalyst removal and fractionation because there is a case where by the operation of water-washing in this case, a part of a silicon-containing organic compound and a compound containing a metal oxide other than silicon escapes into a water film, thereby substantially obtaining the same effect as a fractionation operation.

In any of an organic silicon compound and a compound containing a metal oxide in which a catalyst remain, and a solution of an organic silicon compound and a compound containing a metal oxide from which a catalyst is removed, a final solvent is added, and then solvents are exchanged under reduced pressure to obtain a solution of an organic silicon compound and a compound containing a metal oxide. The temperature of the solvent exchange in this case varies depending on the kind of reaction solvent to be removed and extraction solvent, but is preferably 0 to 100° C., more preferably 10 to 90° C., and still more preferably 15 to 80° C. Further, a degree of vacuum in this case varies depending on the kind of extraction solvent to be removed, the exhausting device, the condensation device, and the heating temperature, but is preferably an atmospheric pressure or less, more preferably 80 kPa or less in absolute pressure, and still more preferably 50 kPa or less in absolute pressure.

In this case, there is a case where a silicon-containing organic compound and a compound containing a metal oxide other than silicon become unstable as the solvent is changed. This is generated by compatibility of a final solvent with a silicon-containing organic compound and a compound containing a metal oxide other than silicon, and in order to prevent this from occurring, a component to be described below may be added as a stabilizer. The addition amount is 0 to 25 parts by mass, preferably 0 to 15 parts by mass, and more preferably 0 to 5 parts by mass, based on 100 parts by weight of a silicon-containing organic compound and a compound containing a metal oxide other than silicon, in a solution before the solvent exchange, but in a case of addition, 0.5 parts by mass or more is preferred. The solvent exchange may be operated by adding the stabilizer component to the solution, if necessary, before the solvent exchange.

In order to stabilize a silicon-containing compound used in a composition for forming a resist film for reversing a pattern, which includes an organic silicon compound having a siloxane bond used in the patterning forming method of the present invention, a monovalent or divalent or more organic acid having 1 to 30 carbon atoms may be added as the stabilizer. Examples of an acid added in this case include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Oxalic acid, maleic acid, formic acid, acetic acid, propionic acid, citric acid and the like are preferred. In addition, the acids may be used in mixture of two or more thereof in order to maintain the stability. The addition amount is 0.001 to 25 parts by mass, preferably 0.01 to 15 parts by mass, and more preferably 0.1 to 5 parts by mass, based on 100 parts by mass of the total amount of silicon-containing organic compound included in the composition. Alternatively, the organic acid may be blended in terms of pH of the composition adjusted to a range of preferably $0 \le pH \le 7$, more preferably $0.3 \le pH \le 6.5$, and still more preferably $0.5 \le pH \le 6$.

In the composition for forming a resist film for reversing a pattern, which contains the silicon-containing organic compound of the present invention, the organic solvent, which is the same as that used in the preparation of the silicon-containing compound, preferably an aqueous organic solvent, particularly, monoalkyl ethers of alkylene glycol such as ethylene glycol, diethyelene glycol, triethylene glycol, propylene glycol, dipropylene glycol, butanediol, and pentanediol are used. Specifically, an organic solvent selected from butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, and the like is used.

In the present invention, water may be added to the composition for forming a resist film for reversing a pattern. When water is added, the silicon-containing organic compound is hydrated, thereby enhancing the stability. The content ratio of water in the solvent components of the composition is more than 0% by mass and less than 50% by mass, particularly preferably 0.3 to 30% by mass, and still more preferably 0.5 to 20% by mass. When an amount of each component is excessively large, uniformity of a coated film deteriorates, so that there is a risk that repellency occurs in the worst case.

The molecular weight of the organic compound for forming a resist film for reversing a pattern, which includes an organic silicon compound having a siloxane bond, may be adjusted not only by selecting a monomer but also by controlling reaction conditions during the polymerization, and when the organic compound having a weight average molecular weight of more than 100,000 is used, generation of extraneous substances or a coating unevenness may occur in some cases, so that it is preferred to use an organic compound having a weight average molecular weight of 100,000 or less, more preferably 200 to 50,000, and furthermore, 300 to 30,000. Meanwhile, the data on the weight-average molecular weights are expressed as a molecular weight in terms of polystyrene by a gel permeation chromatography (GPC) using an RI as a detector and using polystyrene as a standard material.

Improvement in the alkali-solubility of only a surface of the resist film for reversing a pattern according to the present aspect facilitates dissolution of the resist film for reversing a pattern, which covers the surface of a negative-type pattern changed into alkali-soluble due to the occurrence of a polar group by the action of an acid, thereby effectively improving a dimensional controllability of an isolated line pattern or a dot pattern in which a negative-type pattern is converted. In order to improve an alkali-solubility of the surface of the resist film for reversing a pattern, an alkali-soluble surfactant, particularly a fluorine-based surfactant may be added. The fluorine-based surfactant may at least have one or both of a repeating unit s-1 and s-2, represented by the following Formula (13).

(13)

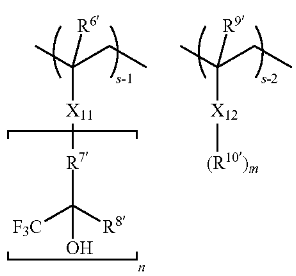

In the formula, each of $R^{6'}$ and $R^{9'}$ independently represents a hydrogen atom or a methyl group. n is 1 or 2, and in a case of n=1, $X_{11}$ is a phenylene group, —O—, —C(═O)—O—R12'-, or —C(═O)—NH—R12-, and $R^{2'}$ is a single bond, or a straight or branched alkylene group having 1 to 4 carbon atoms, and may have an ester group or an ether group. In a case of n=2, $X_{11}$ is a phenylene group, —C(═O)—O—$R^{81'}$= or —C(═O)—NH—$R^{1'}$═, $R^{81'}$ is a group in which one hydrogen atom is eliminated from a straight, branched or cyclic alkylene group having 1 to 10 carbon atoms, and may have an ester group or an ether group. $R^{7'}$ is a single bond or a straight, branched or cyclic alkylene group having 1 to 12 carbon atoms, and $R^{8'}$ is a hydrogen atom, a fluorine atom, a methyl group, a trifluoromethyl group, or a difluoromethyl group, or may combined with $R^{7'}$ to form a ring having 3 to 10 carbon atoms (however, an aromatic ring is excluded) along with a carbon atom to which these are bonded, and may have an ether group, an alkylene group substituted with fluorine, or a trifluoromethyl group in the ring. $X_{12}$ is a phenylene group, —O—, —C(—O)—O—$R^{11'}$—, or —C(—O)—NH—$R^{11'}$—, and $R^{11'}$ is a single bond, or a straight or branched alkylene group having 1 to 4 carbon atoms, and may have an ester group or an ether group. $R^{10'}$ is a fluorine atom, or a straight, branched or cyclic alkyl group having 1 to 20 carbon atoms, is substituted with at least one fluorine atom, and may have an ether group, an ester group, or a sulfonamide group. When $X_{12}$ is a phenylene group, m is an integer of 1 to 5, and when $X_{12}$ is a group other than the above-described groups, m is 1.)

Monomers for obtaining s-1 may be specifically exemplified below.

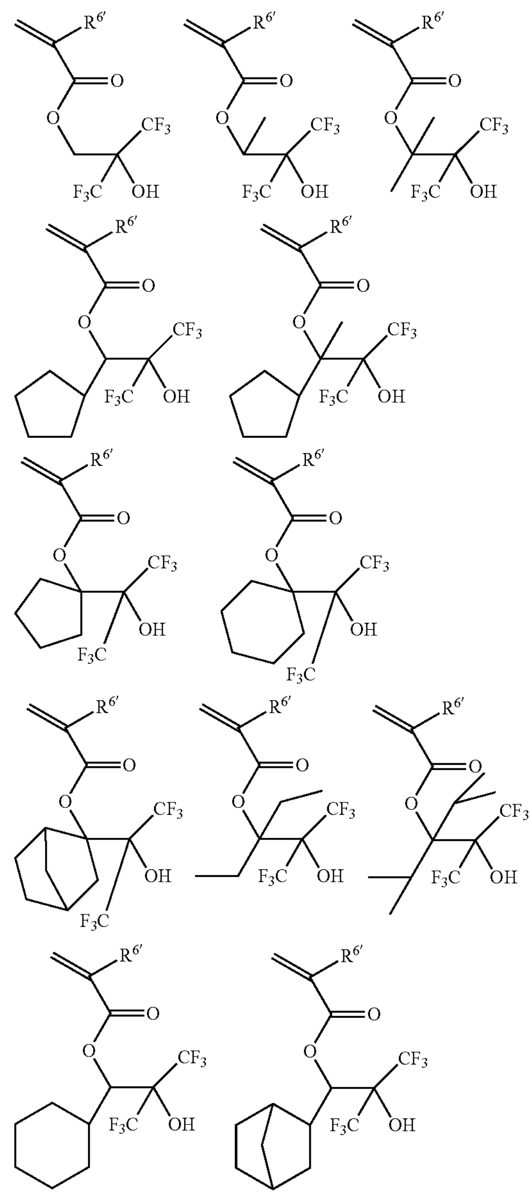

-continued
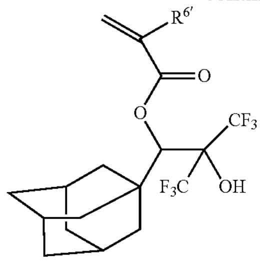
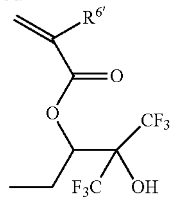
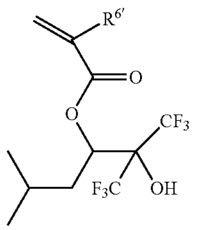
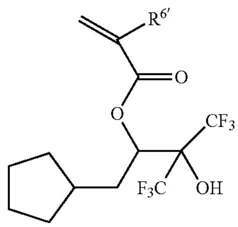
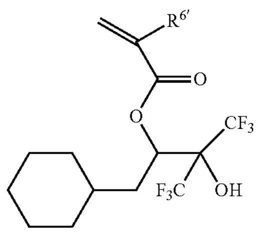
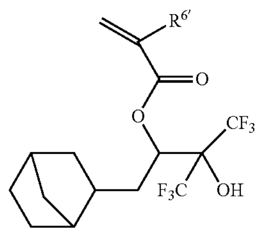
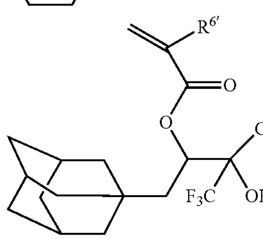
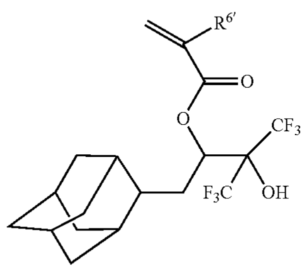
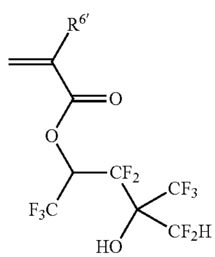
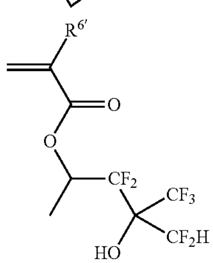
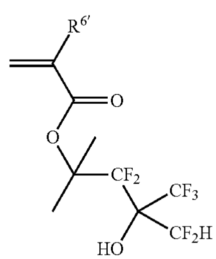
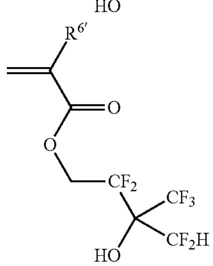
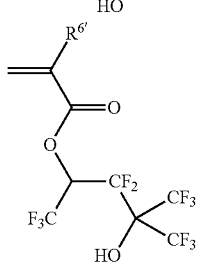
-continued
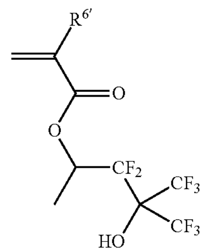
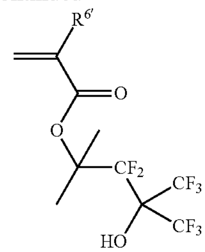
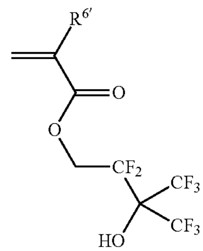
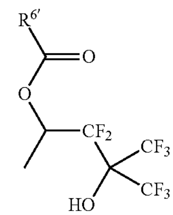
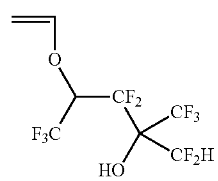
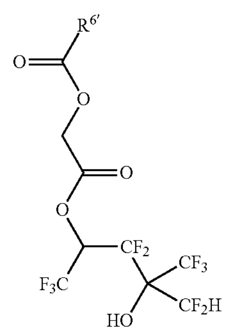
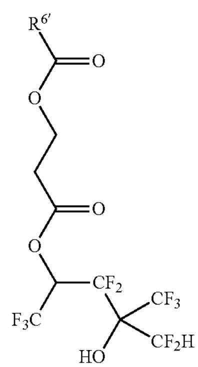
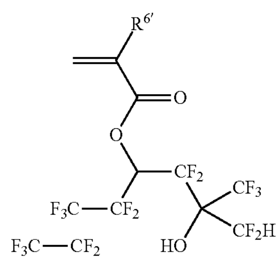
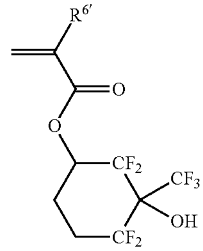
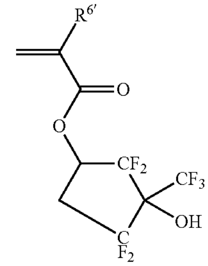
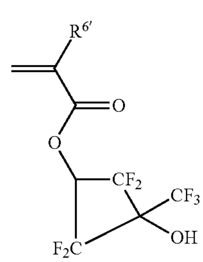
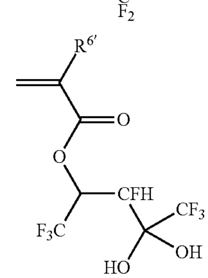

-continued
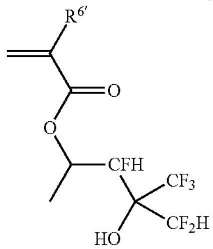
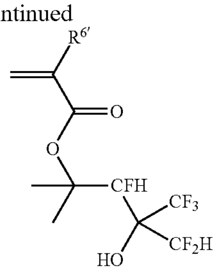
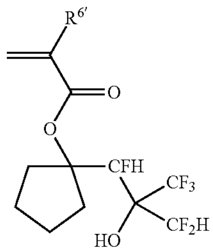
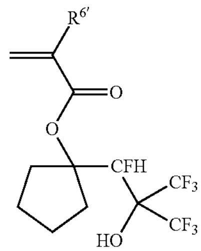
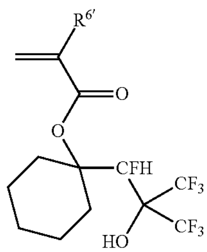
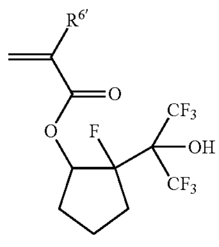
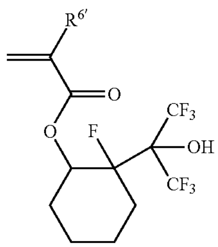
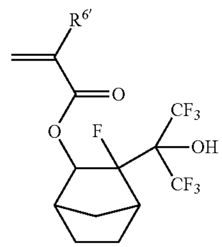
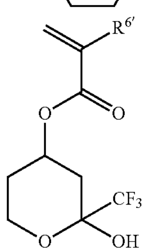
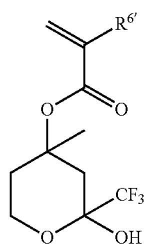
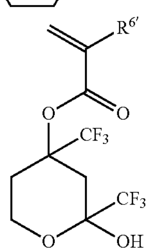
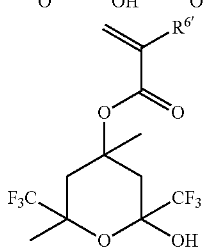
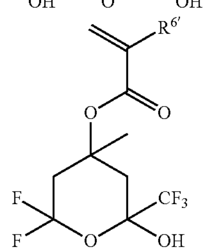
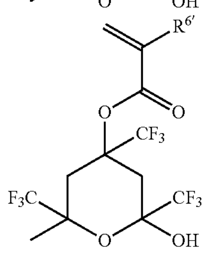
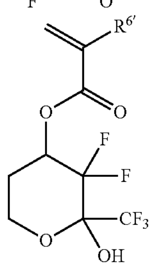
-continued
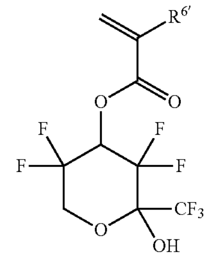
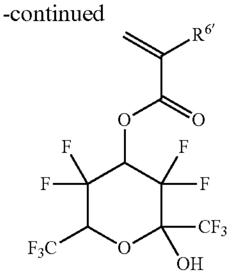
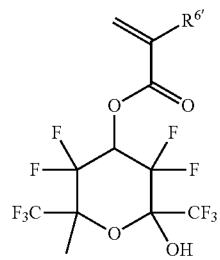
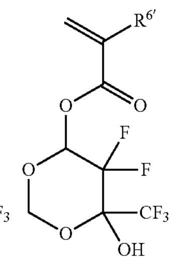
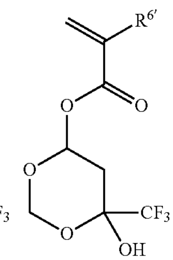
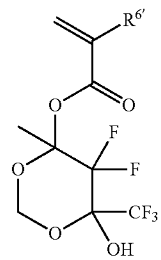
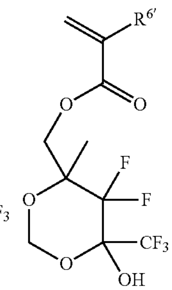
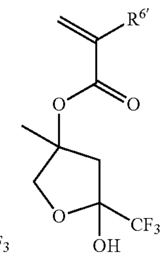
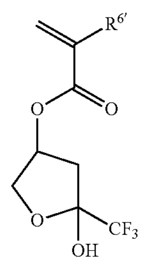
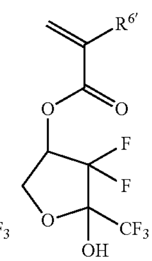
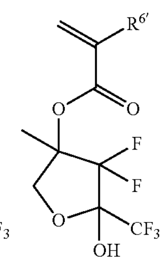
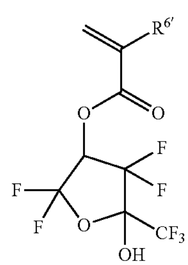
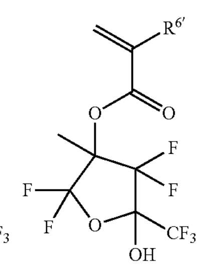
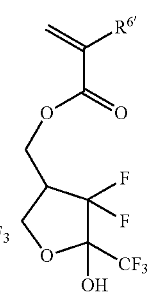
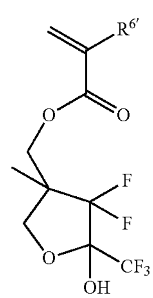
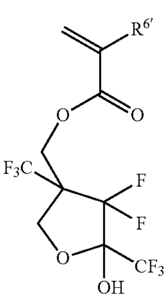
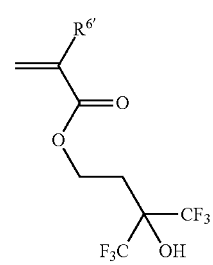

-continued
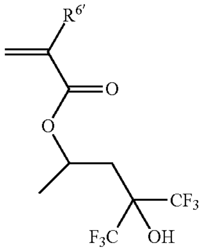
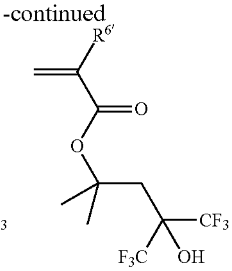
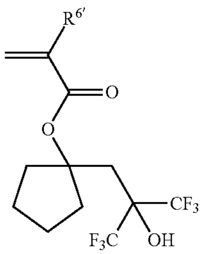
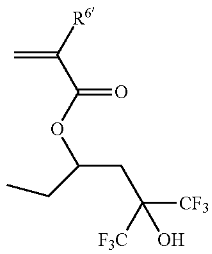
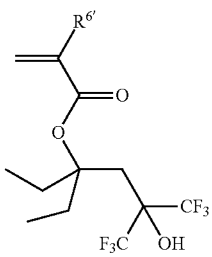
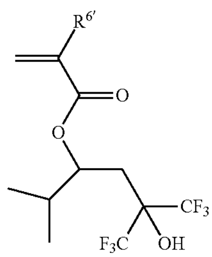
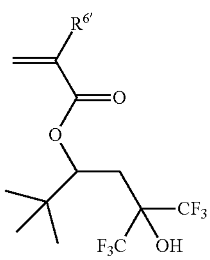
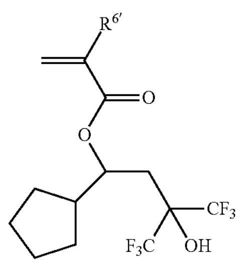
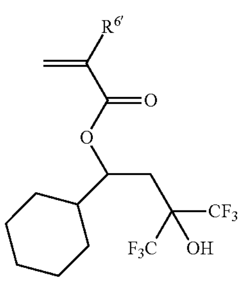
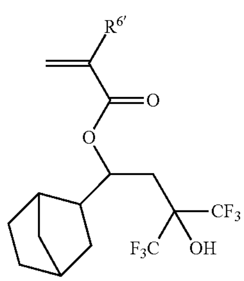
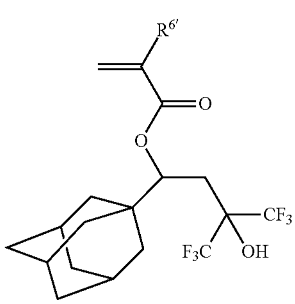
-continued
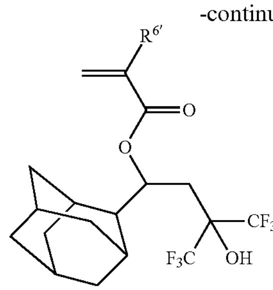
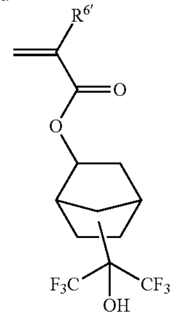
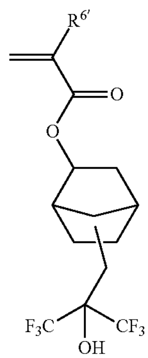
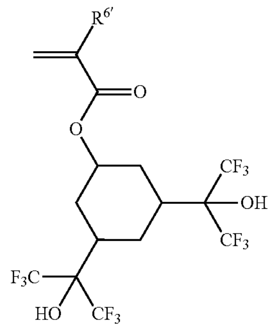
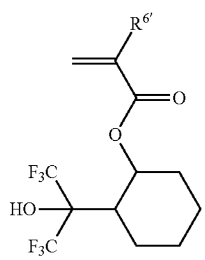
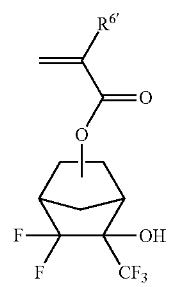
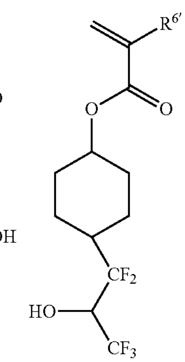
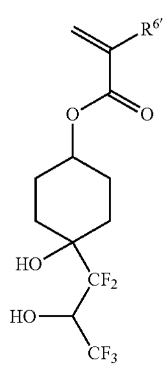
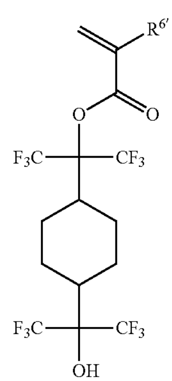
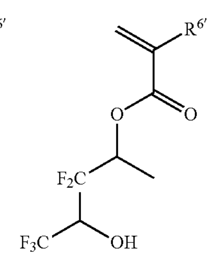
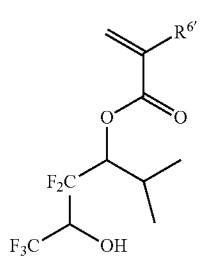
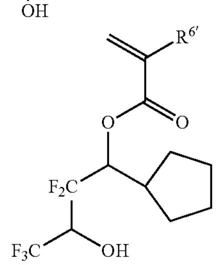

-continued
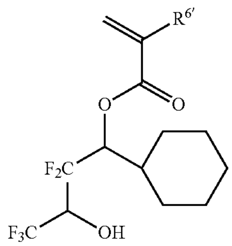
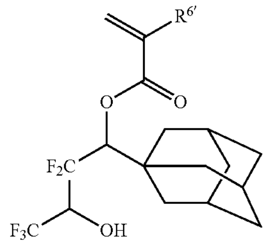
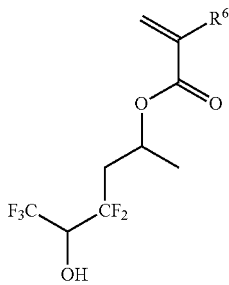
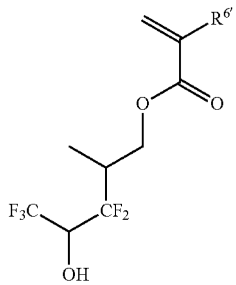
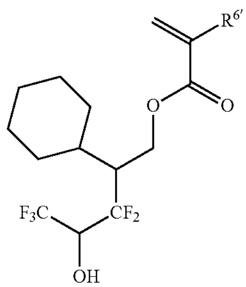
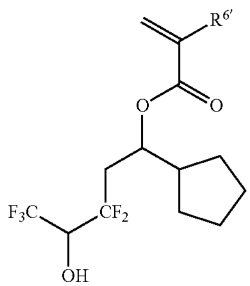
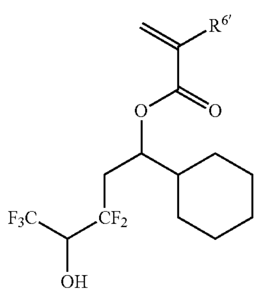
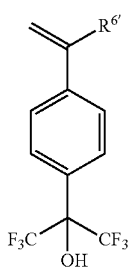
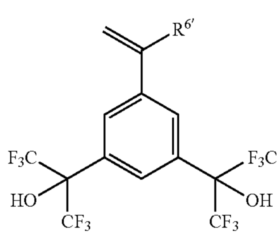
(In the formula, $R^{6'}$ is the same as that described above.)
Further, examples of the monomer for obtaining a repeating unit s-2 having an alkyl group substituted with a fluorine atom, which is represented by s-2 in Formula (13), include the following specific examples.
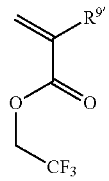
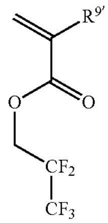
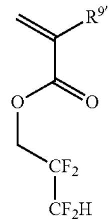
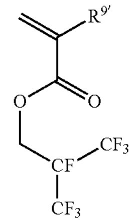
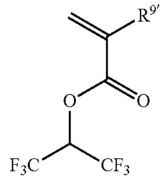
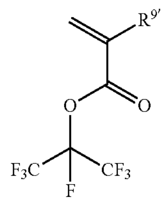
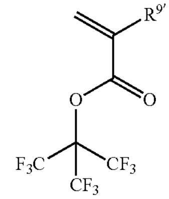
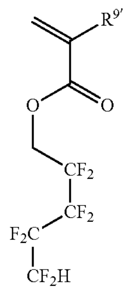
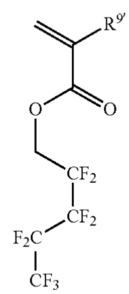
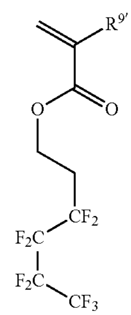
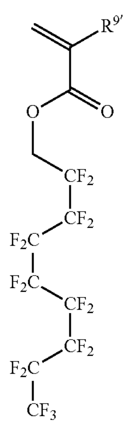
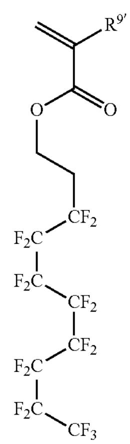
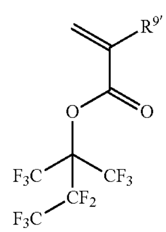
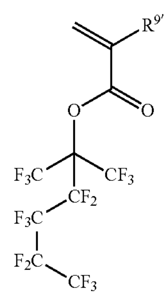
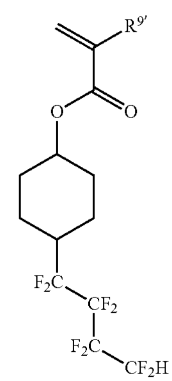
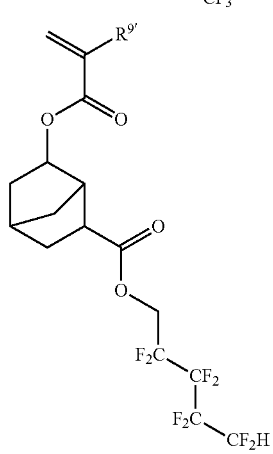

-continued
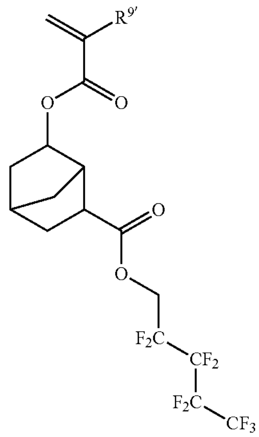
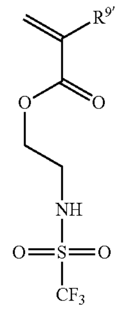
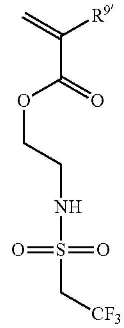
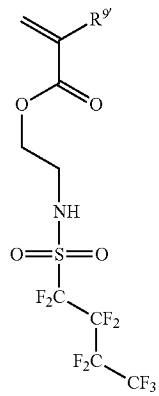
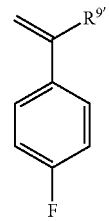
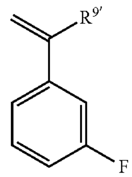
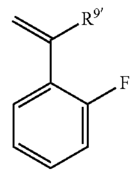
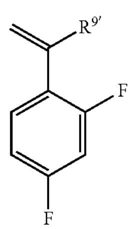
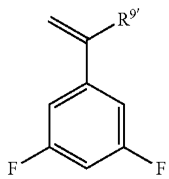
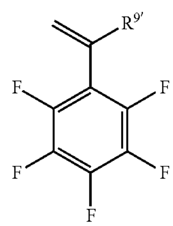
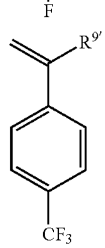
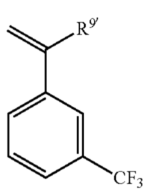
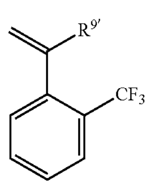
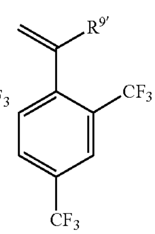
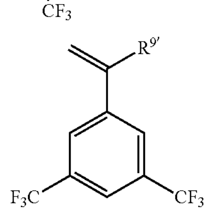
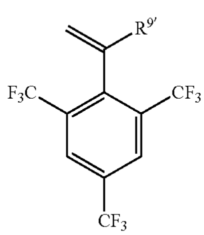
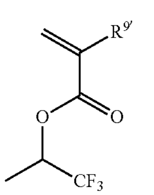
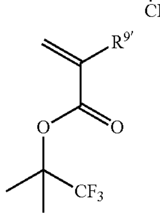
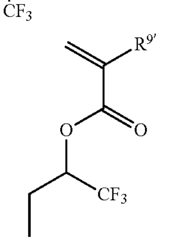
-continued
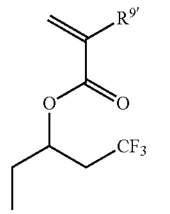
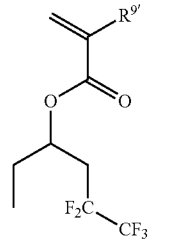
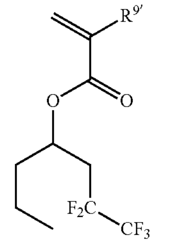
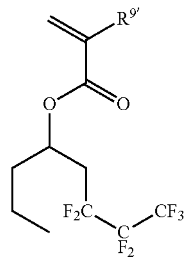
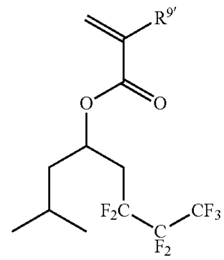
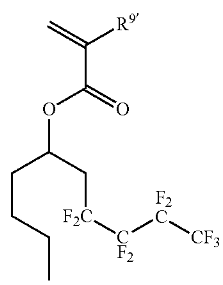
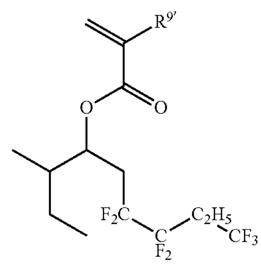
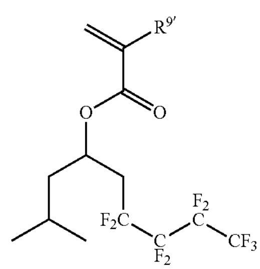
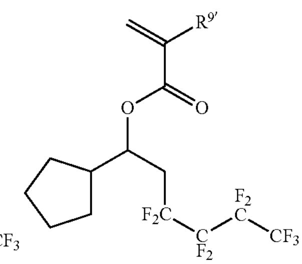
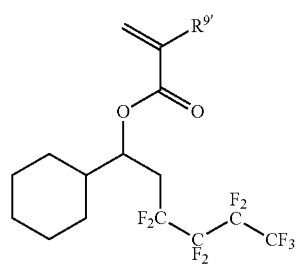
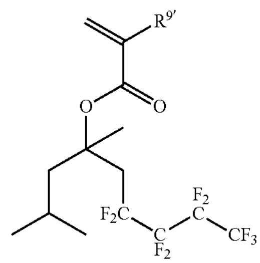

-continued
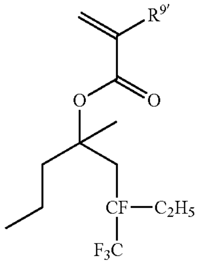
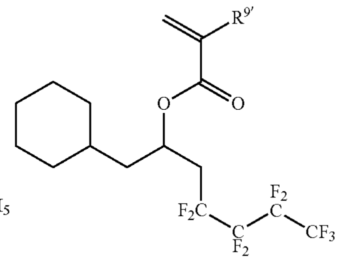
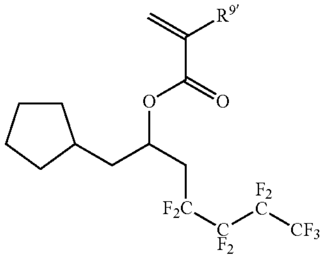
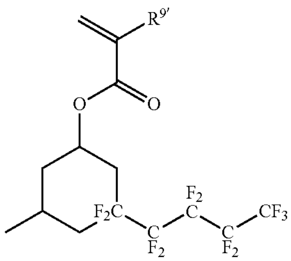
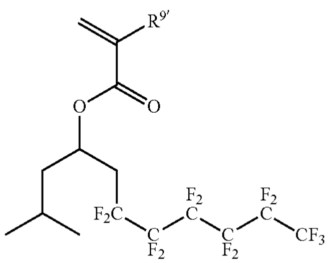
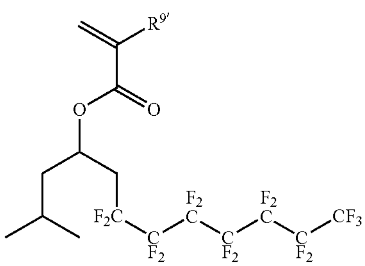
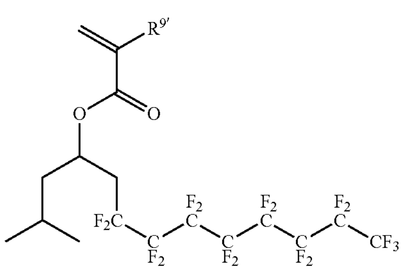
-continued
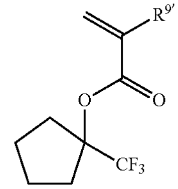
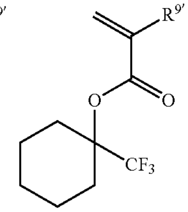
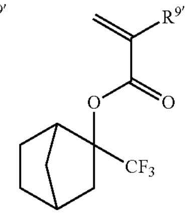
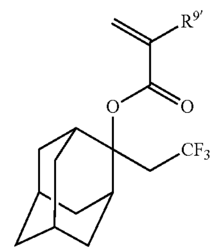
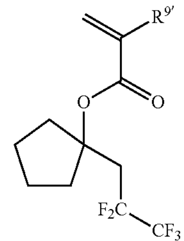
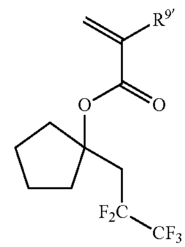
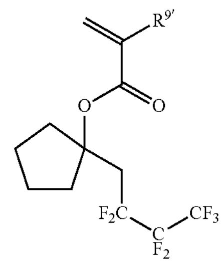
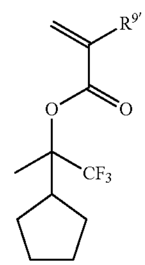
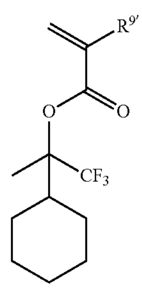
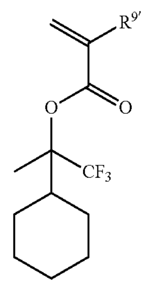
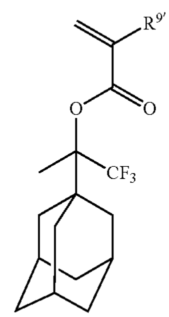
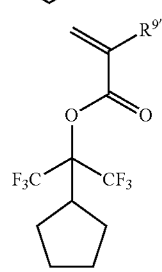
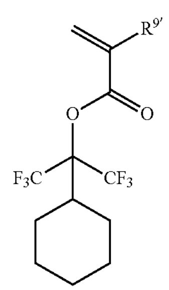
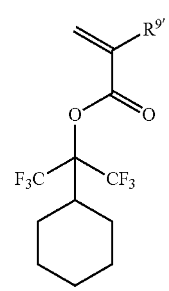
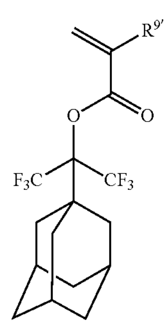
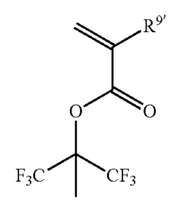

-continued

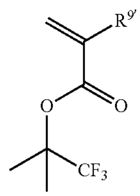

(In the formula, $R^{9'}$ is the same as that described above.)

Repeating Units s-1 and s-2 may be copolymerized with an alkali-soluble repeating unit having a phenol group or a carboxyl group as described above, or with an slightly alkali-soluble repeating unit.

The amount of the alkali-soluble surfactant added is preferably 0 to 50% by mass, and more preferably 0 to 20% by mass, based on the solid content of the composition for forming a resist film for reversing a pattern. When the amount is extremely large, the amount of film loss may be excessively increased, or an etching resistance may deteriorate in some cases. Meanwhile, in a case of blending, the amount is preferably 1% by mass or more.

As a basic quencher to be added in a composition for forming a resist film for reversing a pattern, it is possible to use a basic compound which is the same as the above-described basic compound. That is, to a resist film for reversing a pattern used in the pattern forming method of the present invention, a basic compound may be added in order to prevent an acid-diffusion from a resist pattern after development.

The amount of the basic compound (basic quencher) blended is preferably 0 to 10% by mass, particularly 0 to 5% by mass, based on the solid content of the composition for forming a resist film for reversing a pattern. Meanwhile, in a case of blending, the amount is preferably 0.1% by mass or more.

Examples of the organic solvent used in the composition for forming a resist film for reversing a pattern used in the pattern forming method of the present invention may include ketones such as cyclohexanone and methyl-2-n-amyl ketone, alcohols such as 3-methoxy butanol, 3-methyl-3-methoxy butanol, 1-methoxy-2-propanol, and 1-ethoxy-2-propanol, ethers such as propylene glycol monomethyl ether, ethylene glycol monomethyl ether, propylene glycol monomethyl ether, ethylene glycol monoethyl ether, propylene glycol dimethyl ether, and diethyelene glycol dimethyl ether, esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and lactones such as γ-butyrolactone, and these solvents may be used either alone or in mixture of two or more thereof, but the organic solvent is not limited thereto.

In addition, an alcohol having 3 to 10 carbon atoms, or an ether having 8 to 12 carbon atoms may also be used in order to prevent mixing with the negative-type resist pattern. Specific examples thereof may include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Examples of the ether compound having 8 to 12 carbon atoms may include one or more solvents selected from di-n-butyl ether, di-isobutyl ether, di-sec-butyl ether, di-n-pentyl ether, di-isopentyl ether, di-sec-penthyl ether, di-t-amyl ether, and di-n-hexyl ether.

The concentration of the solid content of the composition for forming a resist film for reversing a pattern in the present invention is preferably 0.5 to 10% by mass, more preferably 1.0 to 5.7% by mass, and 1.2 to 5.3% by mass.

(5) A Process of Reversing the Negative-Type Pattern into a Positive-Type Pattern by Removing the Residual Film Part in the Negative-Type Pattern by Using an Alkaline Wet Etching Liquid Since the negative-type resist pattern is exposed by using the an alkali developer (wet-etching liquid) to dissolve the surface part of the resist film for reversing a pattern, and accordingly, the dissolution rate of the negative-type resist pattern in the alkali developer is faster than the dissolution rate of the resist film for reversing a pattern, the negative-type resist pattern is selectively dissolved, and lost due to the dissolution, thereby forming a reversal pattern in which the negative-type resist pattern is reversed on the resist film for reversing a pattern. In this case, when the negative-type resist pattern is a hole pattern, a dot pattern is formed as a reversal pattern, and when the negative-type resist pattern is an isolated space pattern, an isolated line pattern is formed as the reversal pattern.

Examples of the aqueous alkaline solution which may be used in the alkaline development may include aqueous alkaline solutions of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine, and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, alcohols and a surfactant may be used while being added in a suitable amount thereof to the above aqueous alkaline solution.

The alkaline concentration of the alkaline developer is usually 0.1 to 20% by mass.

The pH of the alkaline developer is usually 10.0 to 15.0.

In particular, 2.38% by mass of an aqueous solution of tetramethyl ammonium hydroxide is preferred.

The alkaline development time is not particularly limited, and is usually 10 seconds to 300 seconds, and preferably 20 seconds to 120 seconds.

The temperature of the alkaline developer is preferably 0° C. to 50° C., and more preferably 15° C. to 35° C.

After the development by the aqueous alkaline solution, a rinse treatment may be performed. As a rinse liquid in the rinse treatment, pure water is preferred, and a surfactant may also be used while being added in a suitable amount thereto.

Furthermore, after the development treatment or the rinse treatment, a heating treatment may also be performed in order to remove residual moisture in the pattern.

Further, a treatment of removing the residual developer or rinse liquid may be performed by heating. The heating temperature is not particularly limited as long as the heating temperature may obtain a good resist pattern, and is usually 40° C. to 160° C. The heating temperature is preferably 50°

C. to 150° C., and most preferably 50° C. to 110° C. The heating time is not particularly limited as long as the heating time may obtain a good resist pattern, and is usually 15 to 300 seconds, and preferably 15 to 180 seconds.

Meanwhile, a mold for imprinting may be manufactured by using the composition according to the present invention, and for the details thereof, see, for example, Japanese Patent Application Laid-Open Nos. 4109085 and 2008-162101 and "Fundamentals of nanoimprint and its technology development/application deployment—technology of nanoimprint substrate and its latest technology deployment-edited by Yoshihiko Hirai (Frontier Publishing Co. Ltd.)".

In addition, the present invention also relates to a method for manufacturing an electronic device, which includes the aforementioned pattern forming method of the present invention, and an electronic device manufactured by the manufacturing method.

The electronic device of the present invention is suitably mounted to electrical and electronic equipment (home appliance. OA media related equipment, optical equipment, and telecommunication equipment, and the like).

EXAMPLES

Hereinafter, the present invention will be described in more detail with reference to the Examples, but the present invention is not limited to the following Examples. Meanwhile, the weight average molecular weight (Mw) denotes a polystyrene equivalent weight average molecular weight by GPC.

Synthesis Example 1

Synthesis of Resin (P-10)

The resin was synthesized according to the following scheme.

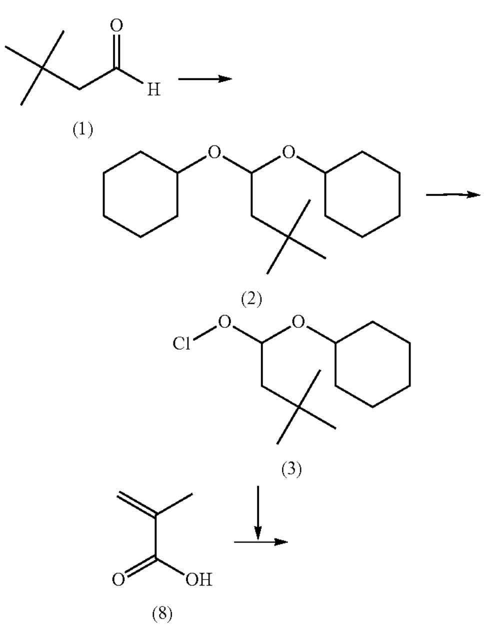

-continued

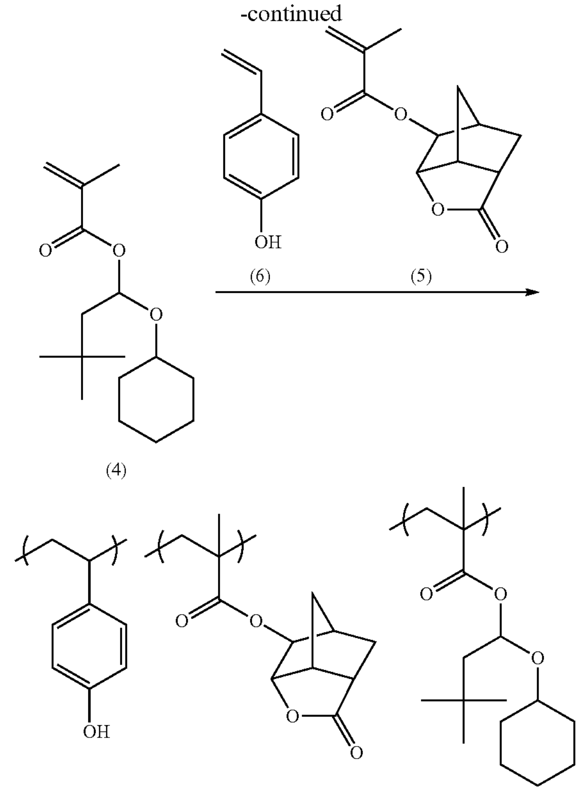

(P-18)

20.00 g of Compound (1) was dissolved in 113.33 g of n-hexane, 42.00 g of cyclohexanol, 20.00 g of anhydrous magnesium sulfate, and 2.32 g of 10-camphorsulfonic acid were added thereto, and the resulting mixture was stirred at room temperature (25° C.) for 7.5 hours. 5.05 g of triethylamine was added thereto, and the resulting mixture was stirred for 10 minutes, and then filtered to remove the solid. 400 g of ethyl acetate was added thereto to wash the organic phase five times with 200 g of ion exchange water, and then the resulting product was dried over anhydrous magnesium sulfate, and the solvent was removed by distillation, thereby obtaining 44.86 g of a solution containing Compound (2).

4.52 g of acetyl chloride was added to 23.07 g of the solution containing Compound (2), and the resulting mixture was stirred at room temperature for 2 hours, thereby obtaining 27.58 g of a solution containing Compound (3).

3.57 g of Compound (8) was dissolved in 26.18 g of dehydrated tetrahydrofuran, 3.57 g of anhydrous magnesium sulfate and 29.37 g of triethylamine were added thereto, and the resulting mixture was stirred under nitrogen atmosphere. The mixture was cooled to 0° C., 27.54 g of the solution containing Compound (3) was dropwise added thereto, and the resulting mixture was stirred at room temperature for 3.5 hours, and filtered to remove the solid. 400 g of ethyl acetate was added thereto, 150 g of the organic phase was washed five times with 150 g of ion exchange water, and then dried over anhydrous magnesium sulfate, and the solvent was removed by distillation. 8.65 g of Compound (4) was obtained by performing isolation and purification with column chromatography.

A cyclohexanone solution (50.00% by mass) of 2.52 g of Compound (6), 0.78 g of Compound (5), 5.64 g of Compound (4), and 0.32 g of the polymerization initiator V-601 (manufactured by Wako Pure Chemical Industries, Ltd.)

were dissolved in 27.01 g of cyclohexanone. 15.22 g of cyclohexanone was put into a reaction vessel, and added dropwise to the system at 85° C. under nitrogen gas atmosphere over 4 hours. The reaction solution was stirred under heating over 2 hours, and then allowed to cool to room temperature.

The reaction solution was added dropwise to 400 g of heptane, and the polymer was precipitated and filtered. The filtered solid was washed using 200 g of heptane. Thereafter, the solid after washing was dried under reduced pressure to obtain 2.98 g of Resin (P-10).

Resins (P-1) to (P-9), (P-11), and (P-12) were synthesized below in the same manner as described above. Structures of polymers synthesized are described above as the specific examples.

In addition, the synthesis was performed as described above, and the weight average molecular weight (Mw) and polydispersity (Mw/Mn) of each resin used in the Examples to be described below are shown in the following table.

TABLE 1

| Resin | Weight average molecular weight | Polydispersity |
|---|---|---|
| P-1 | 10000 | 1.55 |
| P-2 | 12000 | 1.52 |
| P-3 | 11000 | 1.50 |
| P-4 | 11500 | 1.48 |
| P-5 | 14000 | 1.58 |
| P-6 | 17000 | 1.62 |
| P-7 | 12000 | 1.53 |
| P-8 | 11000 | 1.51 |
| P-9 | 11000 | 1.50 |
| P-10 | 11000 | 1.42 |
| P-11 | 11000 | 1.38 |
| P-12 | 10000 | 1.37 |

Synthesis Example 2

Synthesis of Material Polymer I for Reversal

A co-condensation reaction was performed by using an acetic acid catalyst in moisture ethanol using the following Monomer 1 and Monomer 2 (molar ration 30:70) as a polymer compound used in the reversal film, and washing with water was repeated until the organic layer became neutral and then the organic layer was concentrated to obtain an oligomer.

Monomer 1

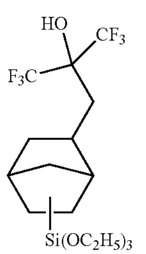

Monomer 2

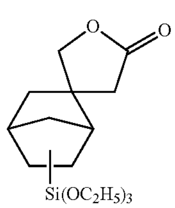

The resulting product was diluted with toluene, calcium hydroxide was added to perform heating and reflux, the reaction solution after cooling was diluted with methyl isobutyl ketone, washing with water was repeated until the organic layer became neutral, and then the organic layer was concentrated to obtain Polymer 1 as described below.

Polymer 1 Weight average molecular weight (Mw)=2,800

Polydispersity (Mw/Mn)=1.88

Polymer 1

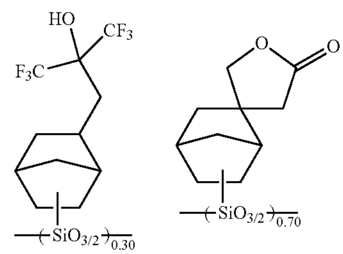

[Photo-Acid Generator]

As the photo-acid generator, the compounds described above as specific examples were appropriately selected and used.

[Basic Compound]

As the basic compound, any one of the following compounds (N-1) to (N-10) was used.

N-1

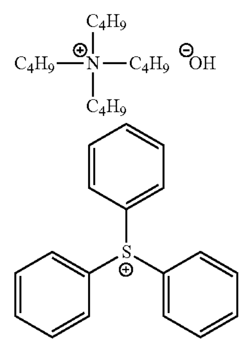

N-2

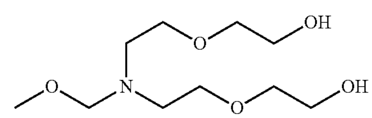

N-3

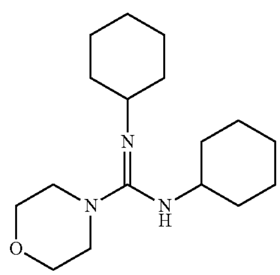

[Surfactant]

As the surfactant, the following W-1 to W-4 were used.

W-1: Megafac F176 (manufactured by Dainippon Ink and Chemicals, Inc.) (fluorine-based)

W-2: Megafac R08 (manufactured by Dainippon Ink and Chemicals, Inc.) (fluorine and silicone-based)

W-3: Polysiloxane polymer KP-341 (manufactured by Shin-Etsu Chemical Co., Ltd.) (silicone-based)

W-4: PF6320 (manufactured by OMNOVA Solutions, Inc.) (fluorine-based)

<Coating Solvent>

As the coating solvent, the following solvents were used.

S1: Propylene glycol monomethyl ether acetate (PGMEA)

S2: Propylene glycol monomethyl ether (PGME)

<Developer>

As the developer, the following developers were used.

SG-1: 2-nonanone

SG-2: Methyl amyl ketone (2-heptanone)

SG-3: Butyl acetate

<Rinse Liquid>

As the rinse liquid, the following rinse liquids were used.

SR-1: 4-methyl-2-pentanol

SR-2: 1-hexanol

SR-3: Methyl isobutyl carbinol

Examples 1 to 12

Extreme Ultraviolet Ray (EUV) Exposure, Evaluation of Isolated Line (1) Preparation and Coating of Coating Solution of Actinic Ray-Sensitive or Radiation-Sensitive Resin Composition A coating solution composition with a solid content concentration of 2.5% by mass, which had the composition shown in the following table, was microfiltered through a membrane filter having a pore diameter of 0.05 μm to obtain an actinic ray-sensitive or radiation-sensitive resin composition (resist composition) solution.

The actinic ray-sensitive or radiation-sensitive resin composition was coated on a 6-inch Si wafer previously subjected to a hexamethyldisilazane (HMDS) treatment, by using a spin coater Mark 8 manufactured by Tokyo Electron Limited, and dried on a hot plate at 100° C. for 60 seconds to obtain a resist film having a film thickness of 50 nm.

(2) EUV Exposure and Development

The resist film-coated wafer obtained in (1) above was patternwise exposed by using an EUV exposure apparatus (Micro Exposure Tool, manufactured by Exitech, NA0.3, X-dipole, outer sigma 0.68, inner sigma 0.36) and using an exposure mask (line/space=4/1). After the irradiation, the wafer was heated on a hot plate at 110° C. for 60 seconds, developed for 30 seconds by puddling the organic developer described in the following table, rinsed by using the rinse liquid described in the following table, spun at a rotation speed of 4,000 rpm for 30 seconds, and then baked at 90° C. for 60 seconds to obtain a resist pattern with an isolated space of a line/space=4:1.

(3) Evaluation of Resist Pattern

Using a scanning electron microscope (S-938011, manufactured by Hitachi Ltd.), the obtained resist pattern was evaluated for sensitivity and resolution by the following methods.

(3-1) Sensitivity

The irradiation energy when a 1:1 line-and-space pattern having a line width of 40 nm was resolved was defined as the sensitivity (Eop). A smaller value indicates higher performance.

(3-2) Resolution in Isolated Space

The limiting resolution (the minimum space width in which a line and a space are separated and resolved) of an isolated space (line/space=4:1) at the Eop above was determined. Moreover, this value was defined as "resolution (nm)". A smaller value indicates higher performance.

TABLE 2

| | Resin (% by mass) | Photo-acid generator (% by mass) | Basic compound (% by mass) | Solvent (mass ratio) | Surfactant (% by mass) | Developer | Rinse liquid | Sensitivity (mJ/cm$^2$) | Isolated space resolution (nm) |
|---|---|---|---|---|---|---|---|---|---|
| Example 1 | P-1 | z115 | N-1 | S1/S2 | w-4 | SG-3 | — | 24.8 | 25 |
| | 77.99 | 20 | 2 | 80/20 | 0.01 | | | | |
| Example 2 | P-2 | z115 | N-1 | S1/S2 | w-4 | SG-3 | — | 21.6 | 21 |
| | 77.99 | 20 | 2 | 80/20 | 0.01 | | | | |
| Example 3 | P-3 | z115 | N-1 | S1/S2 | w-4 | SG-3 | — | 13.8 | 19 |
| | 77.99 | 20 | 2 | 80/20 | 0.01 | | | | |
| Example 4 | P-4 | z115 | N-1 | S1/S2 | w-1 | SG-3 | — | 14.4 | 20 |
| | 77.99 | 20 | 2 | 80/20 | 0.01 | | | | |
| Example 5 | P-5 | z112 | N-2 | S1/S2 | w-2 | SG-3 | — | 17.8 | 18 |
| | 77.99 | 20 | 2 | 80/20 | 0.01 | | | | |
| Example 6 | P-6 | z113 | N-3 | S1/S2 | w-3 | SG-3 | — | 18.3 | 22 |
| | 77.99 | 20 | 2 | 60/40 | 0.01 | | | | |
| Example 7 | P-7 | z108 | N-3 | S1/S2 | w-4 | SG-3 | SR-1 | 21.1 | 24 |
| | 87.99 | 10 | 2 | 80/20 | 0.01 | | | | |
| Example 8 | P-8 | z108 | N-3 | S1/S2 | w-4 | SG-3 | SR-2 | 13.6 | 20 |
| | 77.99 | 20 | 2 | 80/20 | 0.01 | | | | |
| Example 9 | P-9 | z108 | N-3 | S1/S2 | w-4 | SG-1 | SR-3 | 13.9 | 18 |
| | 77.99 | 20 | 2 | 80/20 | 0.01 | | | | |
| Example 10 | P-10 | z115 | N-2 | S1/S2 | w-4 | SG-2 | — | 10.8 | 20 |
| | 77.99 | 20 | 2 | 80/20 | 0.01 | | | | |
| Example 11 | P-11 | z115 | N-2 | S1/S2 | w-4 | SG-3 | — | 10.9 | 22 |
| | 77.99 | 20 | 2 | 80/20 | 0.01 | | | | |
| Example 12 | P-11/P-12 (mass ratio) | z121 | N-2 | S1/S2 | w-4 | SG-3 | — | 11 | 18 |
| | 77.99 | 20 | 2 | 80/20 | 0.01 | | | | |

(4) Reversal and Evaluation of Pattern

A composition for forming a resist film for reversing a pattern was prepared by adding a solvent (PGEMA: 3,000 parts by mass) to the Polymer 1 (100 parts by mass). A fluorine-based surfactant FC-4430 (manufactured by Sumitomo 3M Ltd.) was added in an amount of 100 ppm to the solvent.

The composition for forming a resist film for reversing a pattern was coated on an isolated space pattern so as to have a film thickness of 50 nm, development was performed for 30 seconds with 2.38% by mass of an aqueous solution of tetramethyl ammonium hydroxide (Alkali Development Condition 1), and the post-baking was performed under the heating conditions described in the following Table. Whether the isolated space pattern was reversed into an isolated line pattern was observed by TDSEM (S-9380) manufactured by Hitachi, Ltd., thereby performing evaluation with the line width after the reversal and LWR (LWR (nm)).

In the observation of the isolated line pattern, when the isolated line pattern was observed at the upper portion of the pattern by TDSEM (S-9380) manufactured by Hitachi, Ltd., the line width was observed at any point, and the measurement variation was evaluated with 3σ. A smaller value indicates higher performance.

The result is shown in the following table.

TABLE 3

| Example | Post-bake | Reversal material | Alkali development | Line width after reversal (nm) | LWR (nm) |
|---|---|---|---|---|---|
| 1 | 120° C. 60 seconds | Polymer 1 | 1 | 21 | 3.0 |
| 2 | 150° C. 60 seconds | Polymer 1 | 1 | 18 | 3.2 |
| 3 | 90° C. 60 seconds | Polymer 1 | 1 | 16 | 3.0 |
| 4 | 150° C. 60 seconds | Polymer 1 | 1 | 16 | 3.1 |
| 5 | 120° C. 60 seconds | Polymer 1 | 1 | 16 | 3.2 |
| 6 | 150° C. 60 seconds | Polymer 1 | 1 | 18 | 3.0 |
| 7 | 150° C. 60 seconds | Polymer 1 | 1 | 20 | 3.4 |
| 8 | 150° C. 60 seconds | Polymer 1 | 1 | 17 | 3.2 |
| 9 | 100° C. 60 seconds | Polymer 1 | 1 | 16 | 3.1 |
| 10 | 150° C. 60 seconds | Polymer 1 | 1 | 17 | 3.4 |
| 11 | 160° C. 60 seconds | Polymer 1 | 1 | 20 | 3.0 |
| 12 | 130° C. 60 seconds | Polymer 1 | 1 | 15 | 3.2 |

As clear from the results of the table, the isolated space pattern was reversed into an isolated line pattern by the pattern forming method in Examples 1 to 12. In the usual positive-type pattern forming method, a good isolated line pattern with a line width being difficult to form could be formed with improved LWR.

EXPLANATION OF REFERENCE NUMERALS AND SYMBOLS

10: Substrate, 20: Layer to be processed, 30: Film for forming negative-type pattern, 30*a*: Negative-type pattern. 31*a*: Space part in negative-type pattern, 31*b*: Residual film part in negative-type pattern, 40: Resist film for reversing a pattern, 40*a*: Reversed positive-type resist pattern

INDUSTRIAL APPLICABILITY

According to the present invention, it is possible to provide a pattern forming method, which may form a fine pattern, such as a fine isolated line pattern or a fine dot pattern, which is difficult to form in a positive-type pattern forming method in the related art, may solve a dilemma of line thinning and the development of etching resistance by using a resist film for reversing a specific pattern, and may form a pattern, which has a good roughness performance such as line width roughness (LWR) and may sufficiently withstand etching even though the pattern is fine, a resist pattern formed by the method, a method for manufacturing an electronic device using the same, and an electronic device.

The present invention has been described in detail with reference to specific aspects, but it is obvious to those skilled in the art that various changes or modifications can be made without departing from the spirit and scope of the present invention.

The present application is based on the Japanese Patent Application (Patent Application No. 2012-257845) filed on Nov. 26, 2012, the contents of which are incorporated herein by reference.

What is claimed is:

1. A pattern forming method comprising:

(1) forming a film by an actinic ray-sensitive or radiation-sensitive resin composition containing a resin (A) capable of increasing the polarity by the action of an acid so that a solubility thereof in a developer containing an organic solvent is decreased;

(2) exposing the film;

(3) developing the film by a developer including an organic solvent to form a negative pattern having a space part obtained by removing a part of the film and a residual film part which is not removed by the developing;

(4) forming a resist film for reversing a pattern, on the negative pattern, so as to be embedded in the space part in the negative pattern; and (5) reversing the negative pattern into a positive pattern by removing the residual film part in the negative pattern by using an alkaline wet etching liquid, wherein:

in the step (4) of forming a resist film for reversing a pattern, a resist film for reversing a pattern is formed from a composition containing an organic silicon compound having a siloxane bond; and the organic silicon compound contains at least one substituent selected from the group consisting of a carboxyl group, a hydroxyl group, a phenolic hydroxyl group, an α-trifluoromethylhydroxyl group, and a lactone ring.

2. The pattern forming method according to claim 1, wherein the resin (A) has a repeating unit having a group capable of decomposing by the action of an acid to generate a polar group.

3. The pattern forming method according to claim 1, wherein the exposing is performed by using X-ray, electron beam, or EUV.

4. A resist pattern formed by the pattern forming method according to claim 1.

5. A method for manufacturing an electronic device, comprising:

providing a substrate for a semiconductor of a circuit board; and performing the pattern forming method according to claim 1 on the substrate.

6. An electronic device manufactured by the method for manufacturing an electronic device according to claim 5.

7. A pattern forming method comprising:

(1) forming a film by an actinic ray-sensitive or radiation-sensitive resin composition containing a resin (A)

capable of increasing the polarity by the action of an acid so that a solubility thereof in a developer containing an organic solvent is decreased;

(2) exposing the film;

(3) developing the film by a developer including an organic solvent to form a negative pattern having a space part obtained by removing a part of the film and a residual film part which is not removed by the developing;

(4) forming a resist film for reversing a pattern, on the negative pattern, so as to be embedded in the space part in the negative pattern; and (5) reversing the negative pattern into a positive pattern by removing the residual film part in the negative pattern by using an alkaline wet etching liquid, wherein the resist film for reversing a pattern is formed from a composition containing an organic silicon compound represented by formula (12):

$$U(OR^{44})_{m4}(OR^{45})_{m5} \quad (12)$$

wherein $R^{44}$ and $R^{45}$ each independently represents an organic group having 1 to 30 carbon atoms, m4+m5 is a valency determined by U, m4 and m5 each independently represents an integer of 0 or more, and U is an element selected from Group III, Group IV, and Group V in the Periodic Table except for silicon.

8. The pattern forming method according to claim 1, wherein the organic silicon compound includes a structure represented by any one of a-1 to a-5 in the following set of formulas (11-a):

(11-a)

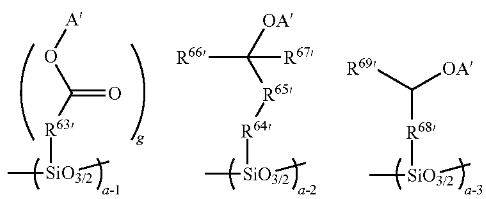

-continued

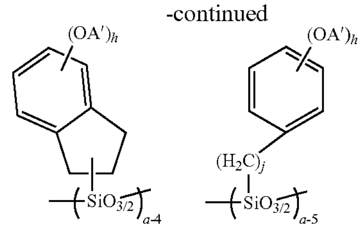

wherein $R^{63'}$, $R^{64'}$, and $R^{68'}$ each independently represents a straight, branched, or cyclic alkylene group having 1 to 20 carbon atoms or an arylene group having 6 to 20 carbon atoms, and may be substituted with a fluorine atom or a trifluoromethyl group;

$R^{65'}$ is a single bond, or a straight, branched or cyclic alkyl group having 1 to 6 carbon atoms;

$R^{66'}$ and $R^{67'}$ are a hydrogen atom, a fluorine atom, or a straight or branched alkyl group having 1 to 4 carbon atoms, or a fluorinated alkyl group, and at least one of $R^{66'}$ and $R^{67'}$ includes one or more fluorine atoms;

$R^{69'}$ represents a fluorine atom or a trifluoromethyl group;

A' represents a hydrogen atom, a straight, branched or cyclic alkyl group having 1 to 10 carbon atoms, an acyl group, an alkoxycarbonyl group, or an acid-decomposable group;

g, h, and i each independently represents 1 or 2; and j is an integer of 0 to 4.

9. The pattern forming method according to claim 8, wherein:

the organic silicon compound includes a structure represented by a-2 in the set of formulas (11-a);

$R^{66'}$ and $R^{67'}$ each independently represents a trifluoromethyl group;

A' represents a hydrogen atom; and $R^{63'}$, $R^{64'}$, $R^{65'}$, $R^{68'}$, $R^{69'}$, g, h, i and j each has the same meaning as in claim 8.

* * * * *